US012735634B2

(12) United States Patent
Kim et al.

(10) Patent No.: US 12,735,634 B2
(45) Date of Patent: Sep. 15, 2026

(54) LIGHT-EMITTING DEVICE INCLUDING HETEROCYCLIC COMPOUND AND ELECTRONIC APPARATUS INCLUDING THE LIGHT-EMITTING DEVICE

(71) Applicant: Samsung Display Co., Ltd., Yongin-si (KR)

(72) Inventors: Seran Kim, Yongin-si (KR); Hoilim Kim, Yongin-si (KR); Dongsun Yoo, Yongin-si (KR); Saena Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 936 days.

(21) Appl. No.: 17/676,767

(22) Filed: Feb. 21, 2022

(65) Prior Publication Data

US 2022/0278279 A1 Sep. 1, 2022

(30) Foreign Application Priority Data

Feb. 22, 2021 (KR) ........................ 10-2021-0023693

(51) Int. Cl.
*C09K 11/06* (2006.01)
*C07F 5/02* (2006.01)
(Continued)

(52) U.S. Cl.
CPC .............. *C09K 11/06* (2013.01); *C07F 5/027* (2013.01); *H10K 85/322* (2023.02);
(Continued)

(58) Field of Classification Search
CPC . C09K 11/06; C09K 2211/1018; C07F 5/027; H10K 85/322; H10K 50/11;
(Continued)

(56) References Cited

U.S. PATENT DOCUMENTS 9,455,411 B2 9/2016 Kwong et al.
2017/0098686 A1* 4/2017 Jeong ..................... H10K 50/84
(Continued)

FOREIGN PATENT DOCUMENTS

KR 10-1804084 12/2017
KR 10-2020-0004248 1/2020
(Continued)

OTHER PUBLICATIONS

Escande, A., & Ingleson, M. J. (2015). Fused polycyclic aromatics incorporating boron in the core: fundamentals and applications. Chemical Communications, 51(29), 6257-6274. (Year: 2015).*
(Continued)

*Primary Examiner* — Dawn L Garrett
(74) *Attorney, Agent, or Firm* — Womble Bond Dickinson (US) LLP

(57) ABSTRACT

An electronic device that includes a light-emitting device includes: a first electrode; a second electrode facing the first electrode; an interlayer between the first electrode and the second electrode and including an emission layer; and a heterocyclic compound of Formula 1:

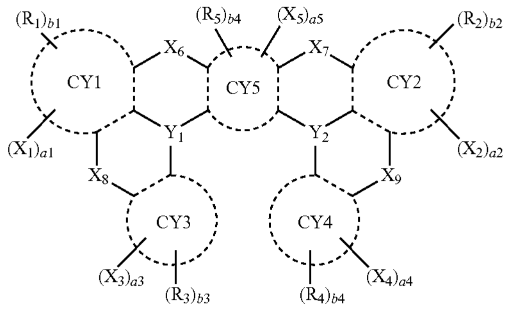

wherein the variables in Formula 1 are defined herein.

20 Claims, 3 Drawing Sheets

10

(51) Int. Cl.

| | |
|---|---|
| ***H10K 50/11*** | (2023.01) |
| ***H10K 59/123*** | (2023.01) |
| ***H10K 85/30*** | (2023.01) |
| ***H10K 101/10*** | (2023.01) |
| ***H10K 101/30*** | (2023.01) |

(52) U.S. Cl.
CPC ...... *C09K 2211/1018* (2013.01); *H10K 50/11* (2023.02); *H10K 59/123* (2023.02); *H10K 2101/10* (2023.02); *H10K 2101/30* (2023.02)

(58) Field of Classification Search
CPC ............. H10K 59/123; H10K 2101/10; H10K 2101/30; H10K 85/636; H10K 85/657; H10K 50/12
See application file for complete search history.

(56) References Cited

U.S. PATENT DOCUMENTS

| | | | |
|---|---|---|---|
| 2019/0312207 A1* | 10/2019 | Hatakeyama | H10K 85/6576 |
| 2020/0190115 A1 | 6/2020 | Hatakeyama et al. | |
| 2021/0122765 A1* | 4/2021 | Wolohan | C07F 5/027 |
| 2021/0257550 A1 | 8/2021 | Lee et al. | |

FOREIGN PATENT DOCUMENTS

| | | |
|---|---|---|
| KR | 10-2020-0006965 | 1/2020 |
| KR | 10-2020-0143653 A | 12/2020 |
| WO | 2018212169 | 11/2018 |

OTHER PUBLICATIONS

Li, Q., Wu, Y., Yang, Q., Wang, S., Shao, S., & Wang, L. (2022). Selenium-doped polycyclic aromatic hydrocarbon multiresonance emitters with fast reverse intersystem crossing for narrowband blue emission. ACS Applied Materials & Interfaces, 14(44), 49995-50003. (Year: 2022).*

Hatakeyama, Takuji, et al. "Ultrapure Blue Thermally Activated Delayed Fluorescence Molecules: Efficient HOMO-LUMO Separation by the Multiple Resonance Effect." Advanced Materials, vol. 28, No. 14, 2016, pp. 2777-2781.

Fell, Valentin H., et al. "Synthesis and Optical Characterization of Hybrid Organic-Inorganic Heterofluorene Polymers." Macromolecules, vol. 50, No. 6, 2017, pp. 2338-2343.

* cited by examiner

LIGHT-EMITTING DEVICE INCLUDING HETEROCYCLIC COMPOUND AND ELECTRONIC APPARATUS INCLUDING THE LIGHT-EMITTING DEVICE

CROSS-REFERENCE TO RELATED APPLICATION

This application claims priority from and the benefit of Korean Patent Application No. 10-2021-0023693, filed on Feb. 22, 2021, which is hereby incorporated by reference for all purposes as if fully set forth herein.

BACKGROUND

Field

Embodiments of the invention relate generally to display devices, and more particularly, to a light-emitting device including a heterocyclic compound and an electronic apparatus including the light-emitting device.

Discussion of the Background

One type of light-emitting devices, self-emissive devices have wide viewing angles, high contrast ratios, short response times, and excellent characteristics in terms of luminance, driving voltage, and response speed.

In a light-emitting device, a first electrode is located on a substrate, and a hole transport region, an emission layer, an electron transport region, and a second electrode are sequentially arranged on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. The excitons transition from an excited state to a ground state to thereby generate light.

The above information disclosed in this Background section is only for understanding of the background of the inventive concepts, and, therefore, it may contain information that does not constitute prior art.

SUMMARY

Applicant discovered that when light-emitting devices and electronic apparatuses include a heterocyclic compound made according to the principles and illustrative implementations of the invention, the devices have excellent driving voltage, excellent luminescence efficiency, and excellent external quantum efficiency.

Additional features of the inventive concepts will be set forth in the description which follows, and in part will be apparent from the description, or may be learned by practice of the inventive concepts.

According to one aspect of the invention, a light-emitting device includes: a first electrode; a second electrode facing the first electrodean interlayer located between the first electrode and the second electrode and including an emission layer; and a heterocyclic compound of Formula 1:

Formula 1

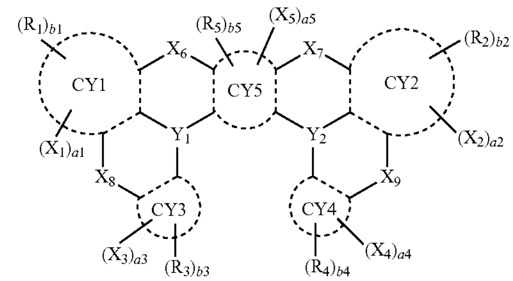

Formula 2

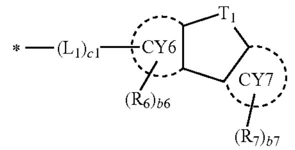

wherein, in Formulae 1 and 2, the variables are defined herein.

The emission layer may further include a host and a dopant, and the heterocyclic compound of Formula 1 may be a dopant.

The emission layer may further include a phosphorescent dopant.

An electronic apparatus may include the light-emitting device as described above.

The electronic apparatus may further include a thin-film transistor, wherein the thin-film transistor may include a source electrode and a drain electrode, and the first electrode of the light-emitting device may be electrically connected to at least one of the source electrode and the drain electrode of the thin-film transistor.

The electronic apparatus may further include a color filter, a color conversion layer, a touch screen layer, a polarizing layer, or any combination thereof.

The variables $Y_1$ and $Y_2$ in Formula 1 may each be B.

In Formula 1, the variables a1 and a2 may each be 1, a3 to a5 are each 0, and Formula 1 may not satisfy Conditions (3) to (5).

In Formula 1, the variable $X_1$ may be $N(Ar_{1a})(Z_{1a})$ or $N(Z_{1a})(Z_{1b})$, $X_2$ may be $N(Ar_{2a})(Z_{2a})$ or $N(Z_{2a})(Z_{2b})$, $X_3$ may be $N(Ar_{3a})(Z_{3a})$ or $N(Z_{3a})(Z_{3b})$, $X_4$ may be $N(Ar_{4a})(Z_{4a})$ or $N(Z_{4a})(Z_{4b})$, $X_5$ may be $N(Ar_{5a})(Z_{5a})$ or $N(Z_{5a})(Z_{5b})$, and Formula 1 may satisfy one of Conditions (1-1) to (5-1), one of Conditions (6) to (9), or any combination thereof, as described herein.

In Formula 1, $X_6$ may be O or S, $X_7$ is O, $N(Ar_7)$, or $N(Z_7)$, $X_8$ may be O, $N(Ar_8)$, or $N(Z_8)$, $X_9$ may be O, $N(Ar_9)$, or $N(Z_9)$, and Formula 1 may not satisfy Condition (6).

Formula 1 may satisfy one of Conditions (1) and (2), one of Conditions (7) to (9), or any combination thereof, and Formula 1 may not satisfy Conditions (3) to (6).

At least one of CY1 to CY5 in Formula 1 may be a benzene group.

In Formula 2, CY6 may be a benzene group, and CY7 may be a benzene group, a fluorene group, a carbazole group, a dibenzofuran group, a dibenzothiophene group, a dibenzosilole group, a dibenzoselenophene group, or a dibenzotellurophene group.

In Formulae 1 and 2, the variables $Z_{1a}$, $Z_{1b}$, $Z_{2a}$, $Z_{2b}$, $Z_{3a}$, $Z_{3b}$, $Z_{4a}$, $Z_{4b}$, $Z_{5a}$, $Z_{5b}$, $Z_6$ to $Z_9$, and $R_1$ to $R_7$ may each be, independently from one another: hydrogen, deuterium, —F, or a cyano group; or a phenyl group, a biphenyl group, or a terphenyl group, each unsubstituted or substituted with deuterium, —F, a cyano group, a $C_1$-$C_{20}$ alkyl group, a phenyl group, a biphenyl group, a terphenyl group, a $C_1$-$C_{20}$ alkylphenyl group, or any combination thereof.

In Formula 2, the variable $L_1$ is defined herein.

A group in Formula 1 may be a group of one of Formulae CY1-1 to CY1-4, as defined herein.

A group of Formula 1 may be a group of one of Formulae CY2-1 to CY2-4, as defined herein.

Formula 2 may be a group of one of Formulae 2-1 to 2-4, as defined herein.

Formula 1 may be one of Compounds 1 to 108, as defined herein.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
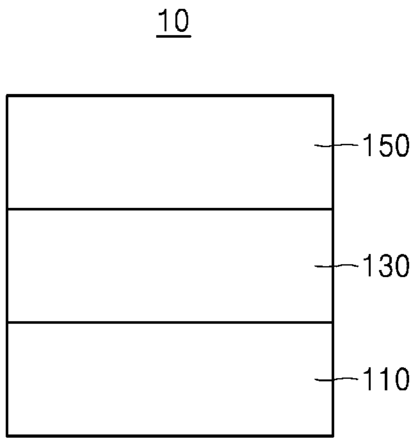
FIG. 1 is a schematic cross-sectional view of an embodiment of a light-emitting device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be per formed substantially at the same time or performed in an order opposite to the described or der. Also, like reference numerals denote like elements, and redundant explanations are omitted to avoid redundancy.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, “a,” “an,” and “the” are intended to include the plural forms as well, unless the context clearly indicates otherwise. Moreover, the terms “comprises,” “comprising,” “includes,” and/or “including,” when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms “substantially,” “about,” and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A heterocyclic compound made according to the principles and an illustrative embodiment of the invention may be represented by Formula 1:

Formula 1

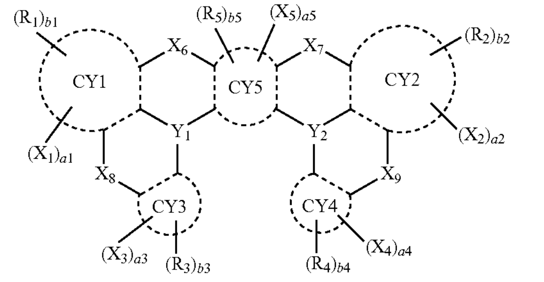

Formula 2

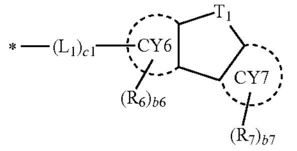

wherein, in Formula 1, $Y_1$ may be B, P(═O), or P(═S), and $Y_2$ may be B, P(═O), or P(═S). In an embodiment, $Y_1$ and $Y_2$ may each be B. The variables a1 to a5 in Formula 1 indicate the numbers of $X_1$ to $X_5$, respectively, and may each independently be an integer from 0 to 4.

When a1 is 2 or more, two or more of $X_1$(s) may be identical to or different from each other, when a2 is 2 or more, two or more of $X_2$(s) may be identical to or different from each other, when a3 is 2 or more, two or more of $X_3$(s) may be identical to or different from each other, when a4 is 2 or more, two or more of $X_4$(s) may be identical to or different from each other, and when a5 is 2 or more, two or more of $X_5$(s) may be identical to or different from each other. In an embodiment, a1 to a5 may each independently be an integer of 0 or 1. In an embodiment, when a1 is 0, $X_1$ may not be present, when a2 is 0, $X_2$ may not be present, when a3 is 0, $X_3$ may not be present, when a4 is 0, $X_4$ may not be present, and when a5 is 0, $X_5$ may not be present.

In Formula 1, $X_1$ may be $N(Ar_{1a})(Ar_{1b})$, $N(Ar_{1a})(Z_{1a})$, or $N(Z_{1a})(Z_{1b})$, $X_2$ may be $N(Ar_{2a})(Ar_{2b})$, $N(Ar_{2a})(Z_{2a})$, or $N(Z_{2a})(Z_{2b})$, $X_3$ may be $N(Ar_{3a})(Ar_{3b})$, $N(Ar_{3a})(Z_{3a})$, or $N(Z_{3a})(Z_{3b})$, $X_4$ may be $N(Ar_{4a})(Ar_{4b})$, $N(Ar_{4a})(Z_{4a})$, or $N(Z_{4a})(Z_{4b})$, $X_5$ may be $N(Ar_{5a})Ar_{5b})$, $N(Ar_{5a})(Z_{5a})$, or $N(Z_{5a})(Z_{5b})$, $X_6$ may be O, S, $N(Ar_6)$, or $N(Z_6)$, $X_7$ may be O, S, $N(Ar_7)$, or $N(Z_7)$, $X_8$ may be O, S, $N(Ar_8)$, or $N(Z_8)$, and $X_9$ may be O, S, $N(Ar_9)$, or $N(Z_9)$.

In Formula 1, $Ar_{1a}$, $Ar_{1b}$, $Ar_{2a}$, $Ar_{2b}$, $Ar_{3a}$, $Ar_{3b}$, $Ar_{4a}$, $Ar_{4b}$, $Ar_{5a}$, $Ar_{5b}$, and $Ar_6$ to $Ar_9$ may each be a group represented by Formula 2. Details of Formula 2 will be described below.

Formula 1 may satisfy at least one of Conditions (1) to (9).

Condition (1)

a1 is an integer of 1 or more, and at least one of $X_1$(s) in the number of a1 is $N(Ar_{1a})(Ar_{1b})$ or $N(Ar_{1a})(Z_{1a})$.

Condition (2)

a2 is an integer of 1 or more, and at least one of $X_2$(s) in the number of a2 is $N(Ar_2)Ar_{2b})$ or $N(Ar_{2a})(Z_{2a})$.

Condition (3)

a3 is an integer of 1 or more, and at least one of $X_3$(s) in the number of a3 is $N(Ar_{3a})(Ar_{4b})$ or $N(Ar_{3a})(Z_{3a})$.

Condition (4)

a4 is an integer of 1 or more, and at least one of $X_4$(s) in the number of a4 is $N(Ar_{4a})(Ar_{4b})$ or $N(Ar_{4a})(Z_{4a})$.

Condition (5)

a5 is an integer of 1 or more, and at least one of $X_5$(s) in the number of a5 is $N(Ar_{5a})(Ar_{5b})$ or $N(Ar_{5a})(Z_{5a})$.

Condition (6)

$X_6$ is $N(Ar_6)$.

Condition (7)

$X_7$ is $N(Ar_7)$.

Condition (8)

$X_8$ is $N(Ar_8)$.

Condition (9)

$X_9$ is $N(Ar_9)$.

In an embodiment, a1 and a2 may each be 1, a3 to a5 may each be 0, and Conditions (3) to (5) may not be satisfied. In an embodiment, not satisfying Condition (3) may mean that a3 is 0 and $X_3$ is not present, not satisfying Condition (4) may mean that a4 is 0 and $X_4$ is not present, and not satisfying Condition (5) may mean that a5 is 0 and $X_5$ is not present.

In an embodiment, Formula 1, $X_1$ may be $N(Ar_{1a})(Z_{1a})$ or $N(Z_{1a})(Z_{1b})$, $X_2$ may be $N(Ar_{2a})(Z_{2a})$ or $N(Z_{2a})(Z_{2b})$, $X_3$ may be $N(Ar_{3a})(Z_{3a})$ or $N(Z_{3a})(Z_{3b})$, $X_4$ may be $N(Ar_{4a})(Z_{4a})$ or $N(Z_{4a})(Z_{4b})$, and $X_5$ may be $N(Ar_{5a})(Z_{5a})$ or $N(Z_{5a})(Z_{5b})$. In this case, Formula 1 may satisfy one of Conditions (1-1) to (5-1), one of Conditions (6) to (9), or any combination thereof.

Condition (1-1)

a1 is an integer of 1 or more, and at least one of $X_1$(s) in the number of a1 is $N(Ar_{1a})(Z_{1a})$.

Condition (2-1)

a2 is an integer of 1 or more, and at least one of $X_2$(s) in the number of a2 is $N(Ar_{2a})(Z_{2a})$.

Condition (3-1)

a3 is an integer of 1 or more, and at least one of $X_3$(s) in the number of a3 is $N(Ar_{3a})(Z_{3a})$.

Condition (4-1)

a4 is an integer of 1 or more, and at least one of $X_4$(s) in the number of a4 is $N(Ar_{4a})(Z_{4a})$.

Condition (5-1)

a5 is an integer of 1 or more, and at least one of $X_5$(s) in the number of a5 is $N(Ar_{5a})(Z_{5a})$.

In an embodiment, in Formula 1, $X_6$ may be O, S, or $N(Z_6)$, $X_7$ may be O, S, $N(Ar_7)$, or $N(Z_7)$, $X_8$ may be O, S, $N(Ar_8)$, or $N(Z_8)$, $X_9$ may be O, S, N(Arg), or $N(Z_9)$, and Formula 1 may not satisfy Condition (6). In this case, not satisfying Condition (6) may mean that $X_6$ is O, S, or $N(Z_6)$, rather than $N(Ar_6)$. In an embodiment, in Formula 1, $X_6$ may be O or S, $X_7$ may be O, S, $N(Ar_7)$, or $N(Z_7)$, $X_8$ may be O, S, $N(Ar_8)$, or $N(Z_8)$, $X_9$ may be O, S, N(Arg), or $N(Z_9)$, and Formula 1 may not satisfy Condition (6). In this case, not satisfying Condition (6) may mean that $X_6$ is O or S, rather than $N(Ar_6)$.

In one or more embodiments, in Formula 1, $X_7$ may be O, S, or $N(Z_7)$, $X_6$ may be O, S, $N(Ar_6)$, or $N(Z_6)$, $X_8$ may be O, S, $N(Ar_8)$, or $N(Z_8)$, $X_9$ may be O, S, N(Arg), or $N(Z_9)$, and Formula 1 may not satisfy Condition (7). In this case, not satisfying Condition (7) may mean that $X_7$ is O, S, or $N(Z_7)$, rather than $N(Ar_7)$.

In an embodiment, in Formula 1, $X_7$ may be O or S, $X_6$ may be O, S, $N(Ar_6)$, or $N(Z_7)$, $X_8$ may be O, S, $N(Ar_8)$, or $N(Z_8)$, $X_9$ may be O, S, N(Arg), or $N(Z_9)$, and Formula 1 may not satisfy Condition (7). In this case, not satisfying Condition (7) may mean that $X_7$ is O or S, rather than $N(Ar_7)$.

In one or more embodiments, in Formula 1, $X_8$ may be O, S, or $N(Z_8)$, $X_6$ may be O, S, $N(Ar_6)$, or $N(Z_6)$, $X_7$ may be O, S, $N(Ar_7)$, or $N(Z_7)$, $X_9$ may be O, S, N(Arg), or $N(Z_9)$, and Formula 1 may not satisfy Condition (8). In this case, not satisfying Condition (8) may mean that $X_8$ is O, S, or $N(Z_8)$, rather than $N(Ar_8)$.

In an embodiment, in Formula 1, $X_8$ may be O or S, $X_6$ may be O, S, $N(Ar_6)$, or $N(Z_7)$, $X_7$ may be O, S, $N(Ar_7)$, or $N(Z_7)$, $X_9$ may be O, S, N(Arg), or $N(Z_9)$, and Formula 1 may not satisfy Condition (8). In this case, not satisfying Condition (8) may mean that $X_8$ is O or S, rather than $N(Ar_8)$.

In one or more embodiments, in Formula 1, $X_9$ may be O, S, or $N(Z_9)$, $X_6$ may be O, S, $N(Ar_6)$, or $N(Z_6)$, $X_7$ may be O, S, $N(Ar_7)$, or $N(Z_7)$, $X_8$ may be O, S, $N(Ar_8)$, or $N(Z_8)$, and Formula 1 may not satisfy Condition (9). In this case, not satisfying Condition (9) may mean that $X_9$ is O, S, or $N(Z_9)$, rather than N(Arg).

In an embodiment, in Formula 1, $X_9$ may be O or S, $X_6$ may be O, S, $N(Ar_6)$, or $N(Z_7)$, $X_7$ may be O, S, $N(Ar_7)$, or $N(Z_7)$, $X_8$ may be O, S, $N(Ar_8)$, or $N(Z_8)$, and Formula 1 may not satisfy Condition (9). In this case, not satisfying Condition (9) may mean that $X_9$ is O or S, rather than N(Arg).

In an embodiment, Formula 1 may satisfy one of Conditions (1) and (2), one of Conditions (6) to (9), or any combination thereof, and may not satisfy Conditions (3) to (5). In an embodiment, not satisfying Condition (3) may mean that a3 is 0 and $X_3$ is not present, not satisfying Condition (4) may mean that a4 is 0 and $X_4$ is not present, and not satisfying Condition (5) may mean that a5 is 0 and $X_5$ is not present. In one or more embodiments, Formula 1 may satisfy one of Conditions (1) and (2), one of Conditions (7) to (9), or any combination thereof, and may not satisfy Conditions (3) to (6).

In an embodiment, not satisfying Condition (3) may mean that a3 is 0 and $X_3$ is not present, not satisfying Condition (4) may mean that a4 is 0 and $X_4$ is not present, not satisfying Condition (5) may mean that a5 is 0 and $X_5$ is not present, and not satisfying Condition (6) may mean that $X_6$ is O, S, or $N(Z_6)$, rather than $N(Ar_6)$.

In an embodiment, Formula 1 may not satisfy Conditions (3) to (5) and (7), may not satisfy Conditions (3) to (5) and (8), or may not satisfy Conditions (3) to (5) and (9), instead of Conditions (3) to (6). Ring CY1 to ring CY7 in Formulae 1 and 2 may each independently be a $C_3$-$C_{60}$ carbocyclic group or a $C_1$-$C_{60}$ heterocyclic group. In an embodiment, ring CY1 to ring CY7 in Formulae 1 and 2 may each independently be a benzene group, a naphthalene group, an anthracene group, a dibenzofuran group, a dibenzothiophene group, a carbazole group, a fluorene group, or a dibenzosilole group.

In an embodiment, at least one of CY1 to CY5 in Formula 1 may be a benzene group. In one or more embodiments, CY1 to CY5 in Formula 1 may each be the same group. In one or more embodiments, CY3 to CY5 in Formula 1 may each be a benzene group. In one or more embodiments, CY1 to CY5 in Formula 1 may each be a benzene group. In an embodiment, at least one of CY6 and CY7 in Formula 2 may be a benzene group. In one or more embodiments, CY6 and CY7 in Formula 2 may each be the same group. In one or more embodiments, CY6 and CY7 in Formula 2 may be different groups.

In one or more embodiments, in Formula 2, CY6 may be a benzene group, and CY7 may be a benzene group, a fluorene group, a carbazole group, a dibenzofuran group, a dibenzothiophene group, dibenzosilole group, a dibenzoselenophene group, or a dibenzotellurophene group. In one or more embodiments, CY6 and CY7 in Formula 2 may each be a benzene group.

The variables b1 to b7 in Formulae 1 and 2 indicate the numbers of $R_1$ to $R_7$, respectively, and may each independently be an integer from 0 to 8. When b1 is 2 or more, two or more of $R_1$(s) may be identical to or different from each other, when b2 is 2 or more, two or more of $R_2$(s) may be identical to or different from each other, when b3 is 2 or more, two or more of $R_3$(s) may be identical to or different from each other, when b4 is 2 or more, two or more of $R_4$(s) may be identical to or different from each other, when b5 is 2 or more, two or more of $R_5$(s) may be identical to or different from each other, when b6 is 2 or more, two or more of $R_6$(s) may be identical to or different from each other, and when b7 is 2 or more, two or more of $R_7$(s) may be identical to or different from each other.

The variables $Z_{1a}$, $Z_{1b}$, $Z_{2a}$, $Z_{2b}$, $Z_{3a}$, $Z_{3b}$, $Z_{4a}$, $Z_{4b}$, $Z_{5a}$, $Z_{5b}$, $Z_6$ to $Z_9$, and $R_1$ to $R_7$ in Formulae 1 and 2 may each independently be: hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a pyridinyl group, a pyrimidinyl group, or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In one or more embodiments, $Z_{1a}$, $Z_{1b}$, $Z_{2a}$, $Z_{2b}$, $Z_{3a}$, $Z_{3b}$, $Z_{4a}$, $Z_{4b}$, $Z_{5a}$, $Z_{5b}$, $Z_6$ to $Z_9$, and $R_1$ to R, in Formulae 1 and 2 may each independently be:

hydrogen, deuterium, —F, a cyano group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, $—CD_3$, $—CD_2H$, $—CDH_2$, $—CF_3$, $—CF_2H$, $—CFH_2$, a cyano group, or any combination thereof; or a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, or a benzosilolocarbazolyl group, each unsubstituted or substituted with deuterium, —F, $—CD_3$, $—CD_2H$, $—CDH_2$, —$CF_3$, —$CF_2H$, —$CFH_2$, a cyano group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, or any combination thereof.

In one or more embodiments, $Z_{1a}$, $Z_{1b}$, $Z_{2a}$, $Z_{2b}$, $Z_{3a}$, $Z_{3b}$, $Z_{4a}$, $Z_{4b}$, $Z_{5a}$, $Z_{5b}$, $Z_6$ to $Z_9$, and $R_1$ to $R_7$ in Formulae 1 and 2 may each independently be:

a group represented by hydrogen, deuterium, —F, or a cyano group; or a phenyl group, a biphenyl group, or a terphenyl group, each unsubstituted or substituted with deuterium, —F, a cyano group, a $C_1$-$C_{20}$ alkyl group, a phenyl group, a biphenyl group, a terphenyl group, a $C_1$-$C_{20}$ alkylphenyl group, or any combination thereof.

In one or more embodiments, $Z_{1a}$, $Z_{1b}$, $Z_{2a}$, $Z_{2b}$, $Z_{3a}$, $Z_{3b}$, $Z_{4a}$, $Z_{4b}$, $Z_{5a}$, $Z_{5b}$, $Z_6$ to $Z_9$, and $R_1$ to $R_7$ in Formulae 1 and 2 may each independently be:

a group represented by hydrogen, deuterium, —F, or a cyano group; or a group represented by one of Formulae 3-1 to 3-20.

3-1

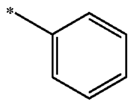

3-2

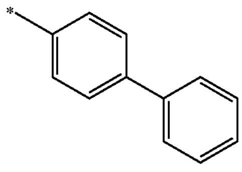

3-3

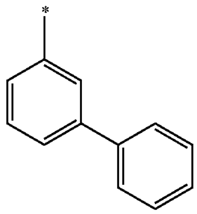

-continued 3-4

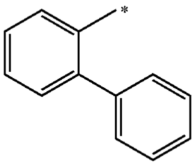

3-5

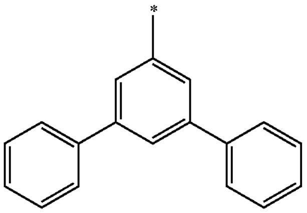

3-6

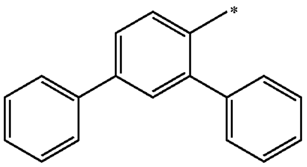

3-7

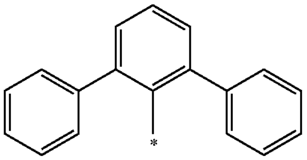

3-8

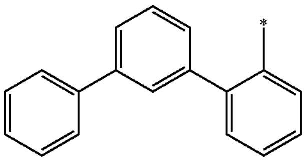

3-9

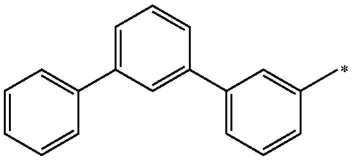

3-10

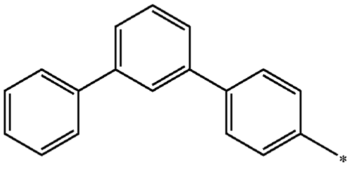

3-11

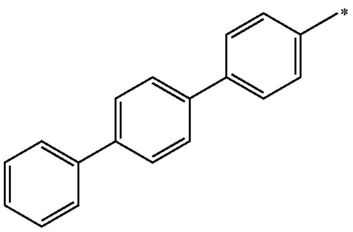

-continued 3-12

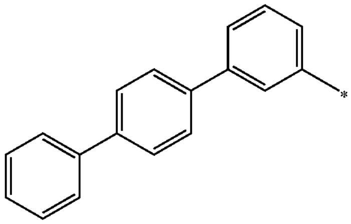

3-13

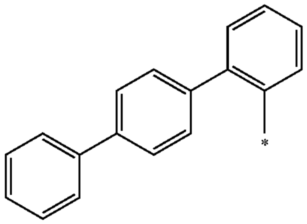

3-14

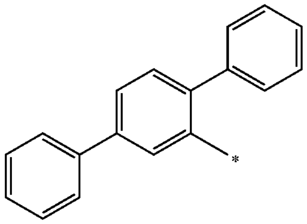

3-15

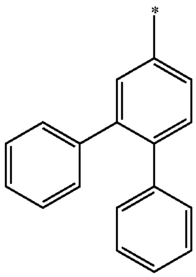

3-16

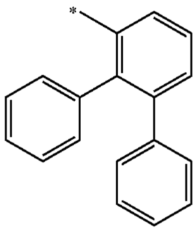

3-17

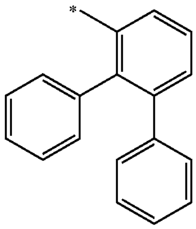

-continued 3-18

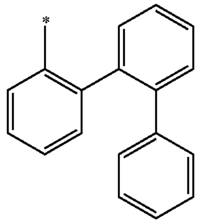

3-19

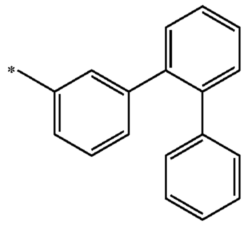

3-20

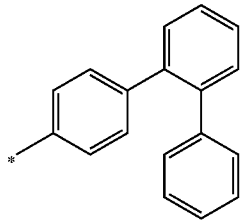

In Formulae 3-1 to 3-20,

* indicates a binding site to a neighboring atom.

c1 in Formula 2 indicates the number of $L_1$(s), and may be an integer from 0 to 3 (for example 0, 1, or 3). When c1 is 2 or more, two or more of $L_1$(s) may be identical to or different from each other.

$L_1$ in Formula 2 may be: a single bond;

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthrolinylene group, a dibenzoquinolinylene group, a bipyridinylene group, or a pyridinylene group; or a phenylene group, a pentalenylene group, an indenylene group, a naphthylene group, an azulenylene group, a heptalenylene group, an indacenylene group, an acenaphthylene group, a fluorenylene group, a spirobifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthrolinylene group, a bipyridinylene group, a dibenzoquinolinylene group, or a pyridinylene group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a quinolinyl group, an isoquinolinyl group, a benzoquinolinyl group, a benzoisoquinolinyl group, a dibenzoquinolinyl group, a dibenzoisoquinolinyl group, a biphenyl group, a phenylpyridinyl group, a phenanthrolinyl, a dibenzoquinolinyl group, a bipyridinyl group, a pyridinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof.

In one or more embodiments, $L_1$ in Formula 2 may be:

a single bond; or a phenylene group, a naphthylene group, a spiro-anthracenefluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a thiophenylene group, a furanylene group, a carbazolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthrolinylene group, a dibenzoquinolinylene group, a bipyridinylene group, or a pyridinylene group; or a phenylene group, a naphthylene group, a spiro-anthracenefluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a thiophenylene group, a furanylene group, a carbazolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthrolinylene group, a dibenzoquinolinylene group, a bipyridinylene group, or a pyridinylene group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, a spiro-anthracenefluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a quinolinyl group, an isoquinolinyl group, a benzoquinolinyl group, a benzoisoquinolinyl group, a dibenzoquinolinyl group, a dibenzoisoquinolinyl group, a biphenyl group, a phenylpyridinyl group, a phenanthrolinyl group, a dibenzoquinolinyl group, a bipyridinyl group, a pyridinyl group, or any combination thereof.

In one or more embodiments, $L_1$ in Formula 2 may be: a single bond;

a phenylene group or a naphthylene group; or a phenylene group or a naphthylene group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, or any combination thereof.

In one or more embodiments, $L_1$ in Formula 2 may be: a single bond; or a group represented by one of Formulae 4-1 to 4-9.

4-1

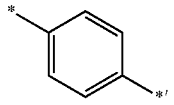

-continued 4-2

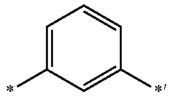

4-3

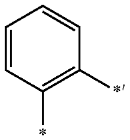

4-4

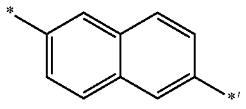

4-5

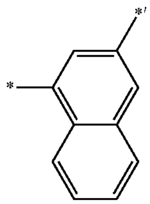

4-6

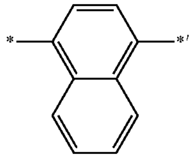

4-7

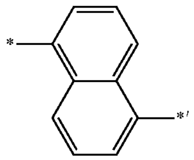

4-8

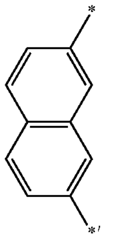

4-9

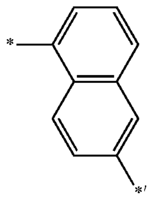

The symbols * and *' in Formulae 4-1 to 4-9 each indicate a binding site to a neighboring atom.

The symbol * in Formula 2 indicates a binding site to Formula 1.

In an embodiment, a group represented by

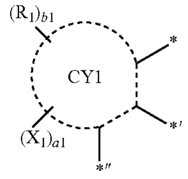

in Formula 1 may be a group represented by one of Formulae CY1-1 to CY1-4.

CY1-1

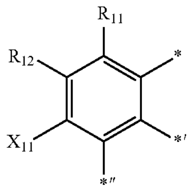

CY1-2

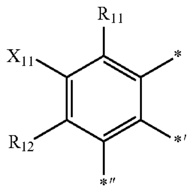

CY1-3

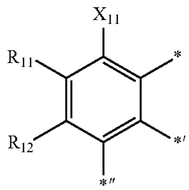

CY1-4

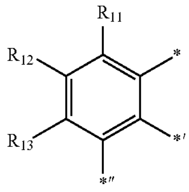

In Formulae CY1-1 to CY1-4, $X_{11}$ is the same as described in connection with $X_1$, $R_{11}$ to $R_{13}$ are each the same as described in connection with $R_1$,

* indicates a binding site to $X_6$ in Formula 1,

*' indicates a binding site to $Y_1$ in Formula 1, and

*" indicates a binding site to $X_8$ in Formula 1.

In one or more embodiments, $R_{11}$ to $R_{13}$ in Formulae CY1-1 to CY1-4 may each be hydrogen.

In an embodiment, a group represented by

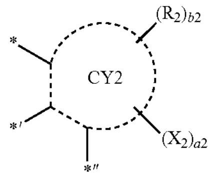

in Formula 1 may be a group represented by one of Formulae CY2-1 to CY2-4.

CY2-1

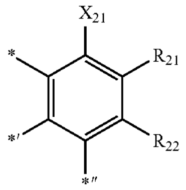

CY2-2

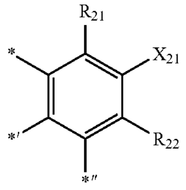

CY2-3

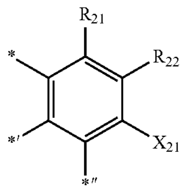

CY2-4

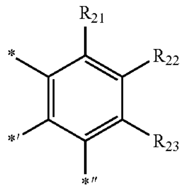

In Formulae CY2-1 to CY2-4, $X_{21}$ is the same as described in connection with $X_2$, $R_{21}$ to $R_{23}$ are each the same as described in connection with $R_2$,

* indicates a binding site to $X_7$ in Formula 1,

*' indicates a binding site to $Y_2$ in Formula 1, and

*" indicates a binding site to $X_9$ in Formula 1.

In one or more embodiments, $R_{21}$ to $R_{23}$ in Formulae CY2-1 to CY2-4 may each be hydrogen.

In an embodiment, a group represented by

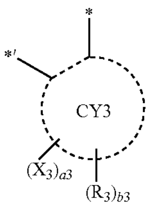

in Formula 1 may be a group represented by one of Formulae CY3-1 to CY3-5.

CY3-1

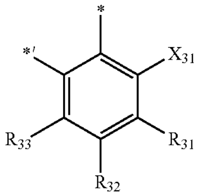

CY3-2

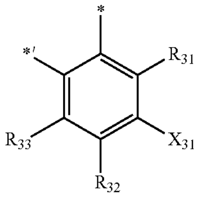

CY3-3

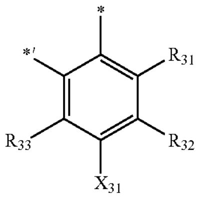

CY3-4

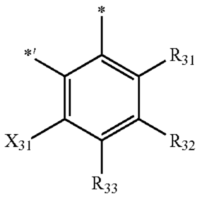

CY3-5

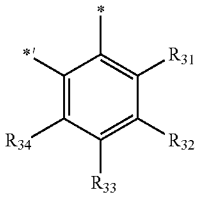

In Formulae CY3-1 to CY3-5, $X_{31}$ is the same as described in connection with $X_3$, $R_{31}$ to $R_{34}$ may each be the same as described in connection with $R_3$,

* indicates a binding site to $Y_1$ in Formula 1, and

*' indicates a binding site to $X_8$ in Formula 1.

In one or more embodiments, $R_{31}$ to $R_{34}$ in Formulae CY3-1 to CY3-5 may each be hydrogen.

In an embodiment, a group represented by

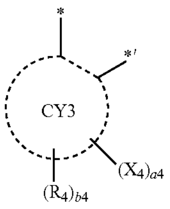

in Formula 1 may be a group represented by one of Formulae CY4-1 to CY4-5.

CY4-1

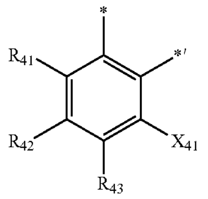

CY4-2

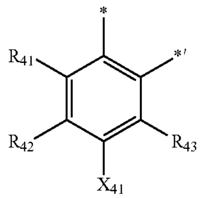

CY4-3

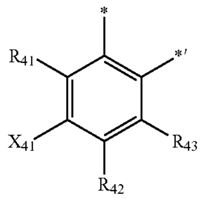

CY4-4

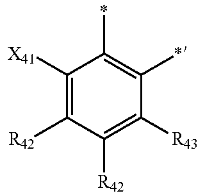

CY4-5

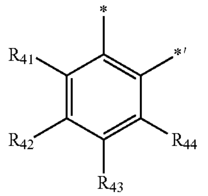

In Formulae CY4-1 to CY4-5, $X_{41}$ is the same as described in connection with $X_4$, $R_{41}$ to $R_{44}$ are each the same as described in connection with $R_4$,

* indicates a binding site to $Y_2$ in Formula 1, and

*' indicates a binding site to $X_9$ in Formula 1.

In one or more embodiments, $R_{41}$ to $R_{44}$ in Formulae CY4-1 to CY4-5 may each be hydrogen.

In an embodiment, a group represented by

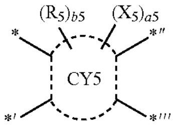

in Formula 1 may be a group represented by one of Formulae CY5-1 to CY5-3.

CY5-1

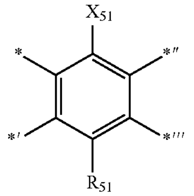

CY5-2

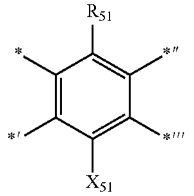

CY5-3

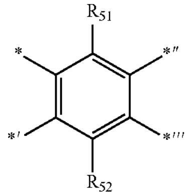

In Formulae CY5-1 to CY5-3, $X_{51}$ is the same as described in connection with $X_5$, $R_{51}$ and $R_{52}$ are each the same as described in connection with $R_5$,

* indicates a binding site to $X_6$ in Formula 1,

*' indicates a binding site to $Y_1$ in Formula 1,

*" indicates a binding site to $X_7$ in Formula 1, and

*'" indicates a binding site to $Y_2$ in Formula 1.

In one or more embodiments, $R_{51}$ and $R_{52}$ in Formulae CY5-1 to CY5-3 may each be hydrogen. In an embodiment, Formula 2 may be a group represented by one of Formulae 2-1 to 2-4.

2-1

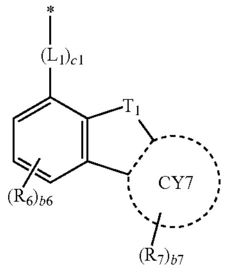

2-2

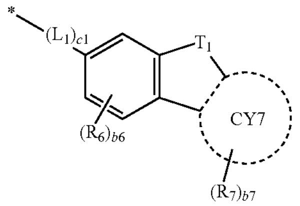

-continued 2-3

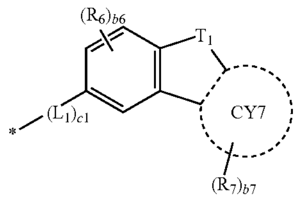

2-4

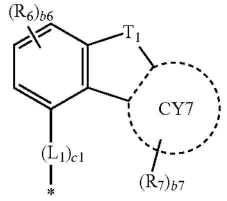

In Formulae 2-1 to 2-4, $L_1$, c1, $T_1$, b6, b7, $R_6$, $R_7$, and CY7 are each the same as described herein, and

* indicates a binding site to Formula 1.

In one or more embodiments, $R_6$ and $R_7$ in Formulae 2-1 to 2-4 may each be hydrogen. In one or more embodiments, in Formulae 2-1 to 2-4, c1 may be 0, $L_1$ may not be present, and a binding site to Formula 1 may directly be located. In one or more embodiments, c1 may be 1, and $L_1$ may be a single bond. In an embodiment, $T_1$ in Formula 2 may be Se or Te. In an embodiment, when Formula 1 satisfies at least one of Conditions (1) to (9), Formula 1 may include at least one substituent represented by Formula 2.

In one or more embodiments, when Formula 1 includes two or more substituents represented by Formula 2, the two or more substituents represented by Formula 2 may each independently include Se or Te as $T_1$. In one or more embodiments, when Formula 1 includes two or more substituents represented by Formula 2, $T_1$(s) respectively included in any two or more substituents represented by Formula 2 may each be the same atom.

The heterocyclic compound represented by Formula 1 may be, for example, one of Compounds 1 to 104:

1

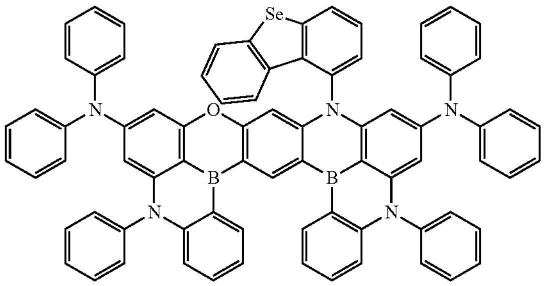

2

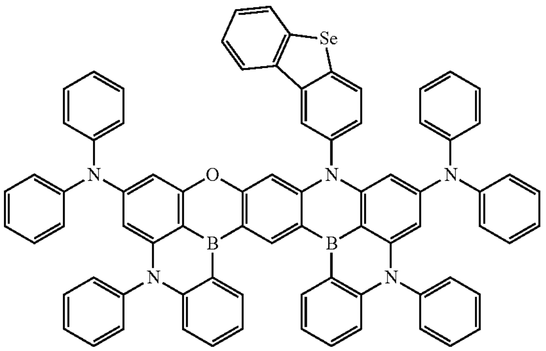

3

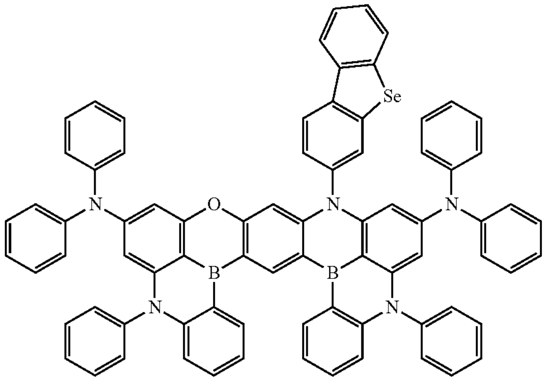

4

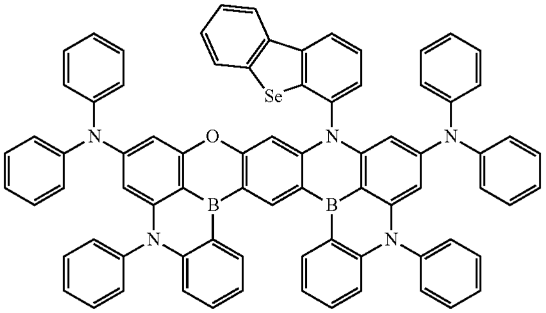

-continued
5
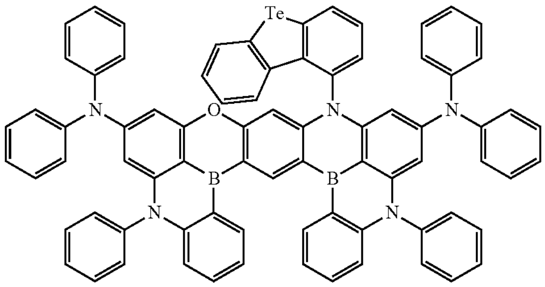
6
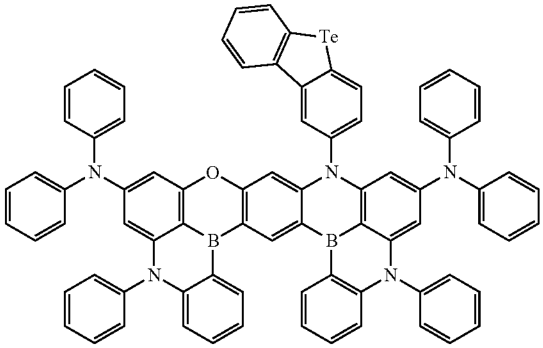
7
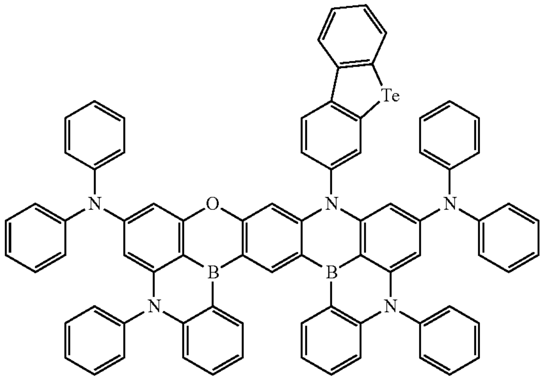
8
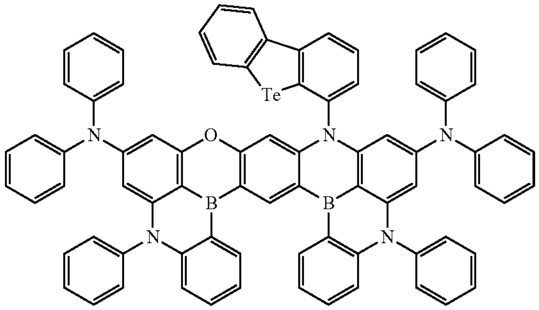
9
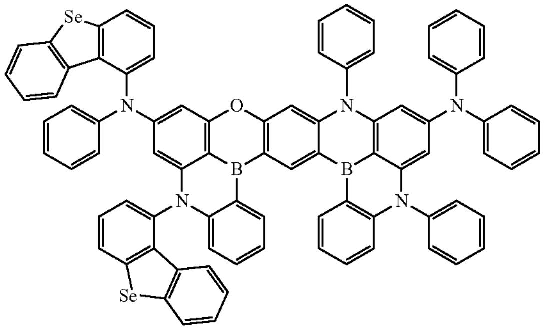
10
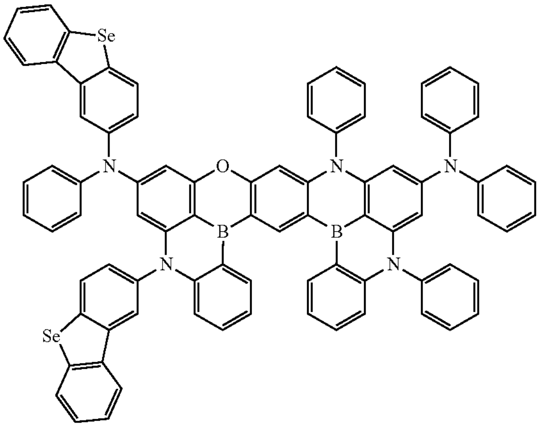
11
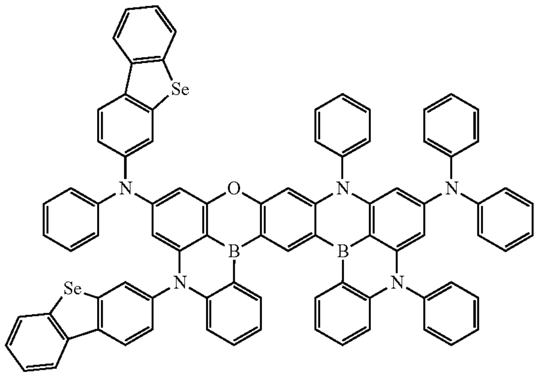
12
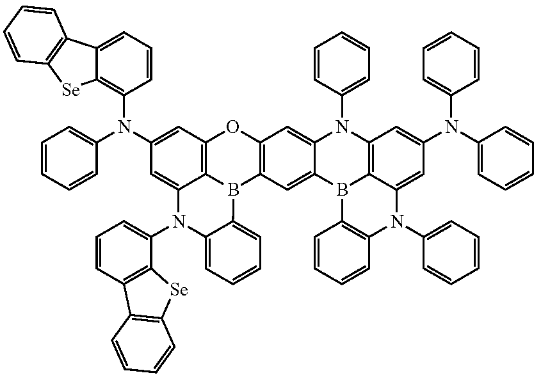

-continued
13
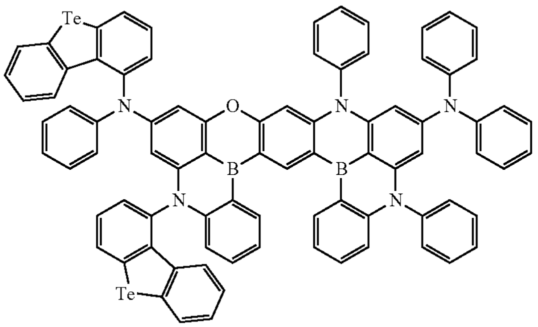
14
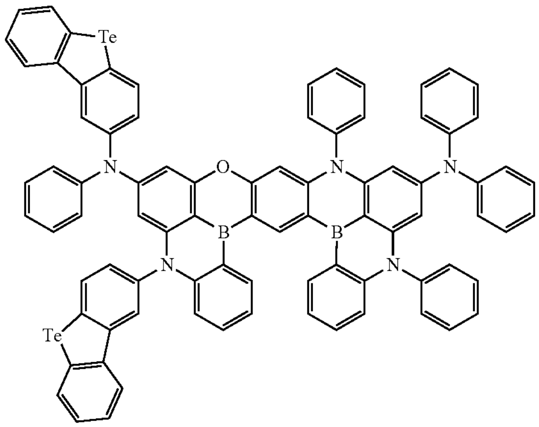
15
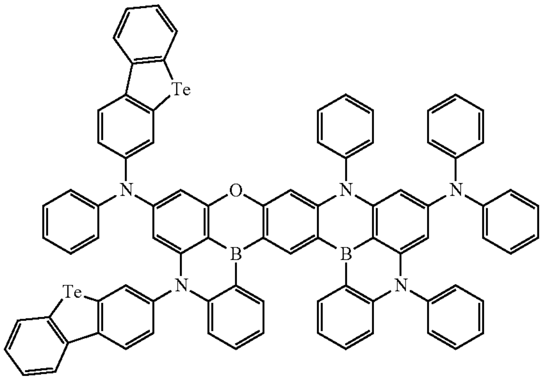
16
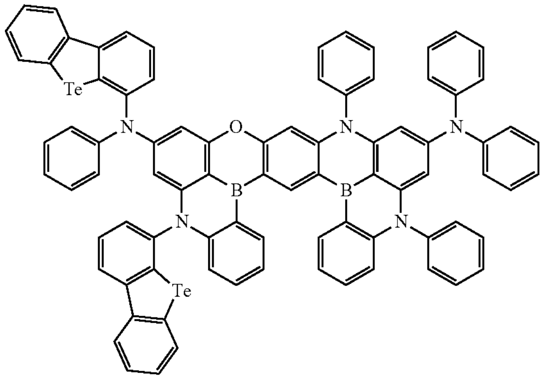
17
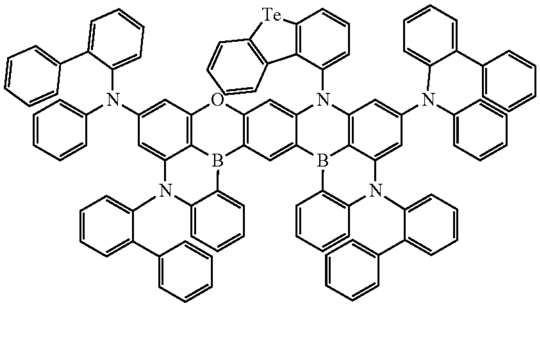
18
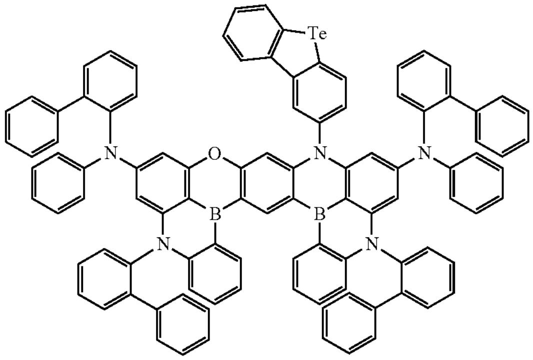
19
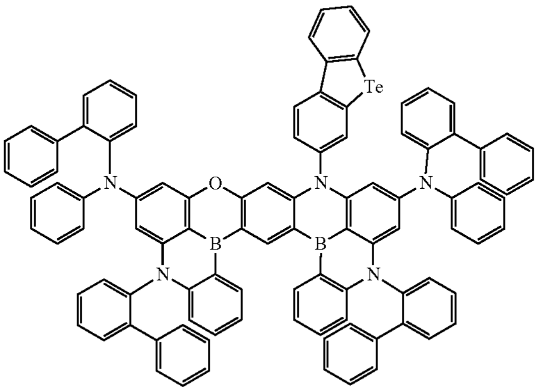
20
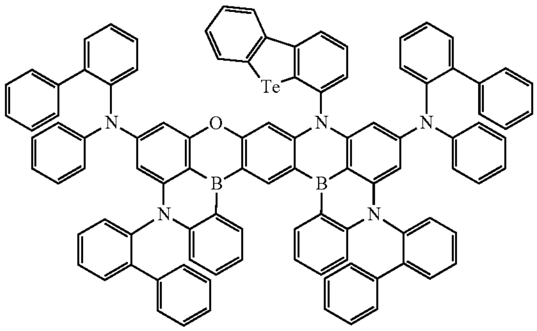

-continued
21
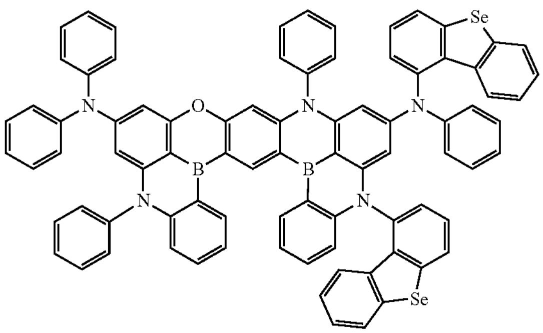
22
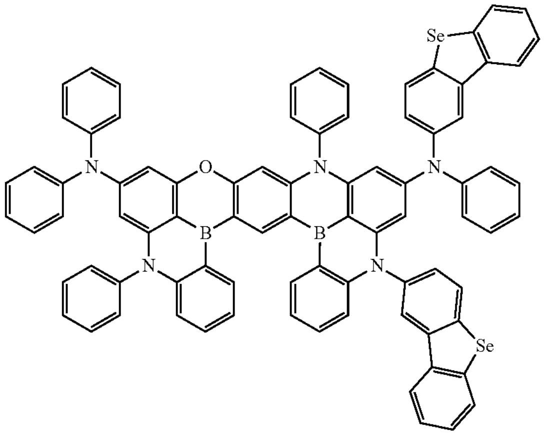
23
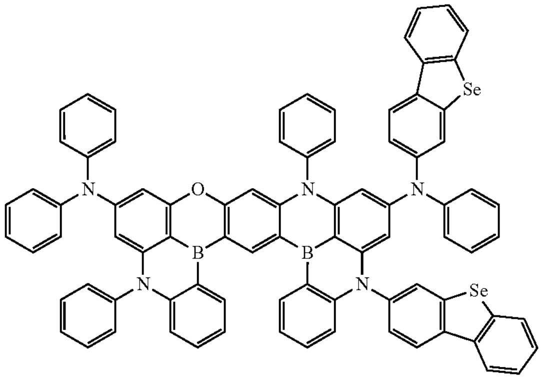
24
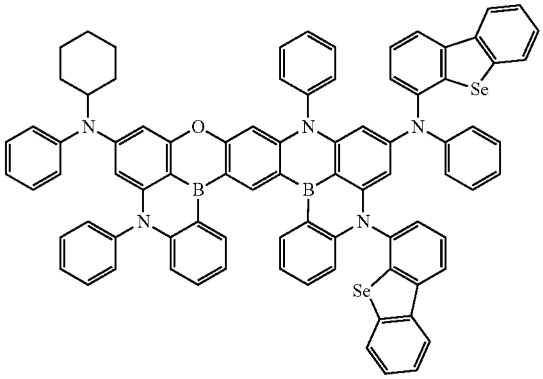
25
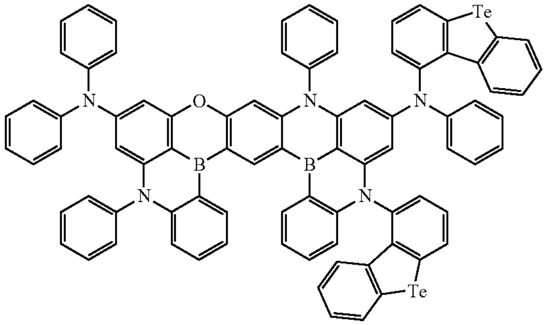
26
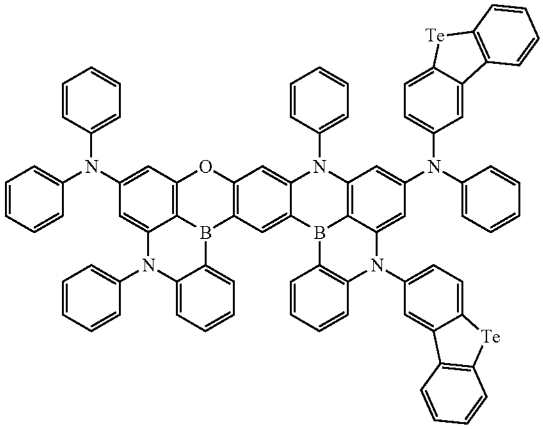

-continued
27
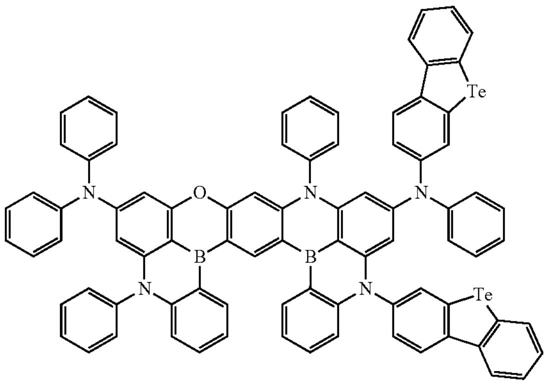
28
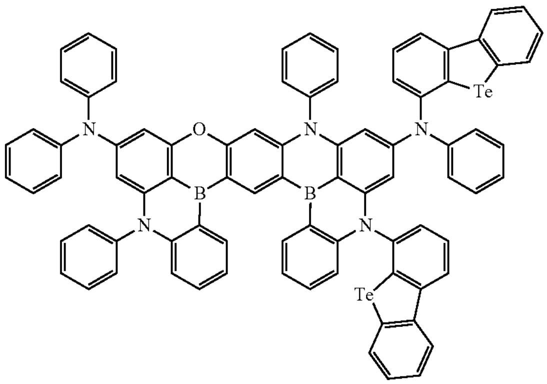
29
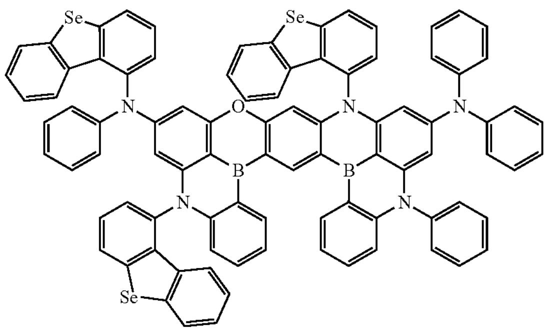
30
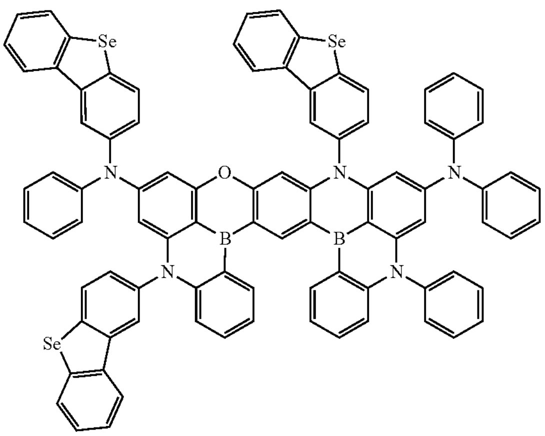
31
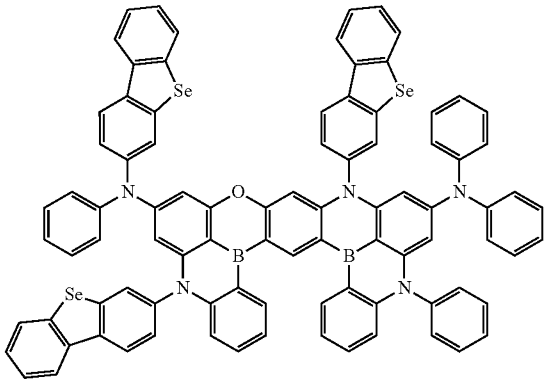
32
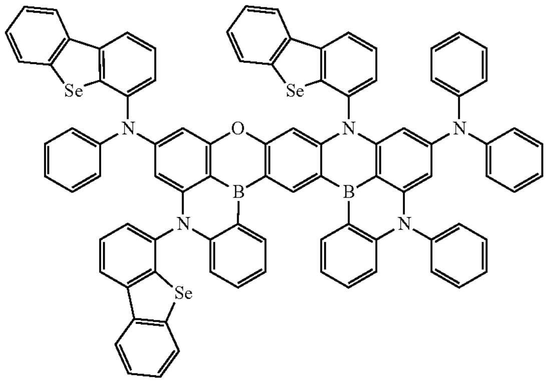

-continued
33
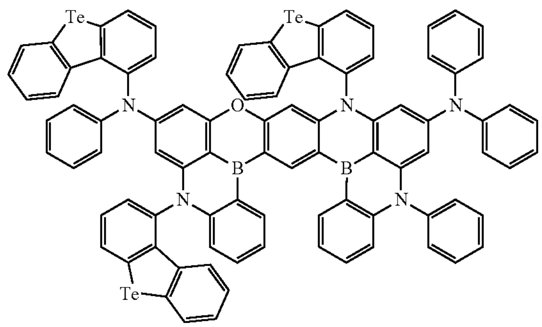
34
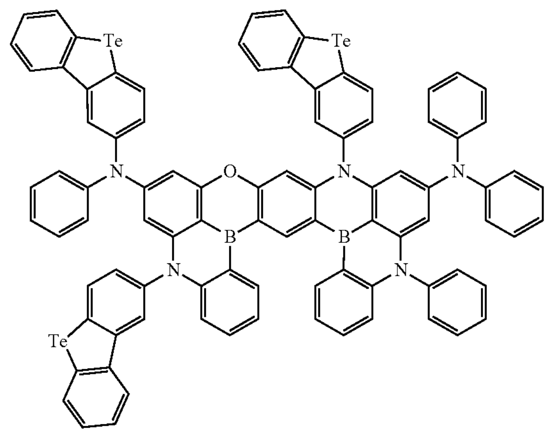
35
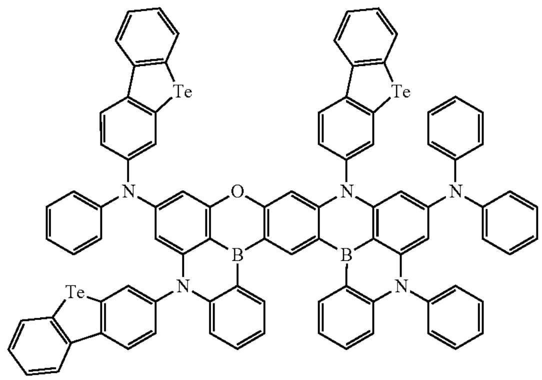
36
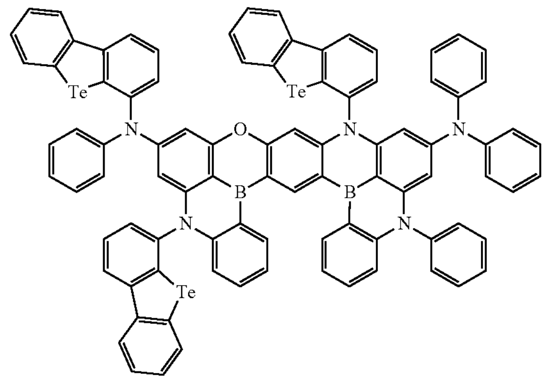
37
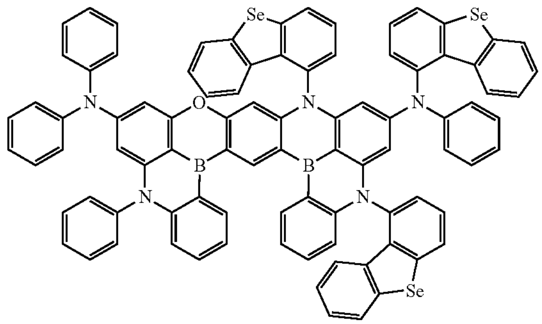
38
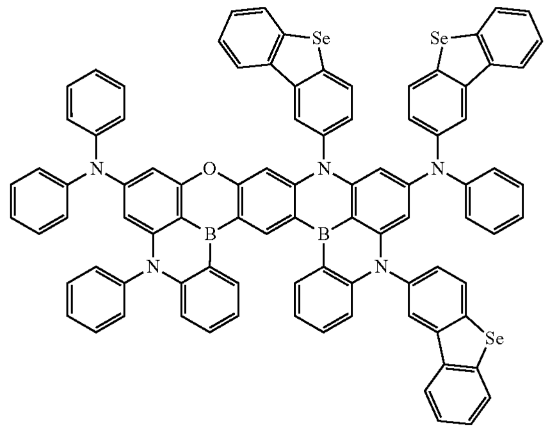

-continued
39
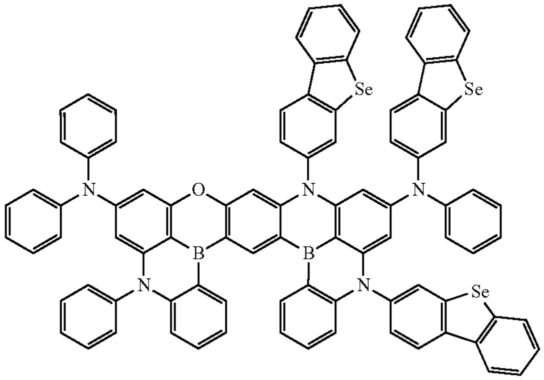
40
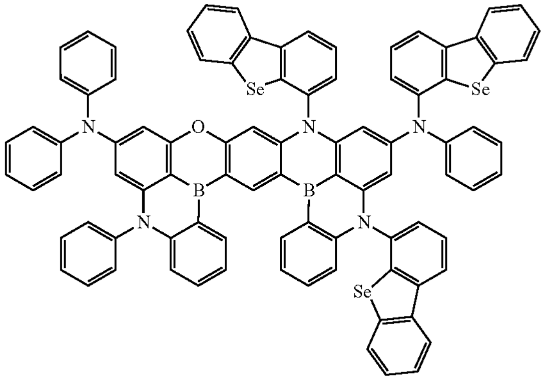
41
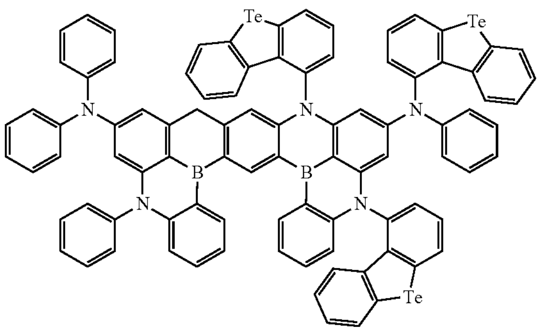
42
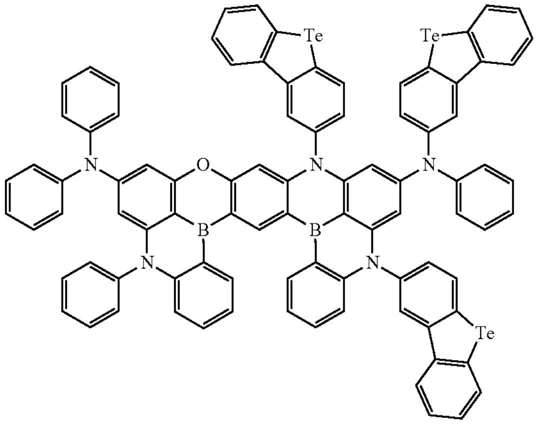
43
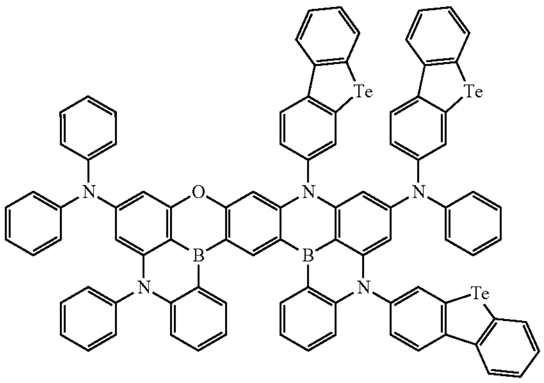
44
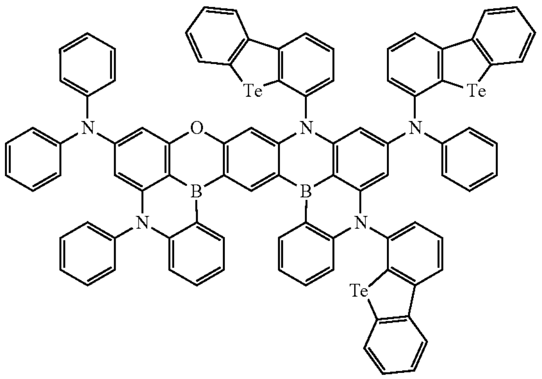

-continued
45
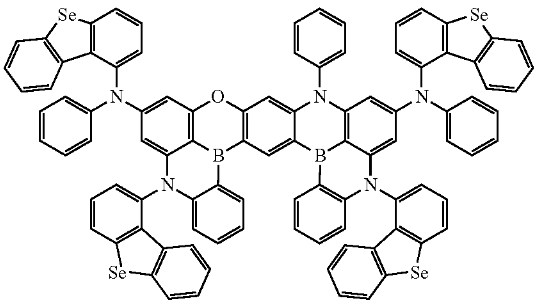
46
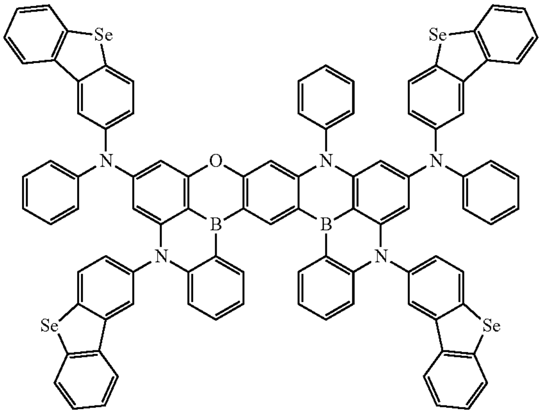
47
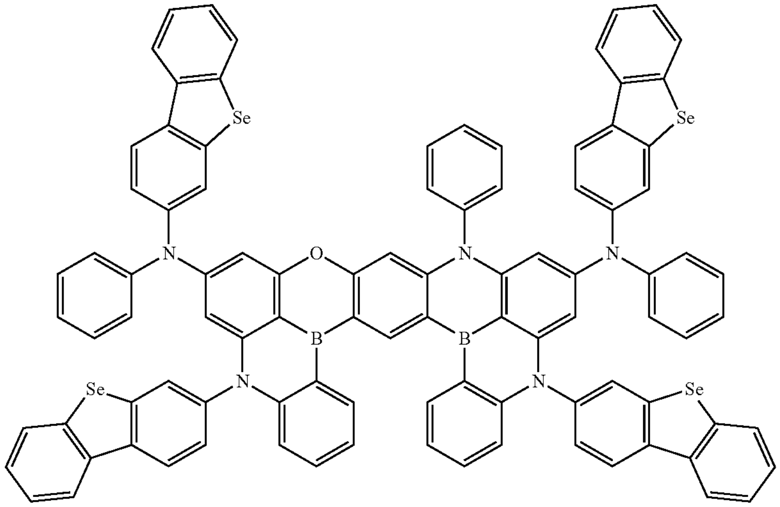
48
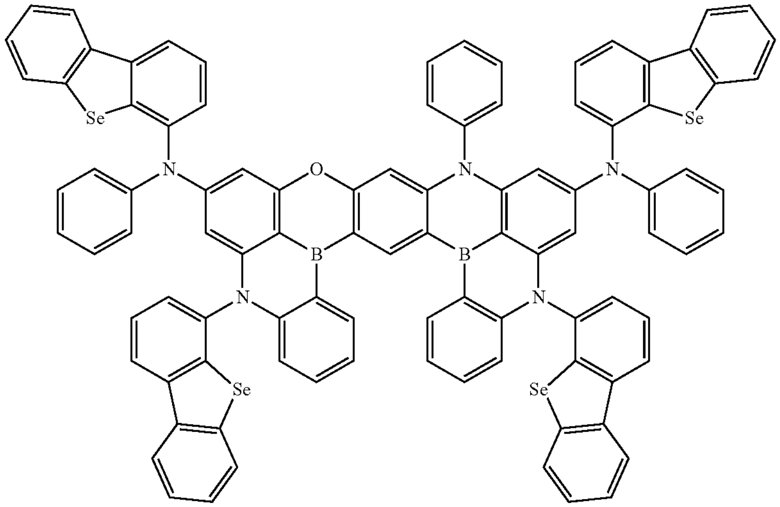

-continued
49
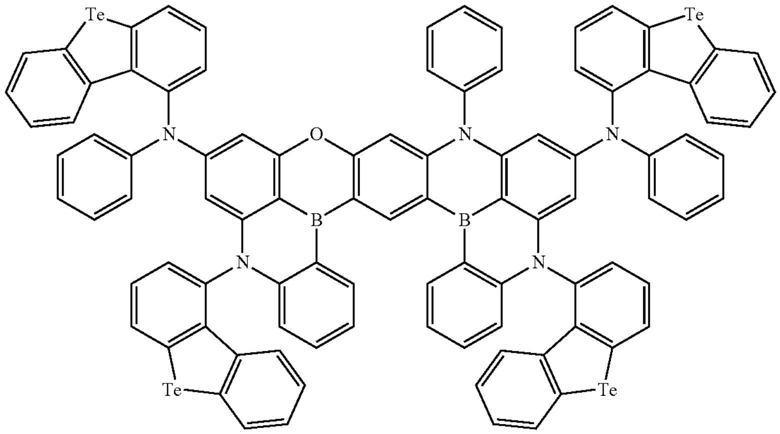
50
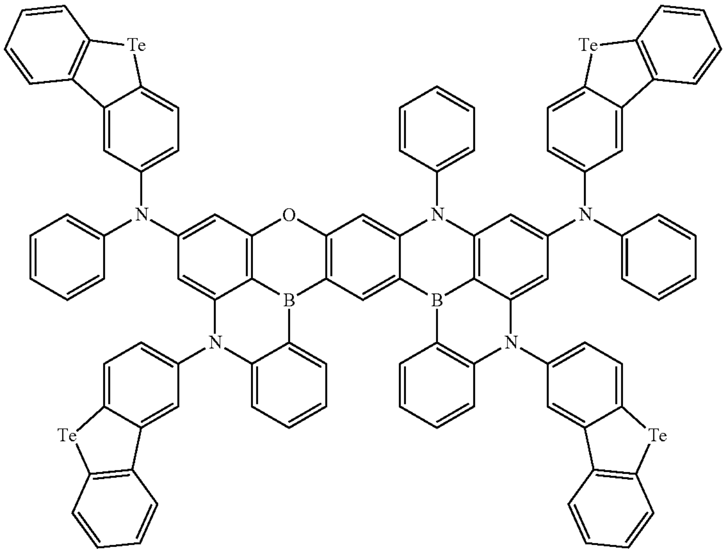
51
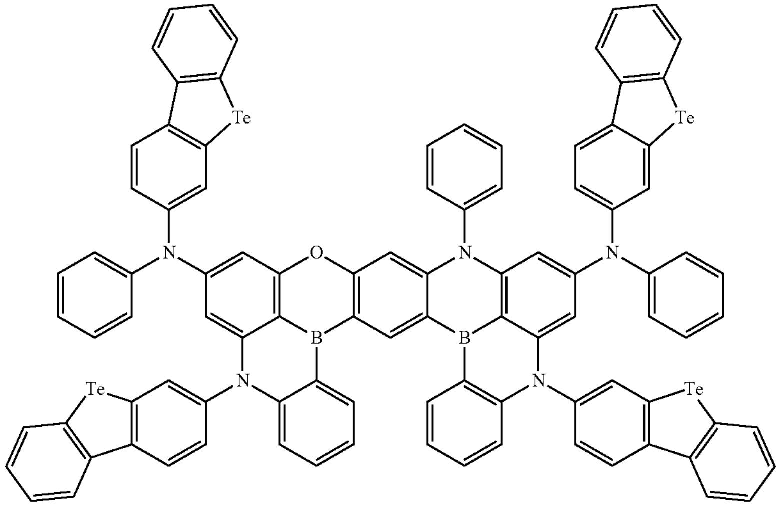

-continued
52
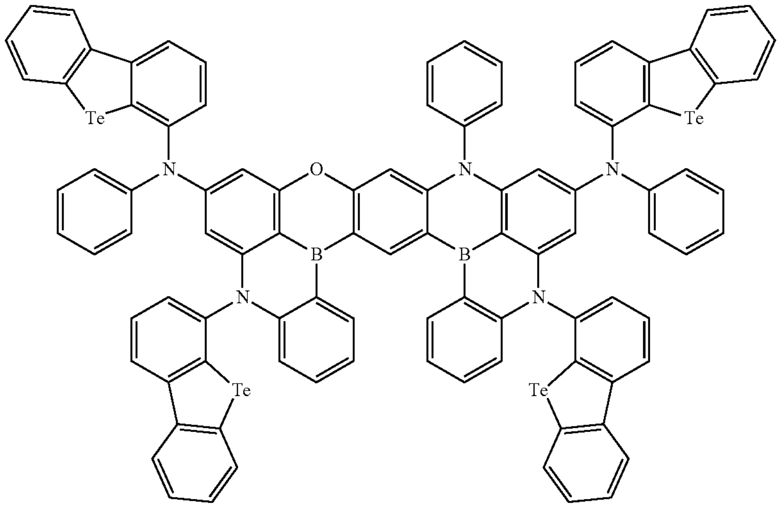
53
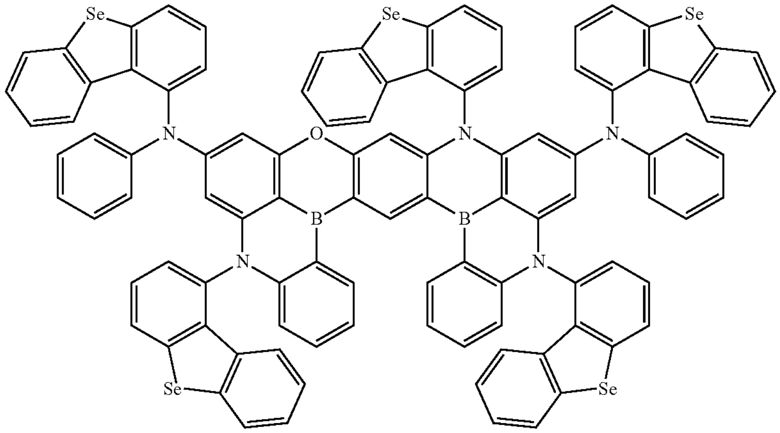
54
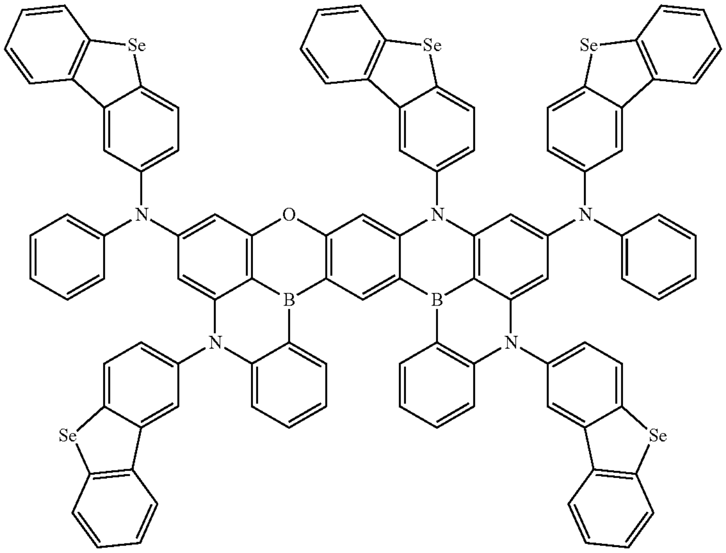

-continued
55
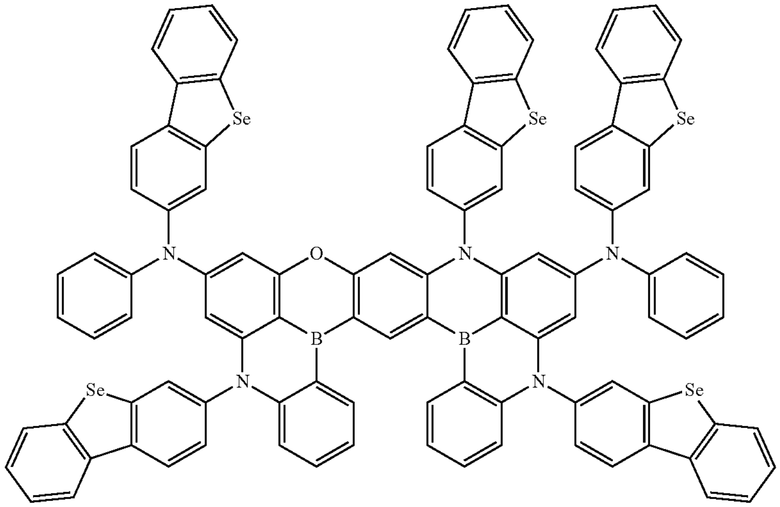
56
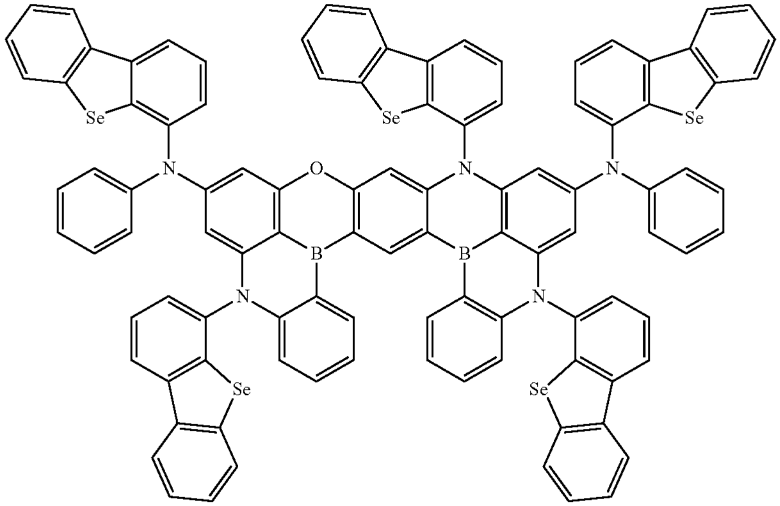
57
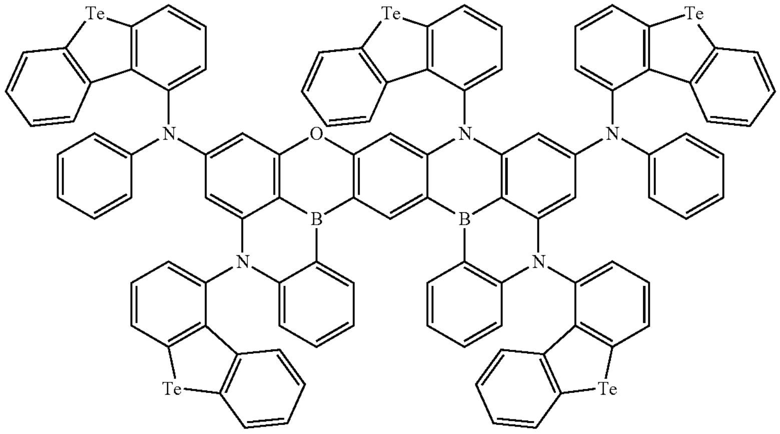

-continued
58
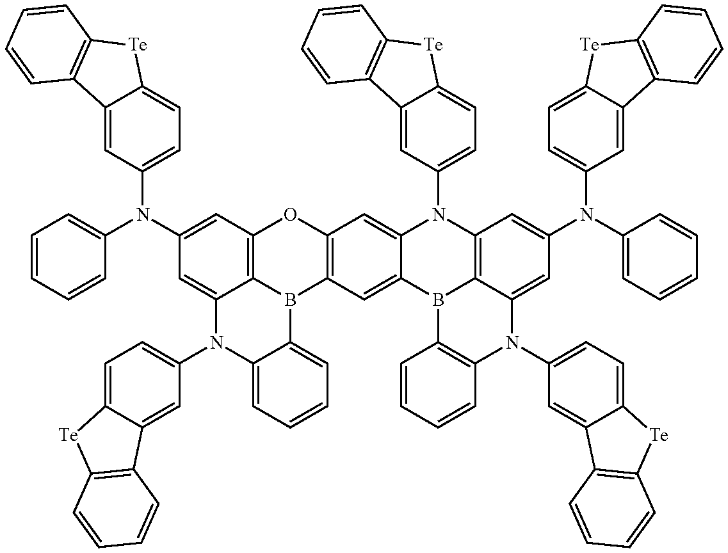
59
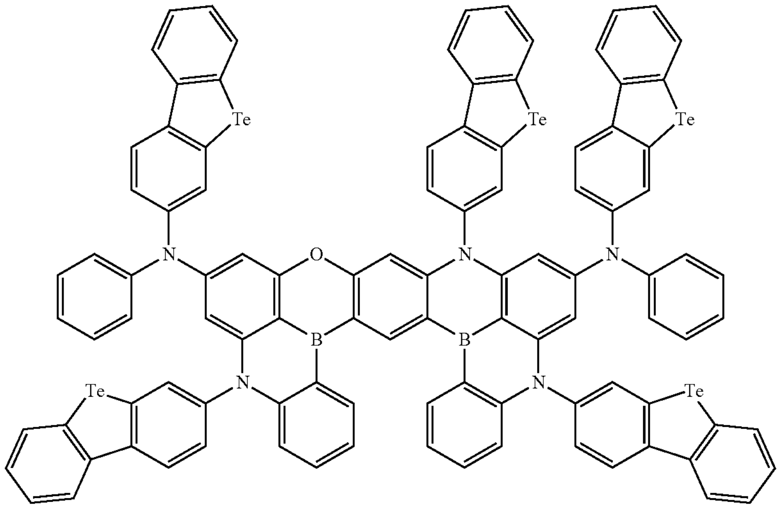
60
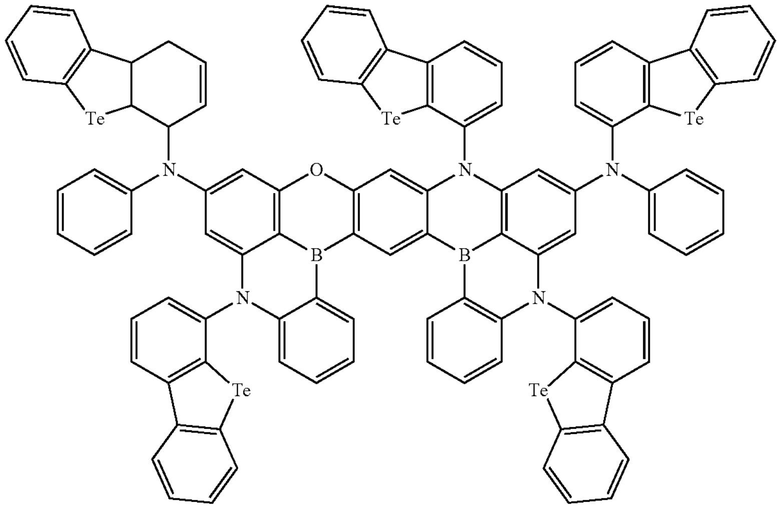

-continued
61
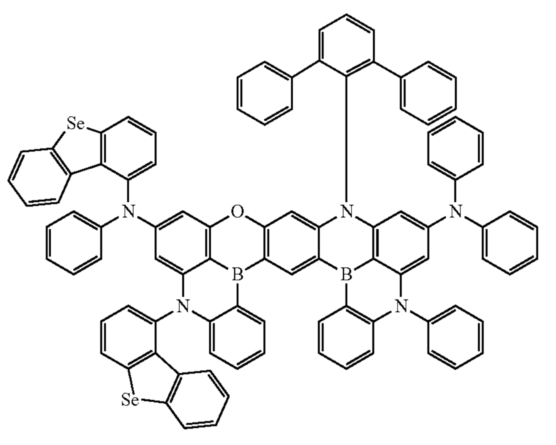
62
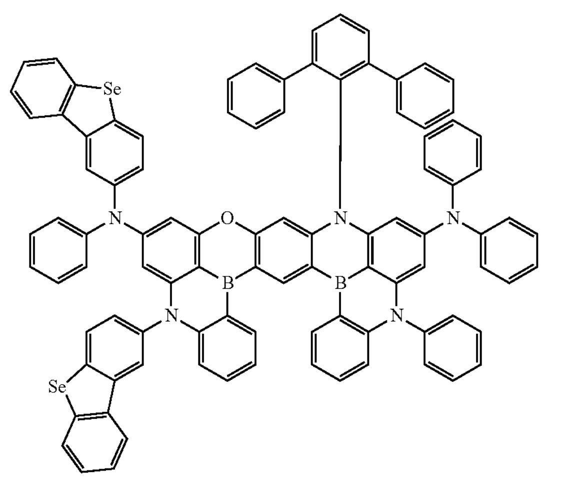
63
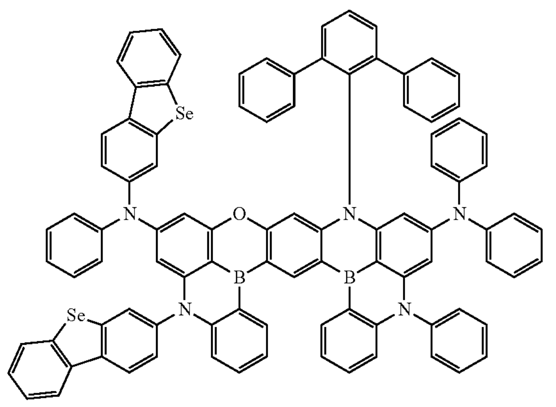
64
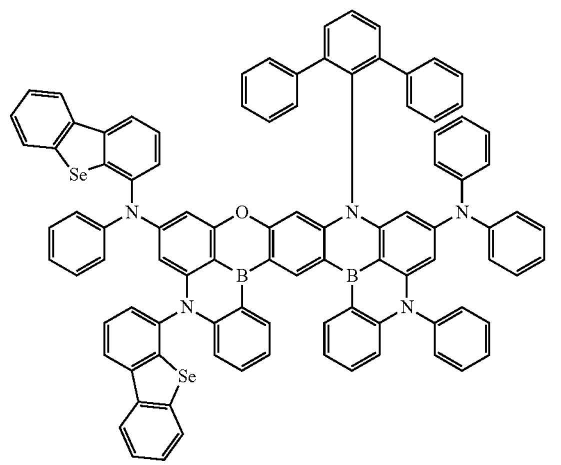
65
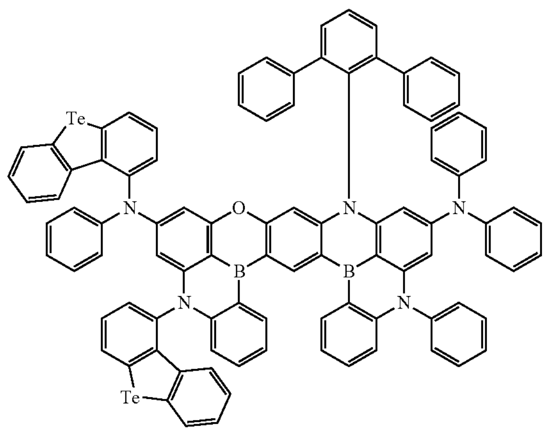
66
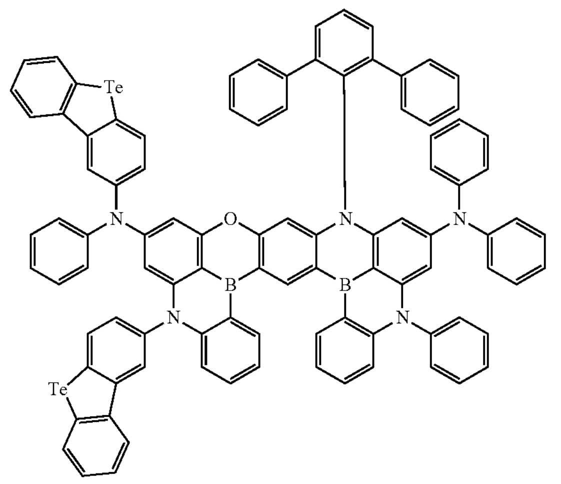

-continued
67
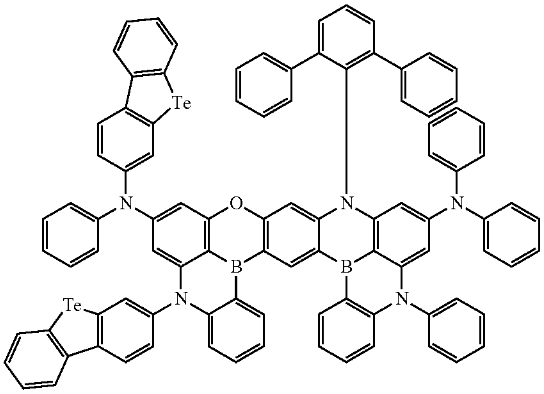
68
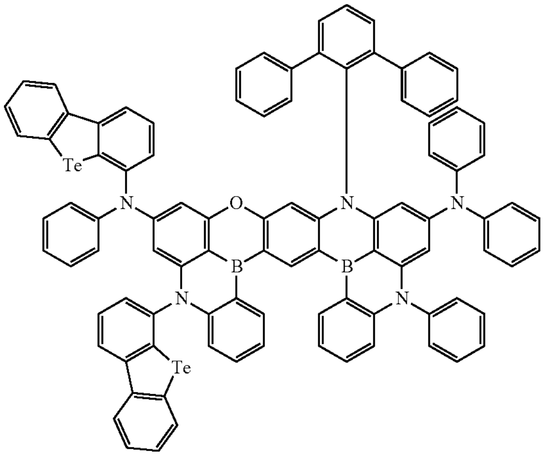
69
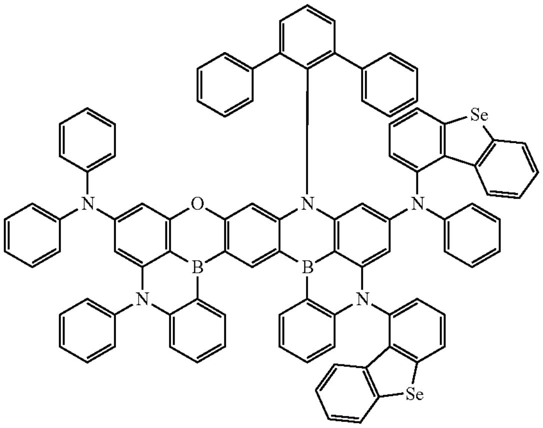
70
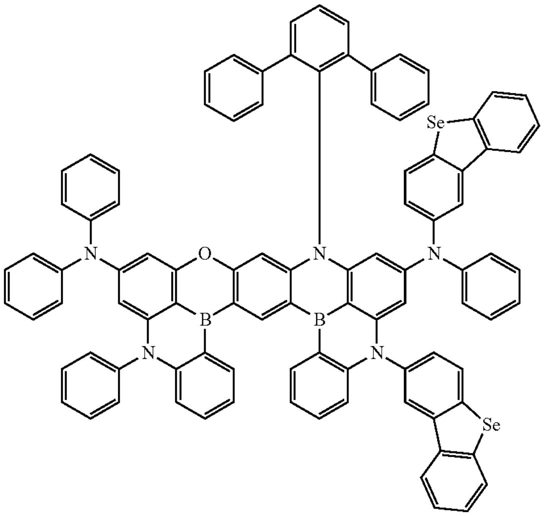
71
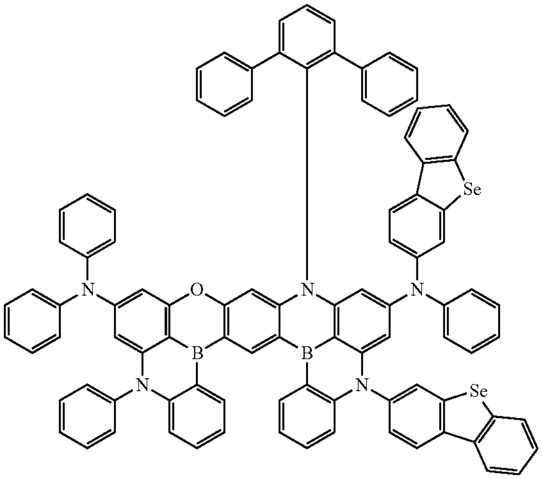
72
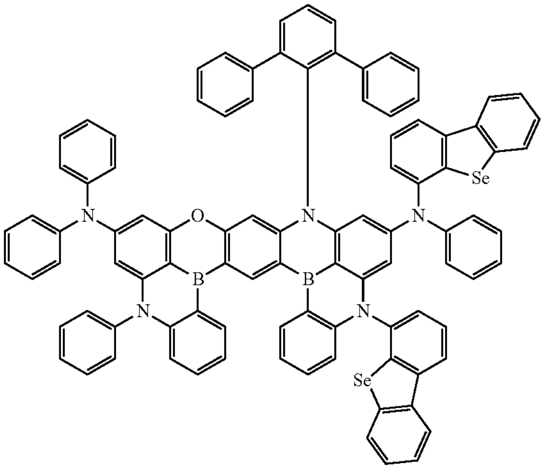

-continued
73
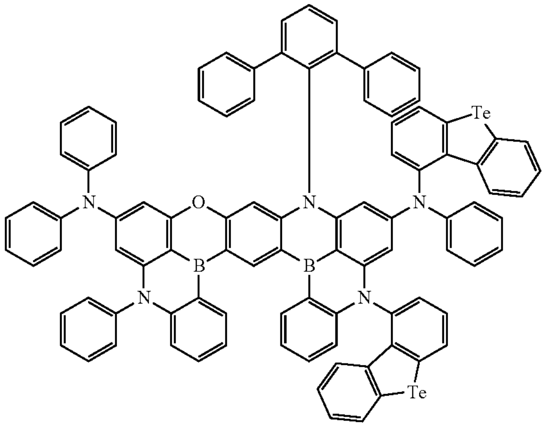
74
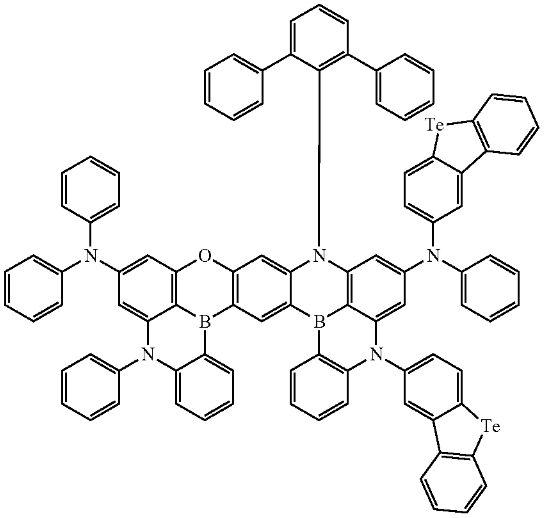
75
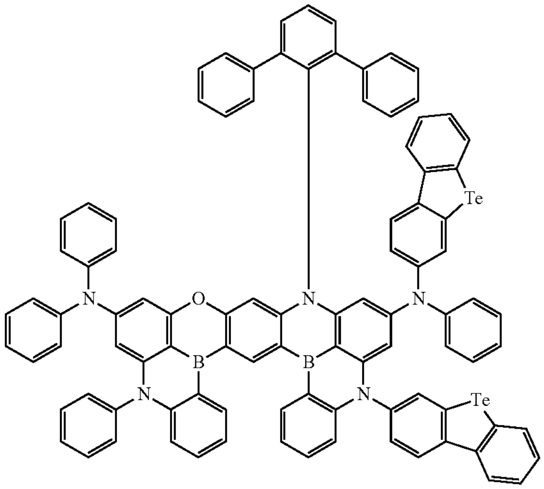
76
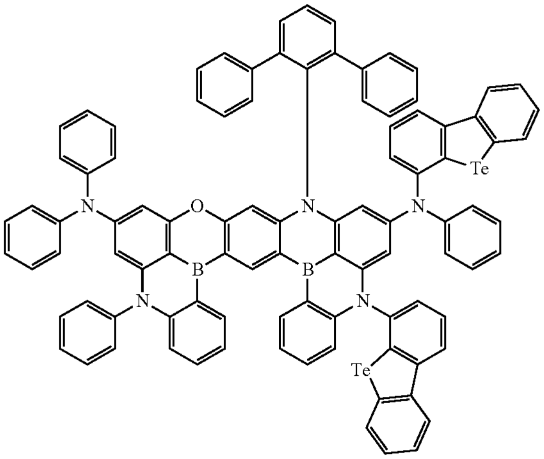
77
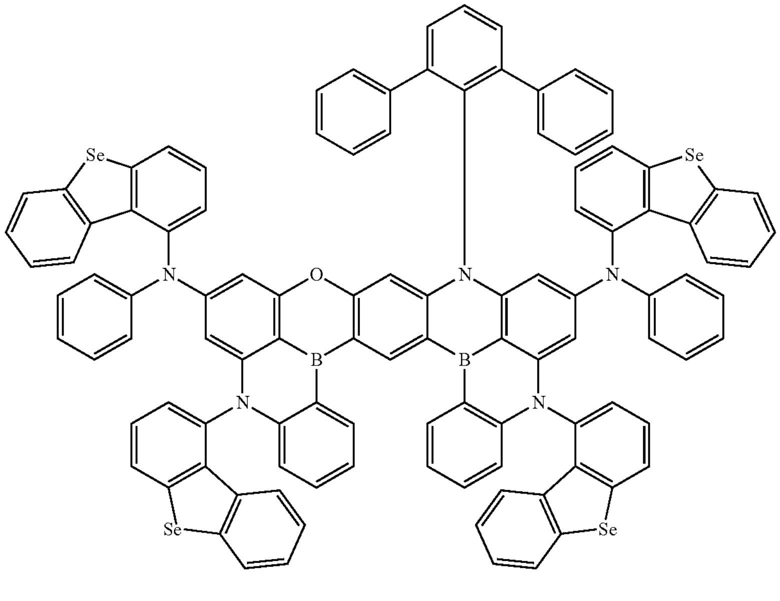

-continued
78
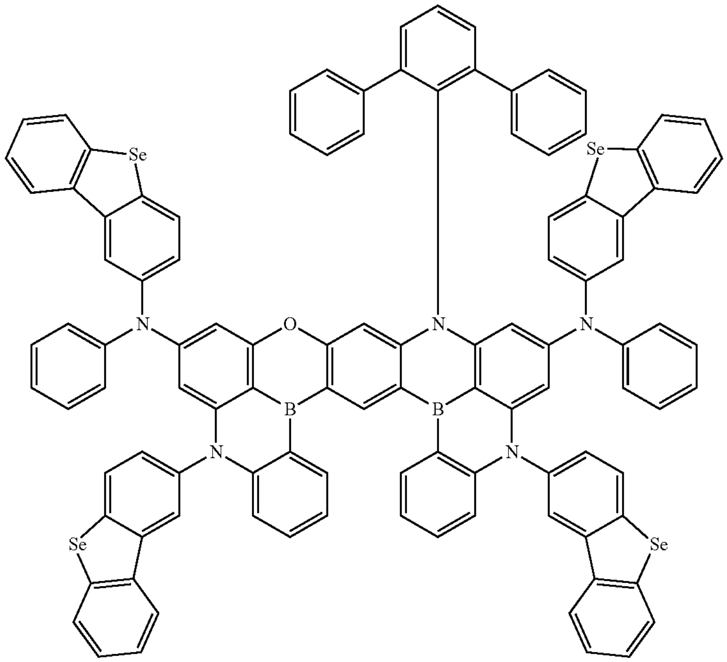
79
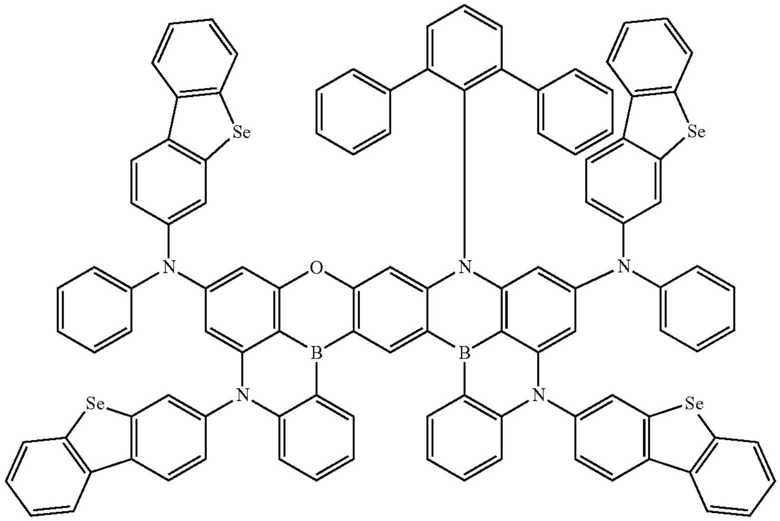

-continued
80
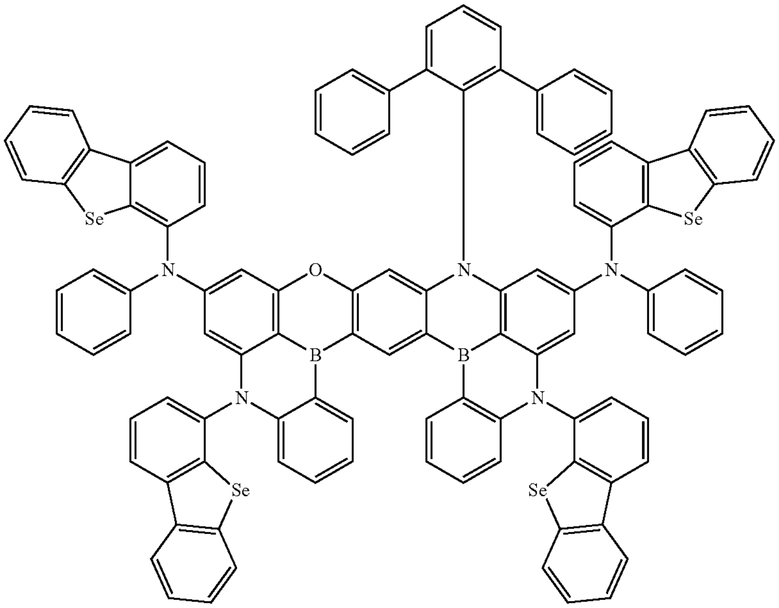
81
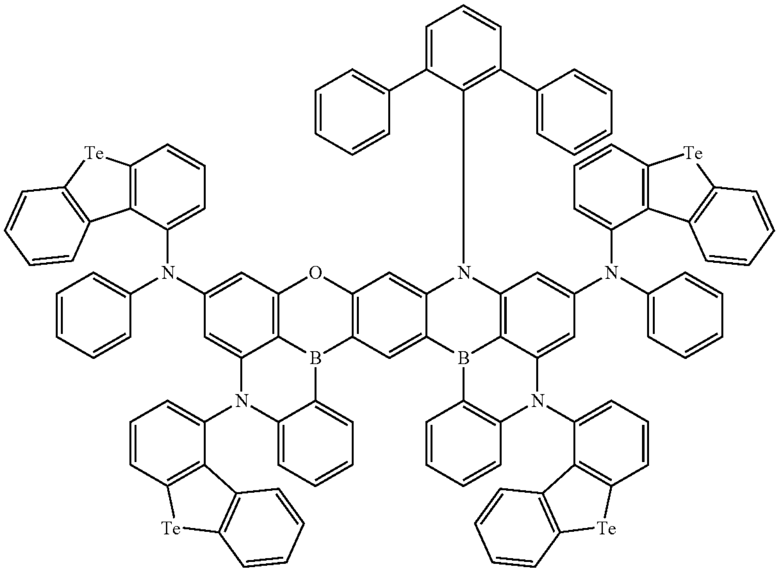

-continued
82
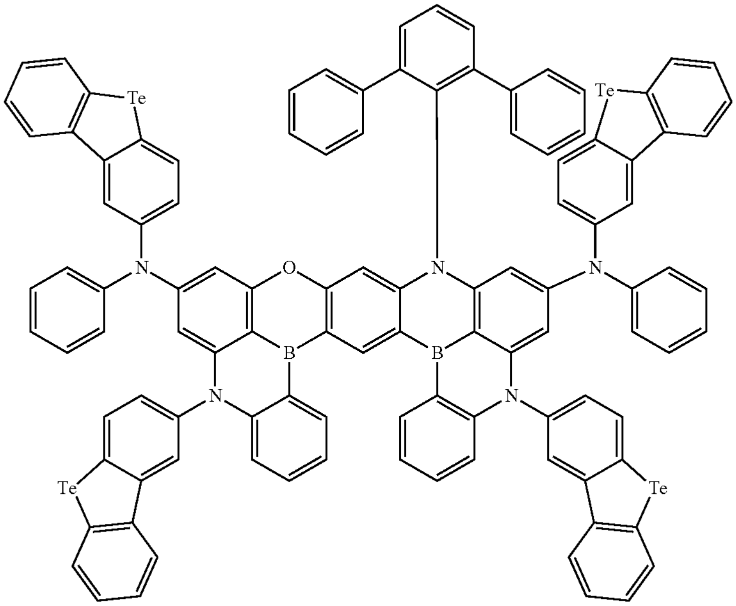
83
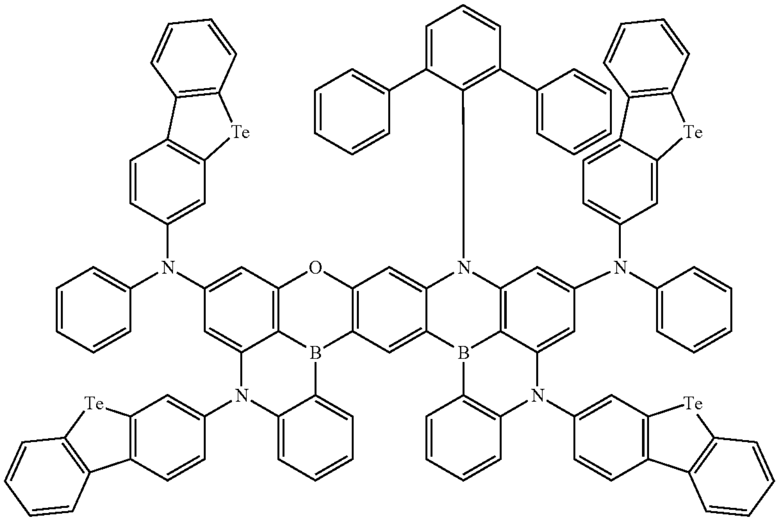

-continued
84
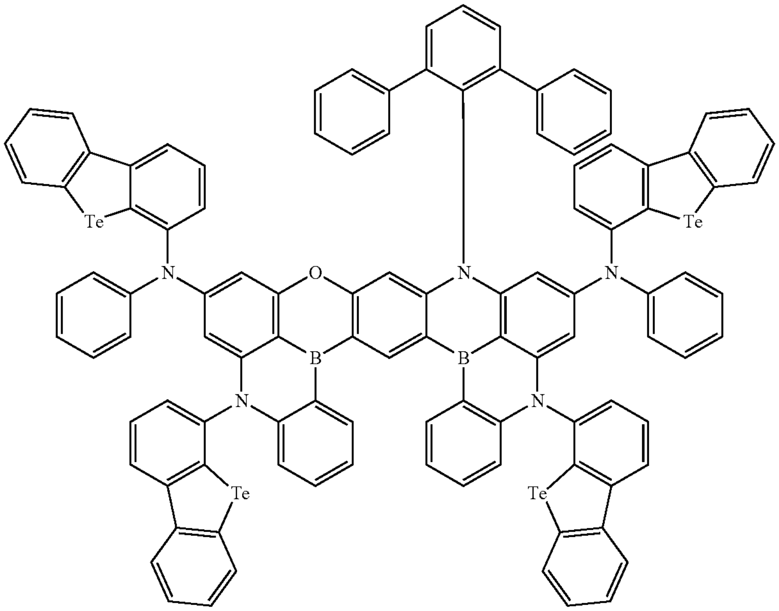
85
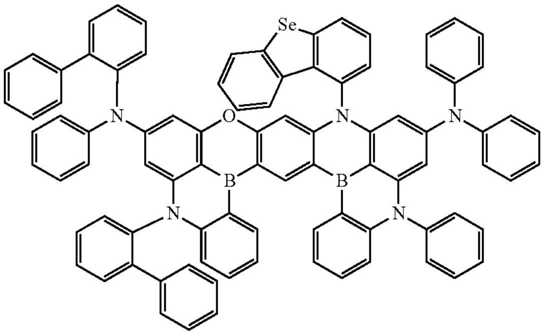
86
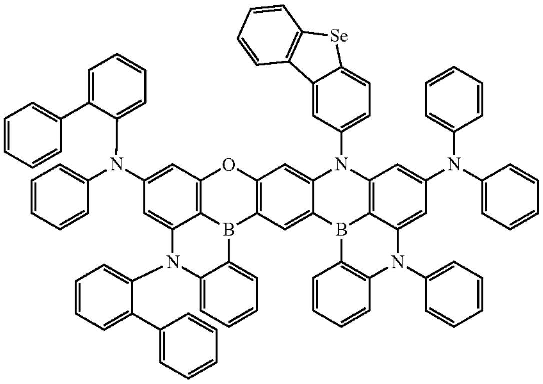
87
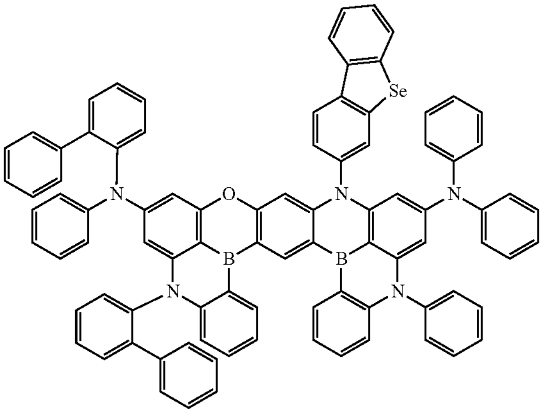
88
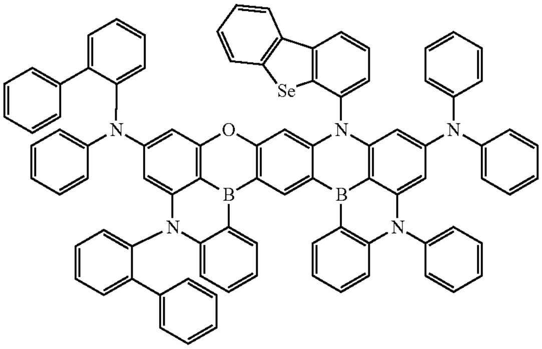

-continued
89
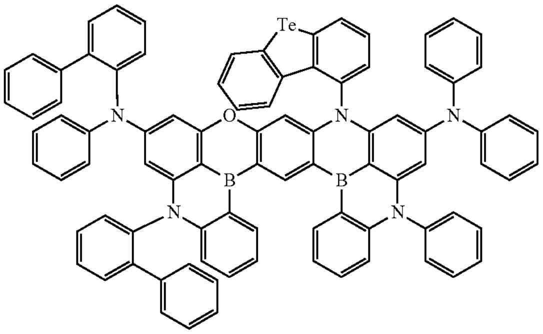
90
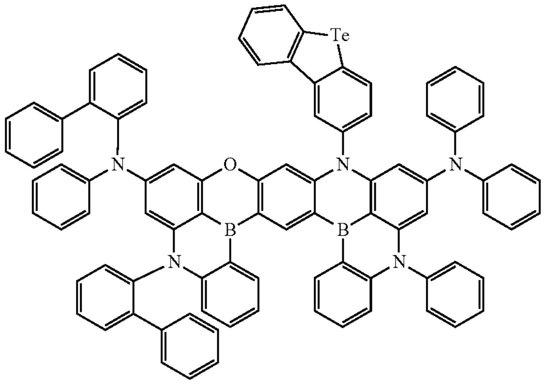
91
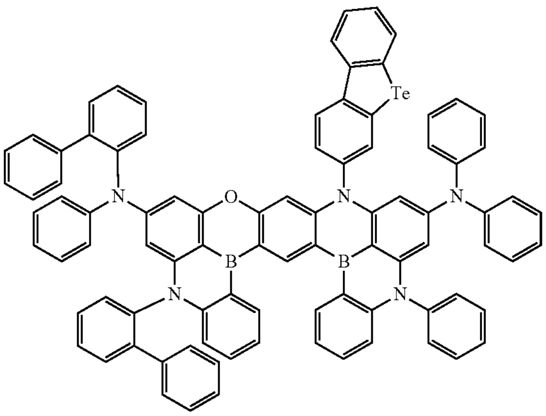
92
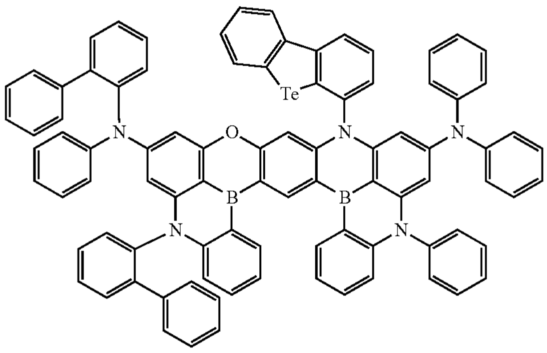
93
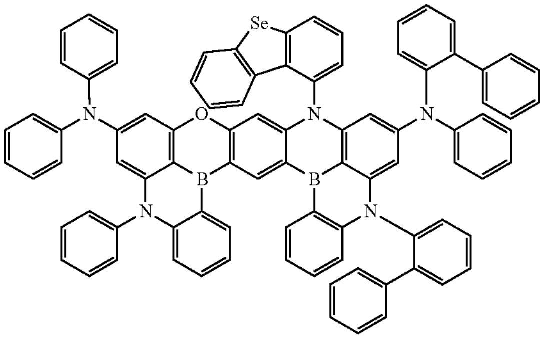
94
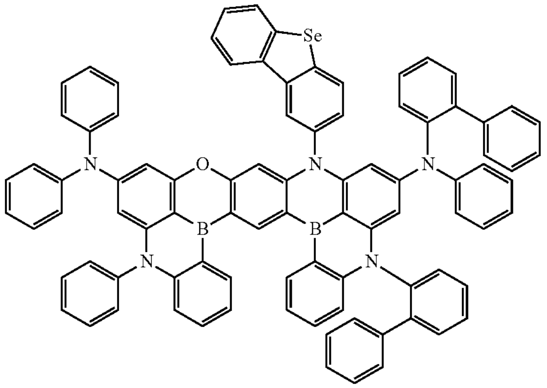

-continued
95
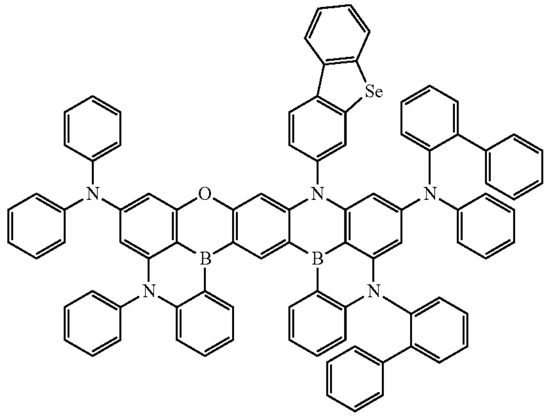
96
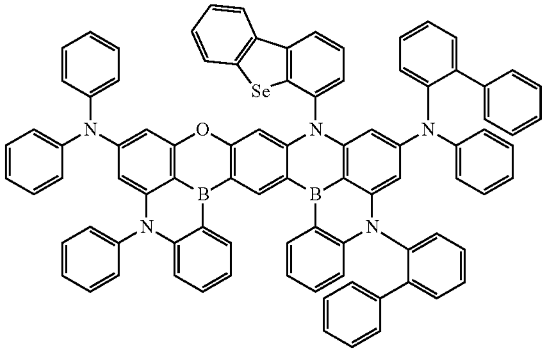
97
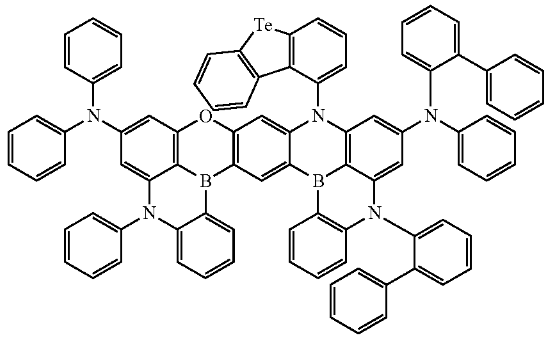
98
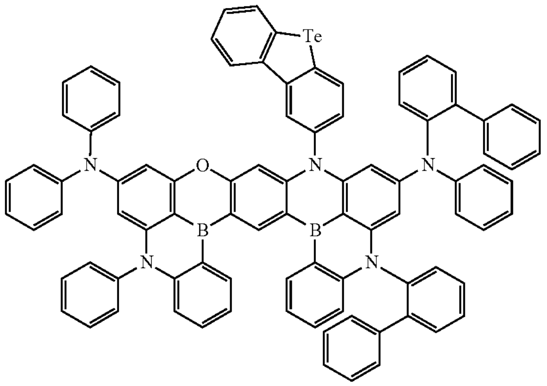
99
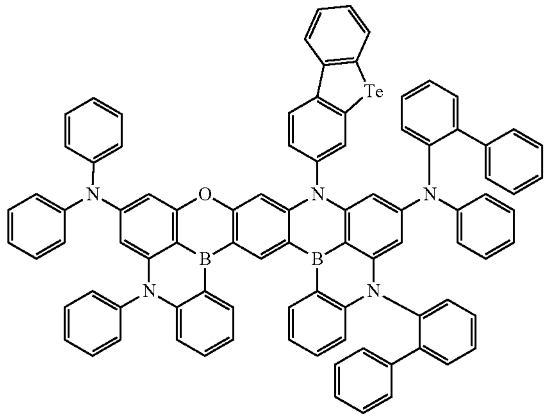
100
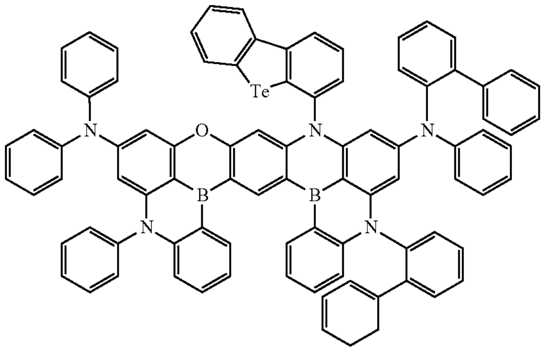

-continued

101

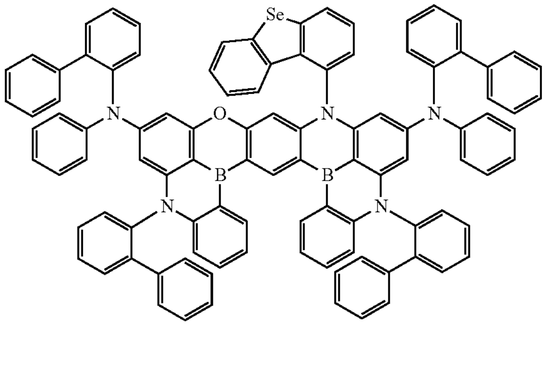

102

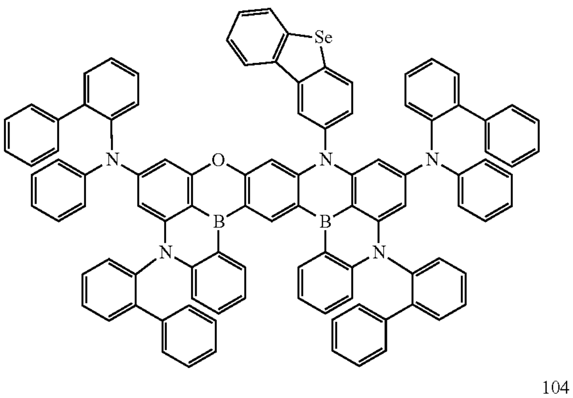

103

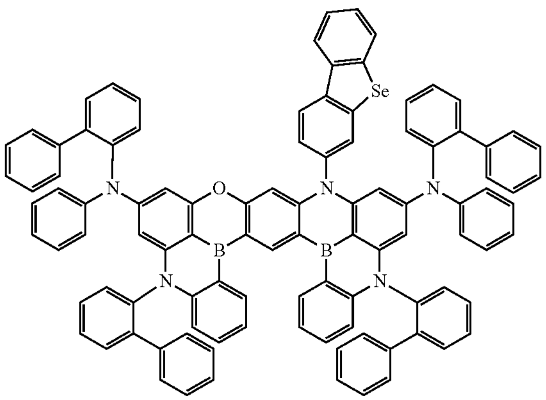

104

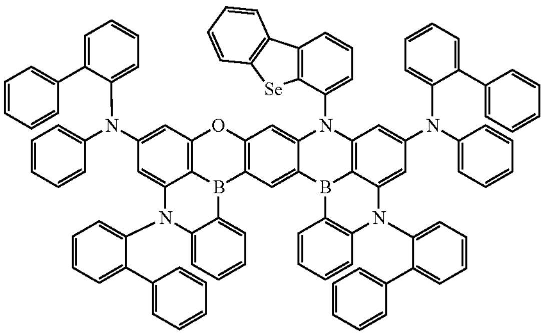

In the heterocyclic compound represented by Formula 1, $X_1$ in Formula 1 may include $Ar_{1a}$ or $Ar_{1b}$ as a substituent, $X_2$ may include $Ar_{2a}$ or $Ar_{2b}$ as a substituent, $X_3$ may include $Ar_{3a}$ or $Ar_{3b}$ as a substituent, $X_4$ may include $Ar_{4a}$ or $Ar_{4b}$ as a substituent, $X_5$ may include $Ar_{5a}$ or $Ar_{5b}$ as a substituent, $X_6$ may include $Ar_6$ as a substituent, $X_7$ may include $Ar_7$ as a substituent, $X_8$ may include $Ar_8$ as a substituent, and $X_9$ may include $Ar_9$ as a substituent. In addition, $Ar_{1a}$, $Ar_{1b}$, $Ar_{2a}$, $Ar_{2b}$, $Ar_{3a}$, $Ar_{3b}$, $Ar_{4a}$, $Ar_{4b}$, $Ar_{5a}$, $Ar_{5b}$, and $Ar_6$ to $Ar_9$ may each be a group represented by Formula 2, and Formula 1 may satisfy at least one of Conditions (1) to (9).

Although not intended to be limited by a specific theory, because the heterocyclic compound represented by Formula 1 as described above includes a group represented by Formula 2 as a substituent, unlike in a virtual compound that has the same structure as Formula 1 but does not include a group represented by Formula 2 as a substituent, improved spin-orbit is coupling and an increased reverse intersystem crossing (kRISC) rate may be realized due to heavy atoms ($T_1$). In addition, since the heavy atoms ($T_1$) included in the group represented by Formula 2 are rich in electrons, multiple resonance may be increased according to an increase in the degree of conjugation of the entire molecule, thereby improving bond dissociation energy (BDE).

Furthermore, because Formula 1 includes the group represented by Formula 2 as a substituent, unlike in the virtual compound that has the same structure as that of Formula 1 but does not include the group represented by Formula 2 wherein heavy atoms ($T_1$) are included in the core, although not wanting to be bound by theory, an increase in instability of the molecule caused by distortion in the molecular structure due to the arrangement of heavy atoms ($T_1$) in the core may be effectively prevented.

Accordingly, an electronic device, for example, a light-emitting device, including the heterocyclic compound represented by Formula 1 may have improved luminescence efficiency and/or lifespan. Synthesis methods of the heterocyclic compound represented by Formula 1 may be recognizable by one of ordinary skill in the art by referring to Synthesis Examples and/or Examples provided below.

At least one heterocyclic compound represented by Formula 1 may be used in a light-emitting device (for example, an organic light-emitting device). Accordingly, provided is a light-emitting device including: a first electrode; a second electrode facing the first electrode; an interlayer located between the first electrode and the second electrode and including an emission layer; and the heterocyclic compound represented by Formula 1.

In an embodiment, the first electrode of the light-emitting device may be an anode, the second electrode of the light-emitting device may be a cathode, the interlayer may further include a hole transport region located between the first electrode and the emission layer and an electron transport region located between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In an embodiment, the heterocyclic compound may be included between the first electrode and the second electrode of the light-emitting device. Accordingly, the heterocyclic compound may be included in the interlayer of the light-emitting device, for example, in the emission layer of the interlayer. The emission layer may emit red light, green light, blue light, and/or white light. In an embodiment, the emission layer may emit blue light. The blue light may have a maximum emission wavelength of, for example, about 400 nm to about 490 nm.

In one or more embodiments, the emission layer may further include a host, and an amount of the host may be greater than an amount of the heterocyclic compound represented by Formula 1. In an embodiment, the host included in the emission layer may include two or more different hosts.

In one or more embodiments, the emission layer may further include a phosphorescent dopant, in addition to the host and the heterocyclic compound represented by Formula 1. In an embodiment, the phosphorescent dopant may include an organometallic compound. In an embodiment, the phosphorescent dopant may include platinum (Pt).

In one or more embodiments, the light-emitting device may include a capping layer located outside the first electrode and/or outside the second electrode. In an embodiment, the capping layer may include the heterocyclic compound represented by Formula 1.

In an embodiment, the light-emitting device may further include at least one of a first capping layer located outside the first electrode and a second capping layer located outside the second electrode, and the heterocyclic compound represented by Formula 1 may be included in at least one of the first capping layer and the second capping layer. More details for the first capping layer and/or second capping layer are the same as described herein.

In an embodiment, the light-emitting device may further include: a first capping layer located outside the first electrode and including the heterocyclic compound represented by Formula 1; a second capping layer located outside the second electrode and including the heterocyclic compound represented by Formula 1; or the first capping layer and the second capping layer.

In an embodiment, the interlayer and/or capping layer may include Compound 1 only as the heterocyclic compound. In this regard, Compound 1 may be present in the emission layer of the light-emitting device. In one or more embodiments, the interlayer may include, as the heterocyclic compound, Compound 1 and Compound 2. In this regard, Compound 1 and Compound 2 may be present in an identical layer (for example, both Compound 1 and Compound 2 may be present in an emission layer), or different layers (for example, Compound 1 may be present in an emission layer and Compound 2 may be present in an electron transport region).

According to another aspect of the invention an electronic apparatus includes the light-emitting device. The electronic apparatus may further include a thin-film transistor. In an embodiment, the electronic apparatus may further include a thin-film transistor including a source electrode and a drain electrode, and the first electrode of the light-emitting device may be electrically connected to the source electrode or the drain electrode. In one or more embodiments, the electronic apparatus may further include a color filter, a color conversion layer, a touch screen layer, a polarizing layer, or any combination thereof. More details on the electronic apparatus are the same as described herein.

Description of FIG. 1

FIG. 1 is a schematic cross-sectional view of an embodiment of a light-emitting device constructed according to the principles of the invention.

FIG. 1 is a schematic cross-sectional view of a light-emitting device 10 according to an embodiment. The light-emitting device 10 includes a first electrode 110, an interlayer 130, and a second electrode 150. Hereinafter, the structure of the light-emitting device 10 constructed according to the principles and an illustrative embodiment of the invention and an illustrative method of manufacturing the light-emitting device 10 will be described in connection with FIG. 1.

First Electrode 110

In FIG. 1, a substrate may be additionally located under the first electrode 110 or above the second electrode 150. As the substrate, a glass substrate or a plastic substrate may be used. In one or more embodiments, the substrate may be a flexible substrate, and may include plastics with excellent heat resistance and durability, such as polyimide, a polyethylene terephthalate (PET), a polycarbonate, a polyethylene naphthalate, a polyarylate (PAR), a polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include an indium tin oxide (ITO), an indium zinc oxide (IZO), a tin oxide ($SnO_2$), a zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode.

The first electrode 110 may have a single-layered structure consisting of a single layer or a multi-layered structure including a plurality of layers. In an embodiment, the first electrode 110 may have a three-layered structure of an ITO/Ag/ITO.

Interlayer 130

The interlayer 130 may be located on the first electrode 110. The interlayer 130 may include an emission layer. The interlayer 130 may further include a hole transport region located between the first electrode 110 and the emission layer and an electron transport region placed between the emission layer and the second electrode 150. The interlayer 130 may further include, in addition to various organic materials, metal-containing compounds such as organometallic compounds, inorganic materials such as quantum dots, and the like.

In one or more embodiments, the interlayer 130 may include, i) two or more light-emitting units sequentially stacked between the first electrode 110 and the second electrode 150 and ii) a charge generation layer located between the two or more emitting units. When the interlayer 130 includes an emitting unit and a charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer consisting of a plurality of different materials, or iii) a multi-layered structure including a plurality of layers including different materials.

The hole transport region may include a hole injection layer, a hole transport layer, an emission auxiliary layer, an electron blocking layer, or any combination thereof.

In an embodiment, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

Formula 201

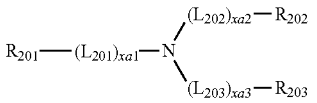

Formula 202

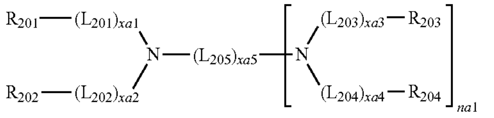

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In one or more embodiments, each of Formulae 201 and 202 may include at least one of groups represented by Formulae CY201 to CY217:

CY201

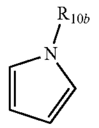

CY202

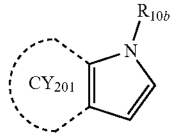

CY203

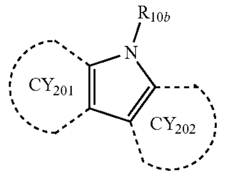

CY204

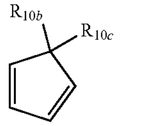

CY205

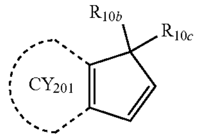

CY206

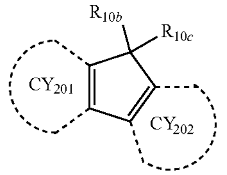

CY207

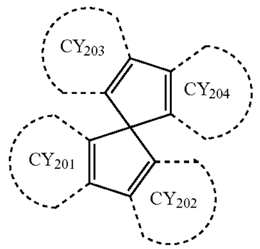

CY208

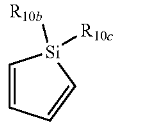

-continued

CY209

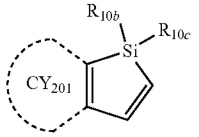

CY210

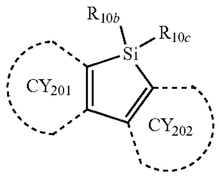

CY211

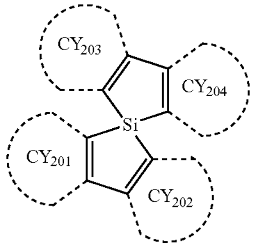

CY212

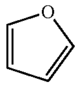

CY213

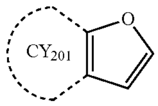

CY214

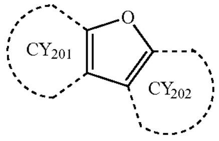

CY215

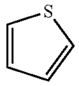

CY216

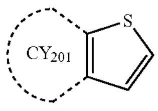

-continued

CY217

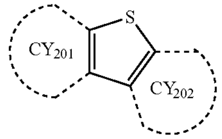

wherein, in Formulae CY201 to CY217, $R_{10b}$ and $R_{10c}$ are the same as described in connection with $R_{10}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one of groups represented by Formulae CY201 to CY203. In one or more embodiments, Formula 201 may include at least one of groups represented by Formulae CY201 to CY203 and at least one of groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207. In one or more embodiments, each of Formulae 201 and 202 may not include a group represented by one of Formulae CY201 to CY203. In one or more embodiments, each of Formulae 201 and 202 may not include a group represented by one of Formulae CY201 to CY203, and may include at least one of groups represented by Formulae CY204 to CY217. In one or more embodiments, each of Formulae 201 and 202 may not include a group represented by one of Formulae CY201 to CY217.

In an embodiment, the hole transport region may include one of Compounds HT1 to HT46, 4,4',4"-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4"-tris[2-naphthyl(phenyl)amino]triphenylamine (2-TNATA), bis(naphthalen-1-yl)-N,N'-bis(phenyl)benzidine (NPB or NPD), N4,N4'-di(naphthalen-2-yl)-N4,N4'-diphenyl-[1,1'-biphenyl]-4,4'-diamine (P—NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (Spiro-TPD), N2,N7-di-1-naphthalenyl-N2,N7-diphenyl-9,9'-spirobi[9H-fluorene]-2,7-diamine (Spiro-NPB), N,N'-di(1-naphthyl)-N,N'-diphenyl-2,2'-dimethyl-(1,1'-biphenyl)-4,4'-diamine (methylated NPB), 4,4'-cyclohexylidenebis[N,N-bis(4-methylphenyl)benzenamine] (TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), 9-(4-tert-Butylphenyl)-3,6-bis(triphenylsilyl)-9H-carbazole (CzSi), or any combination thereof:

HT1
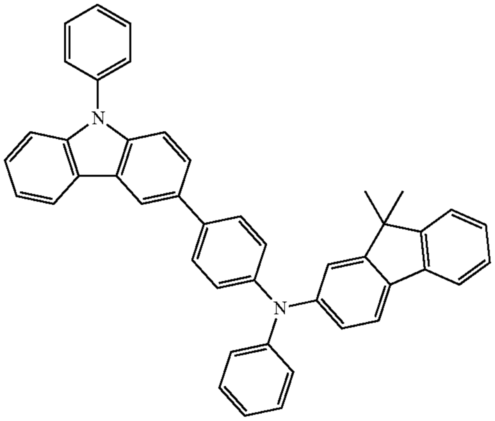
HT2
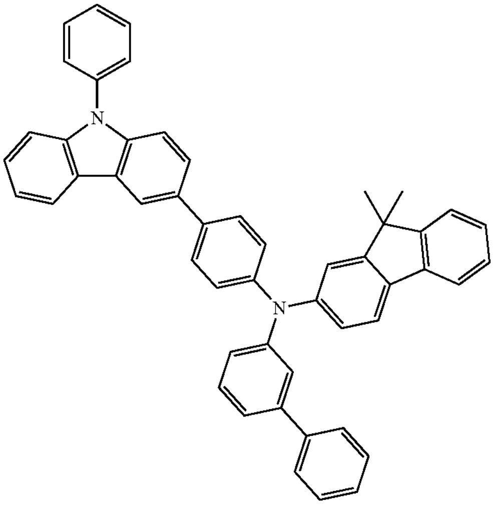
HT3
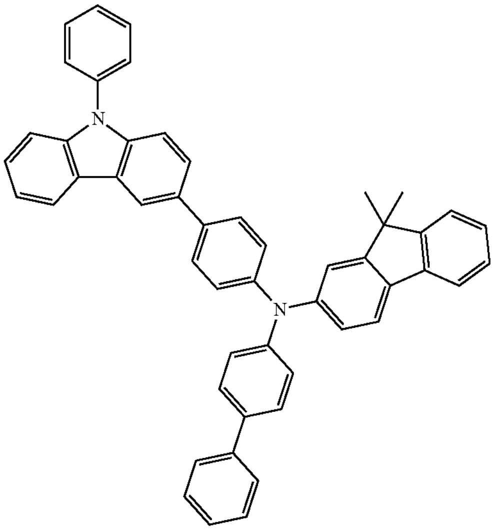
HT4
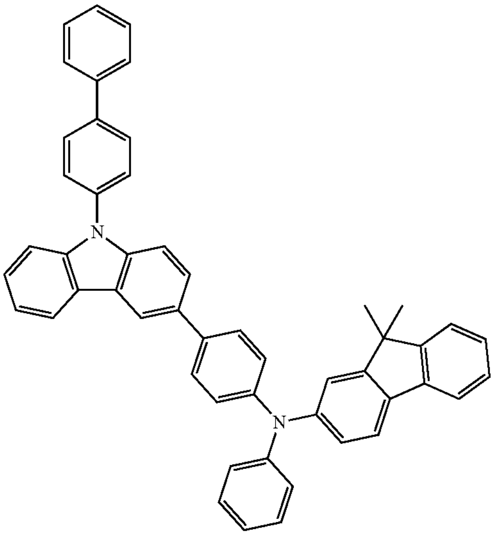
HT5
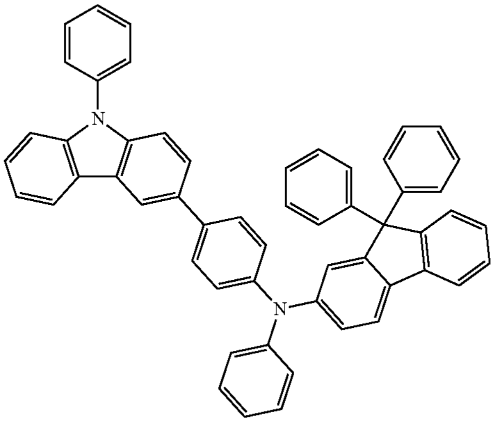
HT6
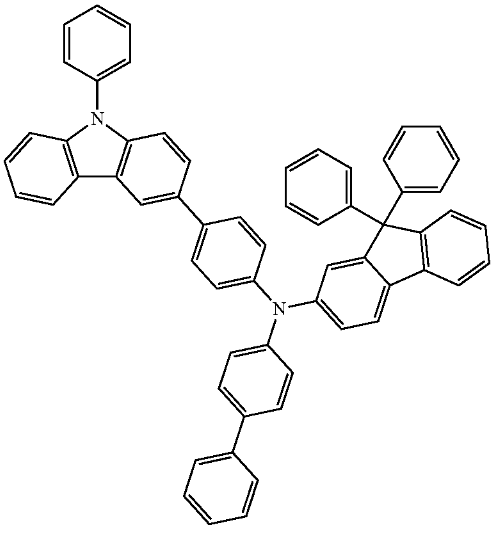

-continued
HT7
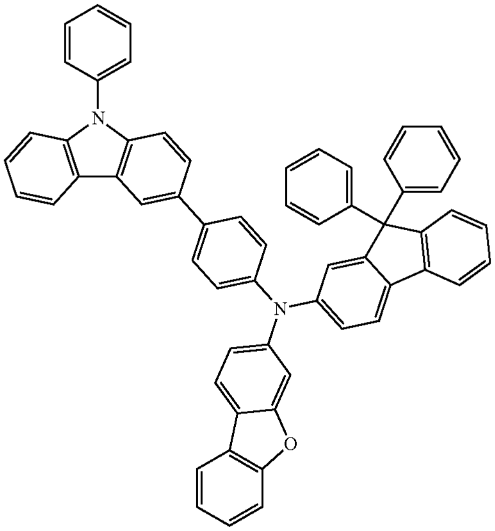
HT8
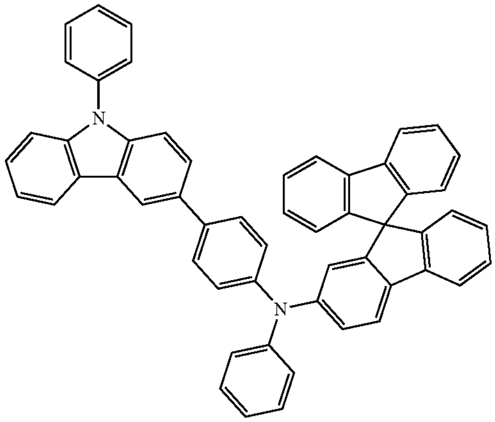
HT9
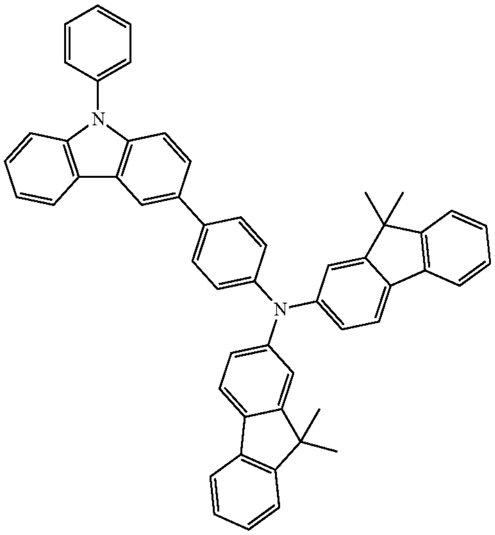
HT10
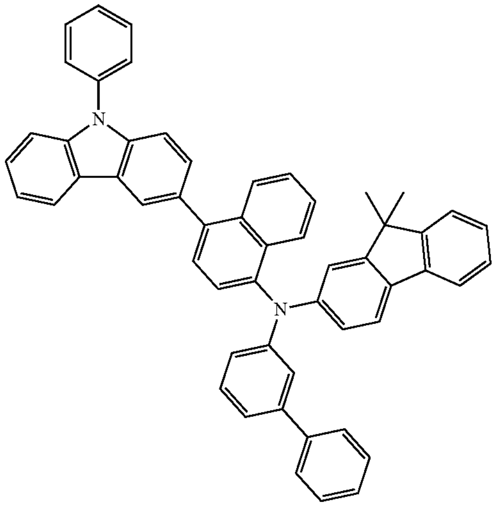
HT11
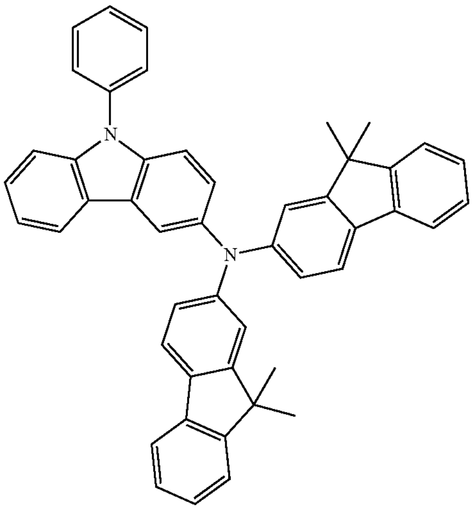
HT12
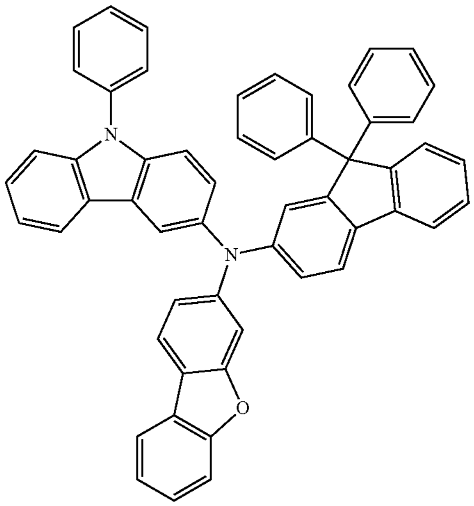

-continued
HT13
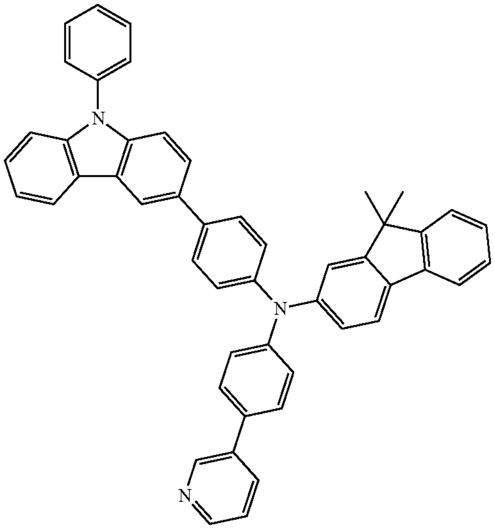
HT14
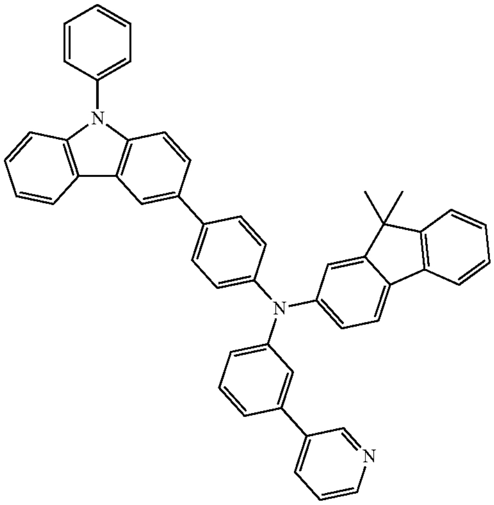
HT15
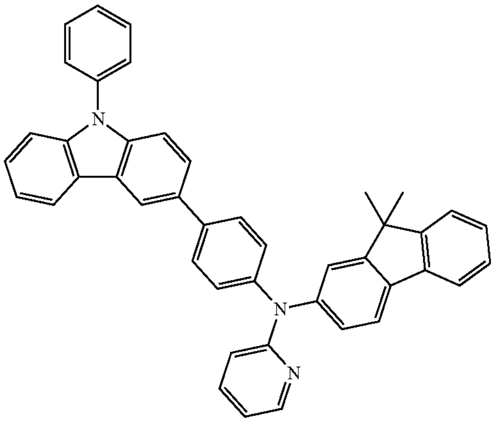
HT16
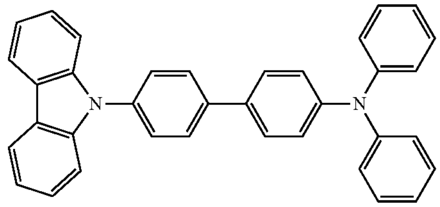
HT17
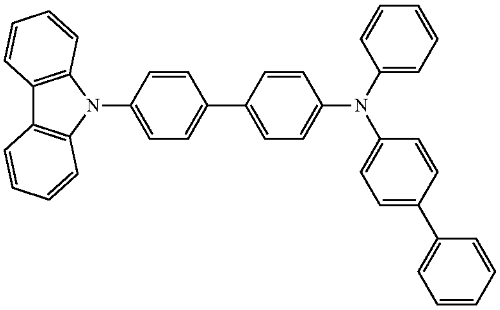
HT18
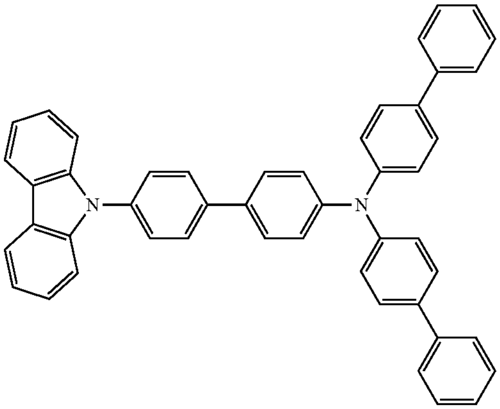

-continued
HT19
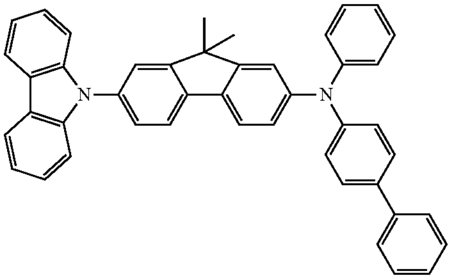
HT20
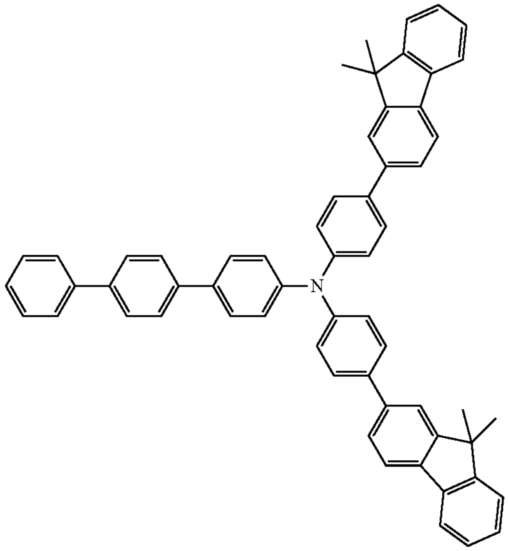
HT21
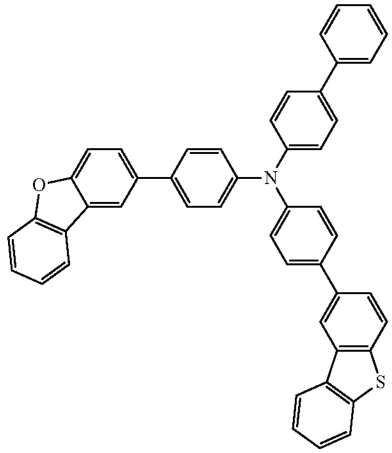
HT22
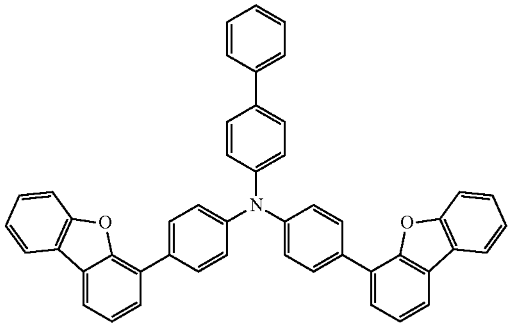
HT23
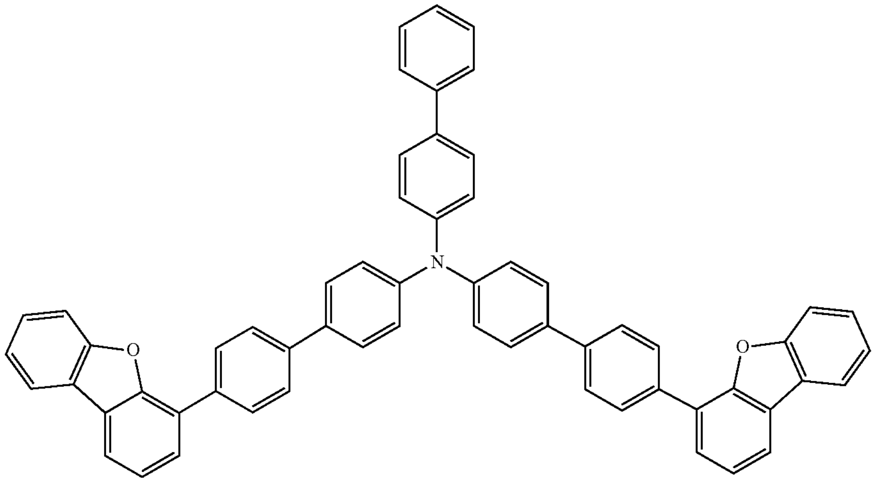

-continued
HT24
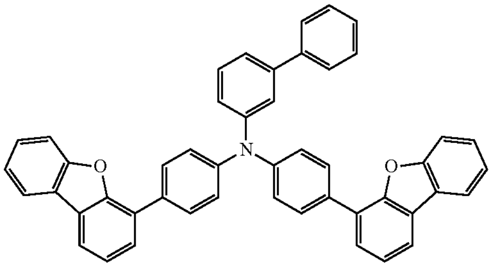
HT25
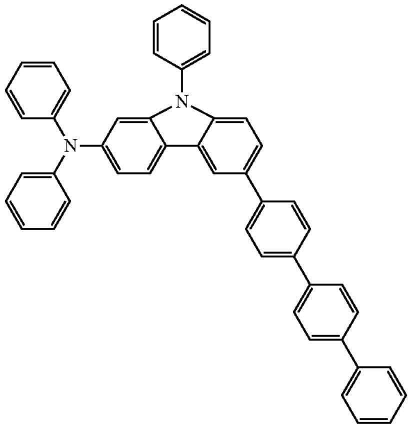
HT26
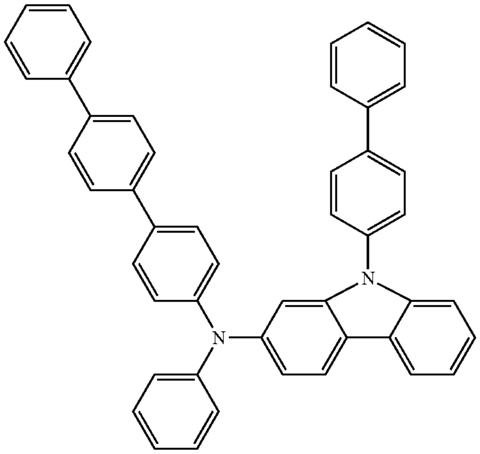
HT27
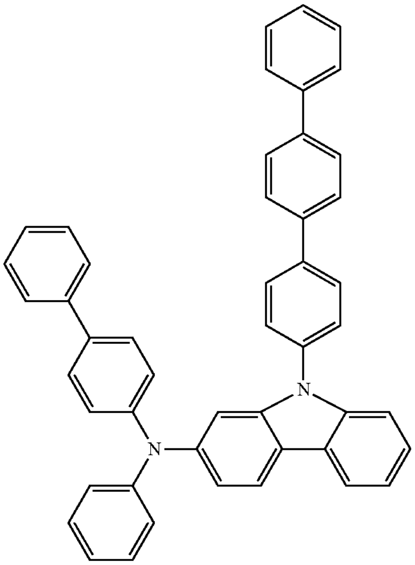
HT28
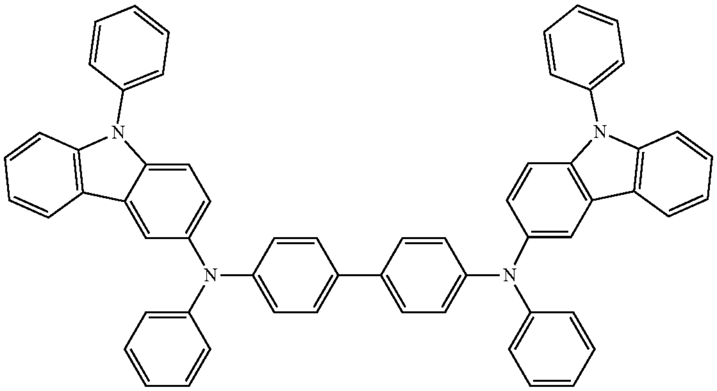

-continued
HT29
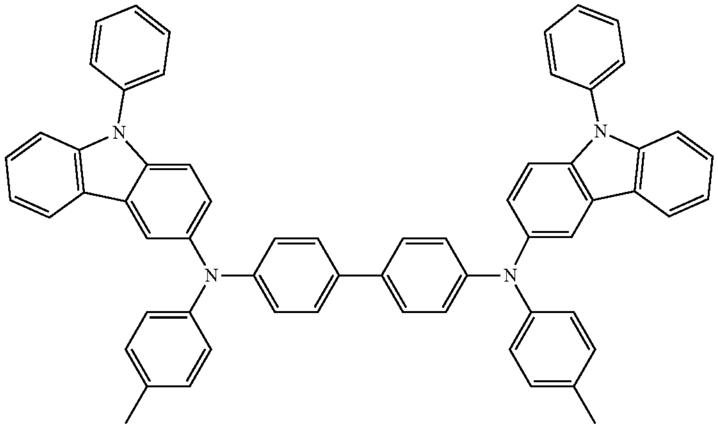
HT30
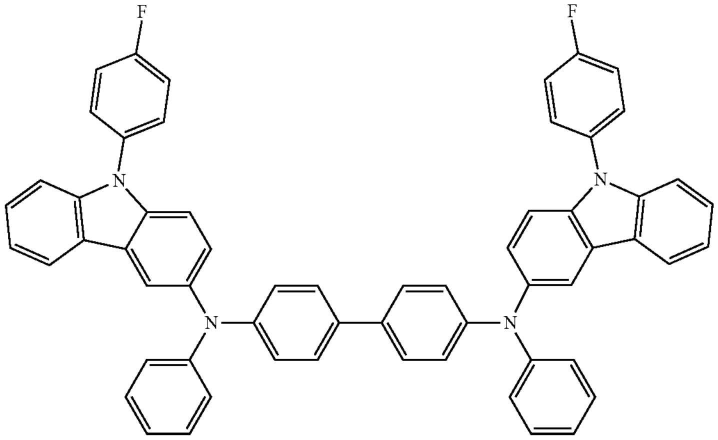
HT31
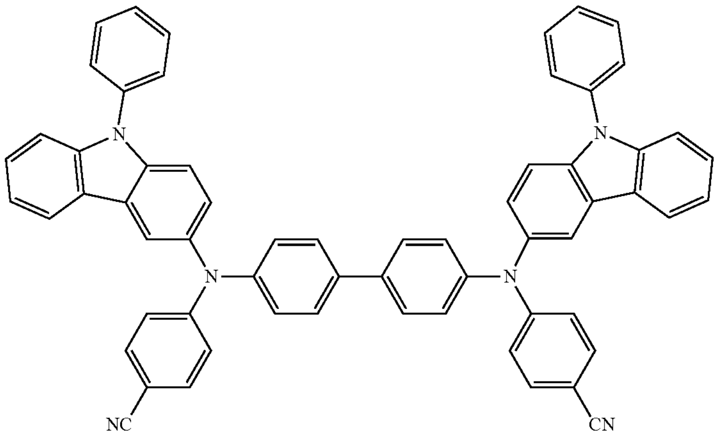

-continued
HT32
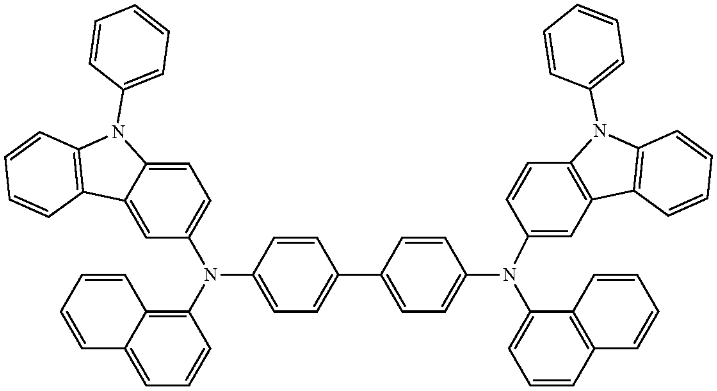
HT33
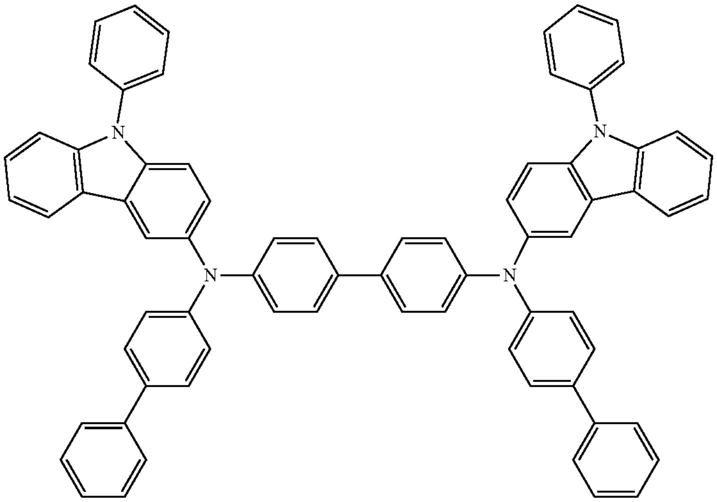
HT34
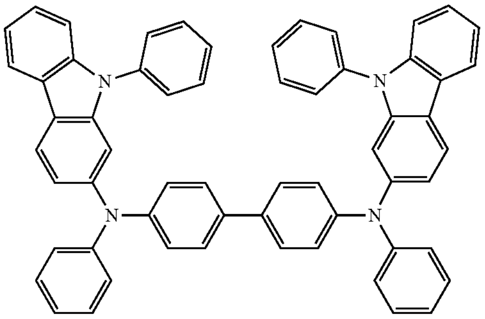
HT35
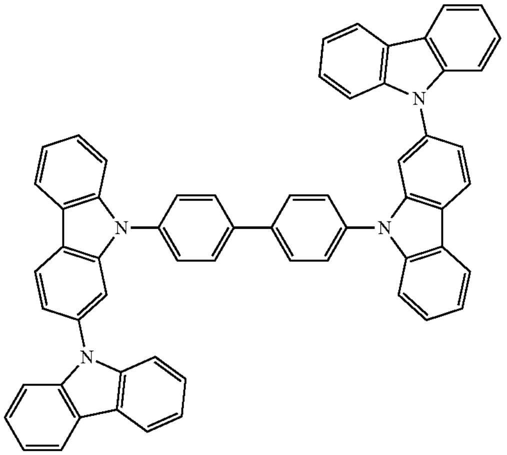

-continued
HT36
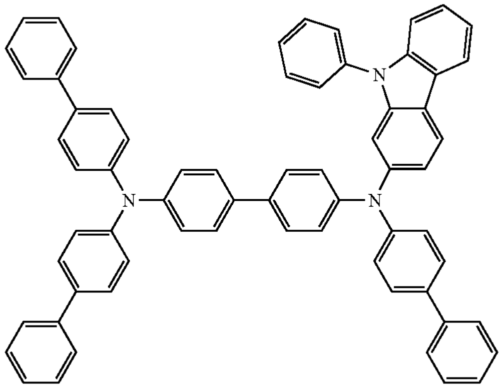
HT37
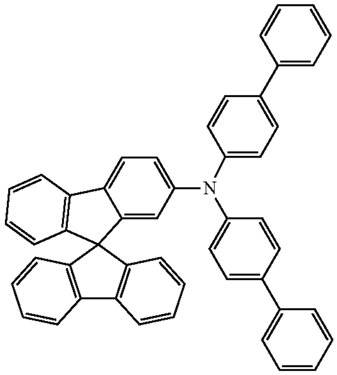
HT38
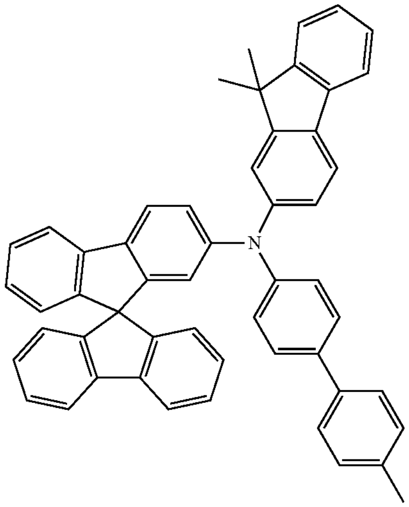
HT39
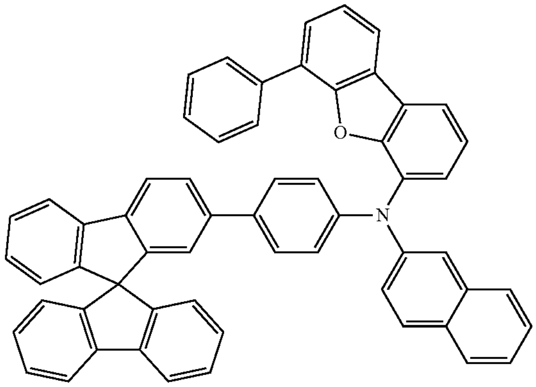
HT40
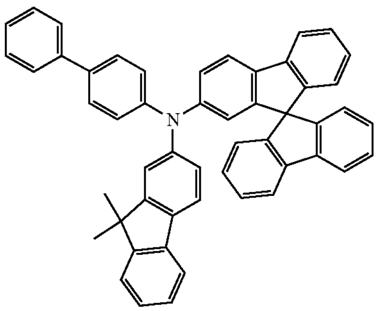
HT41
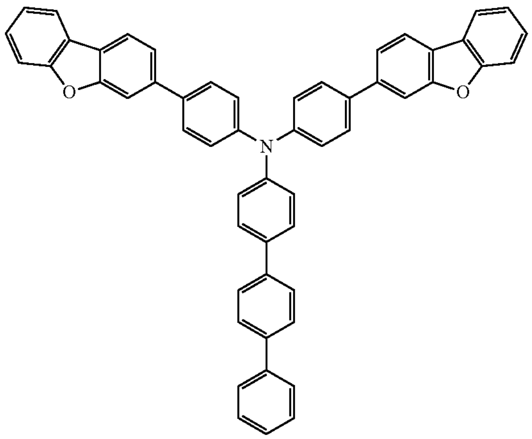

-continued
HT42
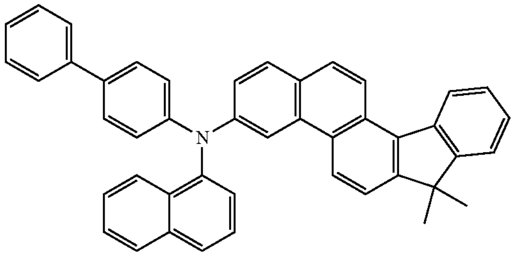
HT43
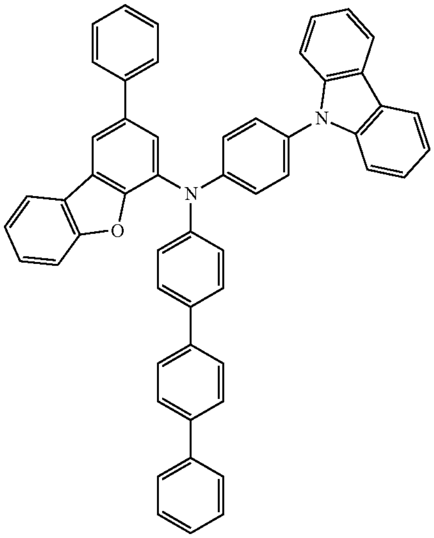
HT44
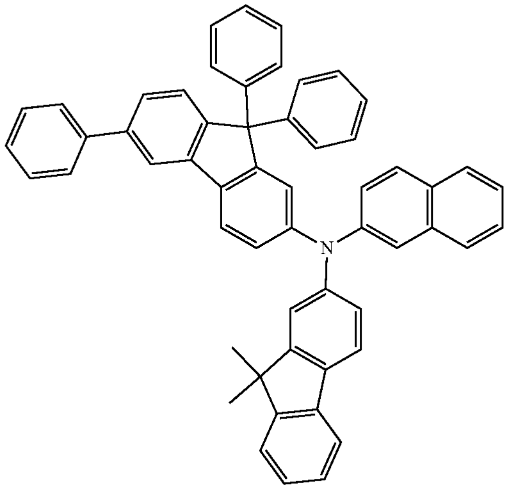
HT45
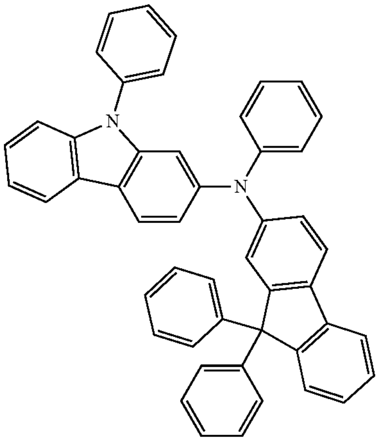
HT46
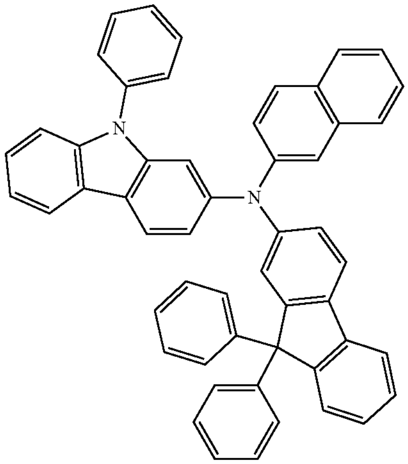

-continued
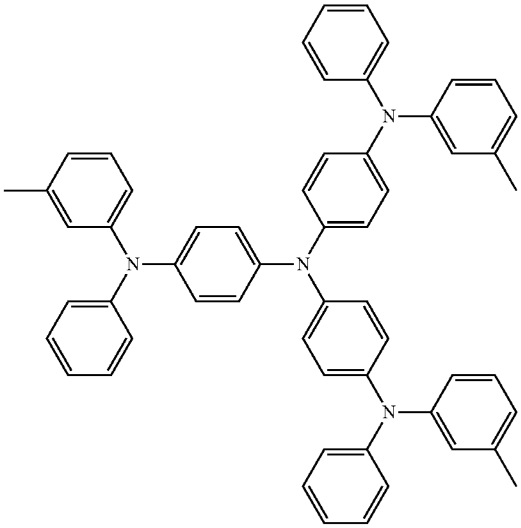
m-MTDATA
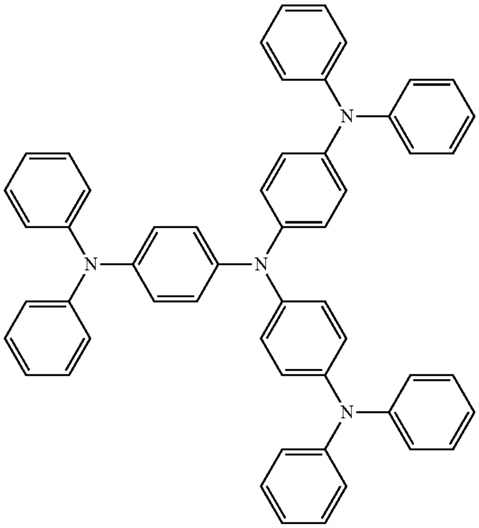
TDATA
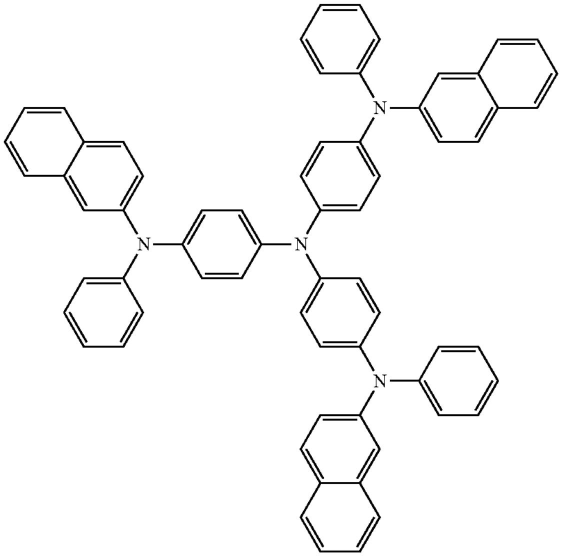
2-TNATA
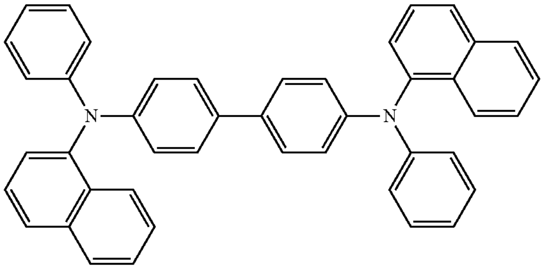
NPB
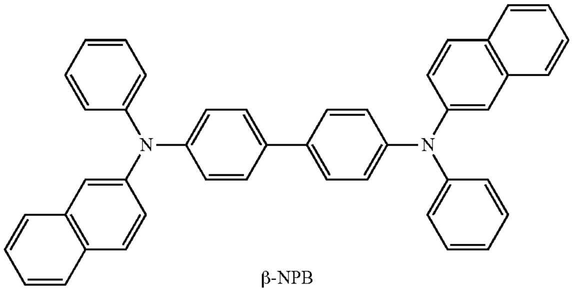
β-NPB
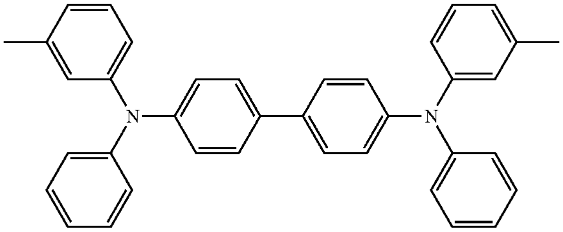
TPD -continued
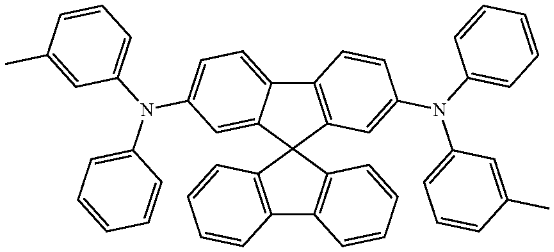
Spiro-TPD
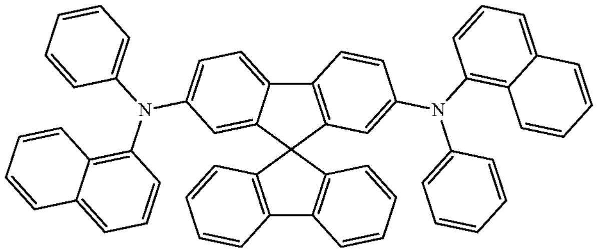
Spiro-NPB
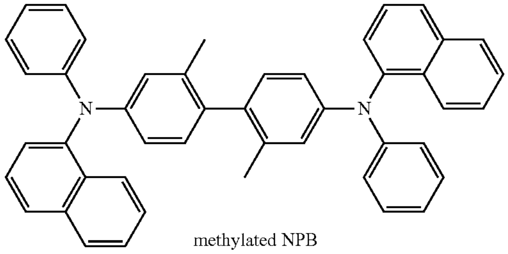
methylated NPB
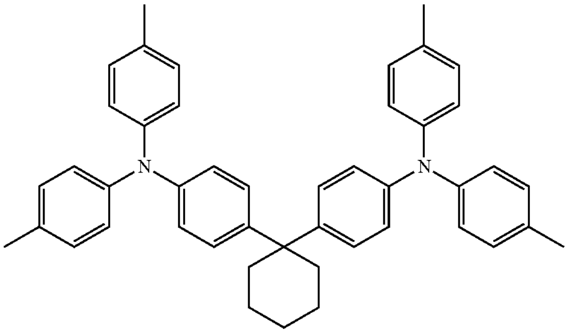
TAPC
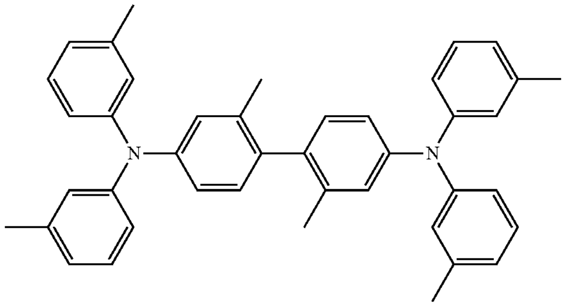
HMTPD
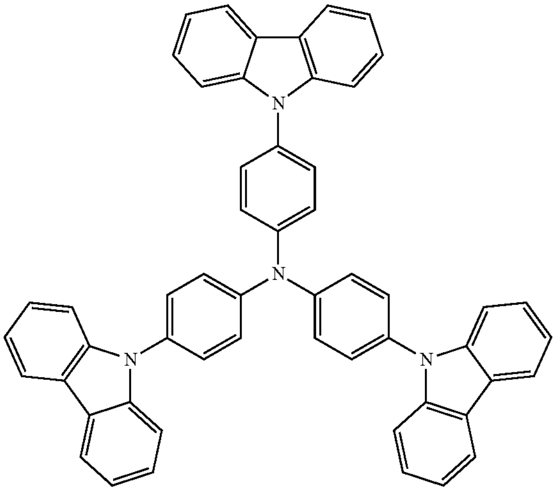
TCTA -continued

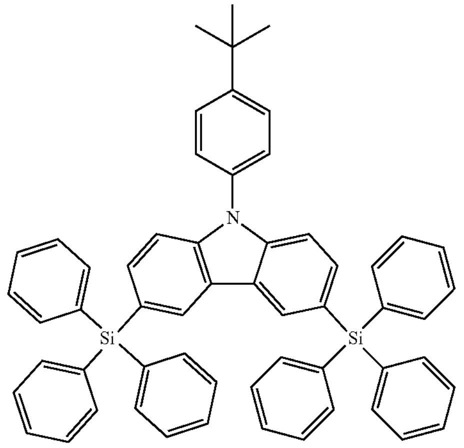

CzSi

The thickness of the hole transport region may be in a range of about 50 Å to about 10,000 Å, for example, about 100 Å to about 4,000 Å. When the hole transport region includes a hole injection layer, a hole transport layer, or any combination thereof, the thickness of the hole injection layer may be in a range of about 100 Å to about 9,000 Å, for example, about 100 Å to about 2,000 Å, for example, about 100 Å to about 1,500 Å. When the thicknesses of the 50 Å to about 2,000 Å, for example, about 100 Å to about 1,500 Å. When the thicknesses of the hole transport region, the hole injection layer and the hole transport layer are within the ranges described above, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the leakage of electrons from an emission layer to a hole transport region. Materials that may be included in the hole transport region may be included in the emission auxiliary layer and the electron blocking layer.

p-Dopant

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant. In an embodiment, the lowest unoccupied molecular orbital (LUMO) energy level of the p-dopant may be about −3.5 eV or less. In an embodiment, the p-dopant may include a quinone derivative, a cyano group-containing compound, a compound containing element EL1 and element EL2, or any combination thereof.

Examples of the quinone derivative are tetracyanoquinodimethane (TCNQ), 2,3,5,6-tetrafluoro-7,7,8,8-tetracyanoquinodimethane (F4-TCNQ), etc. Examples of the cyano group-containing compound are 1,4,5,8,9,12-hexaazatriphenylene-hexacarbonitrile (HAT-CN), and a compound represented by Formula 221 below.

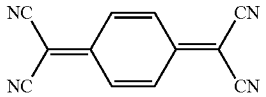

TCNQ

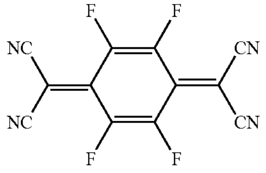

F4-TCNQ

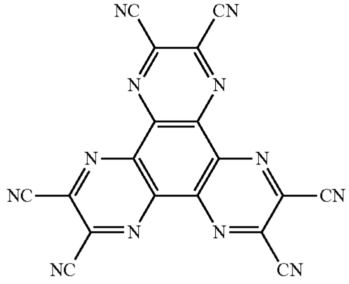

HAT-CN

Formula 221

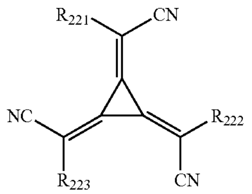

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or any combination thereof, and element EL2 may be a non-metal, a metalloid, or any combination thereof.

Examples of the metal are an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid are silicon (Si), antimony (Sb), and tellurium (Te). Examples of the non-metal are oxygen (O) and a halogen (for example, F, Cl, Br, I, etc.).

In one or more embodiments, examples of the compound containing element EL1 and element EL2 are a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide are a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $MO_2O_5$, etc.), and a rhenium oxide (for example, $ReO_3$, etc.). Examples of the metal halide are an alkali metal halide, an alkaline earth metal halide, a transition metal halide, a post-transition metal halide, and a lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and CsI. Examples of the alkaline earth metal halide are $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfC_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide are a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.). Examples of the lanthanide metal halide are YbF, $YbF_2$, $YbF_3$, $SmF_3$, YbCl, $YbCl_2$, $YbCl_3$, $SmCl_3$, YbBr, $YbBr_2$, $YbBr_3$ $SmBr_3$, YbI, $YbI_2$, $YbI_3$, and $SmI_3$. An example of the metalloid halide is an antimony halide (for example, $SbCl_5$, etc.).

Examples of the metal telluride are an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact each other or are separated from each other. In one or more embodiments, the emission layer may include two or more materials of a red light-emitting material, a green light-emitting material, and a blue light-emitting material, in which the two or more materials are mixed with each other in a single layer to emit white light. In an embodiment, the emission layer may emit blue light.

In an embodiment, the emission layer may include the heterocyclic compound represented by Formula 1 as described herein. The emission layer may include a host and a dopant. In an embodiment, the dopant may include the heterocyclic compound represented by Formula 1 as described herein. In this regard, the dopant may further include, in addition to the heterocyclic compound represented by Formula 1, a phosphorescent dopant, a fluorescent dopant, or any combination thereof. The phosphorescent dopant, the fluorescent dopant, or the like that may be further included in the emission layer in addition to the heterocyclic compound represented by Formula 1 will be described in detail below. The amount of the dopant in the emission layer may be from about 0.01 to about 15 parts by weight based on 100 parts by weight of the host.

In one or more embodiments, the emission layer may include a quantum dot. The emission layer may include a delayed fluorescence material. The delayed fluorescence material may act as a host or a dopant in the emission layer.

The thickness of the emission layer may be in a range of about 100 Å to about 1,000 Å, for example, about 200 Å to about 600 Å. When the thickness of the emission layer is within the range described above, excellent light-emission characteristics may be obtained without a substantial increase in driving voltage.

Host

The host may include, for example, a carbazole-containing compound, an anthracene-containing compound, a triazine-containing compound, or any combination thereof. The host may include, for example, a carbazole-containing compound and a triazine-containing compound. In one or more embodiments, the host may include a compound represented by Formula 301:

$[Ar_{301}]_{xb11}$-$[(L_{301})_{xb1}$-$R_{301}]_{xb21}$ Formula 301 wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ are each the same as described in connection with $Q_1$.

In an embodiment, when xb11 in Formula 301 is 2 or more, two or more of $Ar_{301}$(s) may be linked to each other via a single bond. In one or more embodiments, the host may include a compound represented by Formula 301-1, a compound represented by Formula 301-2, or any combination thereof:

Formula 301-1

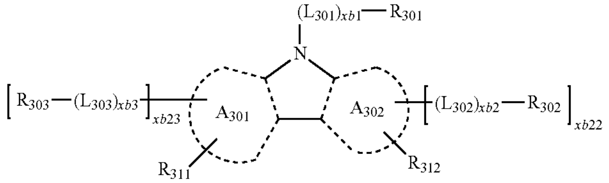

Formula 301-2

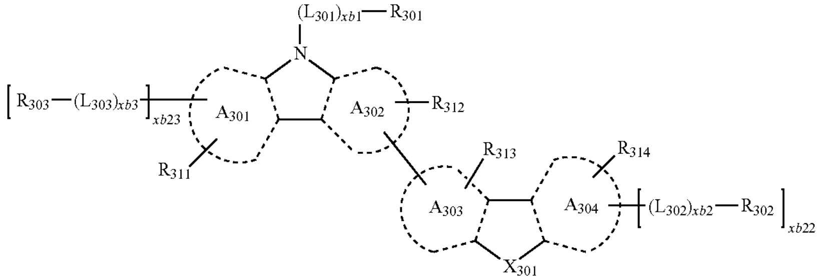

wherein, in Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-$[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ are each the same as described herein, $L_{302}$ to $L_{304}$ are each independently the same as described in connection with $L_{301}$, xb2 to xb4 are each independently the same as described in connection with xb1, and $R_{302}$ to $R_{305}$ and $R_{311}$ to $R_{314}$ are each the same as described in connection with $R_{301}$.

In one or more embodiments, the host may include an alkali earth metal complex, a post-transition metal complex, or any combination thereof. In an embodiment, the host may include a Be complex (for example, Compound H55), an Mg complex, a Zn complex, or any combination thereof.

In one or more embodiments, the host may include one of Compounds H1 to H139, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di(carbazole-9-yl)benzene (mCP), 1,3,5-tri(carbazol-9-yl) benzene (TCP), or any combination thereof:

H1

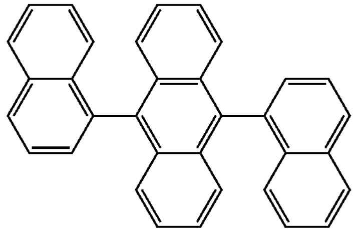

-continued
H2
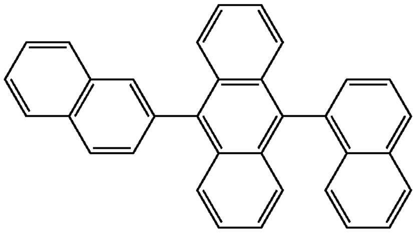
H3
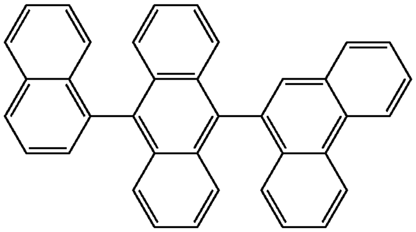
H4
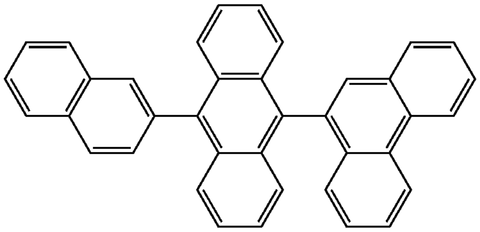
H5
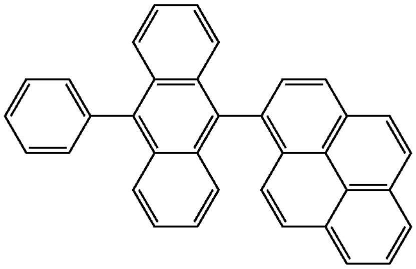
H6
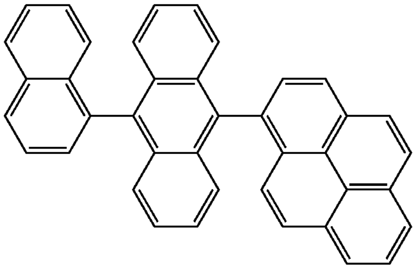
H7
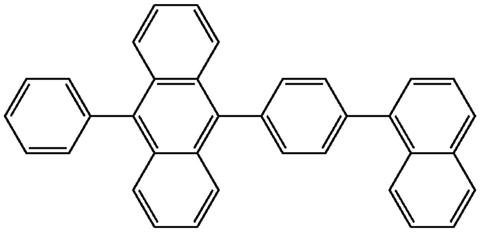
-continued
H8
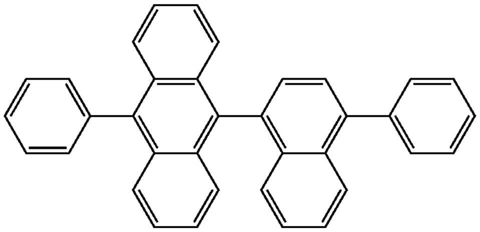
H9
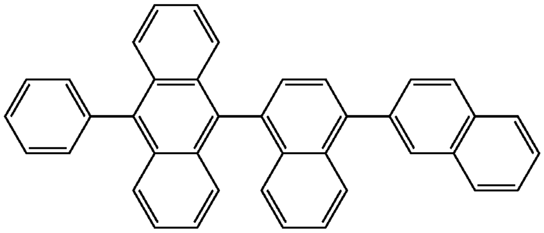
H10
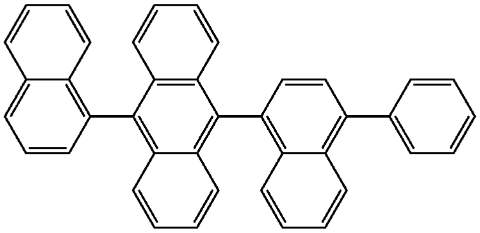
H11
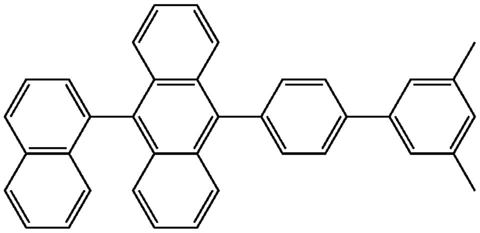
H12
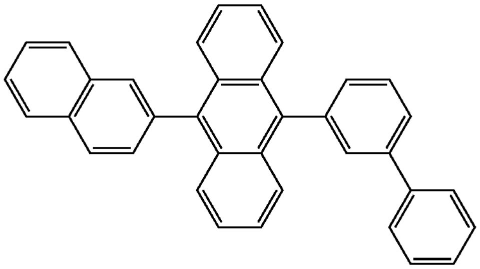
H13
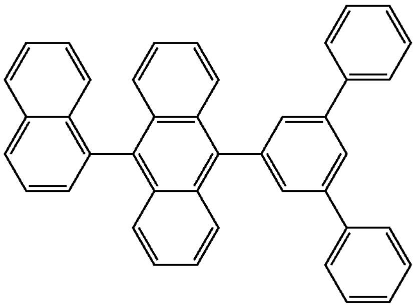

-continued
H14
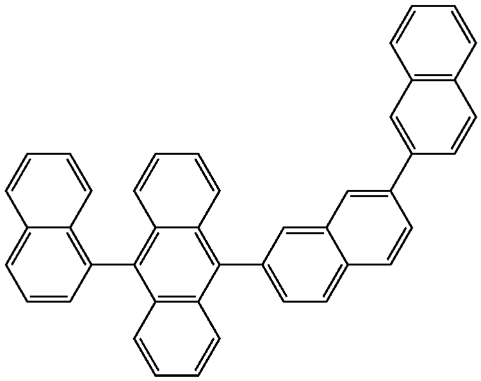
H15
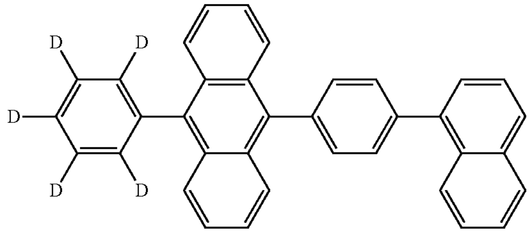
H16
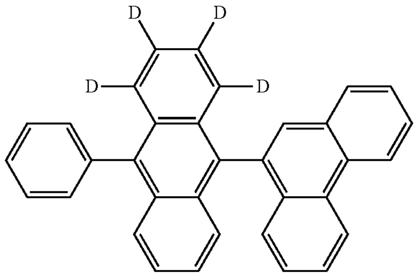
H17
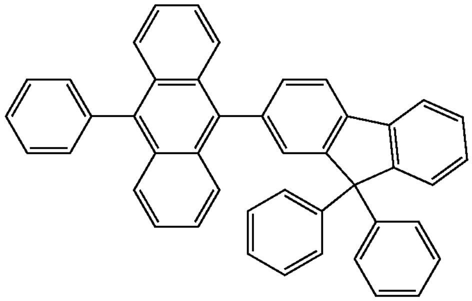
H18
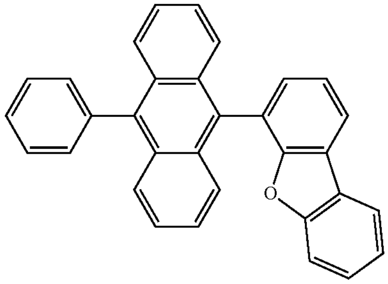
-continued
H19
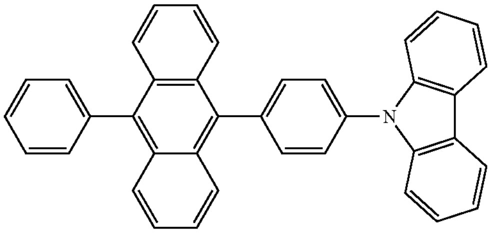
H20
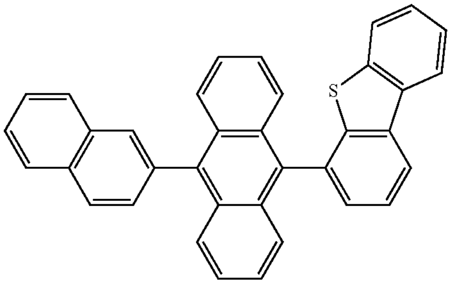
H21
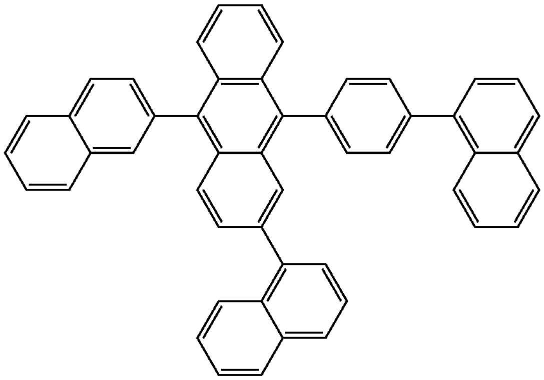
H22
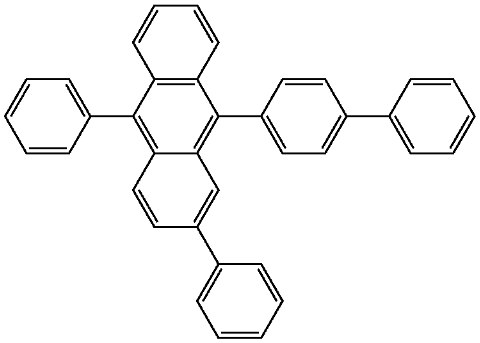

H23
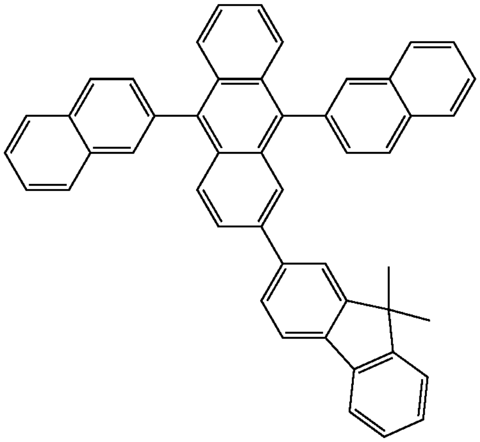
H24
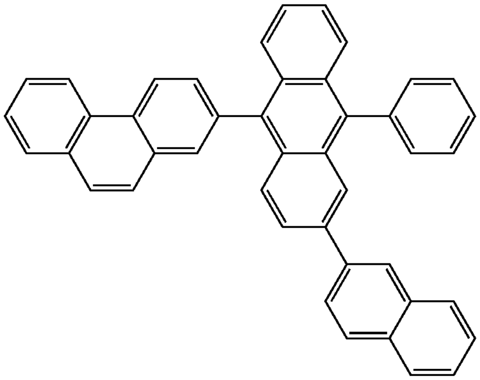
H25
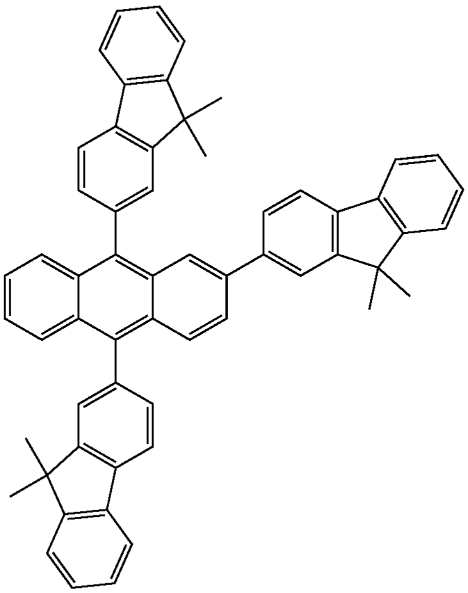
H26
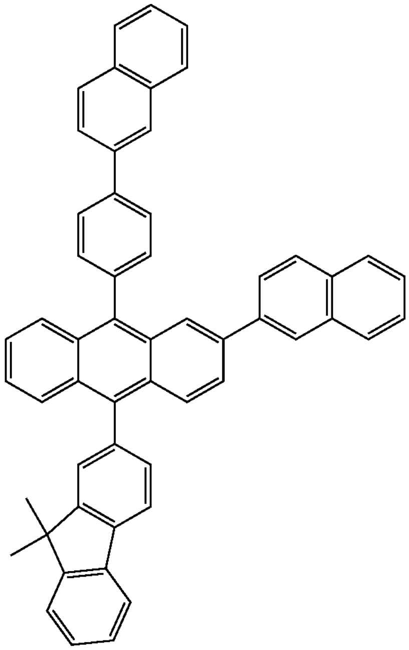
H27
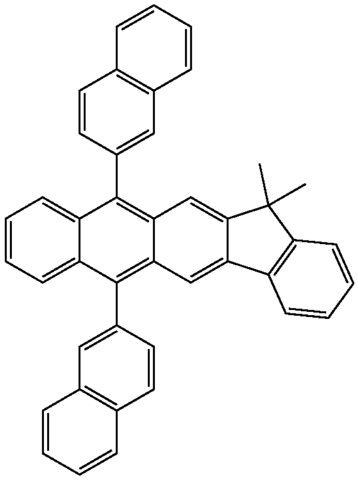
H28
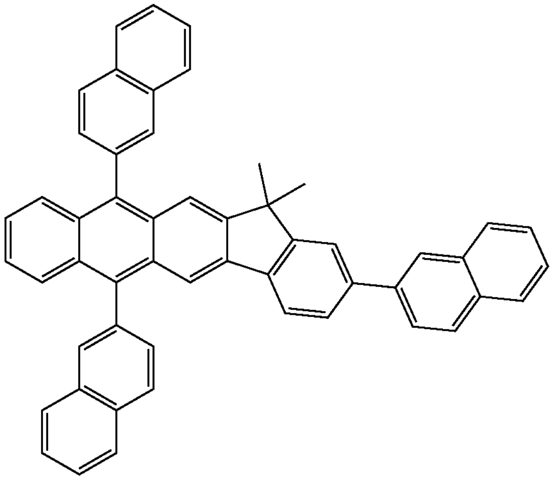

-continued
H29
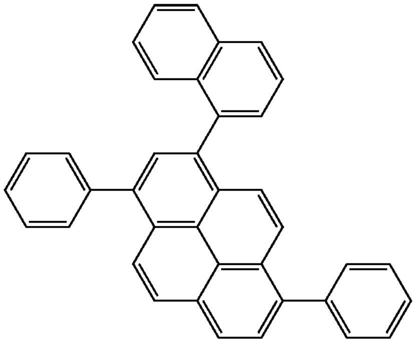
H30
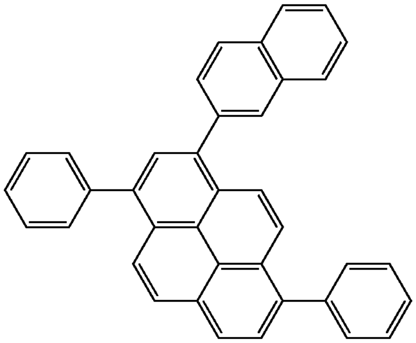
H31
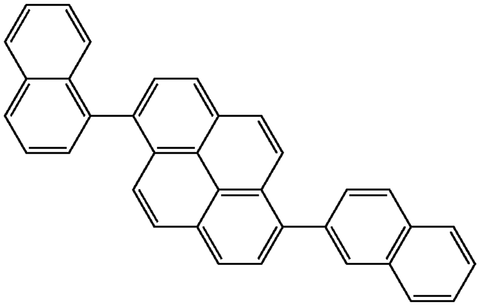
H32
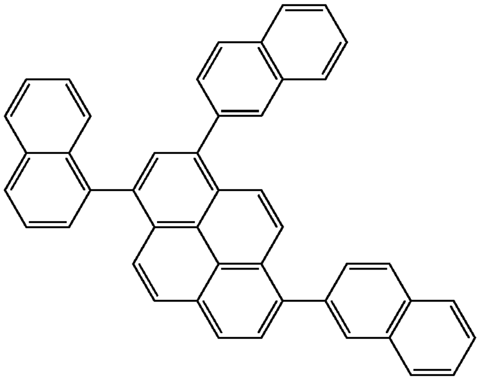
H33
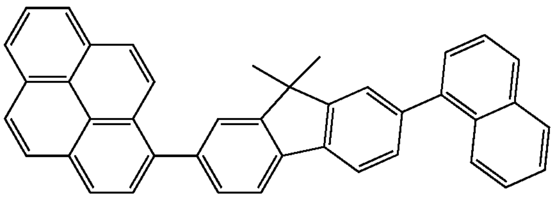
-continued
H34
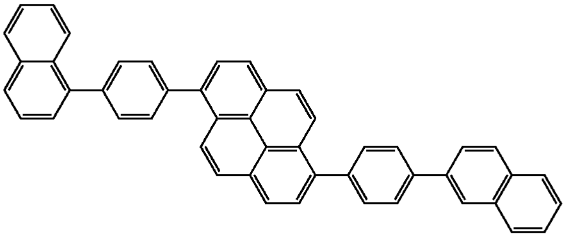
H35
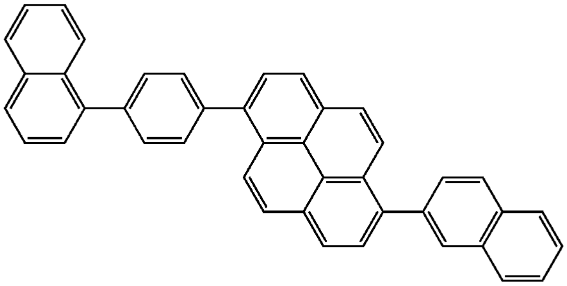
H36
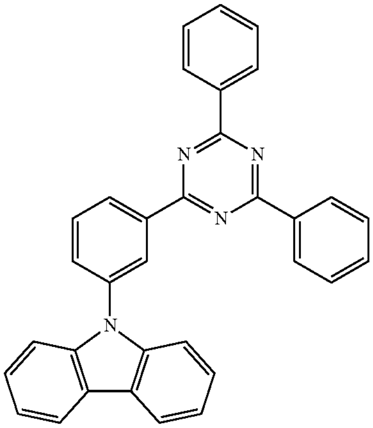
H37
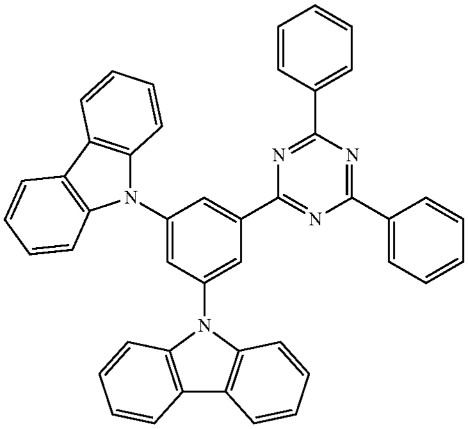

-continued
H38
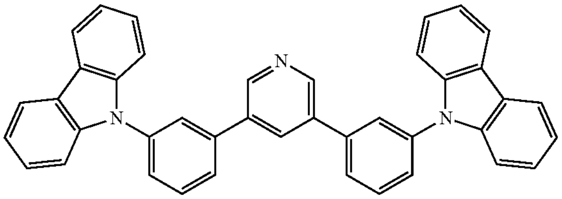
H39
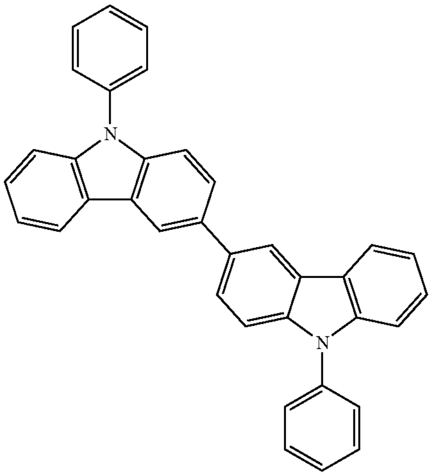
H40
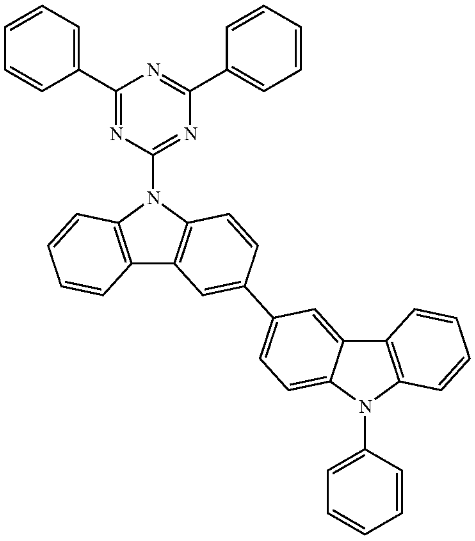
-continued
H41
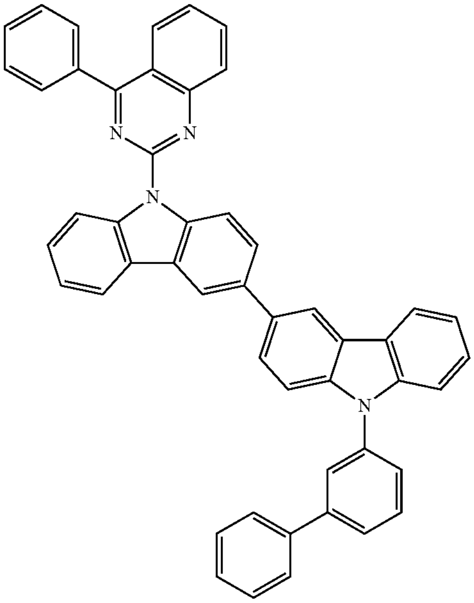
H42
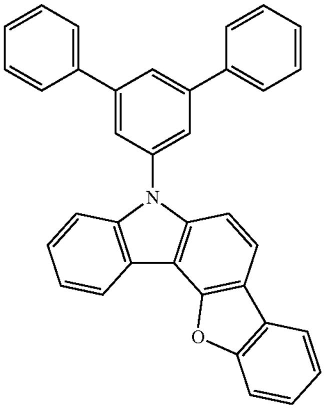
H43
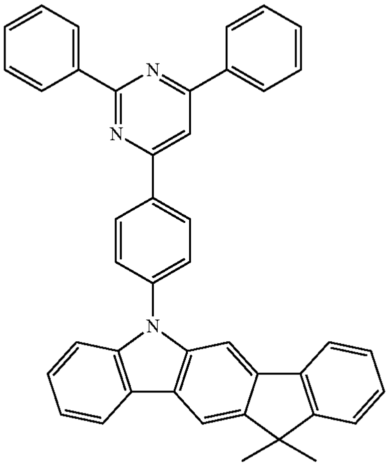

H44
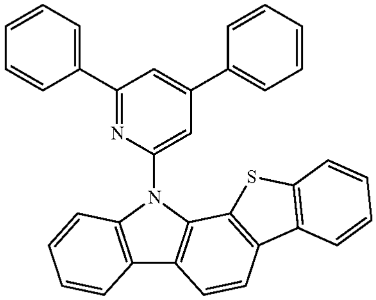
H45
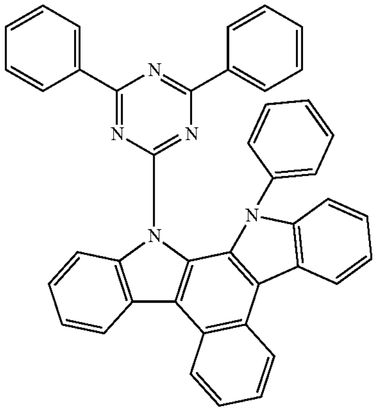
H46
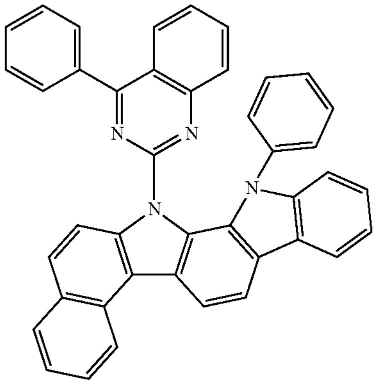
H47
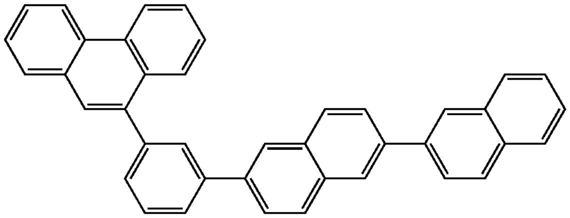
H48
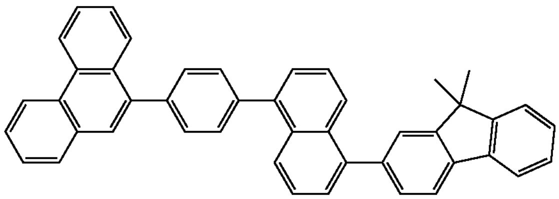
H49
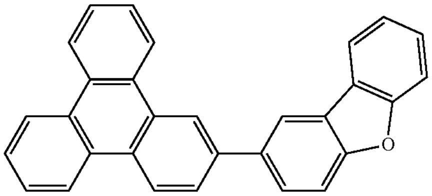
H50
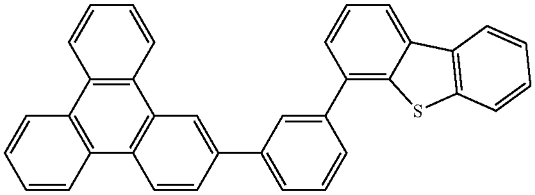
H51
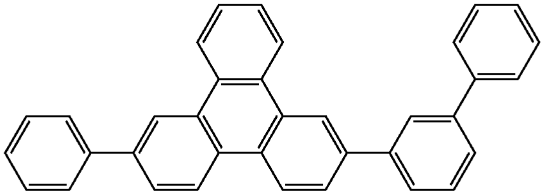
H52
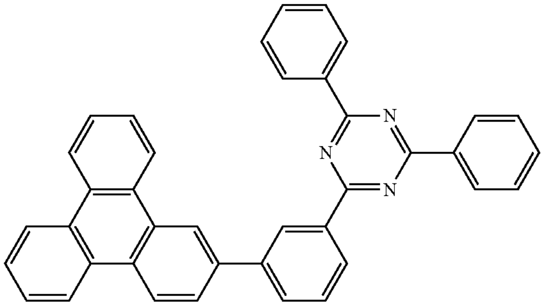
H53
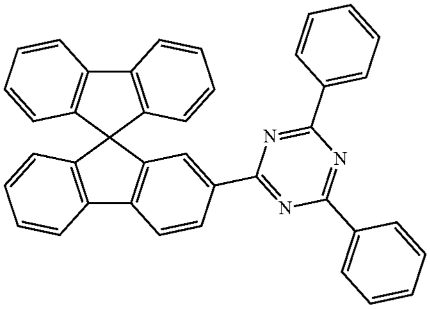

-continued
H54
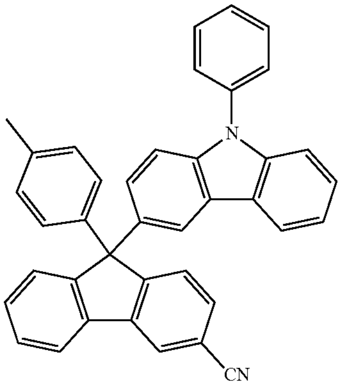
H55
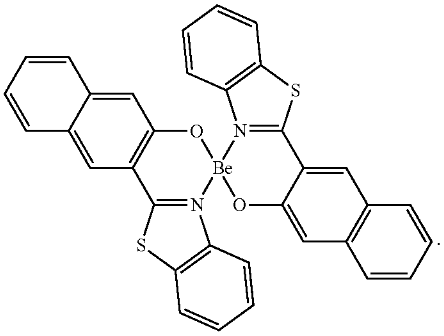
H56
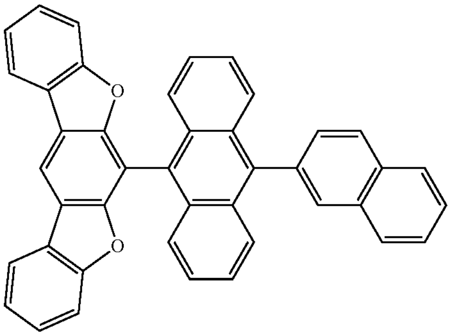
H57
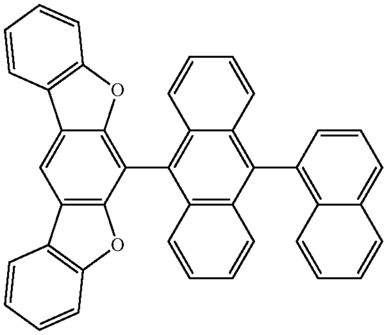
-continued
H58
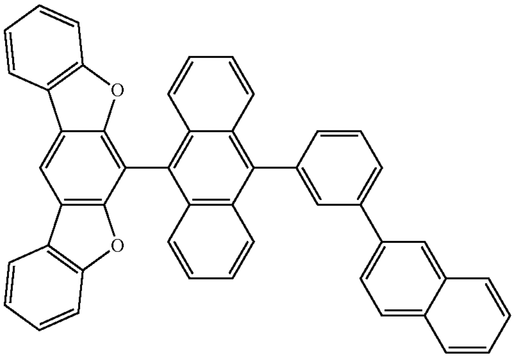
H59
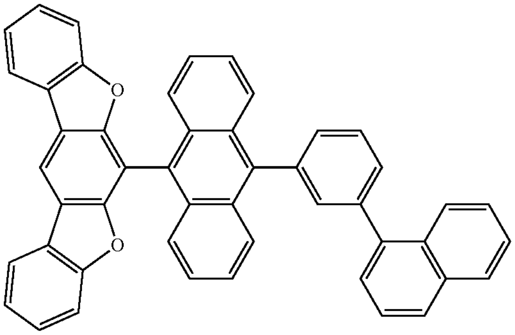
H60
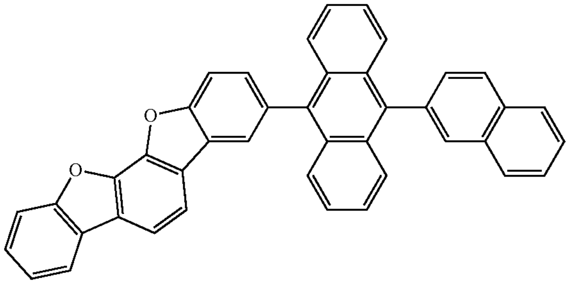
H61
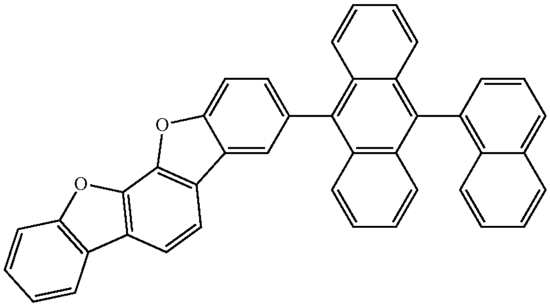

-continued
H62
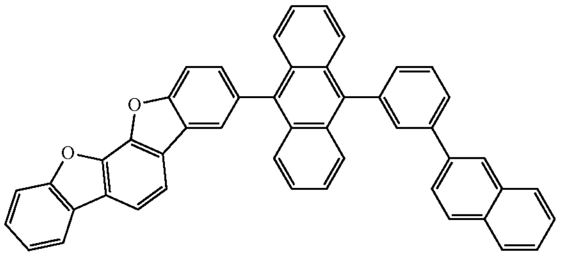
H63
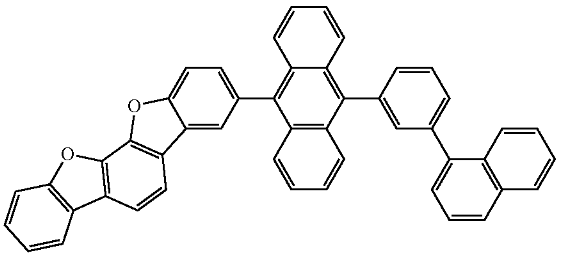
H64
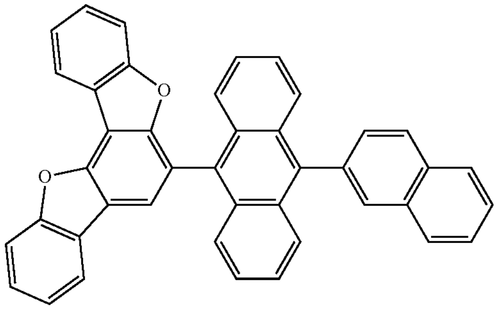
H65
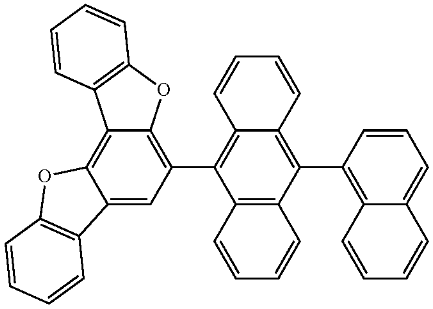
H66
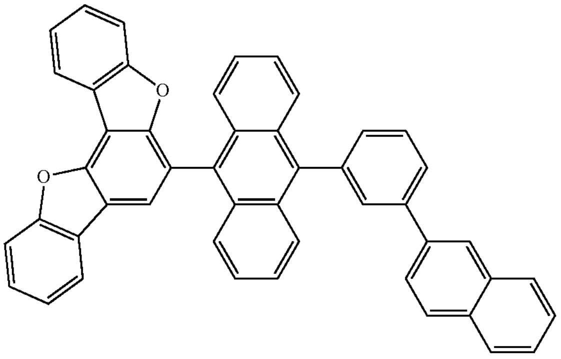
-continued
H67
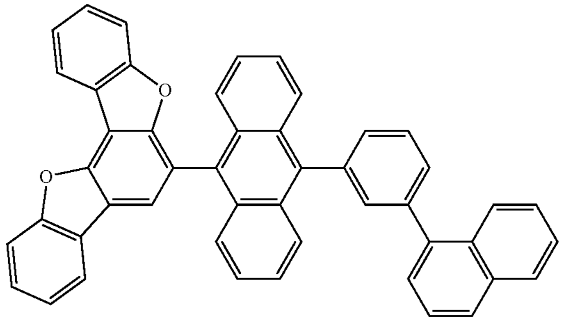
H68
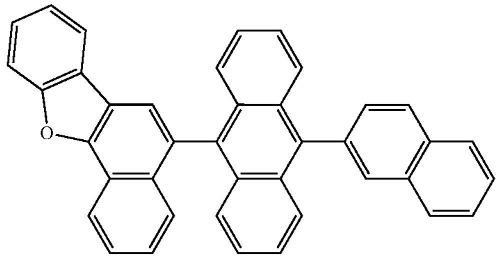
H69
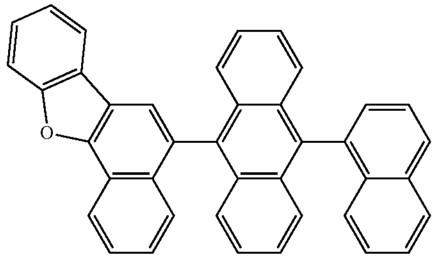
H70
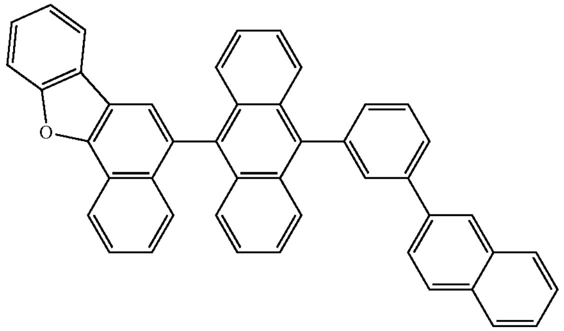
H71
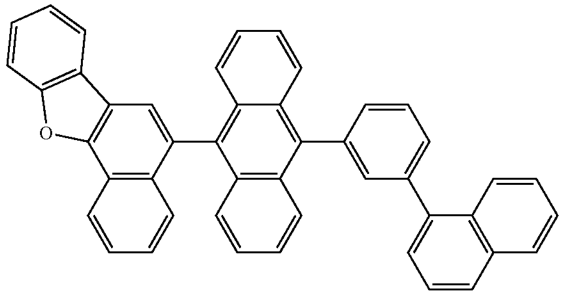

-continued
H72
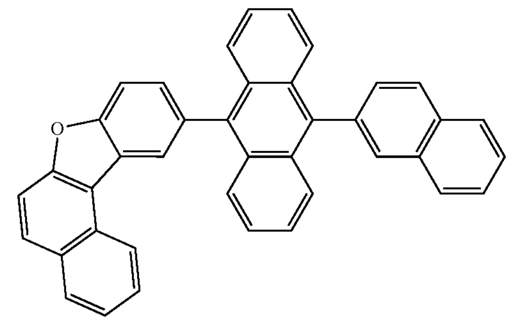
H73
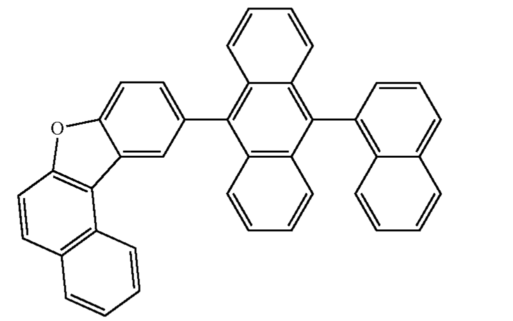
H74
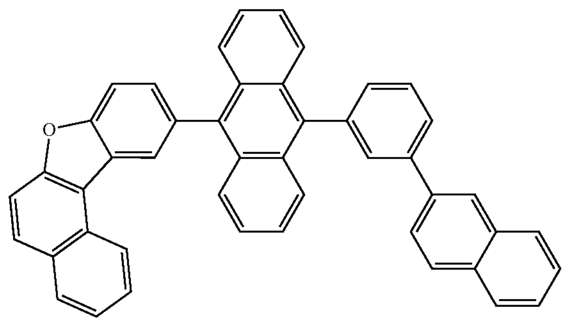
H75
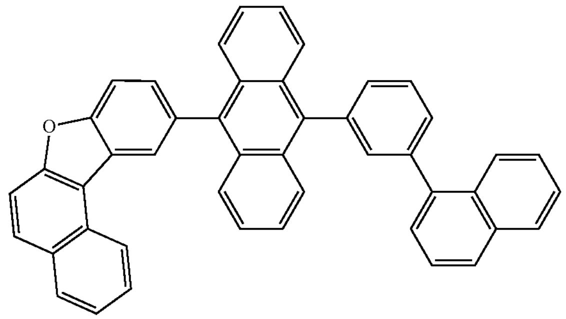
H76
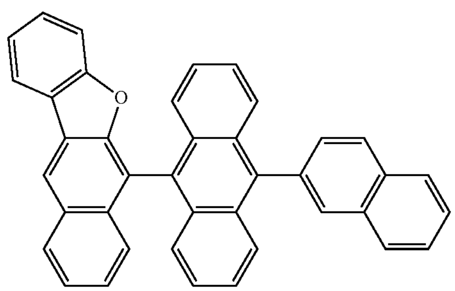
-continued
H77
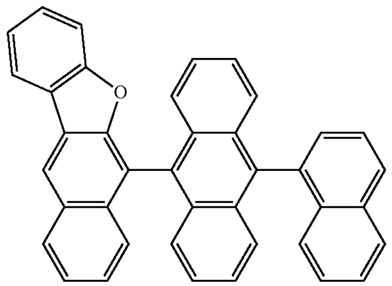
H78
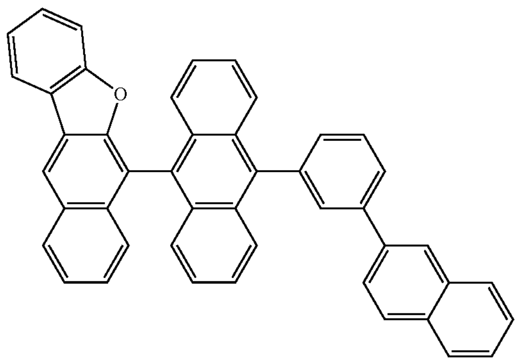
H79
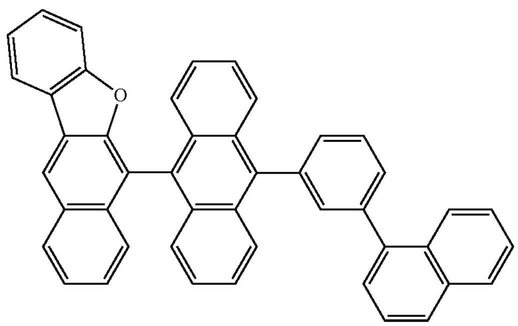
H80
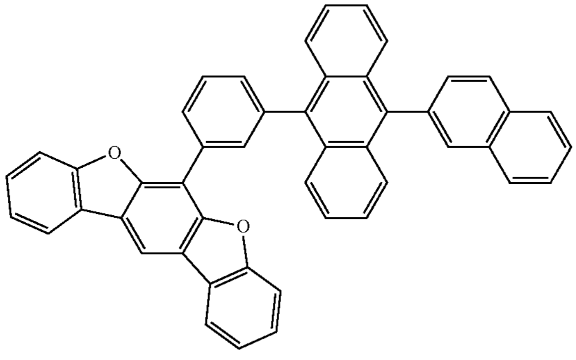

-continued
H81
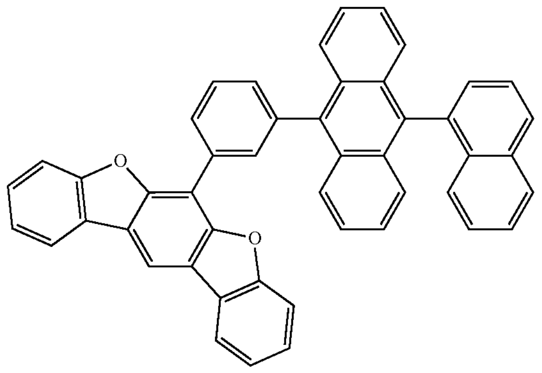
H82
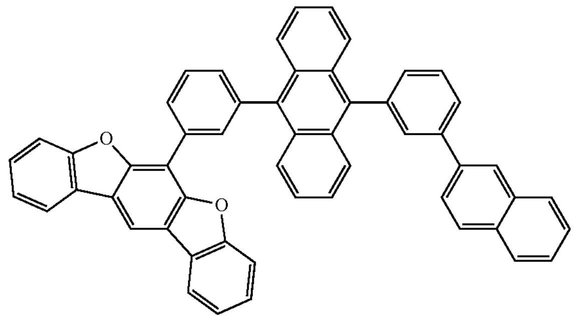
H83
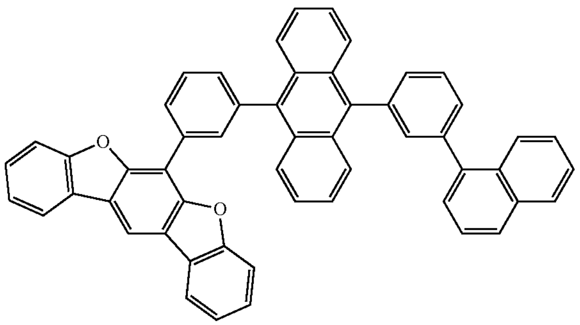
H84
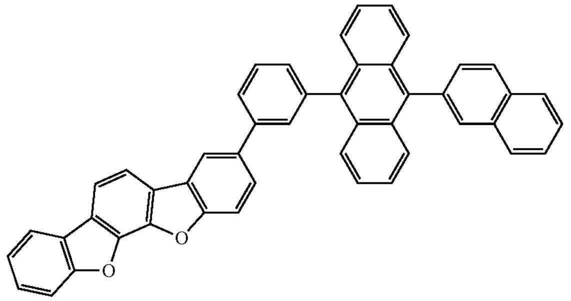
-continued
H85
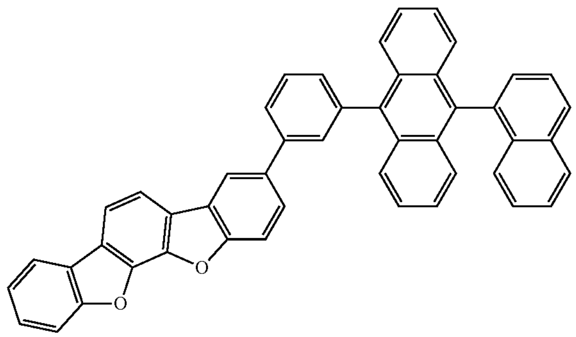
H86
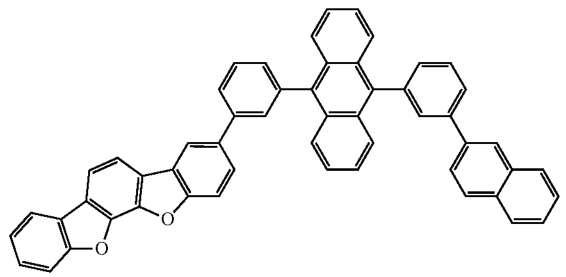
H87
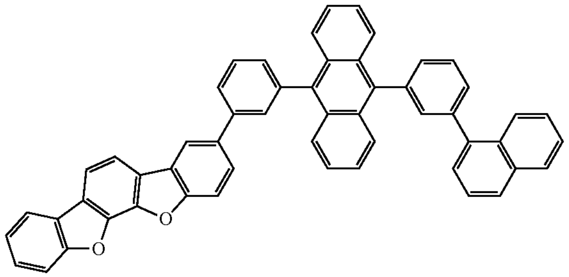
H88
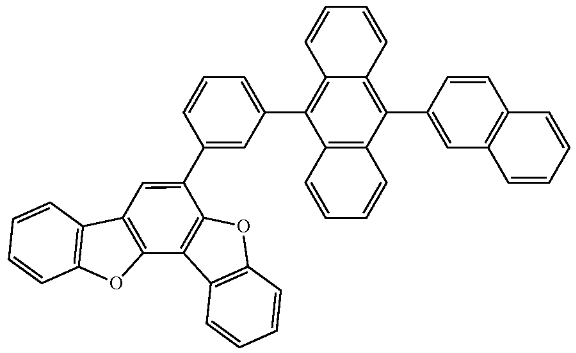

-continued
H89
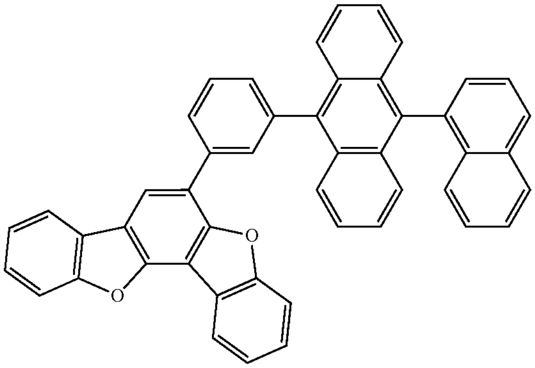
H90
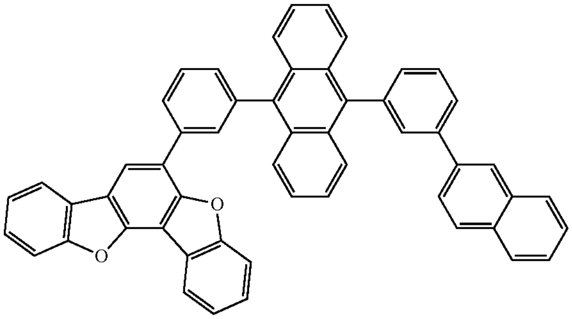
H91
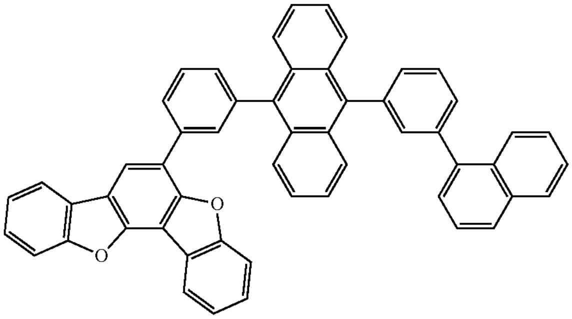
H92
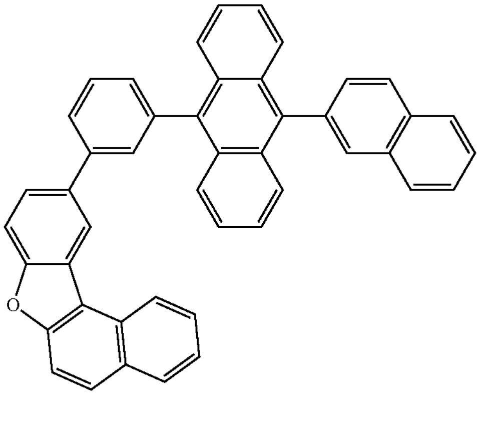
-continued
H93
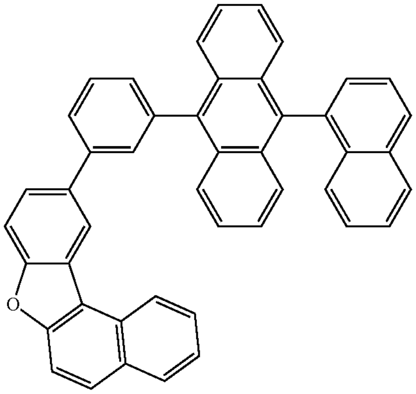
H94
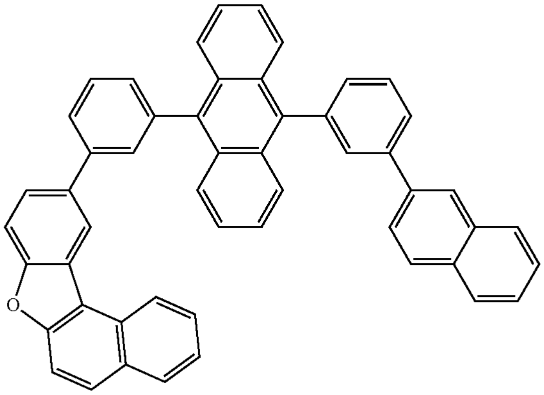
H95
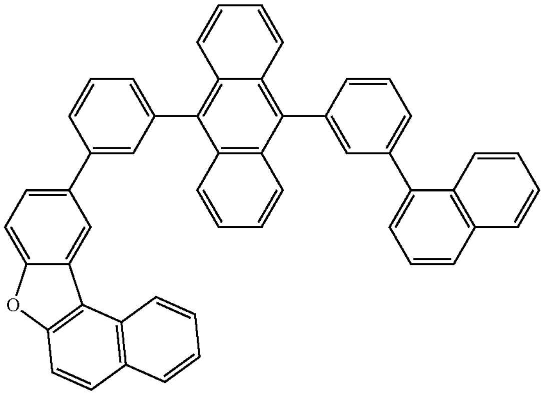
H96
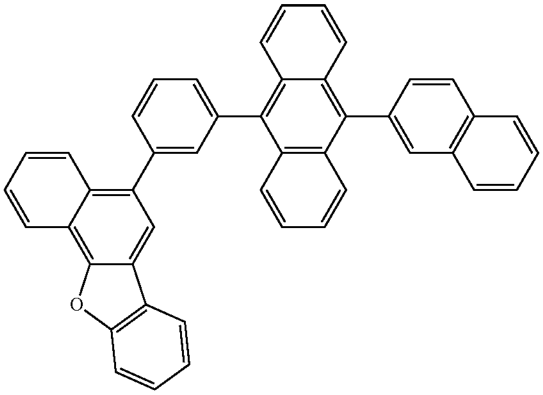

H97
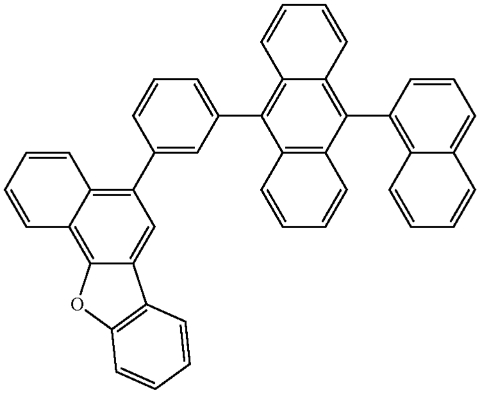
H98
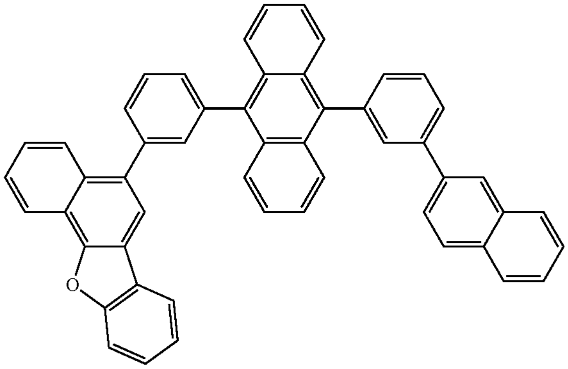
H99
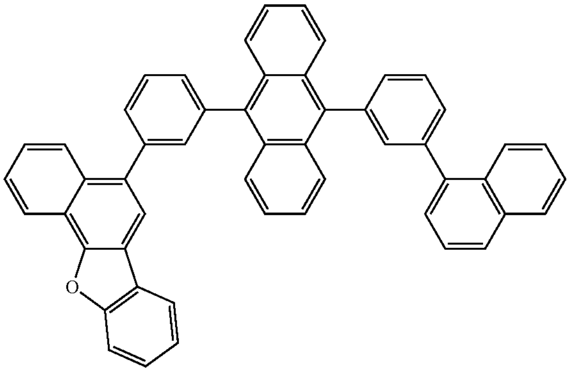
H100
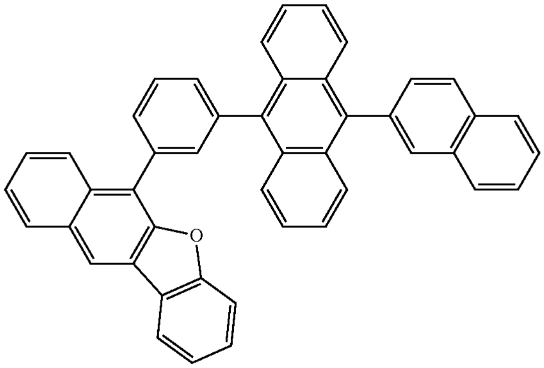
H101
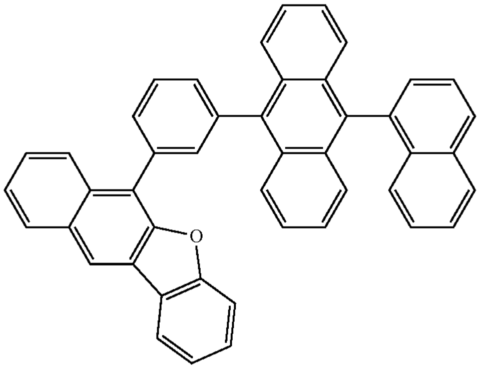
H102
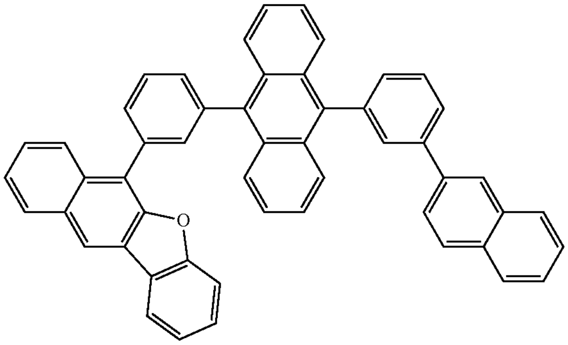
H103
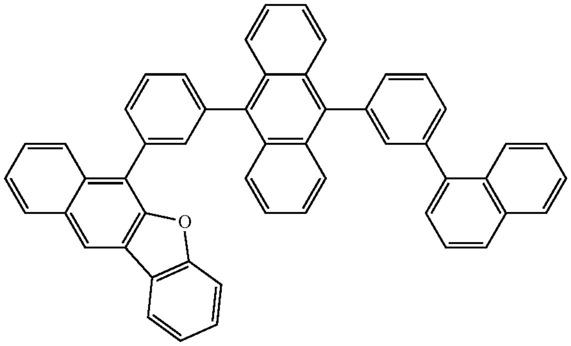
H104
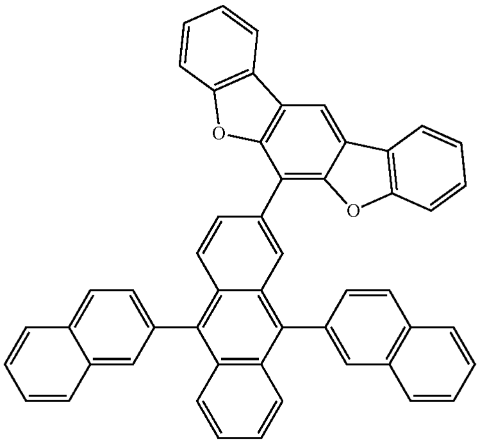

-continued
H105
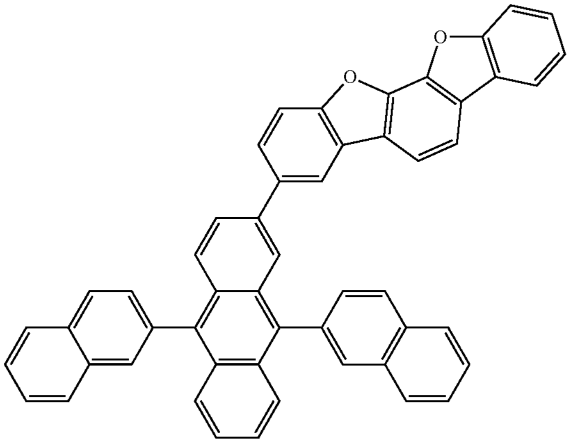
H106
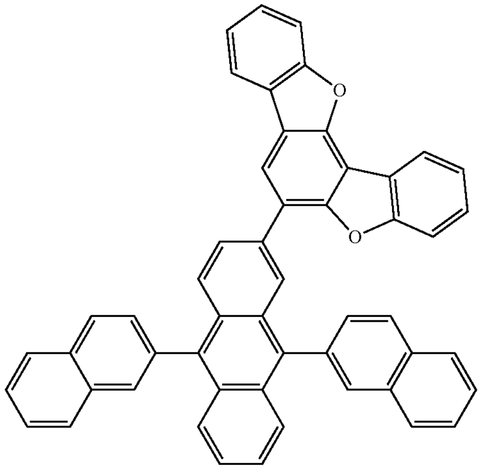
H107
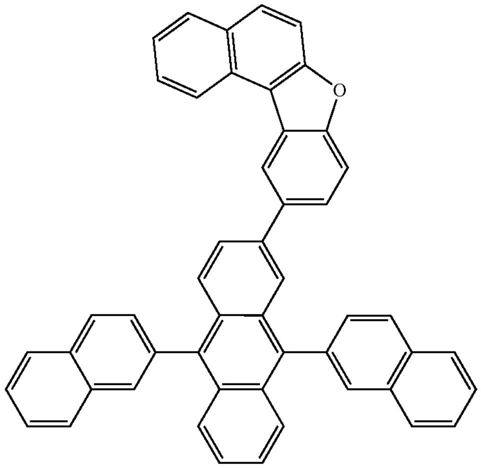
-continued
H108
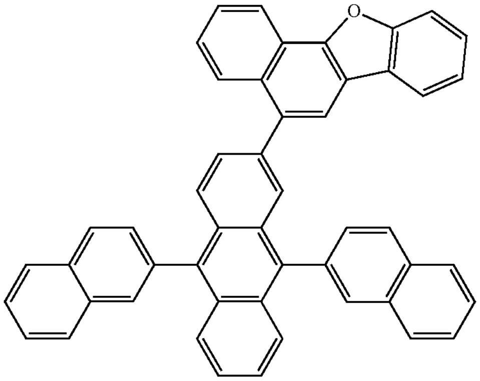
H109
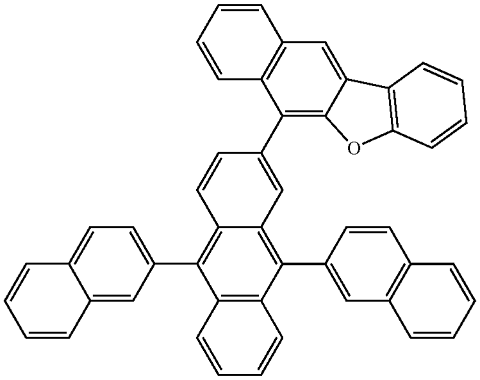
H110
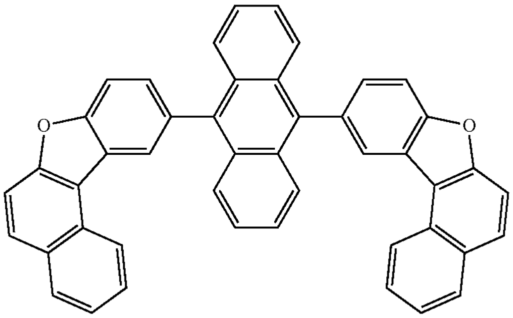
H111
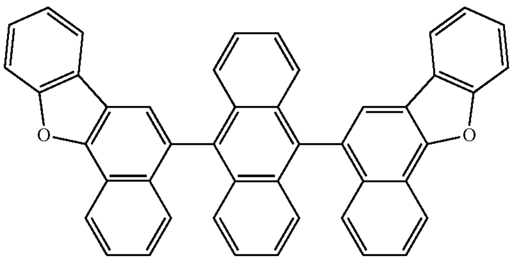

H112
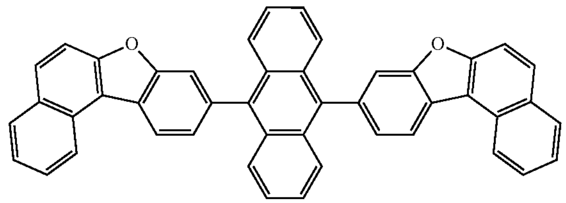
H113
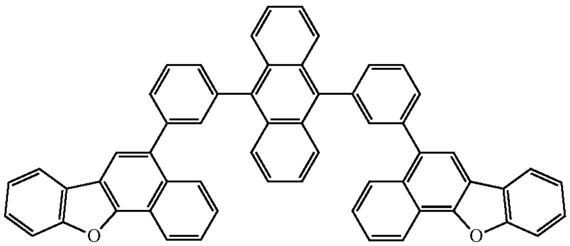
H114
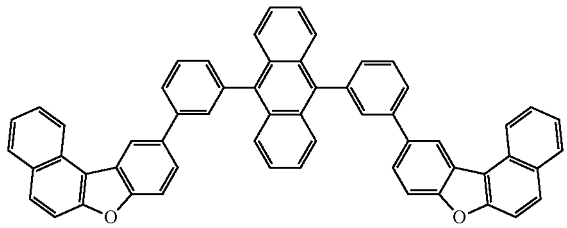
H115
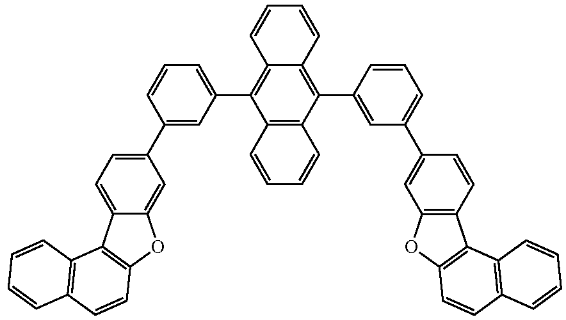
H116
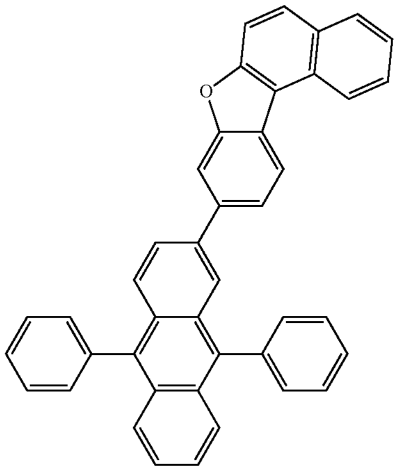
H117
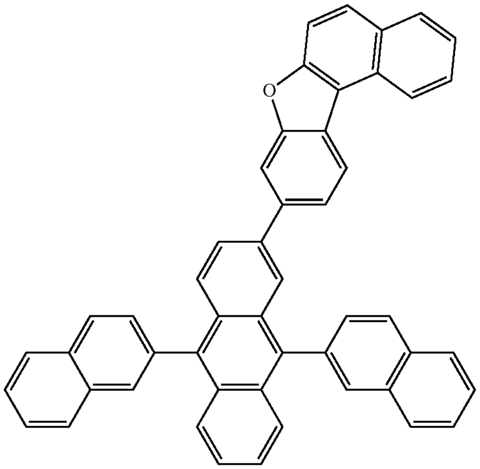
H118
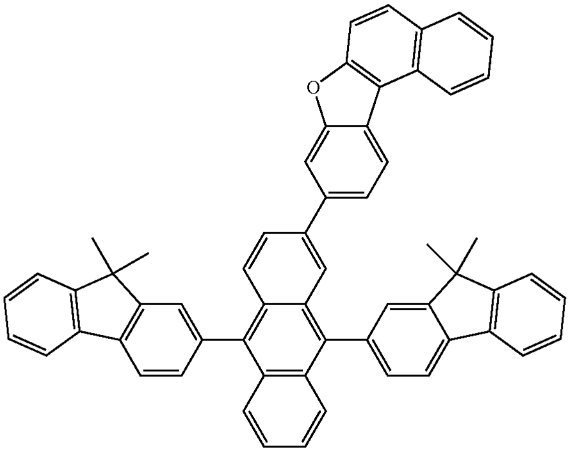
H119
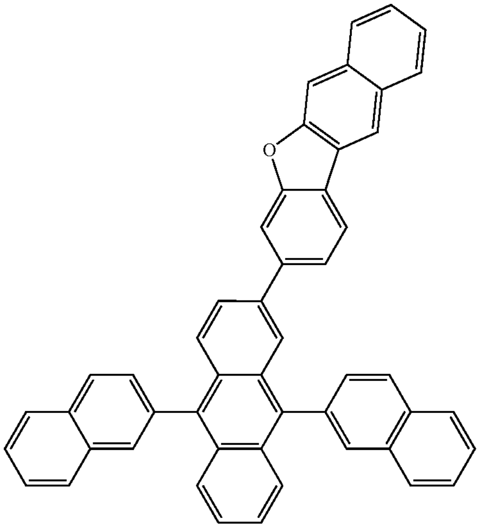

-continued
H120
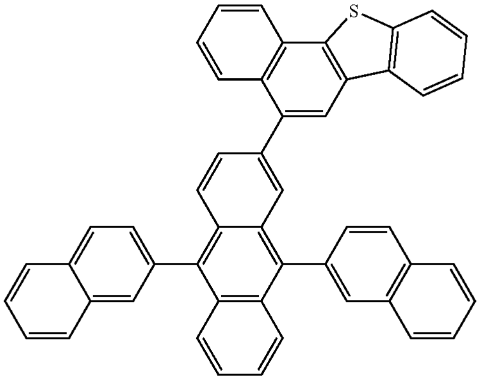
H121
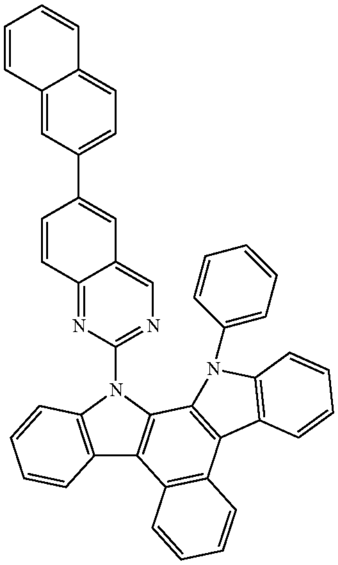
H122
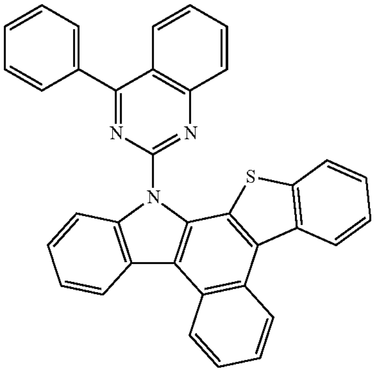
-continued
H123
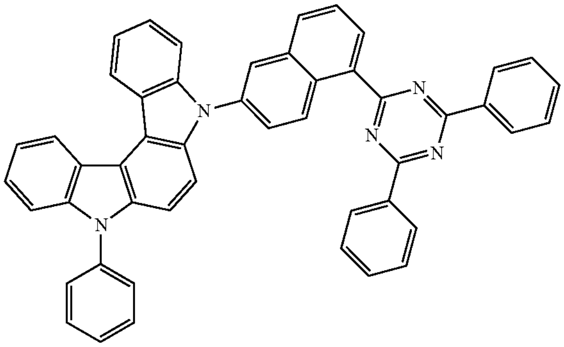
H124
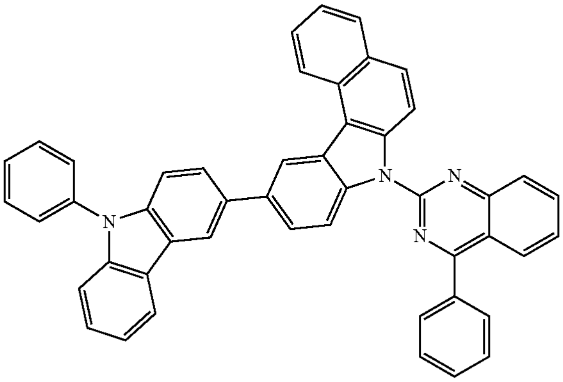
H125
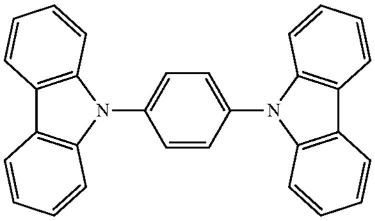
H126
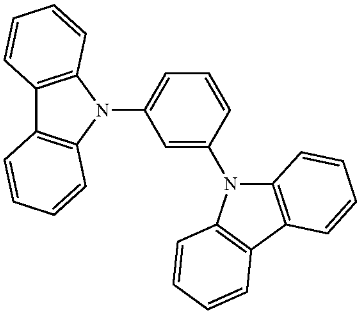
H127
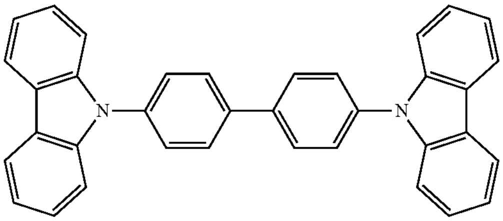

-continued
H128
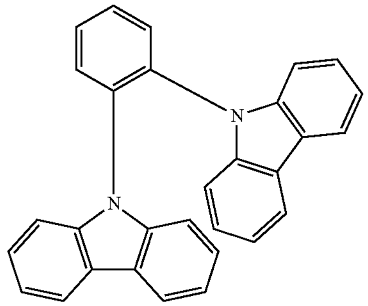
H129
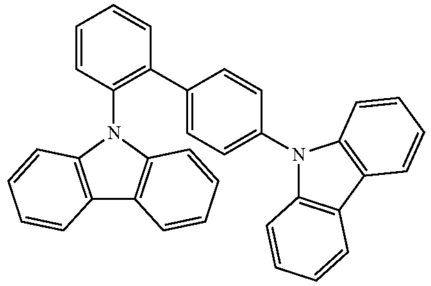
H130
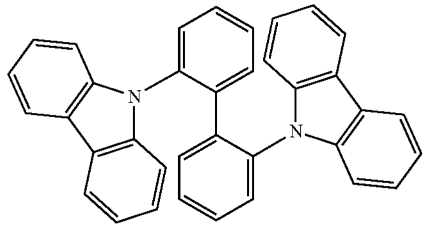
H131
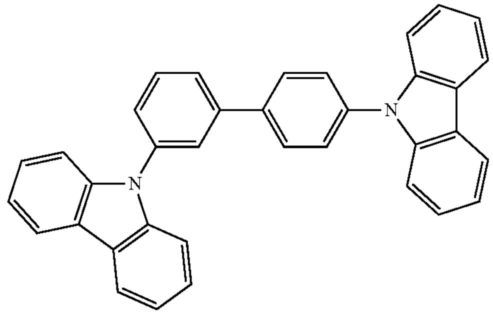
H132
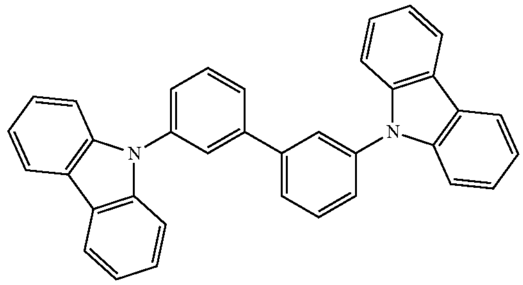
-continued
H133
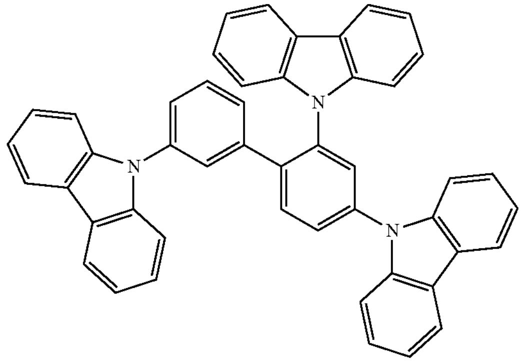
H134
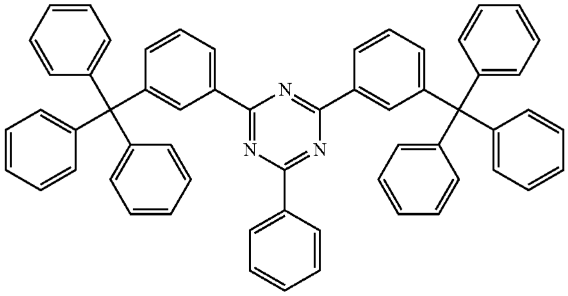
H135
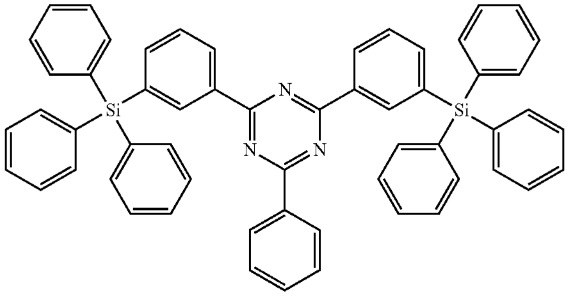
H136
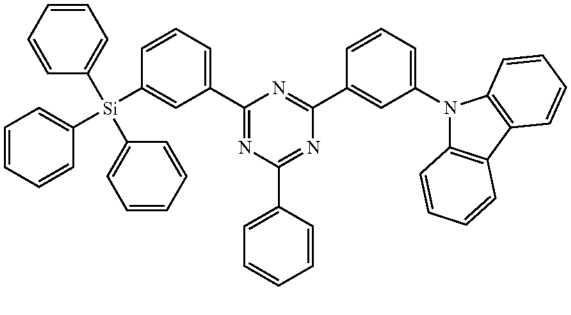

-continued

H137

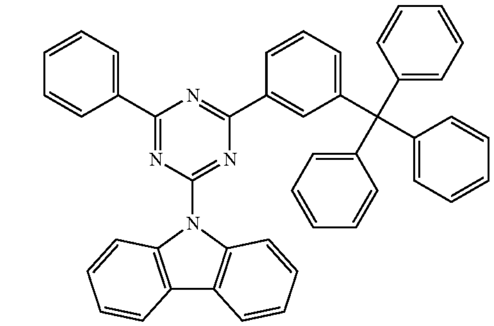

H138

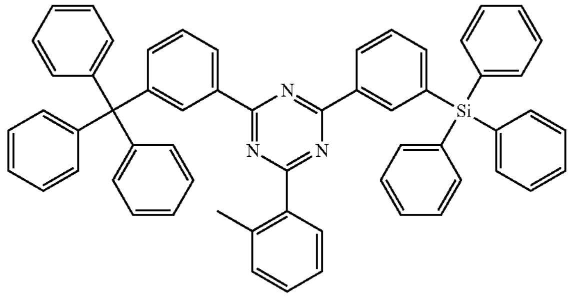

H139

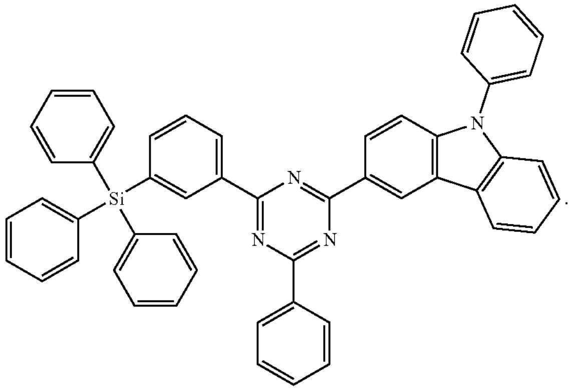

Phosphorescent Dopant

The phosphorescent dopant may include at least one transition metal as a central metal. The phosphorescent dopant may include a monodentate ligand, a bidentate ligand, a tridentate ligand, a tetradentate ligand, a pentadentate ligand, a hexadentate ligand, or any combination thereof. The phosphorescent dopant may be electrically neutral.

In an embodiment, the phosphorescent dopant may include an organometallic compound represented by Formula 401:

Formula 401

$$M(L_{401})_{xc1}(L_{402})_{xc2}$$

-continued

Formula 402

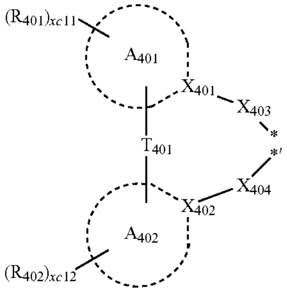

wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is 2 or more, two or more of $L_{401}$(s) may be identical to or different from each other, $L_{402}$ may be an organic ligand, and xc2 may be 0, 1, 2, 3, or 4, wherein when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are each the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are each the same as described in connection with $Q_1$, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 402 is 2 or more, two ring $A_{401}$ in two or more of $L_{401}$(s) may be optionally linked to each other via $T_{402}$, which is a linking group, and two ring $A_{402}$ may optionally be linked to each other via $T_{403}$, which is a linking group (see Compounds PD1 to PD4 and PD7). The variables $T_{402}$ and $T_{403}$ are each the same as described in connection with $T_{401}$.

The variable $L_{402}$ in Formula 401 may be an organic ligand. In an embodiment, $L_{402}$ may include a halogen group, a diketone group (for example, an acetylacetonate group), a carboxylic acid group (for example, a picolinate group), a —C(=O) group, an isonitrile group, a —CN group, a phosphorus group (for example, a phosphine group, a phosphite group, etc.), or any combination thereof.

The phosphorescent dopant may include, for example, one of Compounds PD1 to PD25, or any combination thereof:

PD1

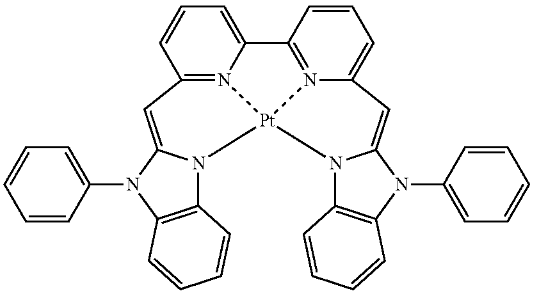

PD2

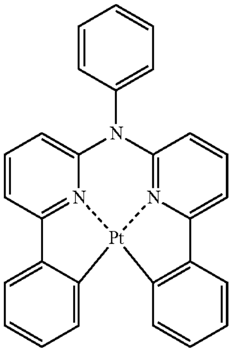

PD3

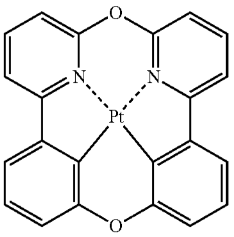

PD4

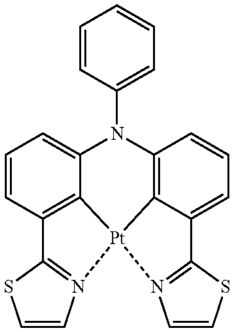

-continued

PD5

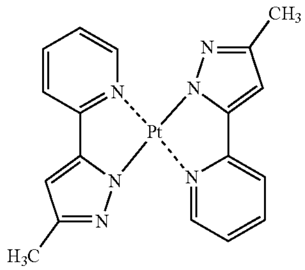

PD6

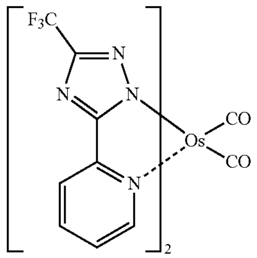

PD7

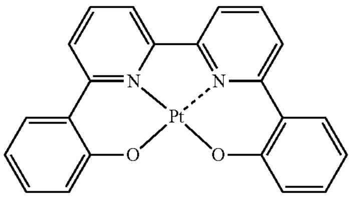

PD8

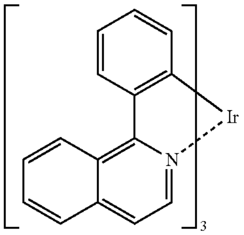

PD9

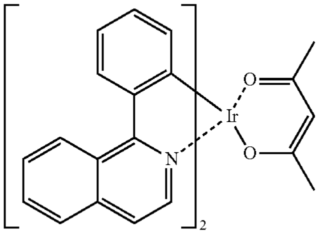

PD10

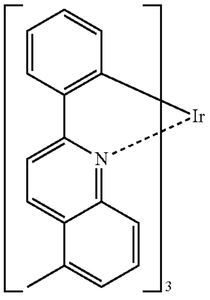

-continued
PD11
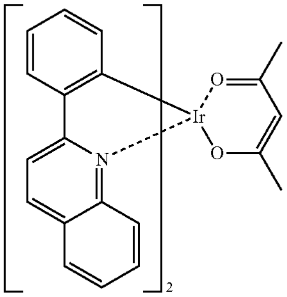
PD12
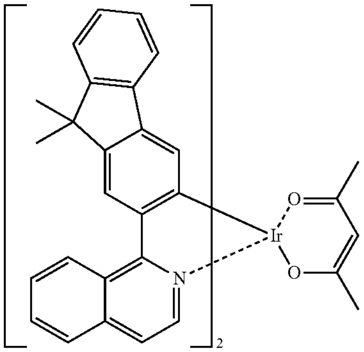
PD13
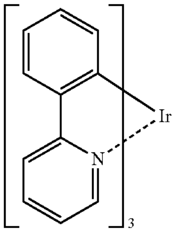
PD14
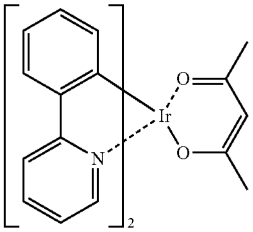
PD15
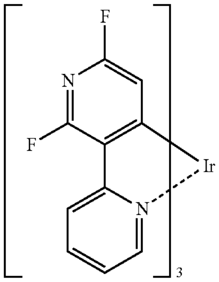
-continued
PD16
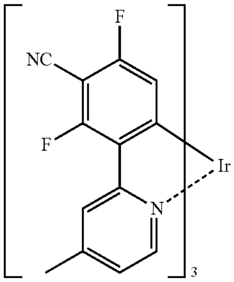
PD17
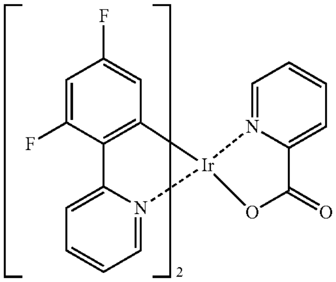
PD18
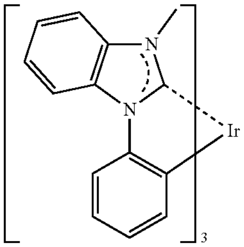
PD19
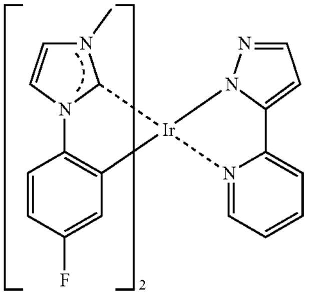
PD20
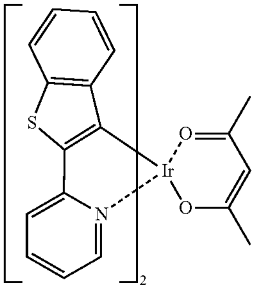

-continued

PD21

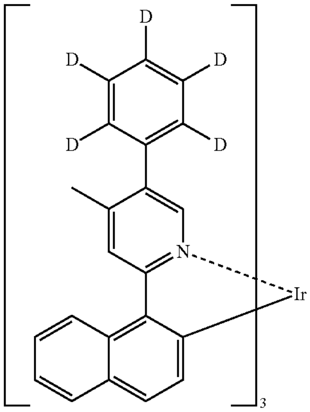

PD22

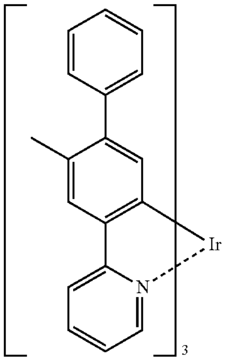

PD23

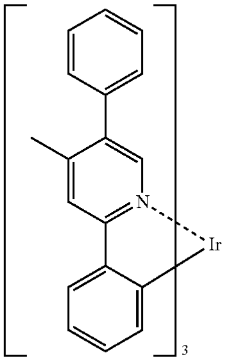

PD24

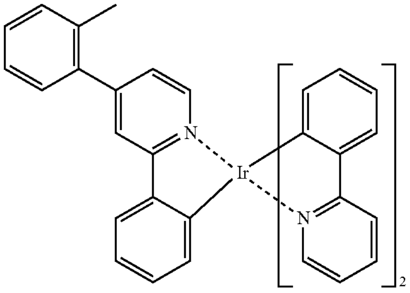

-continued

PD25

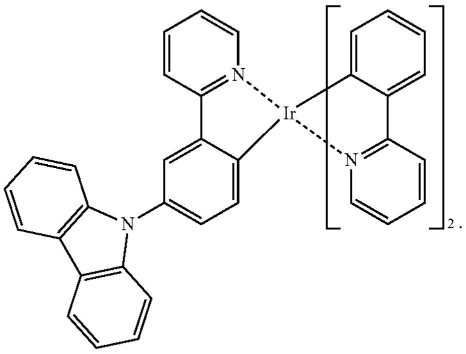

Fluorescent Dopant

The fluorescent dopant may include an amine group-containing compound, a styryl group-containing compound, or any combination thereof. In an embodiment, the fluorescent dopant may include a compound represented by Formula 501:

Formula 501

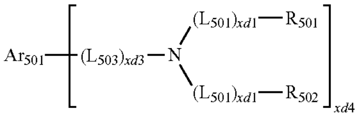

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together. In one or more embodiments, xd4 in Formula 501 may be 2.

In an embodiment, the fluorescent dopant may include: one of Compounds FD1 to FD36; DPVBi; DPAVBi; or any combination thereof:

FD1
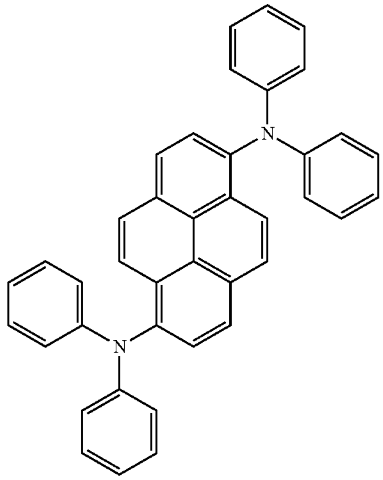
FD2
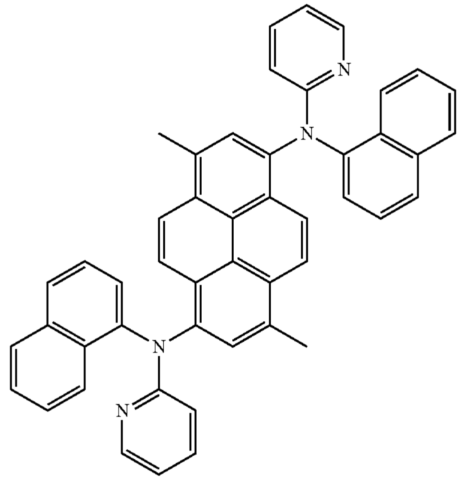
FD3
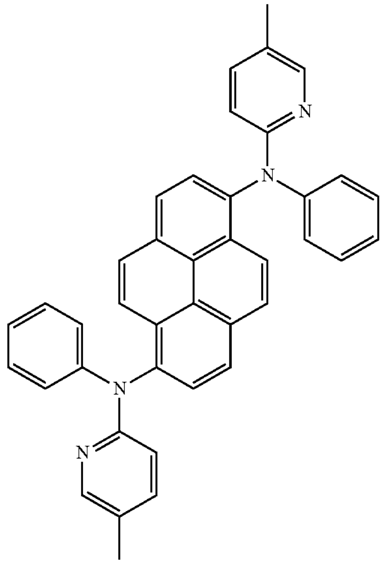
FD4
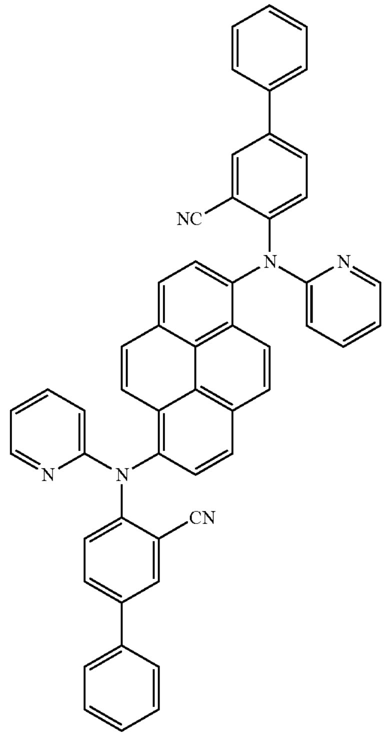
FD5
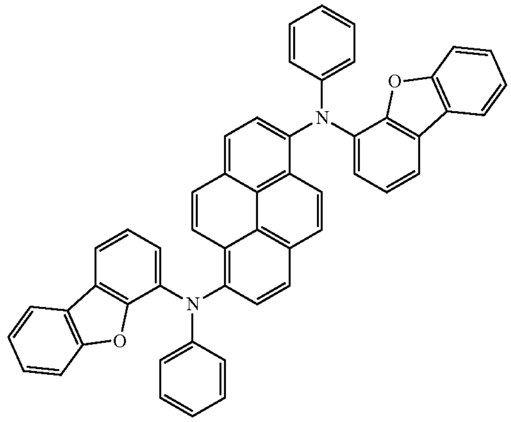
FD6
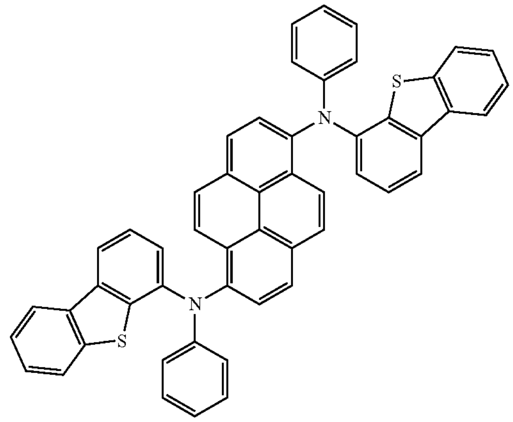

-continued
FD7
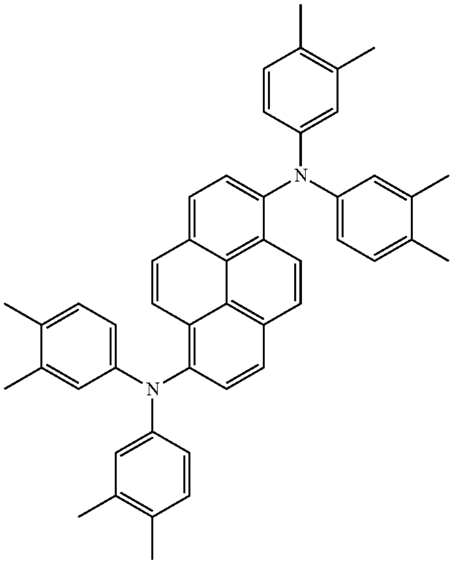
FD8
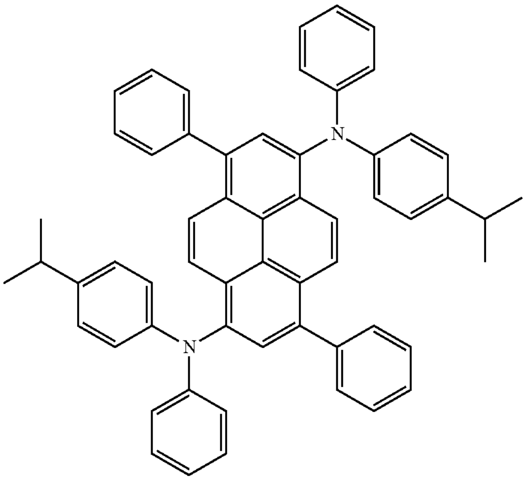
FD9
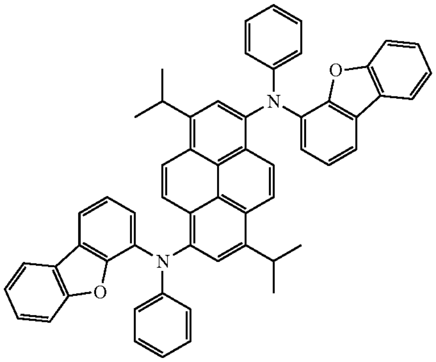
FD10
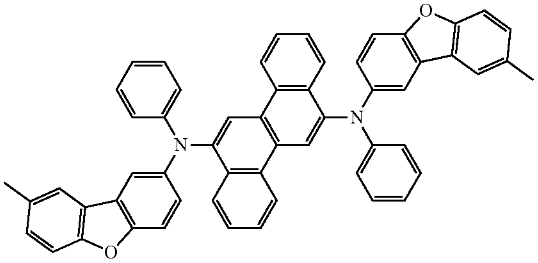
FD11
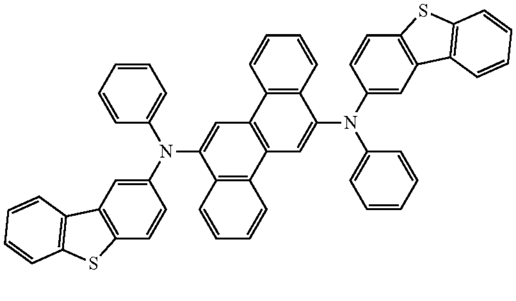
FD12
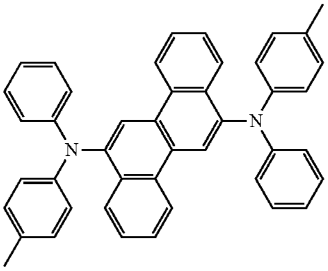
FD13
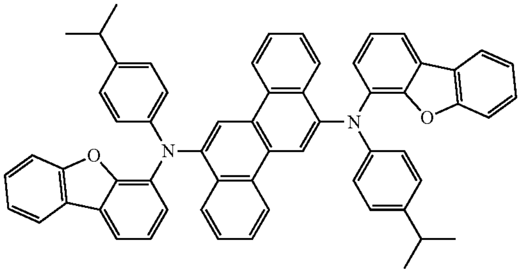
FD14
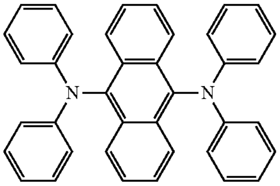

-continued
FD15
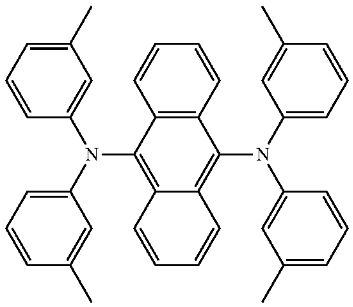
FD16
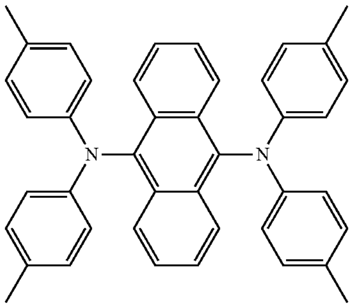
FD17
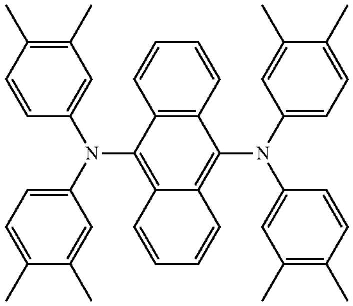
FD18
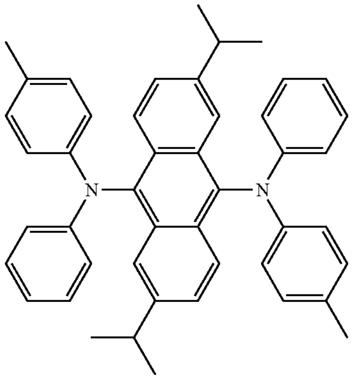
FD19
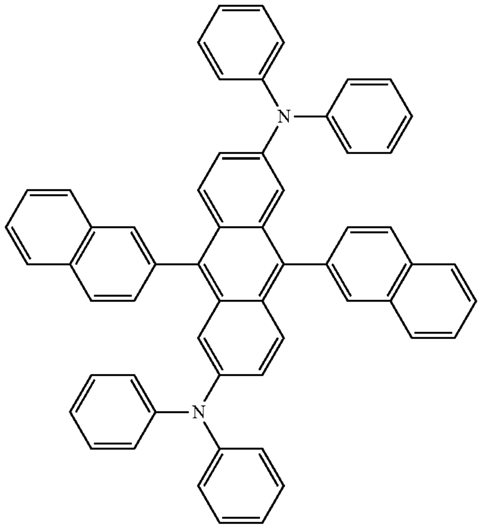
FD20
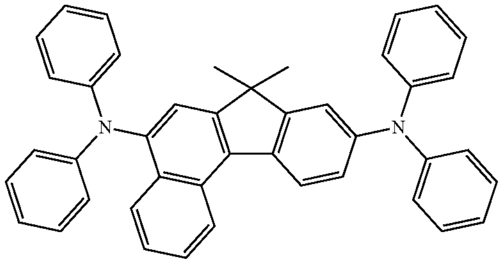
FD21
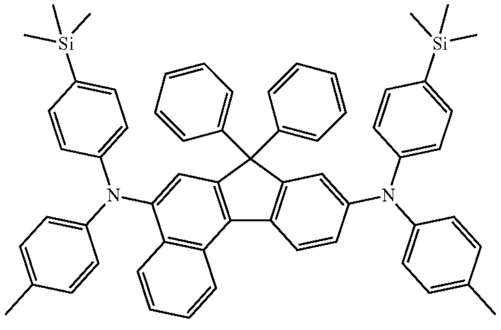
FD22
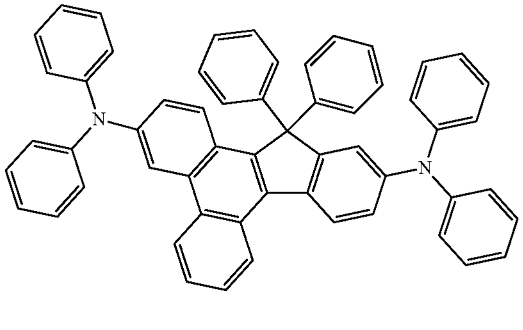

-continued
FD23
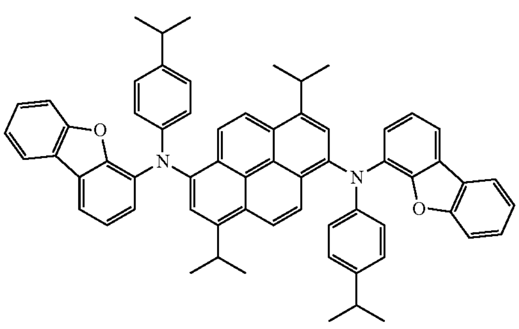
FD24
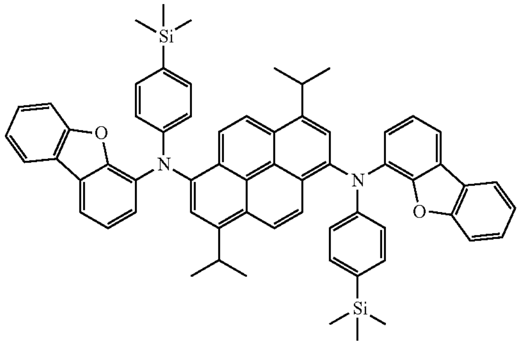
FD25
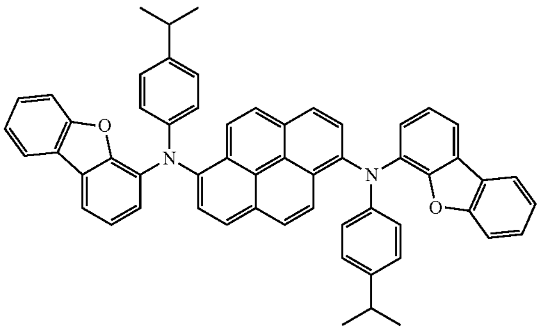
FD26
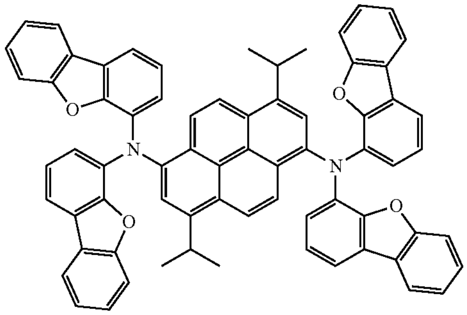
FD27
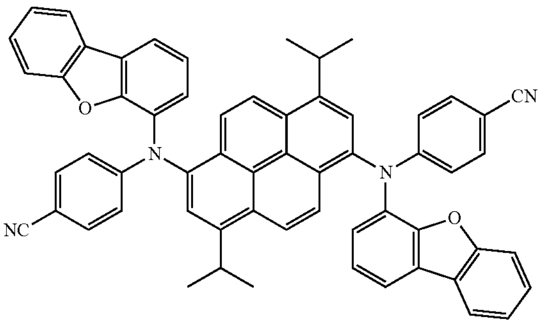
FD28
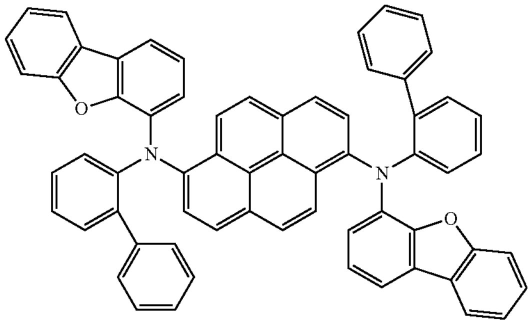
FD29
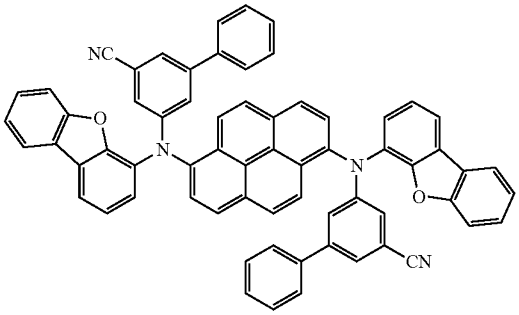
FD30
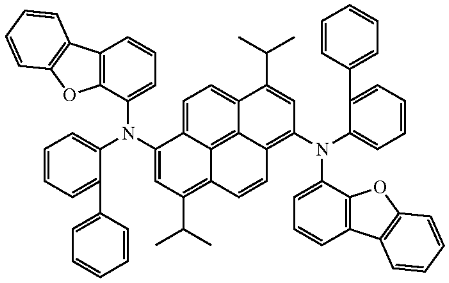

-continued
FD31
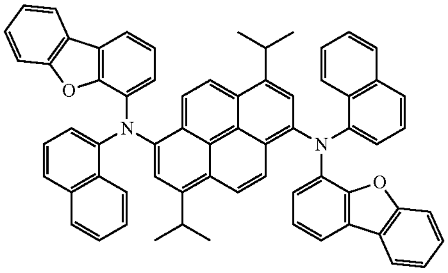
FD32
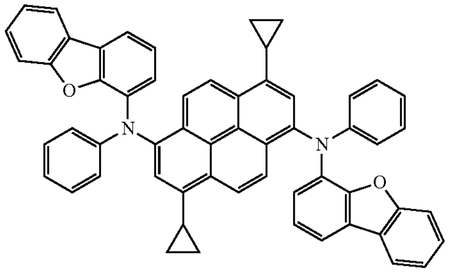
FD33
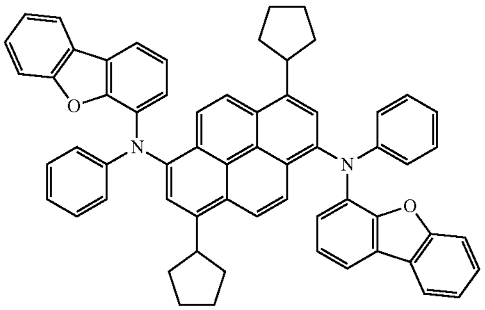
FD34
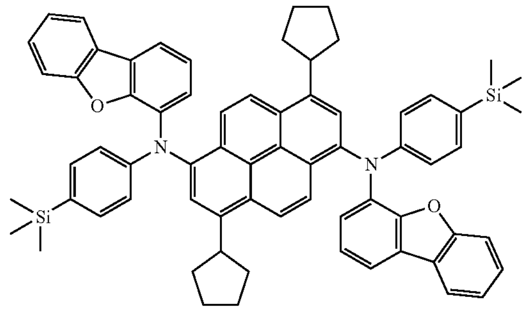
FD35
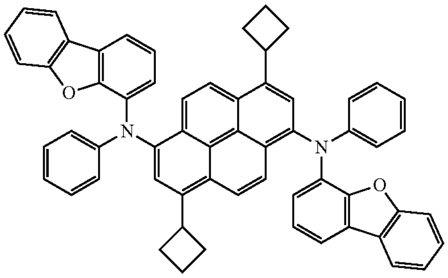
FD36
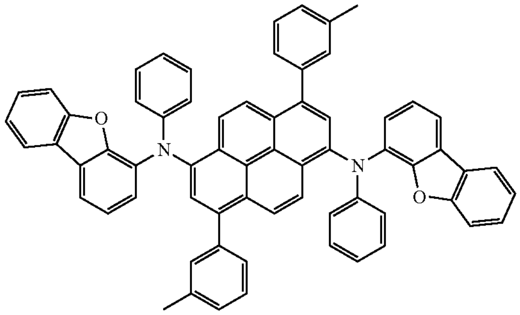
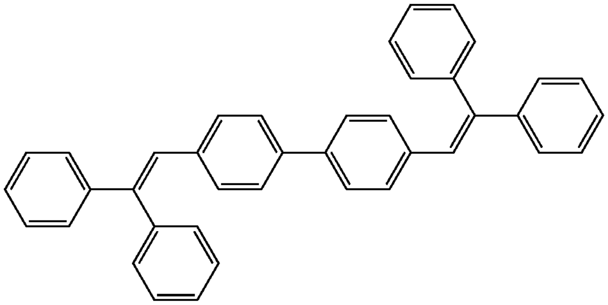
DPVBi
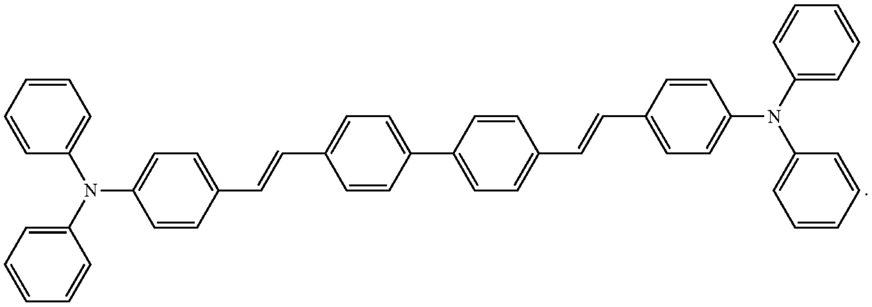
DPAVBi Delayed Fluorescence Material The emission layer may include a delayed fluorescence material. The delayed fluorescence material may be selected from compounds capable of emitting delayed fluorescence based on a delayed fluorescence emission mechanism. The delayed fluorescence material included in the emission layer may act as a host or a dopant depending on the type of other materials included in the emission layer.

In an embodiment, the difference between the triplet energy level in electron volt (eV) of the delayed fluorescence material and the singlet energy level in electron volt (eV) of the delayed fluorescence material may be greater than or equal to about 0 eV and less than or equal to about 0.5 eV. When the difference between the triplet energy level in electron volt (eV) of the delayed fluorescence material and the singlet energy level in electron volt (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

In an embodiment, the delayed fluorescence material may include i) a material including at least one electron donor (for example, a n electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

Examples of the delayed fluorescence material may include at least one of Compounds DF1 to DF9:

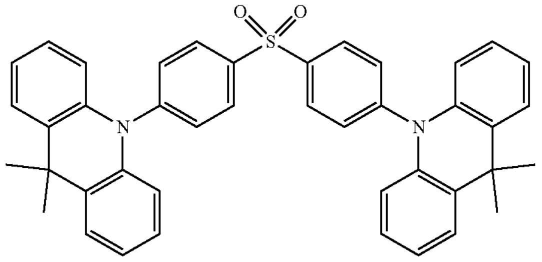

DF1(DMAC-DPS)

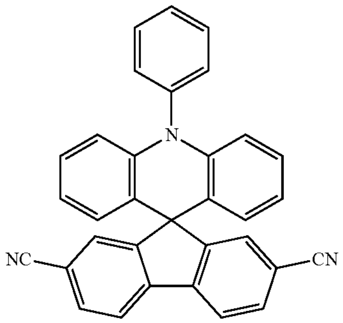

DF2(ACRFLCN)

-continued

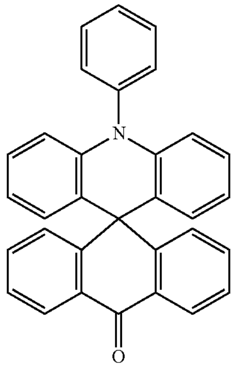

DF3(ACRSA)

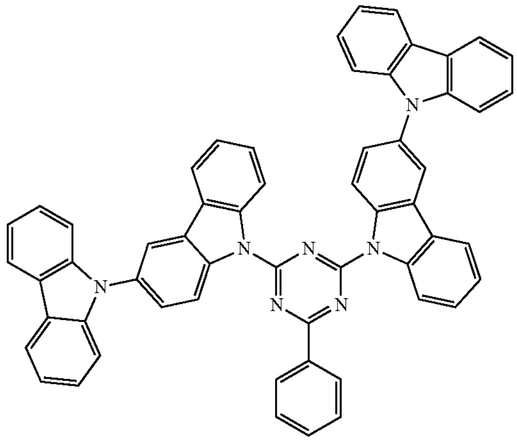

DF4(CC2TA)

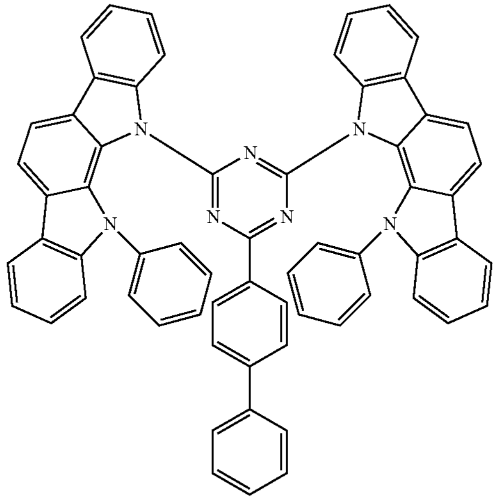

DF5(PIC-TRZ)

-continued

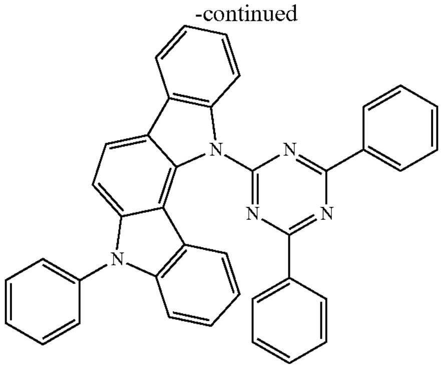

DF6(PIC-TRZZ)

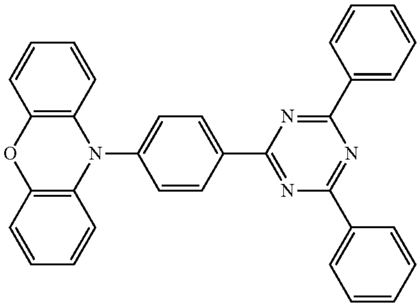

DF7(PXZ-TRZ)

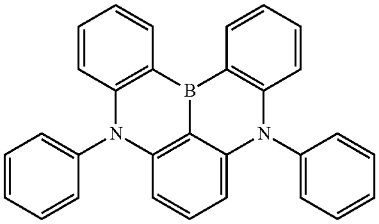

DF8(DABNA-1)

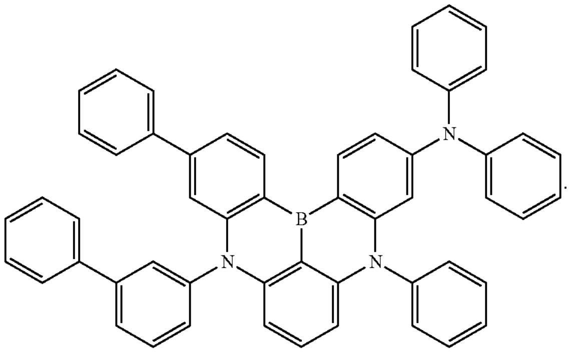

DF9(DABNA-2)

Quantum Dot

The emission layer may include a quantum dot. The diameter of the quantum dot may be, for example, in a range of about 1 nm to about 10 nm. The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles may be controlled through a process which is more easily performed than vapor deposition methods, such as metal organic chemical vapor deposition (MOCVD) or molecular beam epitaxy (MBE), and which requires low costs.

The quantum dot may include semiconductor compounds of Groups II-VI, semiconductor compounds of Groups III-V, semiconductor compounds of Groups III-VI, semiconductor compounds of Groups I, III, and VI, semiconductor compounds of Groups IV-VI, an element or a compound of Group IV; or any combination thereof.

Examples of the semiconductor compound of Groups II-VI are a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the semiconductor compound of Groups III-V are a binary compound, such as GaN, GaP, GaAs, GaSb, AlN, AlP, AlAs, AlSb, InN, InP, InAs, InSb, or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, or the like; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or the like; or any combination thereof. The semiconductor compound of Groups III-V may further include Group II elements. Examples of the semiconductor compound of Groups III-V further including Group II elements are InZnP, InGaZnP, InAlZnP, etc.

Examples of the semiconductor compound of Groups III-VI are a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; and any combination thereof. Examples of the semiconductor compound of Groups I, III, and VI are a ternary compound, such as AgInS, $AgInS_2$, CuInS, $CuInS_2$, $CuGaO_2$, $AgGaO_2$, or $AgAlO_2$; or any combination thereof.

Examples of the semiconductor compound of Groups IV-VI are a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof. The element or compound of Group IV may include a single element compound, such as Si or Ge; a binary compound, such as SiC or SiGe; or any combination thereof.

Each element included in a multi-element compound such as the binary compound, ternary compound and quaternary compound, may exist in a particle with a uniform concentration or non-uniform concentration. The quantum dot may have a single structure or a dual core-shell structure. In the case of the quantum dot having a single structure, the concentration of each element included in the corresponding quantum dot is uniform. In one or more embodiments, the material contained in the core and the material contained in the shell may be different from each other.

The shell of the quantum dot may act as a protective layer to prevent chemical degeneration of the core to maintain semiconductor characteristics and/or as a charging layer to impart electrophoretic characteristics to the quantum dot. The shell may be a single layer or a multi-layer. The interface between the core and the shell may have a concentration gradient that decreases toward the center of the element present in the shell.

Examples of the shell of the quantum dot may be an oxide of a metal, a metalloid, or a non-metal, a semiconductor compound, and any combination thereof. Examples of the oxide of the metal, metalloid, or non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and any combination thereof. Examples of the semiconductor compound are, as described herein, semiconductor compounds of Groups II-VI; semiconductor compounds of Groups III-V; semiconductor compounds of Groups III-VI; semiconductor compounds of Groups I, III, and VI; semiconductor compounds of Groups IV-VI; and any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The full width at half maximum (FWHM) of an emission wavelength spectrum of the quantum dot may be about 45 nm or less, for example, about 40 nm or less, for example, about 30 nm or less, and within these ranges, color purity or color gamut may be increased. In addition, since the light emitted through the quantum dot is emitted in all directions, the wide viewing angle can be improved.

In addition, the quantum dot may be a generally spherical particle, a generally pyramidal particle, a generally multi-armed particle, a generally cubic nanoparticle, a generally nanotube-shaped particle, a generally nanowire-shaped particle, a generally nanofiber-shaped particle, or a generally nanoplate-shaped particle.

Because the energy band gap may be adjusted by controlling the size of the quantum dot, light having various wavelength bands may be obtained from the quantum dot emission layer. Therefore, by using quantum dots of different sizes, a light-emitting device that emits light of various wavelengths may be implemented. In detail, the size of the quantum dot may be selected to emit red, green and/or blue light. In addition, the size of the quantum dot may be configured to emit white light by combining light of various colors.

Electron Transport Region in Interlayer 130

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials. The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

In an embodiment, the electron transport region (for example, the buffer layer, the hole blocking layer, the electron control layer, or the electron transport layer in the electron transport region) may include a metal-free compound including at least one $\pi$ electron-deficient nitrogen-containing $C_1$-$C_{60}$ cyclic group.

In an embodiment, the electron transport region may include a compound represented by Formula 601:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ are each the same as described in connection with $Q_1$, xe21 may be 1, 2, 3, 4, or 5, and at least one of $Ar_{601}$, $L_{601}$, and $R_{601}$ may each independently be a $\pi$ electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked to each other via a single bond. In one or more embodiments, $Ar_{601}$ in Formula 601 may be a substituted or unsubstituted anthracene group. In one or more embodiments, the electron transport region may include a compound represented by Formula 601-1:

Formula 601-1

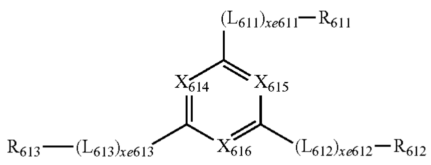

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ are each the same as described in connection with $L_{601}$, $xe_{611}$ to $xe_{613}$ are each the same as described in connection with xe1, $R_{611}$ to $R_{613}$ are each the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), tris-(8-hydroxyquinoline)aluminum ($Alq_3$), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), TSPO1, TPBI, or any combination thereof:
ET1
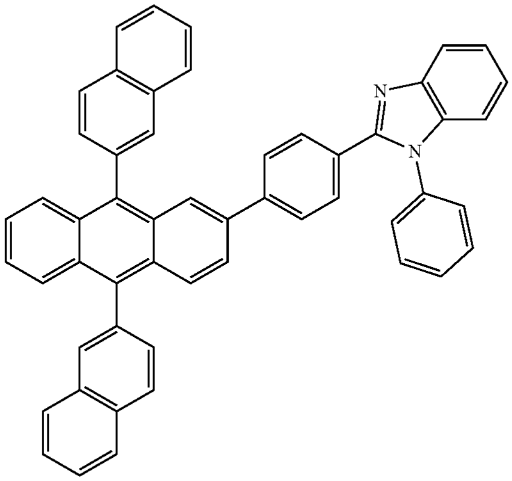
ET2
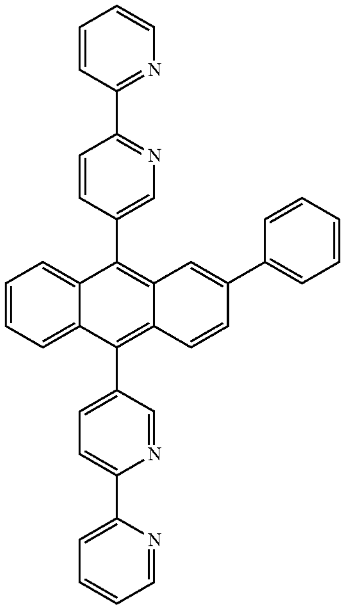
-continued
ET3
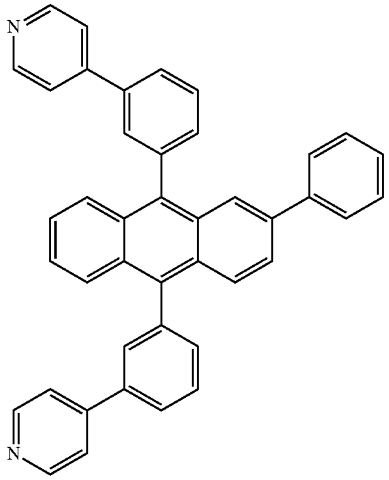
ET4
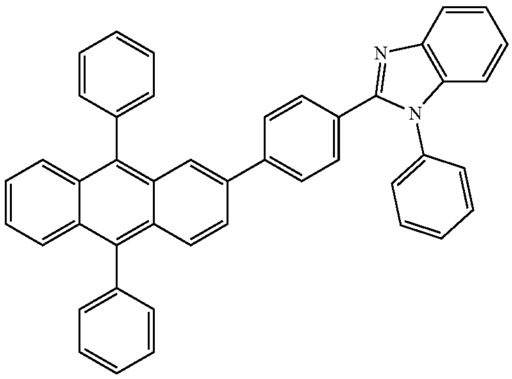
ET5
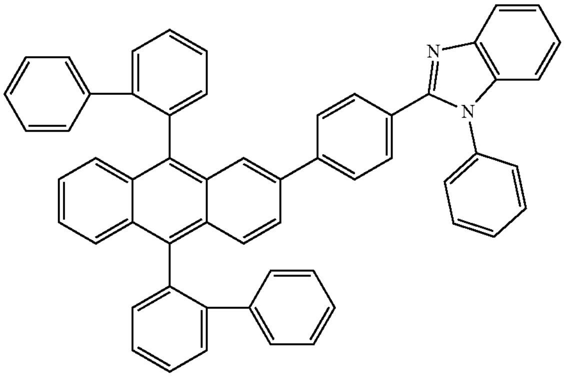

ET6
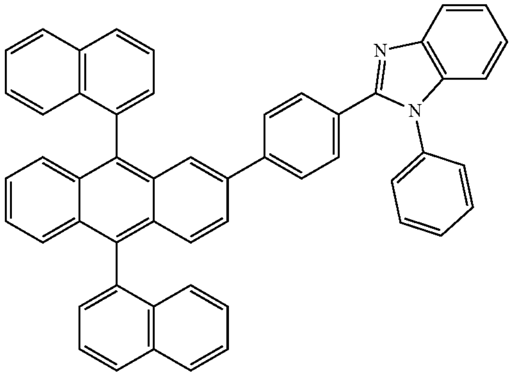
ET7
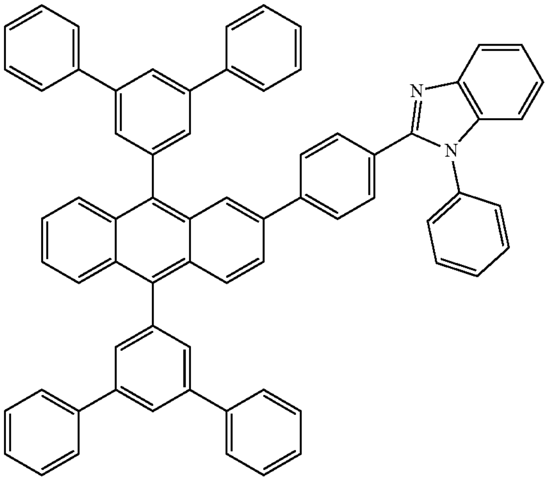
ET8
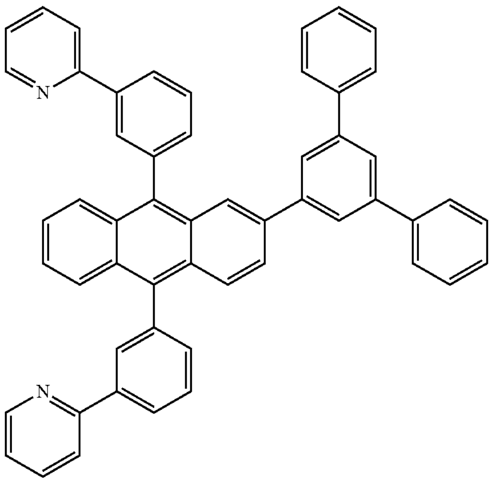
ET9
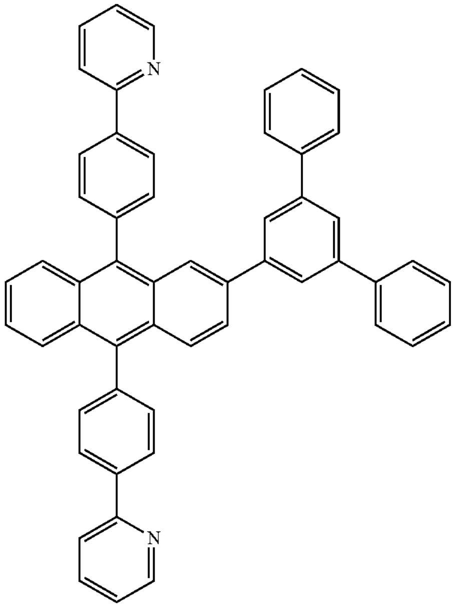
ET10
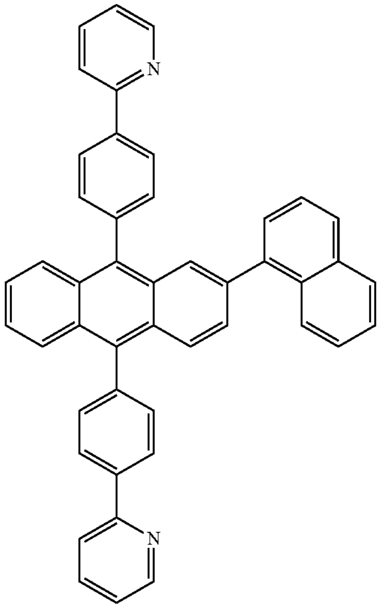

162
-continued
ET11
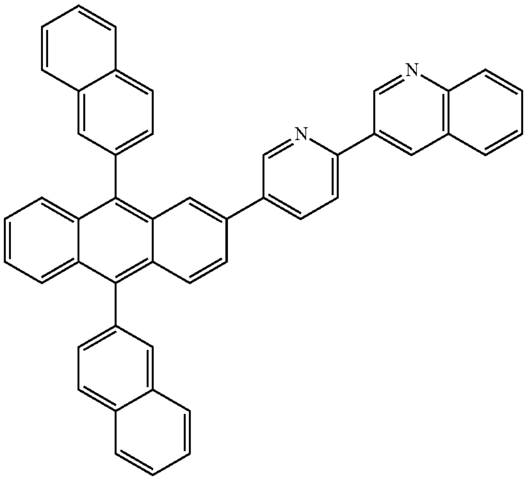
ET12
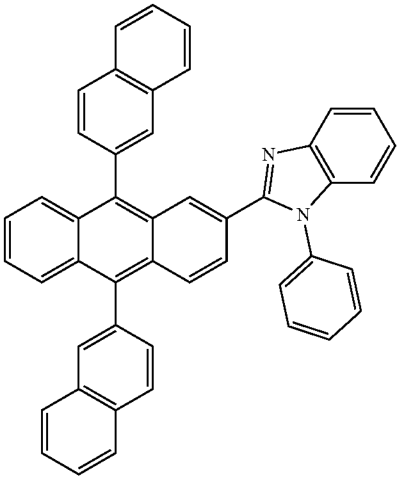
ET13
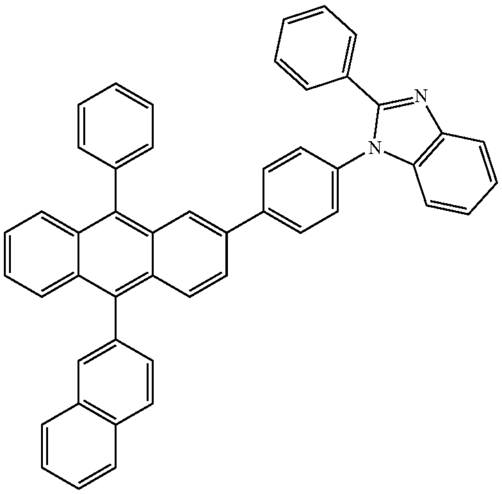
ET14
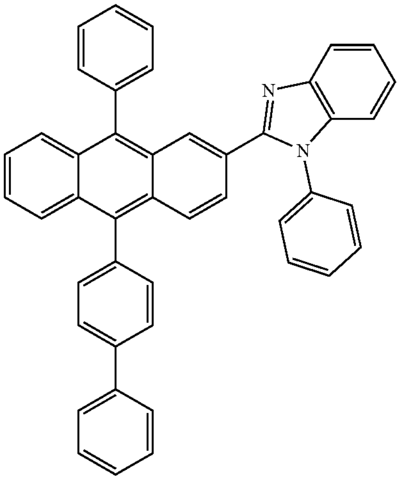
ET15
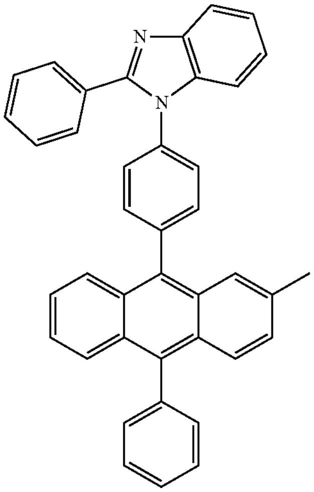
ET16
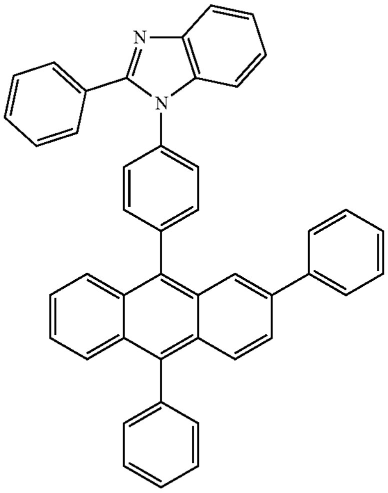

-continued
ET17
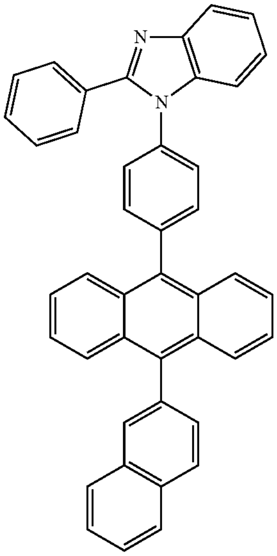
ET18
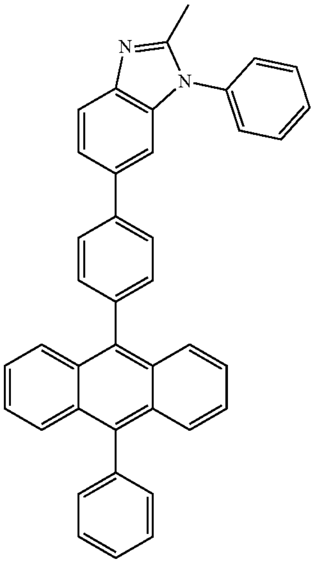
ET19
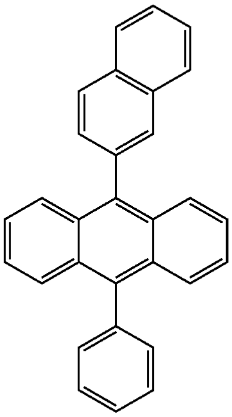
-continued
ET20
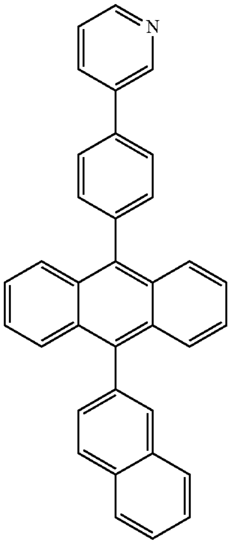
ET21
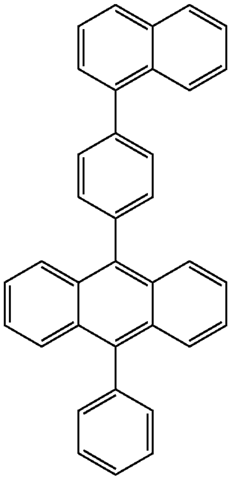
ET22
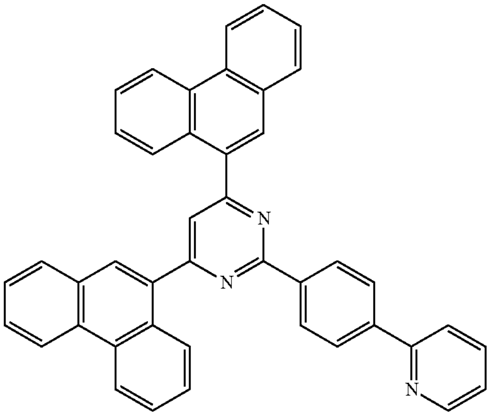

-continued
ET23
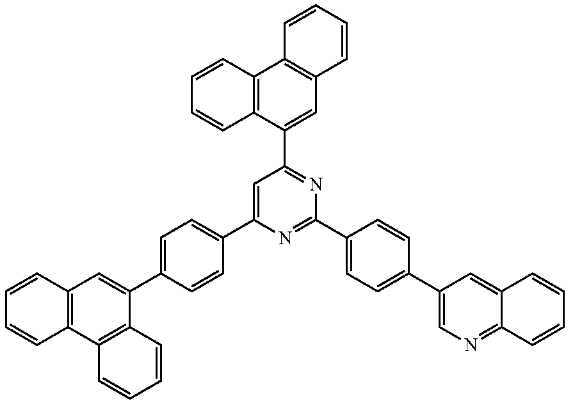
ET24
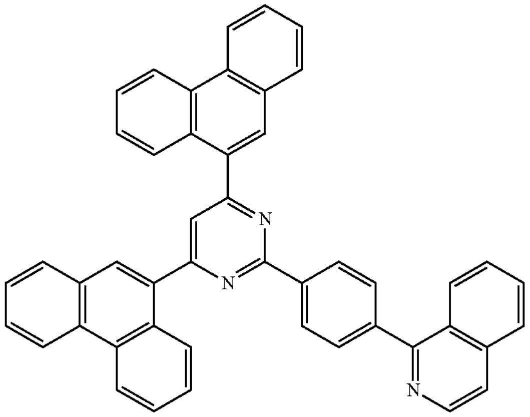
ET25
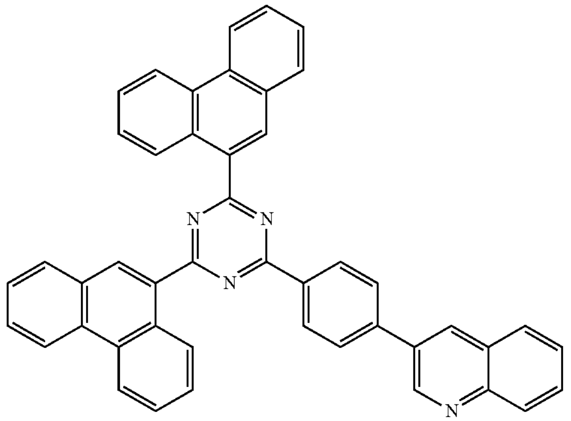
-continued
ET26
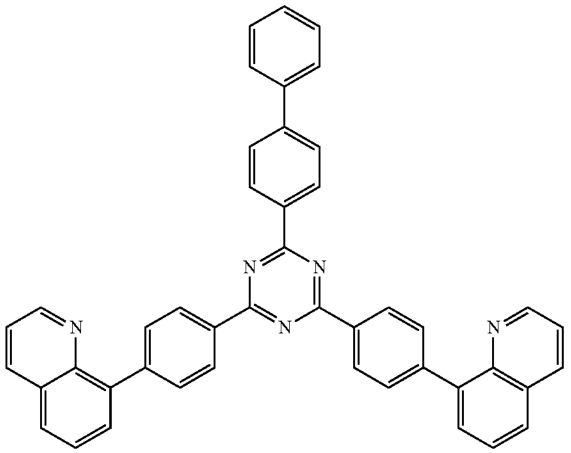
ET27
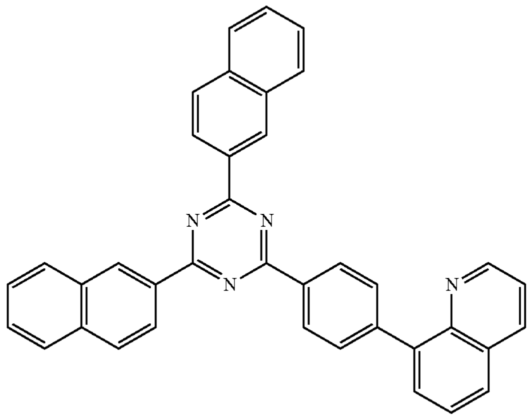
ET28
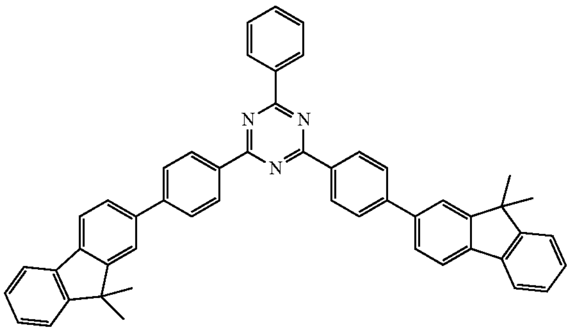

-continued
ET29
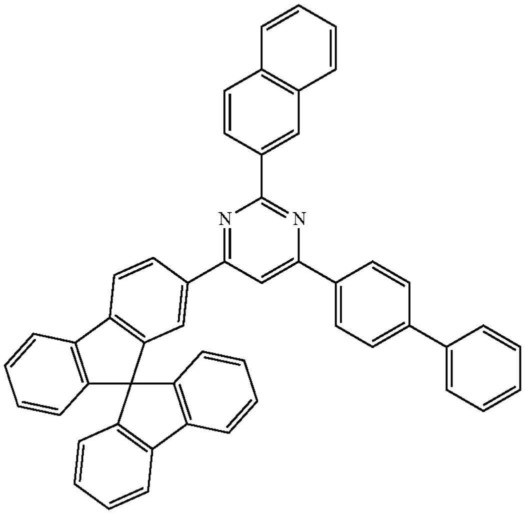
ET30
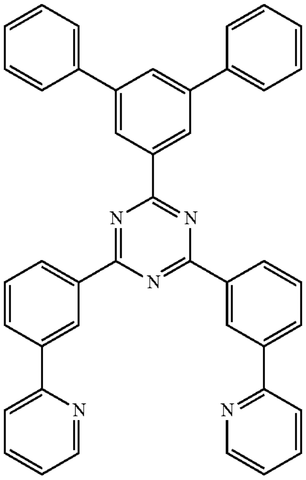
ET31
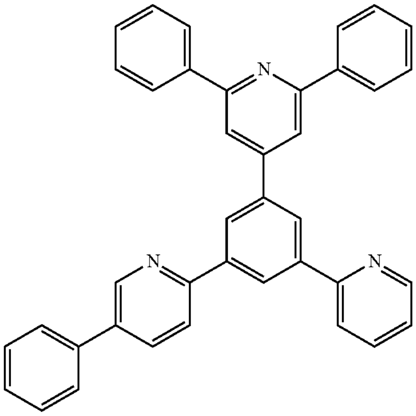
-continued
ET32
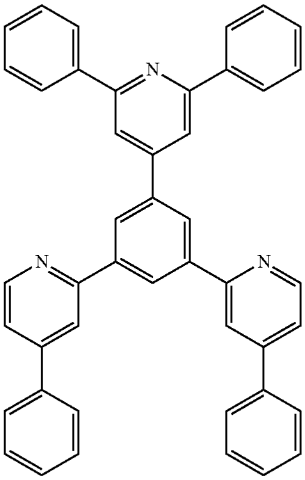
ET33
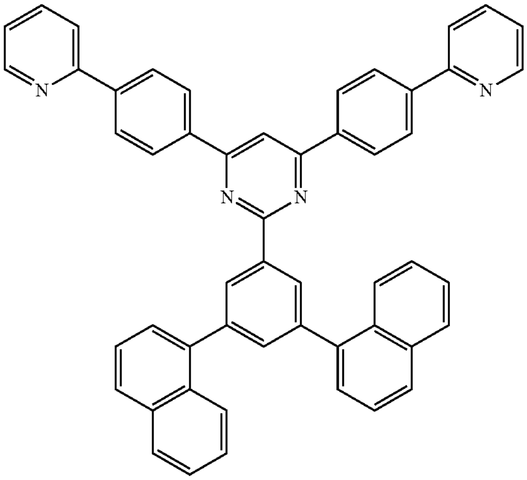
ET34
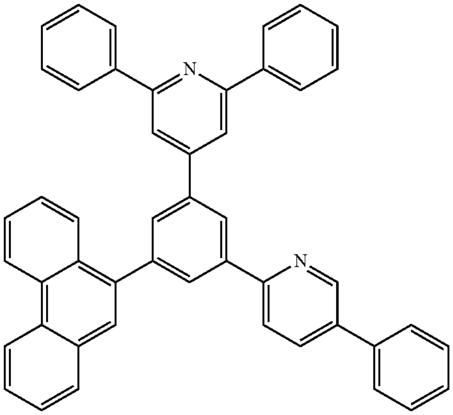

-continued
ET35
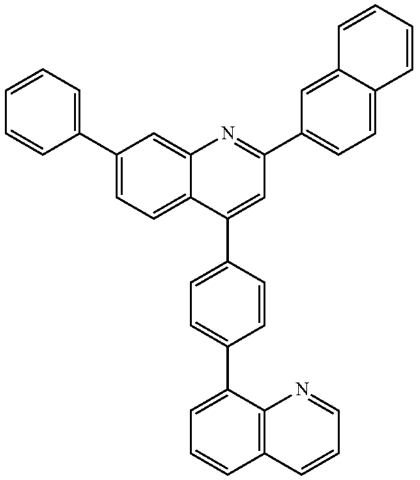
ET36
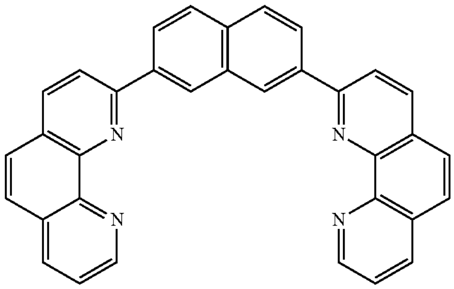
ET37
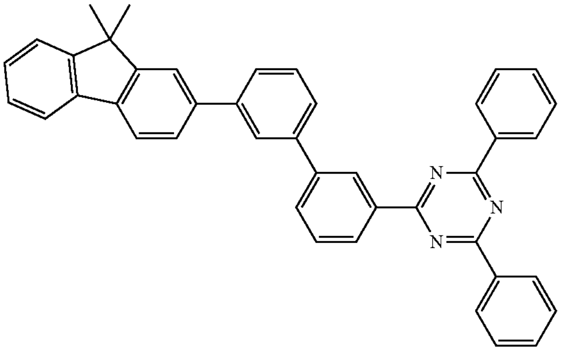
ET38
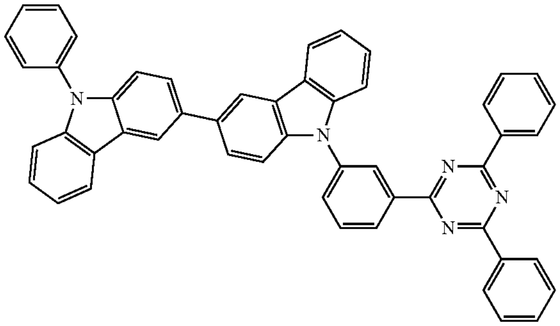
-continued
ET39
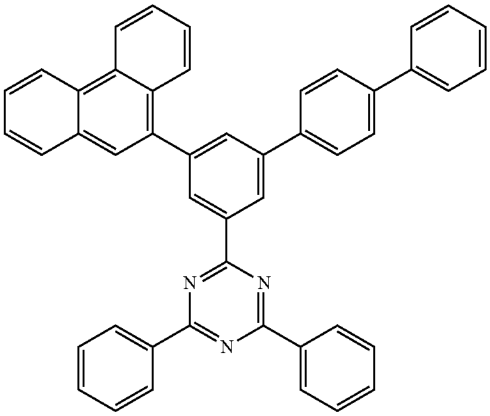
ET40
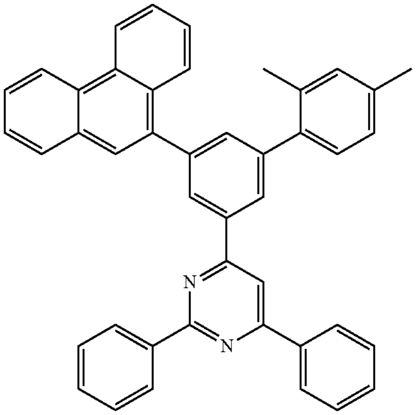
ET41
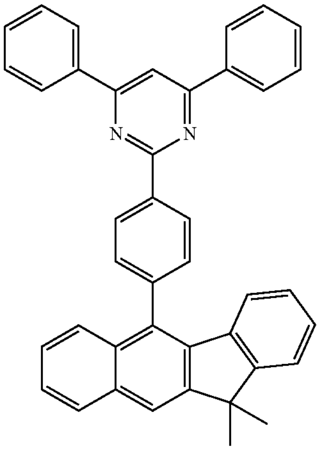

-continued
ET42
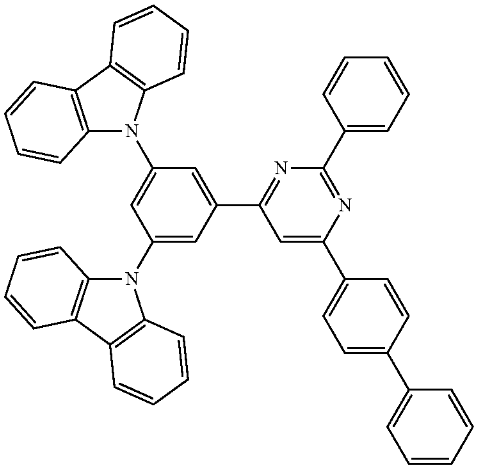
ET43
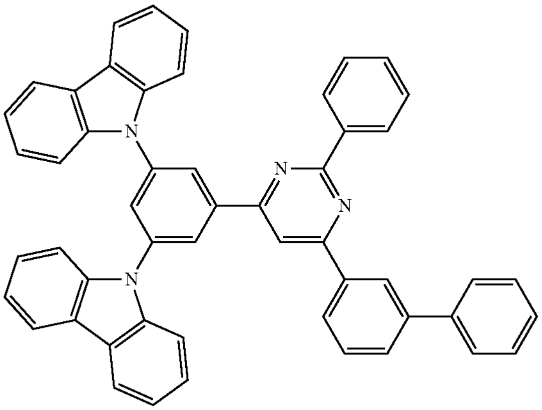
ET44
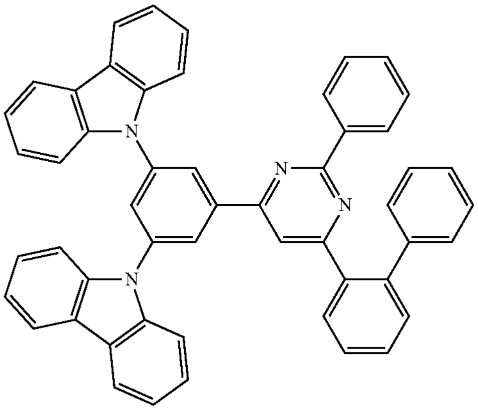
ET45
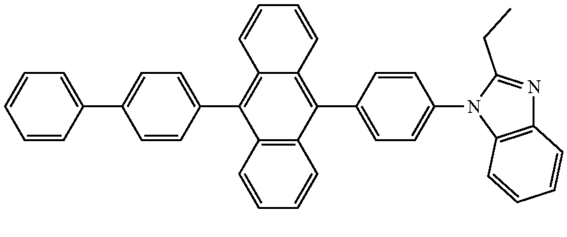
-continued
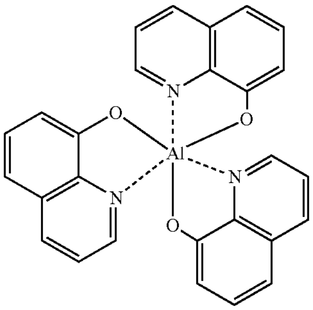
$Alq_3$
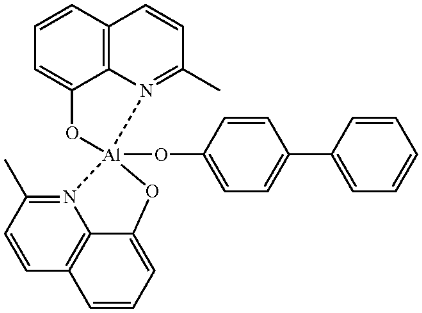
BAlq
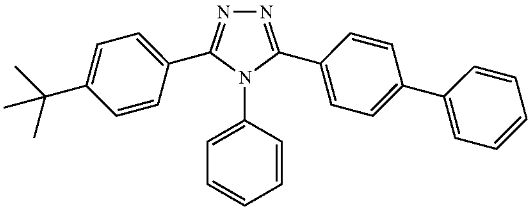
TAZ
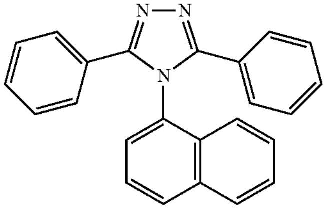
NTAZ
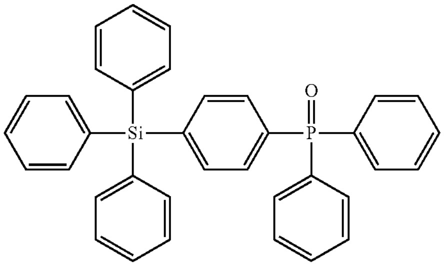
TSPO1

-continued

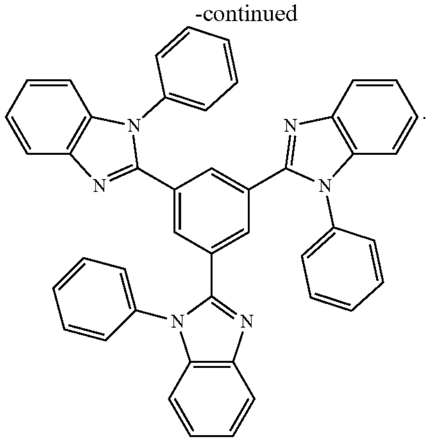

TPBI

The thickness of the electron transport region may be from about 160 Å to about 5,000 Å, for example, from about 100 Å to about 4,000 Å. When the electron transport region includes the buffer layer, the hole blocking layer, the electron control layer, the electron transport layer, or any combination thereof, the thickness of the buffer layer, the hole blocking layer, or the electron control layer may each independently be from about 20 Å to about 1,000 Å, for example, about 30 Å to about 300 Å, and the thickness of the electron transport layer may be from about 100 Å to about 1,000 Å, for example, about 150 Å to about 500 Å. When the thicknesses of the buffer layer, the hole blocking layer, the electron control layer, the electron transport layer and/or the electron transport layer are within the ranges described above, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of the alkali metal complex may be a Li ion, a Na ion, a K ion, a Rb ion, or a Cs ion, and the metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (lithium quinolate, LiQ) or ET-D2:

ET-D1

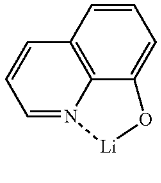

-continued

ET-D2

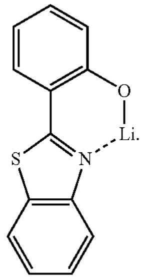

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof. The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include a lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In an embodiment, the electron injection layer may consist of i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, an RbI:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

The thickness of the electron injection layer may be in a range of about 1 Å to about 100 Å, and, for example, about 3 Å to about 90 Å. When the thickness of the electron injection layer is within the range described above, satisfactory electron injection characteristics may be obtained without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), an ITO, an IZO, or any combination thereof. The second electrode 150 may be a transmissive electrode, a semi-transmissive electrode, or a reflective electrode. The second electrode 150 may have a single-layered structure or a multi-layered structure including two or more layers.

Capping Layer

A first capping layer may be located outside the first electrode 110, and/or a second capping layer may be located outside the second electrode 150. In detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which is a semi-transmissive electrode or a transmissive electrode, and the first capping layer or light generated in an emission layer of the interlayer 130 of the light-emitting device 10 may be extracted toward the outside through the second electrode 150, which is a semi-transmissive electrode or a transmissive electrode, and the second capping layer.

Although not wanting to bound by theory, the first capping layer and the second capping layer may increase external emission efficiency according to the principle of constructive interference. Accordingly, the light extraction efficiency of the light-emitting device 10 is increased, so that the emission efficiency of the light-emitting device 10 may be improved. Each of the first capping layer and the second capping layer may include a material having a refractive index (at 589 nm) of about 1.6 or more. Each of the first capping layer and the second capping layer may include the heterocyclic compound represented by Formula 1.

The first capping layer and the second capping layer may each independently be an organic capping layer including an organic material, an inorganic capping layer including an inorganic material, or an organic-inorganic composite capping layer including an organic material and an inorganic material.

At least one selected from the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound. In an embodiment, at least one of the first capping layer and the second capping layer may each independently include a compound represented by Formula 201, a compound represented by Formula 202, or any combination thereof.

In one or more embodiments, at least one of the first capping layer and the second capping layer may each independently include one of Compounds HT28 to HT33, one of Compounds CP1 to CP6, N4,N4'-di(naphthalen-2-yl)-N4,N4'-diphenyl-[1,1'-biphenyl]-4,4'-diamine (β-NPB), or any combination thereof:

CP1

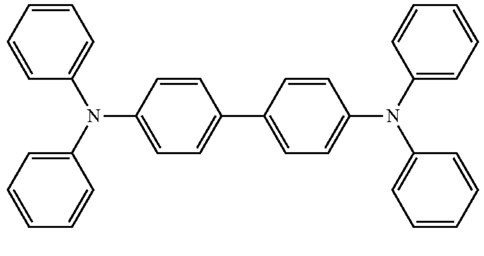

CP2

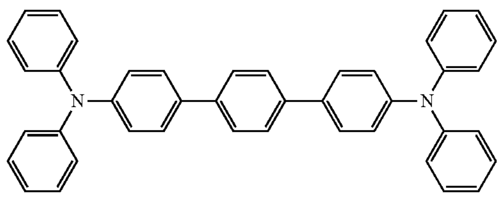

-continued

CP3

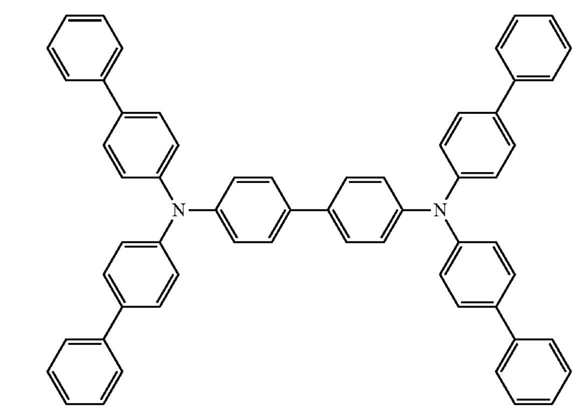

CP4

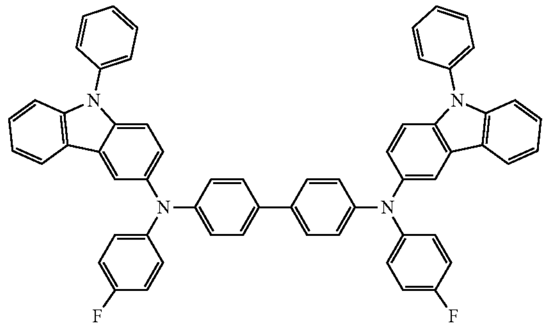

CP5

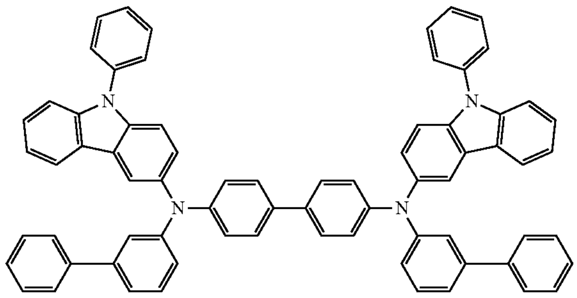

CP6

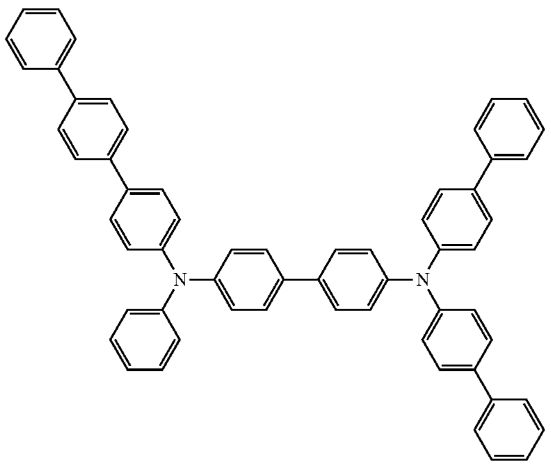

-continued

β-NPB

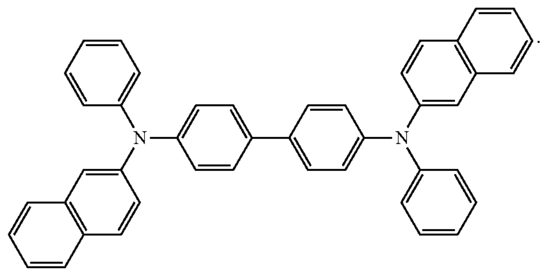

Electronic Apparatus

The light-emitting device 10 may be included in various electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device 10, i) a color filter, ii) a color conversion layer, or iii) a color filter and a color conversion layer. The color filter and/or the color conversion layer may be located in at least one traveling direction of light emitted from the light-emitting device 10. In an embodiment, the light emitted from the light-emitting device 10 may be blue light or white light. The light-emitting device 10 may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas. The color filter may further include a plurality of color filter areas and light-shielding patterns located among the color filter areas, and the color conversion layer may include a plurality of color conversion areas and light-shielding patterns located among the color conversion areas.

The color filter areas (or the color conversion areas) may include a first area emitting first-color light, a second area emitting second-color light, and/or a third area emitting third-color light, and the first-color light, the second-color light, and/or the third-color light may have different maximum emission wavelengths from one another. In an embodiment, the first-color light may be red light, the second-color light may be green light, and the third-color light may be blue light. In an embodiment, the color filter areas (or the color conversion areas) may include quantum dots. In detail, the first area may include a red quantum dot, the second area may include a green quantum dot, and the third area may not include a quantum dot. The quantum dot is the same as described herein. The first area, the second area, and/or the third area may each include a scatter.

In one or more embodiments, the light-emitting device 10 may emit a first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. In detail, the first light may be blue light, the first first-color light may be red light, the second first-color light may be green light, and the third first-color light may be blue light.

The electronic apparatus may further include a thin-film transistor in addition to the light-emitting device 10 as described above. The thin-film transistor may include a source electrode, a drain electrode, and an activation layer, wherein any one of the source electrode and the drain electrode may be electrically connected to any one of the first electrode and the second electrode of the light-emitting device 10.

The thin-film transistor may further include a gate electrode, a gate insulating film, etc. The activation layer may include a crystalline silicon, an amorphous silicon, an organic semiconductor, an oxide semiconductor, or the like.

The electronic apparatus may further include a sealing portion for sealing the light-emitting device 10. The sealing portion and/or the color conversion layer may be placed between the color filter and the light-emitting device 10. The sealing portion allows light from the light-emitting device 10 to be extracted to the outside, while simultaneously preventing ambient air and moisture from penetrating into the light-emitting device 10. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.). The authentication apparatus may further include, in addition to the light-emitting device 10, a biometric information collector.

The electronic apparatus may take the form of or be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
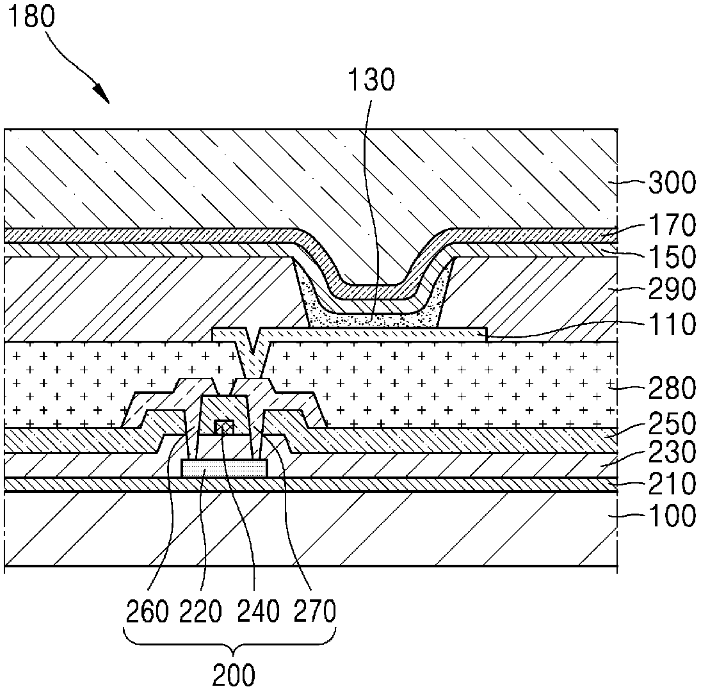
FIG. 2 is a schematic cross-sectional view of an embodiment of a light-emitting apparatus including a light-emitting device constructed according to the principles of the invention.
Figure 3:
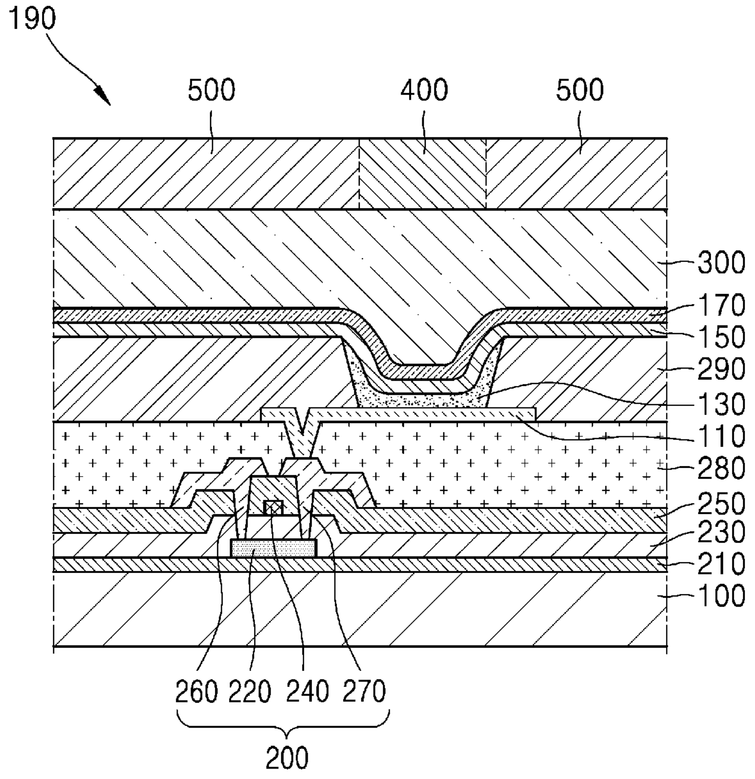
FIG. 3 is a schematic cross-sectional view of another embodiment of a light-emitting apparatus including a light-emitting device constructed according to the principles of the invention.

Description of FIGS. 2 and 3

FIG. 2 is a schematic cross-sectional view of an embodiment of a light-emitting apparatus including a light-emitting device constructed according to the principles of the invention.

The light-emitting apparatus 180 of FIG. 2 includes a substrate 100, a thin-film transistor (TFT) 200, a light-emitting device, and an encapsulation portion 300 that seals the light-emitting device 10.

The substrate 100 may be a flexible substrate, a glass substrate, or a metal substrate. A buffer layer 210 may be located on the substrate 100. The buffer layer 210 may prevent penetration of impurities through the substrate 100 and may provide a substantially flat surface on the substrate 100.

The TFT 200 may be located on the buffer layer 210. The TFT 200 may include an activation layer 220, a gate electrode 240, a source electrode 260, and a drain electrode 270.

The activation layer 220 may include an inorganic semiconductor such as a silicon or a polysilicon, an organic semiconductor, or an oxide semiconductor, and may include a source region, a drain region and a channel region. A gate insulating film 230 for insulating the activation layer 220 from the gate electrode 240 may be located on the activation layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT 200 is electrically connected to a light-emitting device 10 to drive the light-emitting device 10, and is covered by a passivation layer 280. The passivation layer 280 may include an inorganic insulating film, an organic insulating film, or any combination thereof. The light-emitting device 10 is provided on the passivation layer 280. The light-emitting device 10 may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel defining layer 290 containing an insulating material may be located on the first electrode 110. The pixel defining layer 290 exposes a region of the first electrode 110, and an interlayer 130 may be formed in the exposed region of the first electrode 110. The pixel defining layer 290 may be a polyimide or polyacrylic organic film. At least some layers of the interlayer 130 may extend beyond the upper portion of the pixel defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device 10 to protect the light-emitting device from moisture or oxygen. The encapsulation portion 300 may include: an inorganic film including a silicon nitride ($SiN_x$), a silicon oxide ($SiO_x$), an indium tin oxide, an indium zinc oxide, or any combination thereof, an organic film including a polyethylene terephthalate, a polyethylene naphthalate, a polycarbonate, a polyimide, a polyethylene sulfonate, a polyoxymethylene, a polyarylate, a hexamethyldisiloxane, an acrylic resin (for example, a polymethyl methacrylate, a polyacrylic acid, or the like), an epoxy-based resin (for example, an aliphatic glycidyl ether (AGE), or the like), or any combination thereof; or any combination of the inorganic film and the organic film.

FIG. 3 is a schematic cross-sectional view of another embodiment of a light-emitting apparatus including a light-emitting device constructed according to the principles of the invention.

The light-emitting apparatus 190 of FIG. 3 is the same as the light-emitting apparatus 180 of FIG. 2, except that a light-shielding pattern 500 and a functional region 400 are additionally located on the encapsulation portion 300. The functional region 400 may be a combination of i) a color filter area, ii) a color conversion area, or iii) a combination of the color filter area and the color conversion area. In an embodiment, the light-emitting device 10 included in the light-emitting apparatus 190 of FIG. 3 may be a tandem light-emitting device.

Manufacture Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

DEFINITION OF TERMS

The term "interlayer" as used herein refers to a single layer and/or all of a plurality of layers located between a first electrode and a second electrode of a light-emitting device.

As used herein, the expression "(an interlayer and/or a capping layer) includes at least one heterocyclic compound" as used herein may include a case in which "(an interlayer and/or a capping layer) includes identical heterocyclic compounds represented by Formula 1" and a case in which "(an organic layer) includes two or more different heterocyclic compounds represented by Formula 1."

The term "quantum dot" as used herein refers to a crystal of a semiconductor compound, and may include any material capable of emitting light of various emission wavelengths according to the size of the crystal.

As used herein, the term "atom" may mean an element or its corresponding radical bonded to one or more other atoms.

The terms "hydrogen" and "deuterium" refer to their respective atoms and corresponding radicals with the deuterium radical abbreviated "-D", and the terms "—F, —Cl, —Br, and —I" are radicals of, respectively, fluorine, chlorine, bromine, and iodine.

As used herein, a substituent for a monovalent group, e.g., alkyl, may also be, independently, a substituent for a corresponding divalent group, e.g., alkylene.

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are fused with each other. For example, the $C_1$-$C_{60}$ heterocyclic group has 3 to 61 ring-forming atoms.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

In an embodiment, the $C_3$-$C_{60}$ carbocyclic group may be i) a group TG1 or ii) a fused cyclic group in which two or more groups TG1 are fused with each other, for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spirobifluorene group, a benzofluorene group, an indenophenanthrene group, or an indenoanthracene group.

The $C_1$-$C_{60}$ heterocyclic group may be i) a group TG2, ii) a fused cyclic group in which two or more groups TG2 are fused with each other, or iii) a fused cyclic group in which at least one group TG2 and at least one group TG1 are fused with each other, for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.

The π electron-rich $C_3$-$C_{60}$ cyclic group may be i) a group TG1, ii) a fused cyclic group in which two or more groups TG1 are fused with each other, iii) a group TG3, iv) a fused cyclic group in which two or more groups TG3 are fused with each other, or v) a fused cyclic group in which at least one group TG3 and at least one group TG1 are fused with each other, for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.

The n electron-deficient nitrogen-containing $C_1$-$C_{60}$ cyclic group may be i) a group TG4, ii) a fused cyclic group in which two or more groups TG4 are fused with each other, iii) a fused cyclic group in which at least one group TG4 and at least one group TG1 are fused with each other, iv) a fused cyclic group in which at least one group TG4 and at least one group TG3 are fused with each other, or v) a fused cyclic group in which at least one group TG4, at least one group TG1, and at least one group TG3 are fused with one another, for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.

The group TG1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo [2.2.1]heptane) group, a norbornene group, a bicyclo[1.1.1] pentane group, a bicyclo[2.1.1]hexane group, a bicyclo [2.2.2]octane group, or a benzene group.

The group TG2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group.

The group TG3 may be a furan group, a thiophene group, a 1H-pyrrole group, a silole group, or a borole group.

The group TG4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group fused to any cyclic group or a polyvalent group (for example, a divalent group, a trivalent group, a tetravalent group, etc.), depending on the structure of a formula in connection with which the terms are used. In one or more embodiments, "a benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group, and examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and a substituted or unsubstituted divalent non-aromatic fused heteropolycyclic group.

The term "$C_1$-$C_{60}$ alkyl group" as used herein refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo [2.2.1]heptyl group), a bicyclo[1.1.1]pentyl group, a bicyclo [2.1.1]hexyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term $C_3$-$C_{10}$ cycloalkenyl group used herein refers to a monovalent cyclic group that has three to ten carbon atoms and at least one carbon-carbon double bond in the ring thereof and no aromaticity, and examples thereof are a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be fused with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be fused with each other.

The term "monovalent non-aromatic fused polycyclic group" as used herein refers to a monovalent group (for example, having 8 to 60 carbon atoms) having two or more rings fused to each other, only carbon atoms as ring-forming atoms, and no aromaticity in its entire molecular structure. Examples of the monovalent non-aromatic fused polycyclic group are an indenyl group, a fluorenyl group, a spiro-bifluorenyl group, a benzofluorenyl group, an indeno-phenanthrenyl group, and an indeno anthracenyl group. The term "divalent non-aromatic fused polycyclic group" as used herein refers to a divalent group having a structure corresponding to a monovalent non-aromatic fused polycyclic group.

The term "monovalent non-aromatic fused heteropolycyclic group" as used herein refers to a monovalent group (for example, having 1 to 60 carbon atoms) having two or more rings fused to each other, at least one heteroatom other than carbon atoms, as a ring-forming atom, and non-aromaticity in its entire molecular structure. Examples of the monovalent non-aromatic fused heteropolycyclic group are a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic heterofused polycyclic group" as used herein refers to a divalent group having a structure corresponding to a monovalent non-aromatic heterofused polycyclic group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$C_7$-$C_{60}$ aryl alkyl group" used herein refers to -$A_{104}A_{105}$ (where $A_{104}$ may be a $C_1$-$C_{54}$ alkylene group, and $A_{105}$ may be a $C_6$-$C_{59}$ aryl group), and the term $C_2$-$C_{60}$ heteroaryl alkyl group" used herein refers to -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $-Si(Q_{11})(Q_{12})(Q_{13})$, $-N(Q_{11})(Q_{12})$, $-B(Q_{11})(Q_{12})$, $-C(=O)(Q_{11})$, $-S(=O)_2(Q_{11})$, $-P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $-Si(Q_{21})(Q_{22})(Q_{23})$, $-N(Q_{21})(Q_{22})$, $-B(Q_{21}))(Q_{22})$, $-C(=O)(Q_{21})$, $-S(=O)_2(Q_{21})$, $-P(=O)(Q_{21})(Q_{22})$, or any combination thereof, or $-Si(Q_{31})(Q_{32})(Q_{33})$, $-N(Q_{31})(Q_{32})$, $-B(Q_3n)(Q_{32})$, $-C(=O)(Q_{31})$, $-S(=O)_2(Q_{31})$, or $-P(=O)(Q_{31})(Q_{32})$.

The variables $Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom are O, S, N, P, Si, B, Ge, Se, and any combination thereof.

The term "the third-row transition metal" used herein includes hafnium (Hf), tantalum (Ta), tungsten(W), rhenium (Re), osmium (Os), iridium (Ir), platinum (Pt), gold (Au), etc.

As used herein, the term "Ph" refers to a phenyl group, the term "Me" refers to a methyl group, the term "Et" refers to an ethyl group, the term "ter-Bu" or "Bu" refers to a tert-butyl group, and the term "OMe" refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group." In other words, the "terphenyl group" is a substituted phenyl group having, as a substituent, a $C_6$-$C_{60}$ aryl group substituted with a $C_6$-$C_{60}$ aryl group.

The abbreviation "eq." means "mole equivalent".

The symbols * and *' as used herein, unless defined otherwise, each refer to a binding site to a neighboring atom in a corresponding formula or moiety.

Hereinafter, a compound made according to the principles and illustrative embodiments of the invention and a light-emitting device including the same will be described in detail with reference to Synthesis Examples and Examples. The wording "B was used instead of A" used in describing Synthesis Examples refers to that an identical molar equivalent of B was used in place of A.

EXAMPLES

Synthesis Example of Compound 4

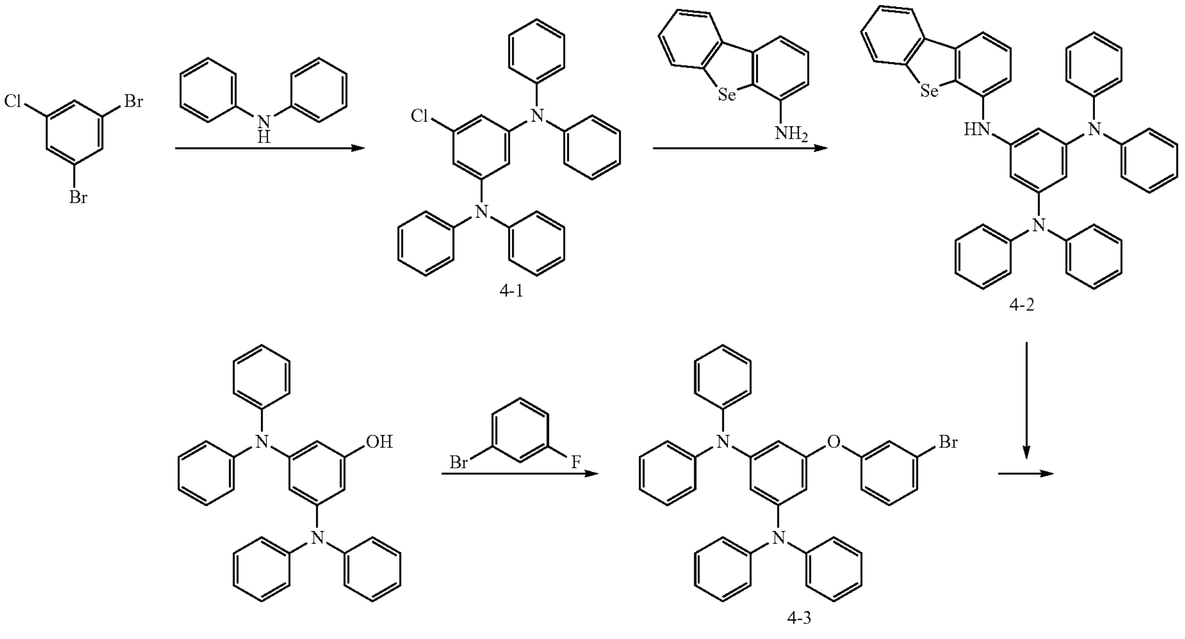

4-1

4-2

4-3

-continued

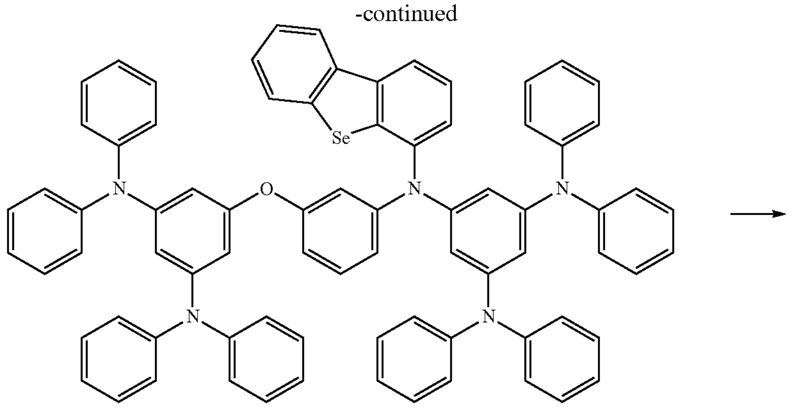

4-4

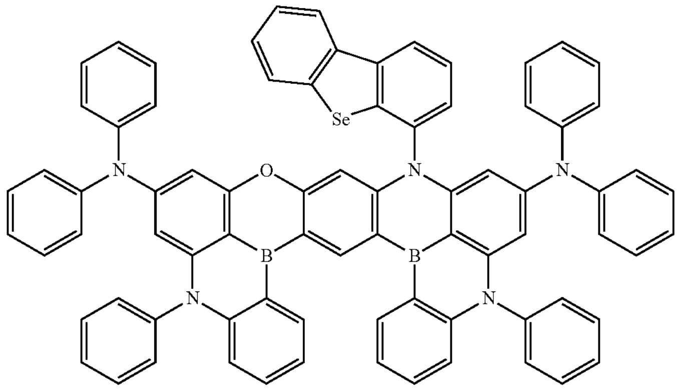

4

Synthesis of Intermediate 4-1

1,3-dibromo-5-chlorobenzene (1 eq), diphenylamine (2.1 eq), tris(dibenzylideneacetone)dipalladium(0) (0.05 eq), tri-tert-butylphosphine (0.1 eq), and sodium tert-butoxide (3 eq) were dissolved in toluene, and then stirred at 100° C. for 12 hours in a nitrogen atmosphere. After cooling, an organic layer obtained therefrom by washing three times with ethyl acetate and water was dried using $MgSO_4$, and then dried under reduced pressure. Subsequently, a separation-purification process was performed by column chromatography to obtain Intermediate 4-1. (Yield: 60%)

Synthesis of Intermediate 4-2

Intermediate 4-1 (1 eq), dibenzo[b,d]selenophene-4-amine (1.5 eq), tris(dibenzylideneacetone)dipalladium(0) (0.05 eq), tri-tert-butylphosphine (0.1 eq), and sodium tert-butoxide (3 eq) were dissolved in toluene, and then stirred at 100° C. for 12 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 4-2. (Yield: 60%)

Synthesis of Intermediate 4-3

3,5-bis(diphenylamino)phenol (1 eq), 1-bromo-3-fluorobenzene (2 eq), CuI (0.2 eq), $K_2CO_3$ (3 eq), and picolinic acid (0.4 eq) were dissolved in dimethylformamide (DMF), and then stirred at 160° C. for 20 hours. After cooling, DMF was removed therefrom by drying under reduced pressure. Next, an organic layer obtained therefrom by washing with ethyl acetate and water was dried using $MgSO_4$, and then dried under reduced pressure. Subsequently, a purification-recrystallization process was performed thereon by column chromatography (dichloromethane:n-hexane) to obtain Intermediate 4-3. (Yield: 55%)

Synthesis of Intermediate 4-4

Intermediate 4-2 (1 eq), Intermediate 4-3 (1 eq), tris(dibenzylideneacetone)dipalladium(0) (0.1 eq), tri-tert-butylphosphine (0.2 eq), and sodium tert-butoxide (3 eq) were dissolved in toluene, and then stirred at 110° C. for 20 hours in a nitrogen atmosphere. After cooling, toluene was removed therefrom by drying under reduced pressure. Next, an organic layer obtained therefrom by washing three times with ethyl acetate and water was dried using $MgSO_4$, and then dried under reduced pressure. A recrystallization process was performed thereon by column chromatography (dichloromethane:n-hexane) to obtain Intermediate 4-4. (Yield: 65%)

Synthesis of Compound 4

Intermediate 4-4 (1 eq) was dissolved in ortho dichlorobenzene, the flask was cooled to 0° C. in a nitrogen atmosphere, and then, boron tribromide ($BBr_3$) in an amount (4 eq) was slowly added dropwise thereto. After completion of the dropwise addition, the temperature was raised to 19° C., and the resultant solution was stirred for 24 hours. After cooling to 0° C., triethylamine was slowly added dropwise into the flask until the exotherm stopped to terminate the reaction. Next, hexane was added thereto to cause precipitation, and a solid was obtained therefrom by filtration. The obtained solid was purified by silica filtration, and then purified by a methylene chloride and n-hexane (MC/Hex) recrystallization to obtain Compound 4. Next, the final purification process was performed thereon by sublimation purification. (Yield after sublimation: 3%)

Synthesis Example of Compound 13

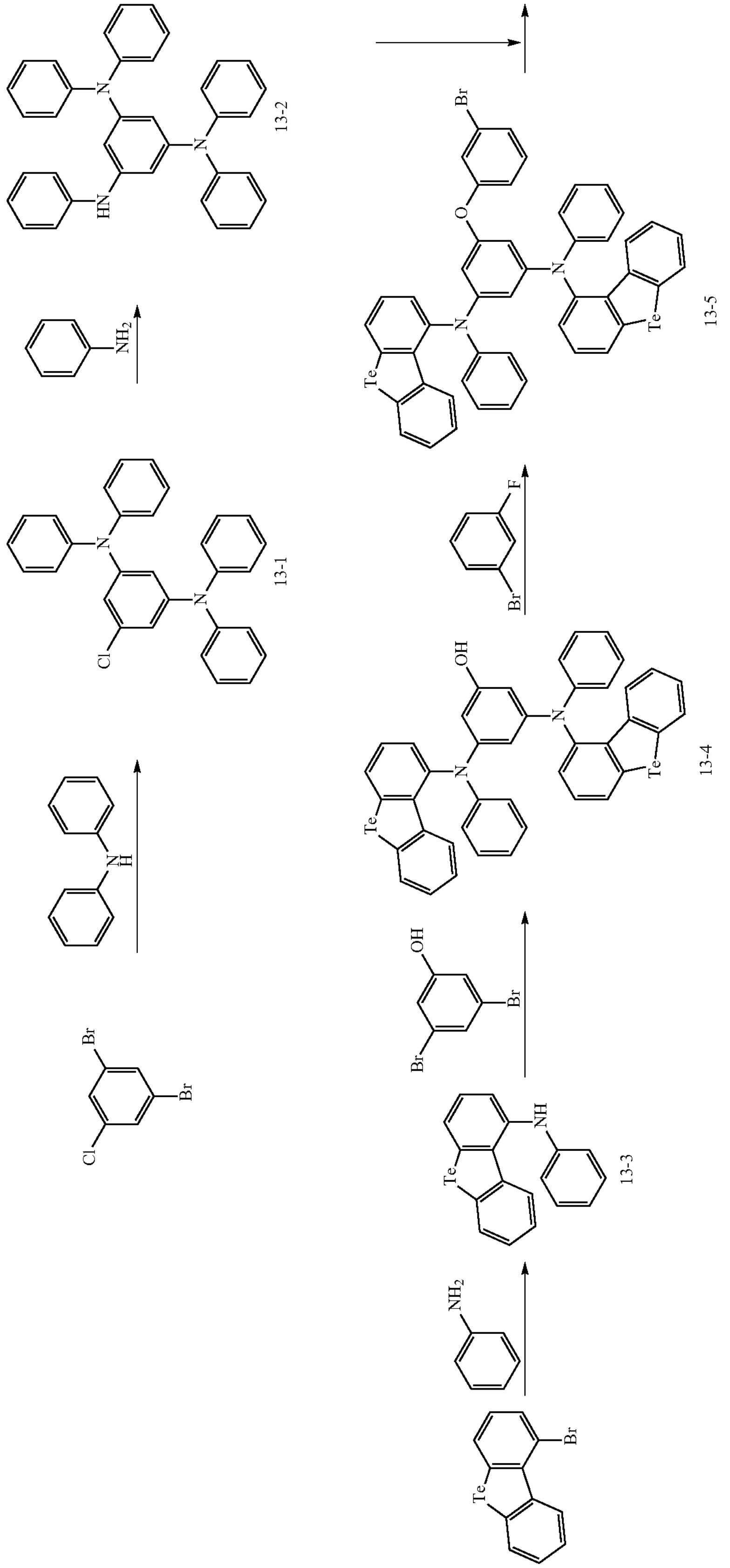
13-1
13-2
13-3
13-4
13-5

-continued
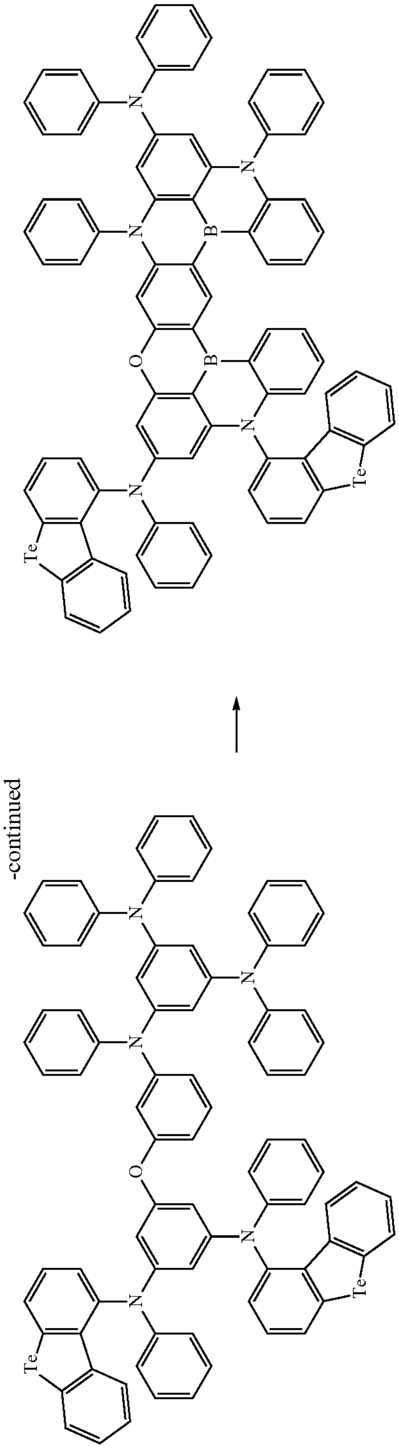
13-6
13

Synthesis of Intermediate 13-1

1,3-dibromo-5-chlorobenzene (1 eq), diphenylamine (2.1 eq), tris(dibenzylideneacetone)dipalladium(0) (0.05 eq), tri-tert-butylphosphine (0.1 eq), and sodium tert-butoxide (3 eq) were dissolved in toluene, and then stirred at 100° C. for 12 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 13-1. (Yield: 60%)

Synthesis of Intermediate 13-2

Intermediate 13-1 (1 eq), aniline (1.5 eq), tris(dibenzylideneacetone)dipalladium(0) (0.05 eq), tri-tert-butylphosphine (0.1 eq), and sodium tert-butoxide (3 eq) were dissolved in toluene, and then stirred at 100° C. for 12 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 13-2. (Yield: 60%)

Synthesis of Intermediate 13-3

1-bromodibenzo[b,d]tellurophene (1 eq), aniline (2.1 eq), tris(dibenzylideneacetone)dipalladium(0) (0.1 eq), tri-tert-butylphosphine (0.2 eq), and sodium tert-butoxide (3 eq) were dissolved in toluene, and then stirred at 110° C. for 8 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 13-3. (Yield: 60%)

Synthesis of Intermediate 13-4

Intermediate 13-3 (2.1 eq), 3,5-dibromophenol (1 eq), tris(dibenzylideneacetone)dipalladium(0) (0.1 eq), tri-tert-butylphosphine (0.2 eq), and sodium tert-butoxide (4 eq) were dissolved in toluene, and then stirred at 110° C. for 12 hours in a nitrogen atmosphere. Next, the reaction mixture was cooled and dried under reduced pressure to remove toluene therefrom. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 13-4. (Yield: 62%)

Synthesis of Intermediate 13-5

Intermediate 13-4 (1 eq), 1-bromo-3-fluorobenzene (2 eq), CuI (0.2 eq), $K_2CO_3$ (3 eq), and picolinic acid (0.4 eq) were dissolved in DMF, and then stirred at 160° C. for 20 hours. After cooling, DMF was removed therefrom by drying under reduced pressure. Next, an organic layer obtained therefrom by washing with ethyl acetate and water was dried using $MgSO_4$, and then dried under reduced pressure. Subsequently, a purification-recrystallization process was performed thereon by column chromatography (dichloromethane:n-hexane) to obtain Intermediate 13-5. (Yield: 55%)

Synthesis of Intermediate 13-6

Intermediate 13-2 (1 eq), Intermediate 13-5 (1 eq), tris (dibenzylideneacetone)dipalladium(0) (0.1 eq), tri-tert-butylphosphine (0.2 eq), and sodium tert-butoxide (3 eq) were dissolved in toluene, and then stirred at 110° C. for 20 hours in a nitrogen atmosphere. After cooling, toluene was removed therefrom by drying under reduced pressure. Next, an organic layer obtained therefrom by washing three times with ethyl acetate and water was dried using $MgSO_4$, and then dried under reduced pressure. A recrystallization process was performed thereon by column chromatography (dichloromethane:n-hexane) to obtain Intermediate 13-6. (Yield: 58%)

Synthesis of Compound 13

Intermediate 13-6 (1 eq) was dissolved in ortho dichlorobenzene, the flask was cooled to 0° C. in a nitrogen atmosphere, and then, $BBr_3$ (4 eq) was slowly added dropwise thereto. After completion of the dropwise addition, the temperature was raised to 19° C., and the resultant solution was stirred for 24 hours. After cooling to 0° C., triethylamine was slowly added dropwise into the flask until the exotherm stopped to terminate the reaction. Next, hexane was added thereto to cause precipitation, and a solid was obtained therefrom by filtration. The obtained solid was purified by silica filtration, and then purified by MC/Hex recrystallization to obtain Compound 13. Next, the final purification process was performed thereon by sublimation purification. (Yield after sublimation: 3%)

Synthesis Example of Compound 29

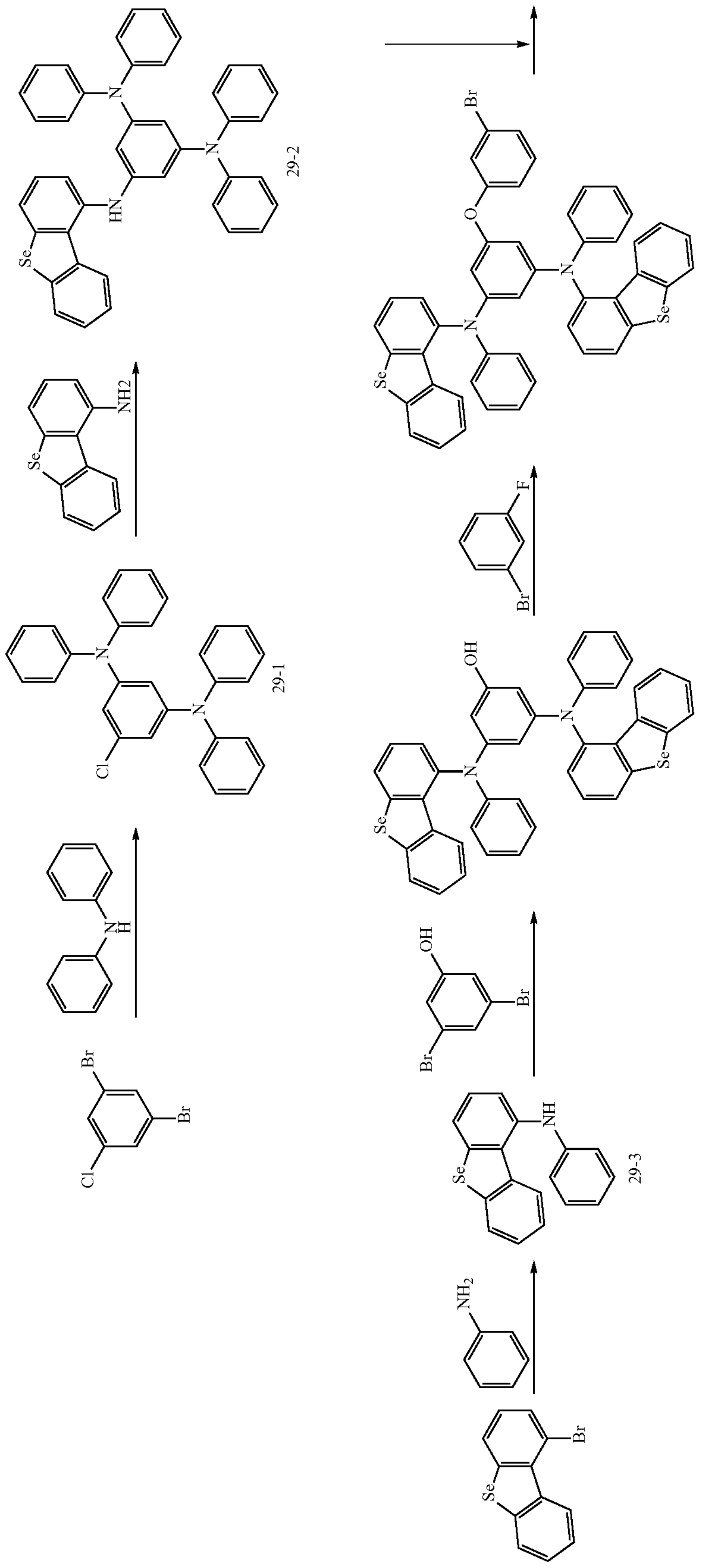
29-1
29-2
29-3
29-4
29-5

-continued
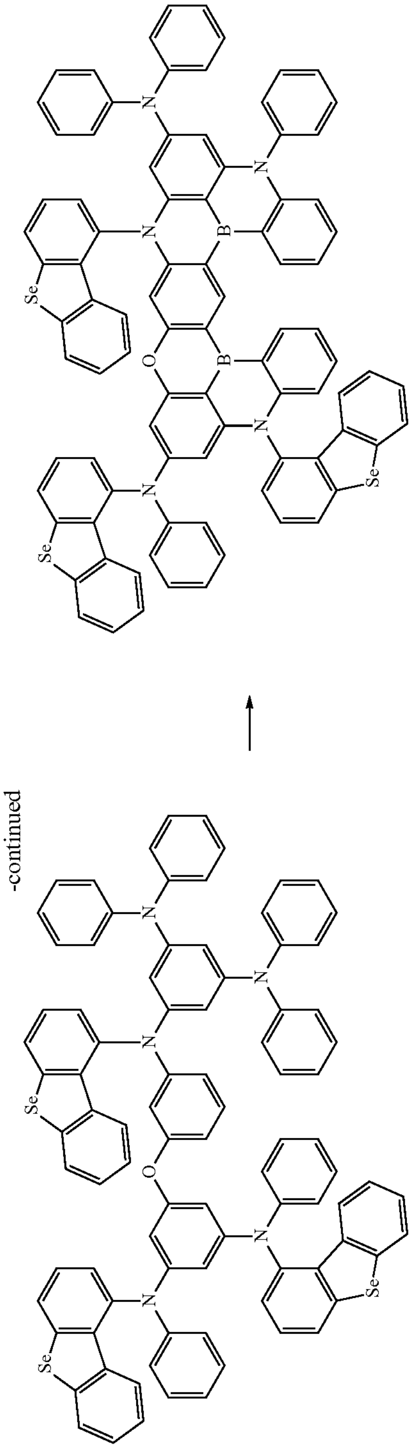
29-6
29

Synthesis of Intermediate 29-1

1,3-dibromo-5-chlorobenzene (1 eq), diphenylamine (2.1 eq), tris(dibenzylideneacetone)dipalladium(0) (0.05 eq), tri-tert-butylphosphine (0.1 eq), and sodium tert-butoxide (3 eq) were dissolved in toluene, and then stirred at 100° C. for 12 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 29-1. (Yield: 60%)

Synthesis of Intermediate 29-2

Intermediate 29-1 (1 eq), dibenzo[b,d]selenophene-1-amine (1.5 eq), tris(dibenzylideneacetone)dipalladium(0) (0.05 eq), tri-tert-butylphosphine (0.1 eq), and sodium tert-butoxide (3 eq) were dissolved in toluene, and then stirred at 100° C. for 12 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 29-2. (Yield: 60%)

Synthesis of Intermediate 29-3

1-bromodibenzo[b,d]selenophene (1 eq), aniline (2.1 eq), tris(dibenzylideneacetone)dipalladium(0) (0.1 eq), tri-tert-butylphosphine (0.2 eq), and sodium tert-butoxide (3 eq) were dissolved in toluene, and then stirred at 110° C. for 8 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 29-3. (Yield: 60%)

Synthesis of Intermediate 29-4

Intermediate 29-3 (2.1 eq), 3,5-dibromophenol (1 eq), tris(dibenzylideneacetone)dipalladium(0) (0.1 eq), tri-tert-butylphosphine (0.2 eq), and sodium tert-butoxide (4 eq) were dissolved in toluene, and then stirred at 110° C. for 12 hours in a nitrogen atmosphere. Next, the reaction mixture was cooled and dried under reduced pressure to remove toluene therefrom. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 29-4. (Yield: 62%)

Synthesis of Intermediate 29-5

Intermediate 29-4 (1 eq), 1-bromo-3-fluorobenzene (2 eq), CuI (0.2 eq), $K_2CO_3$ (3 eq), and picolinic acid (0.4 eq) were dissolved in DMF, and then stirred at 160° C. for 20 hours. After cooling, DMF was removed therefrom by drying under reduced pressure. Next, an organic layer obtained therefrom by washing with ethyl acetate and water was dried using $MgSO_4$, and then dried under reduced pressure. Subsequently, a purification-recrystallization process was performed thereon by column chromatography (dichloromethane:n-hexane) to obtain Intermediate 29-5. (Yield: 55%)

Synthesis of Intermediate 29-6

Intermediate 29-2 (1 eq), Intermediate 29-5 (1 eq), tris(dibenzylideneacetone)dipalladium(0) (0.1 eq), tri-tert-butylphosphine (0.2 eq), and sodium tert-butoxide (3 eq) were dissolved in toluene, and then stirred at 110° C. for 20 hours in a nitrogen atmosphere. After cooling, toluene was removed therefrom by drying under reduced pressure. Next, an organic layer obtained therefrom by washing three times with ethyl acetate and water was dried using $MgSO_4$, and then dried under reduced pressure. A recrystallization process was performed thereon by column chromatography (dichloromethane:n-hexane) to obtain Intermediate 29-6. (Yield: 58%)

Synthesis of Compound 29

Intermediate 29-6 (1 eq) was dissolved in ortho dichlorobenzene, the flask was cooled to 0° C. in a nitrogen atmosphere, and then, $BBr_3$ (4 eq) was slowly added dropwise thereto. After completion of the dropwise addition, the temperature was raised to 19° C., and the resultant solution was stirred for 24 hours. After cooling to 0° C., triethylamine was slowly added dropwise into the flask until the exotherm stopped to terminate the reaction. Next, hexane was added thereto to cause precipitation, and a solid was obtained therefrom by filtration. The obtained solid was purified by silica filtration, and then purified by MC/Hex recrystallization to obtain Compound 29. Next, the final purification process was performed thereon by sublimation purification. (Yield after sublimation: 3%)

Synthesis Example of Compound 36

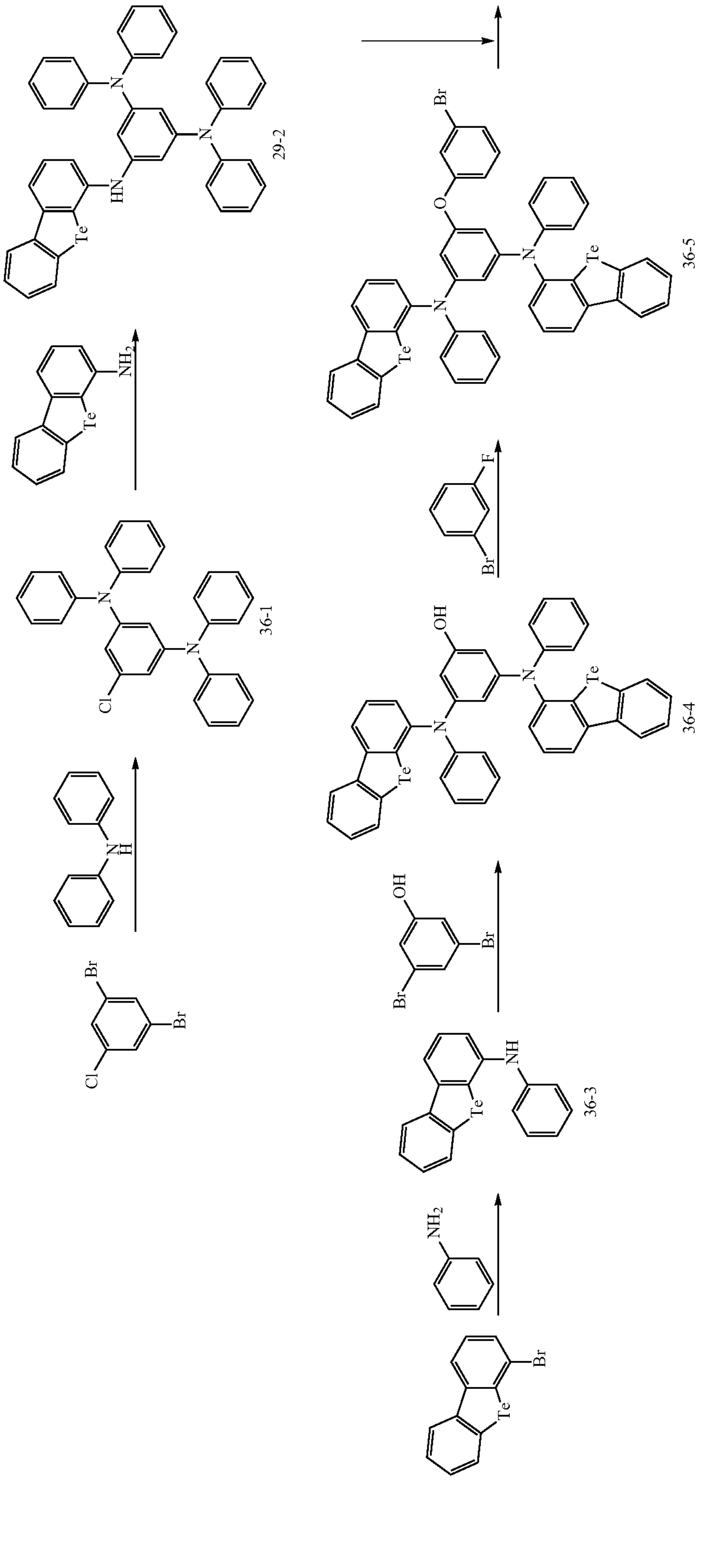
36-1
29-2
36-3
36-4
36-5

-continued
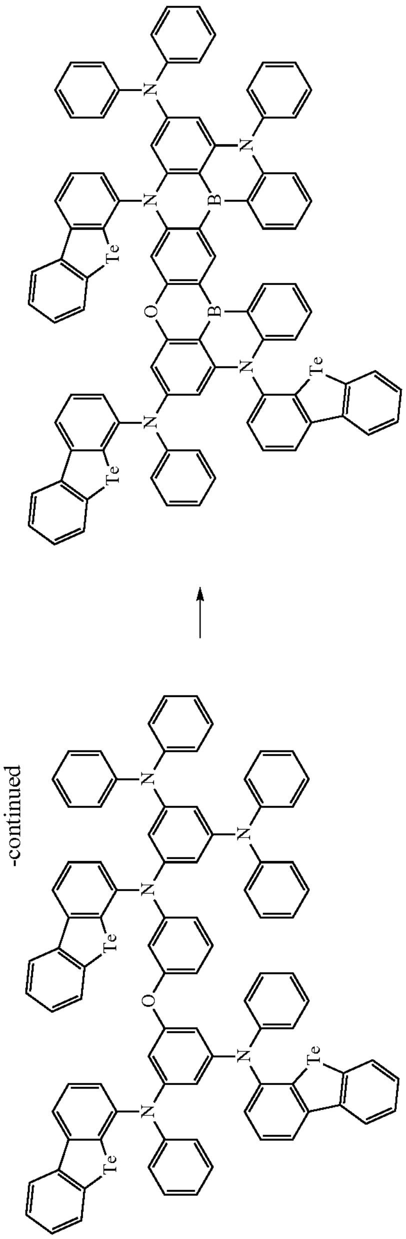
36-6
36

Synthesis of Intermediate 36-1

1,3-dibromo-5-chlorobenzene (1 eq), diphenylamine (2.1 eq), tris(dibenzylideneacetone)dipalladium(0) (0.05 eq), tri-tert-butylphosphine (0.1 eq), and sodium tert-butoxide (3 eq) were dissolved in toluene, and then stirred at 100° C. for 12 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 36-1. (Yield: 60%)

Synthesis of Intermediate 36-2

Intermediate 36-1 (1 eq), dibenzo[b,d]tellurophene-4-amine (1.5 eq), tris(dibenzylideneacetone)dipalladium(0) (0.05 eq), tri-tert-butylphosphine (0.1 eq), and sodium tert-butoxide (3 eq) were dissolved in toluene, and then stirred at 100° C. for 12 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 36-2. (Yield: 60%)

Synthesis of Intermediate 36-3

4-bromodibenzo[b,d]tellurophene (1 eq), aniline (2.1 eq), tris(dibenzylideneacetone)dipalladium(0) (0.1 eq), tri-tert-butylphosphine (0.2 eq), and sodium tert-butoxide (3 eq) were dissolved in toluene, and then stirred at 110° C. for 8 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 36-3. (Yield: 60%)

Synthesis of Intermediate 36-4

Intermediate 36-3 (2.1 eq), 3,5-dibromophenol (1 eq), tris(dibenzylideneacetone)dipalladium(0) (0.1 eq), tri-tert-butylphosphine (0.2 eq), and sodium tert-butoxide (4 eq) were dissolved in toluene, and then stirred at 110° C. for 12 hours in a nitrogen atmosphere. Next, the reaction mixture was cooled and dried under reduced pressure to remove toluene therefrom. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 36-4. (Yield: 62%)

Synthesis of Intermediate 36-5

Intermediate 36-4 (1 eq), 1-bromo-3-fluorobenzene (2 eq), CuI (0.2 eq), $K_2CO_3$ (3 eq), and picolinic acid (0.4 eq) were dissolved in DMF, and then stirred at 160° C. for 20 hours. After cooling, DMF was removed therefrom by drying under reduced pressure. Next, an organic layer obtained therefrom by washing with ethyl acetate and water was dried using $MgSO_4$, and then dried under reduced pressure. Subsequently, a purification-recrystallization process was performed thereon by column chromatography (dichloromethane:n-hexane) to obtain Intermediate 36-5. (Yield: 55%)

Synthesis of Intermediate 36-6

Intermediate 36-2 (1 eq), Intermediate 36-5 (1 eq), tris(dibenzylideneacetone)dipalladium(0) (0.1 eq), tri-tert-butylphosphine (0.2 eq), and sodium tert-butoxide (3 eq) were dissolved in toluene, and then stirred at 110° C. for 20 hours in a nitrogen atmosphere. After cooling, toluene was removed therefrom by drying under reduced pressure. Next, an organic layer obtained therefrom by washing three times with ethyl acetate and water was dried using $MgSO_4$, and then dried under reduced pressure. A recrystallization process was performed thereon by column chromatography (dichloromethane:n-hexane) to obtain Intermediate 36-6. (Yield: 58%)

Synthesis of Compound 36

Intermediate 36-6 (1 eq) was dissolved in ortho dichlorobenzene, the flask was cooled to 0° C. in a nitrogen atmosphere, and then, $BBr_3$ (4 eq) was slowly added dropwise thereto. After completion of the dropwise addition, the temperature was raised to 19° C., and the resultant solution was stirred for 24 hours. After cooling to 0° C., triethylamine was slowly added dropwise into the flask until the exotherm stopped to terminate the reaction. Next, hexane was added thereto to cause precipitation, and a solid was obtained therefrom by filtration. The obtained solid was purified by silica filtration, and then purified by MC/Hex recrystallization to obtain Compound 36. Next, the final purification process was performed thereon by sublimation purification. (Yield after sublimation: 3%)

Synthesis Example of Compound 56

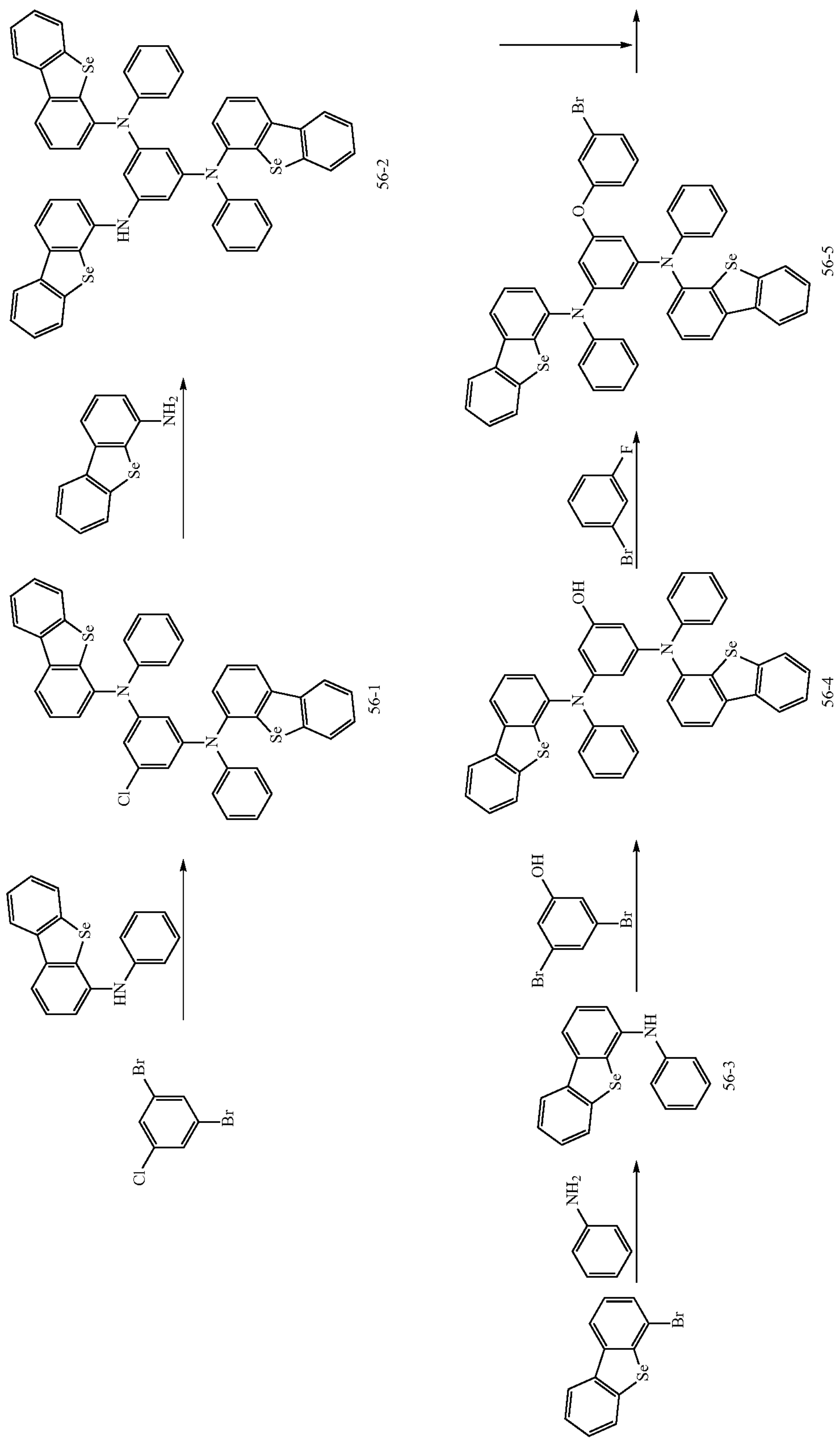
56-1
56-2
56-3
56-4
56-5

-continued
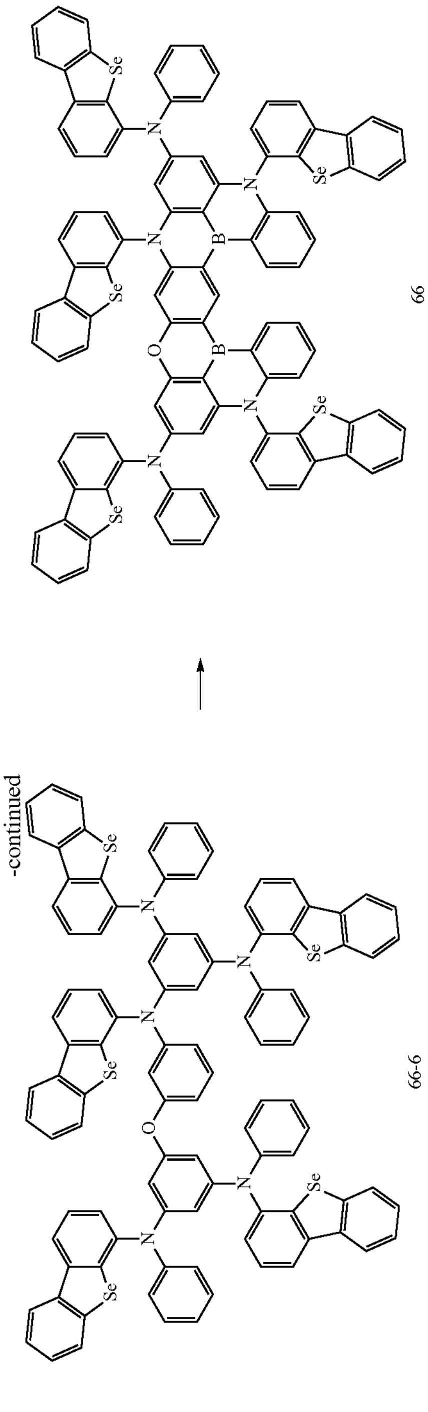
66-6
66

Synthesis of Intermediate 56-1

1,3-dibromo-5-chlorobenzene (1 eq), N-phenyldibenzo[b,d]selenophen-4-amine (2.1 eq), tris(dibenzylideneacetone)dipalladium(0) (0.05 eq), tri-tert-butylphosphine (0.1 eq), and sodium tert-butoxide (3 eq) were dissolved in toluene, and then stirred at 100° C. for 12 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 56-1. (Yield: 55%)

Synthesis of Intermediate 56-2

Intermediate 56-1 (1 eq), dibenzo[b,d]selenophene-4-amine (1.5 eq), tris(dibenzylideneacetone)dipalladium(0) (0.05 eq), tri-tert-butylphosphine (0.1 eq), and sodium tert-butoxide (3 eq) were dissolved in toluene, and then stirred at 100° C. for 12 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 56-2. (Yield: 58%)

Synthesis of Intermediate 56-3

4-bromodibenzo[b,d]selenophene (1 eq), aniline (2.1 eq), tris(dibenzylideneacetone)dipalladium(0) (0.1 eq), tri-tert-butylphosphine (0.2 eq), and sodium tert-butoxide (3 eq) were dissolved in toluene, and then stirred at 110° C. for 8 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 56-3. (Yield: 60%)

Synthesis of Intermediate 56-4

Intermediate 56-3 (2.1 eq), 3,5-dibromophenol (1 eq), tris(dibenzylideneacetone)dipalladium(0) (0.1 eq), tri-tert-butylphosphine (0.2 eq), and sodium tert-butoxide (4 eq) were dissolved in toluene, and then stirred at 110° C. for 12 hours in a nitrogen atmosphere. Next, the reaction mixture was cooled and dried under reduced pressure to remove toluene therefrom. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 56-4. (Yield: 62%)

Synthesis of Intermediate 56-5

Intermediate 56-4 (1 eq), 1-bromo-3-fluorobenzene (2 eq), CuI (0.2 eq), $K_2CO_3$ (3 eq), and picolinic acid (0.4 eq) were dissolved in DMF, and then stirred at 160° C. for 20 hours. After cooling, DMF was removed therefrom by drying under reduced pressure. Next, an organic layer obtained therefrom by washing with ethyl acetate and water was dried using $MgSO_4$, and then dried under reduced pressure. Subsequently, a purification-recrystallization process was performed thereon by column chromatography (dichloromethane:n-hexane) to obtain Intermediate 56-5. (Yield: 55%)

Synthesis of Intermediate 56-6

Intermediate 56-2 (1 eq), Intermediate 56-5 (1 eq), tris(dibenzylideneacetone)dipalladium(0) (0.1 eq), tri-tert-butylphosphine (0.2 eq), and sodium tert-butoxide (3 eq) were dissolved in toluene, and then stirred at 110° C. for 20 hours in a nitrogen atmosphere. After cooling, toluene was removed therefrom by drying under reduced pressure. Next, an organic layer obtained therefrom by washing three times with ethyl acetate and water was dried using $MgSO_4$, and then dried under reduced pressure. A recrystallization process was performed thereon by column chromatography (dichloromethane:n-hexane) to obtain Intermediate 56-6. (Yield: 55%)

Synthesis of Compound 56

Intermediate 56-6 (1 eq) was dissolved in ortho dichlorobenzene, the flask was cooled to 0° C. in a nitrogen atmosphere, and then, $BBr_3$ (4 eq) was slowly added dropwise thereto. After completion of the dropwise addition, the temperature was raised to 19° C., and the resultant solution was stirred for 24 hours. After cooling to 0° C., triethylamine was slowly added dropwise into the flask until the exotherm stopped to terminate the reaction. Next, hexane was added thereto to cause precipitation, and a solid was obtained therefrom by filtration. The obtained solid was purified by silica filtration, and then purified by MC/Hex recrystallization to obtain Compound 56. Next, the final purification process was performed thereon by sublimation purification. (Yield after sublimation: 3%)

Synthesis Example of Compound 68

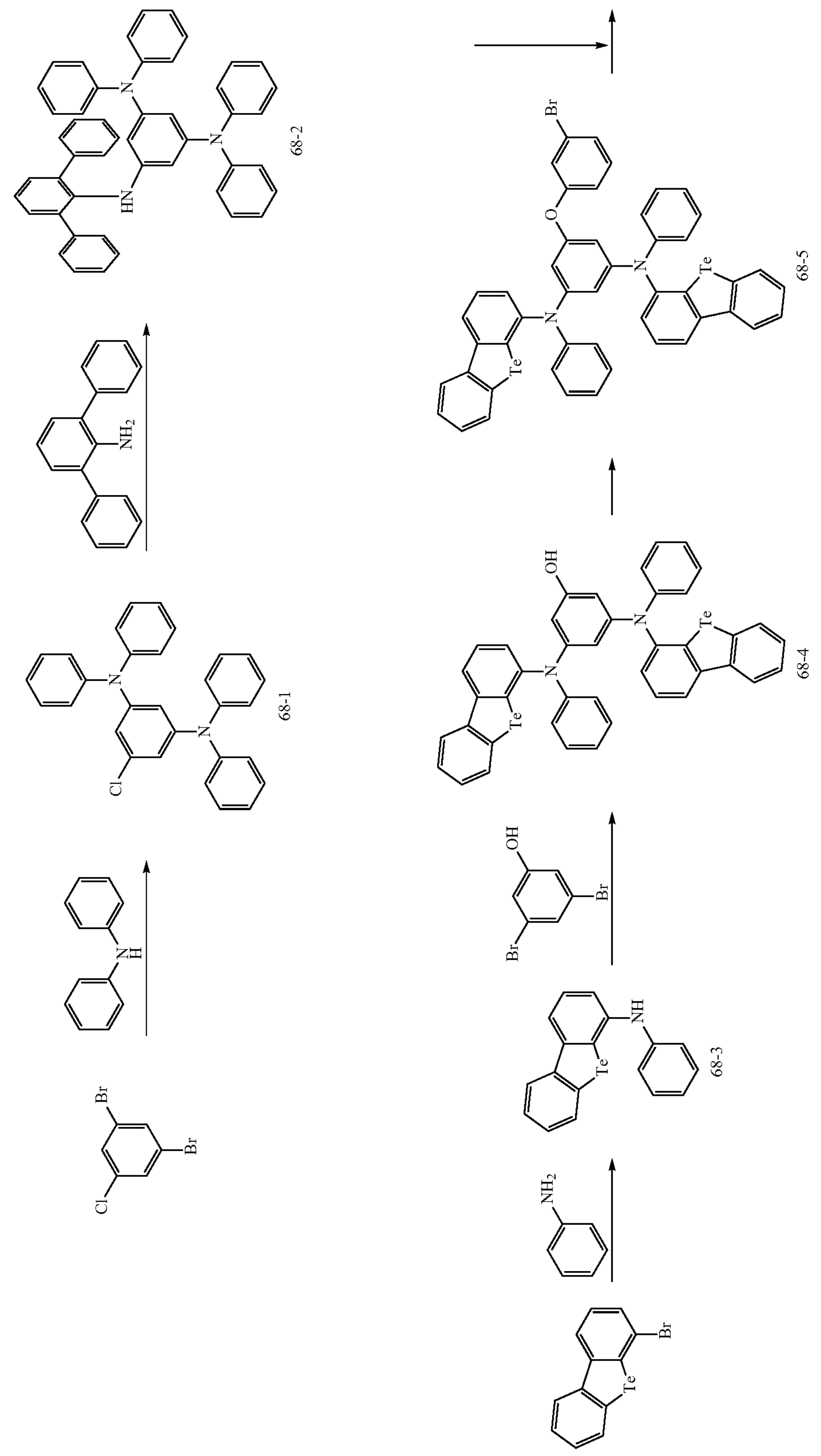
68-1
68-2
68-3
68-4
68-5

-continued
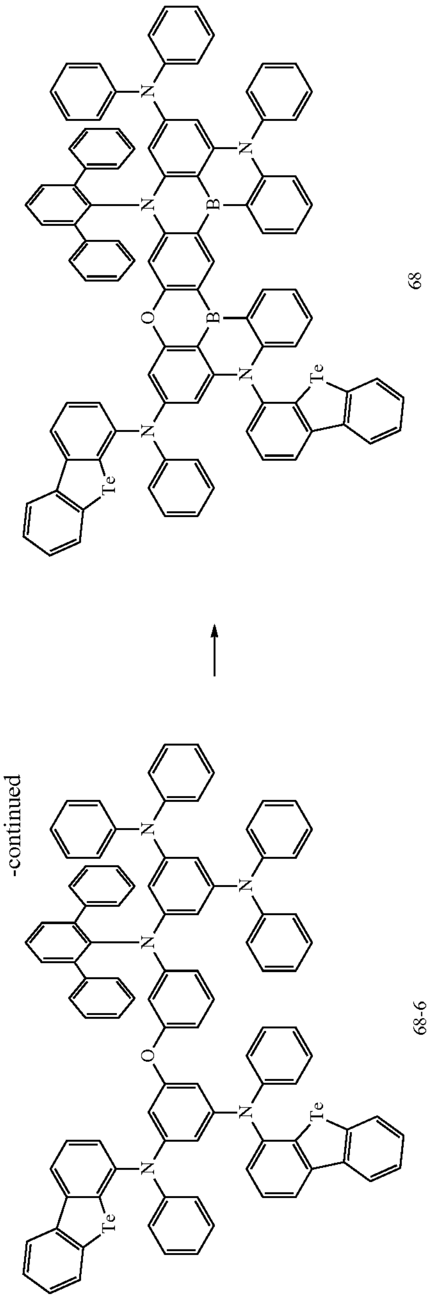
68-6
68

Synthesis of Intermediate 68-1

1,3-dibromo-5-chlorobenzene (1 eq), diphenylamine (2.1 eq), tris(dibenzylideneacetone)dipalladium(0) (0.05 eq), tri-tert-butylphosphine (0.1 eq), and sodium tert-butoxide (3 eq) were dissolved in toluene, and then stirred at 100° C. for 12 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 68-1. (Yield: 60%)

Synthesis of Intermediate 68-2

Intermediate 68-1 (1 eq), [1,1':3,1"-terphenyl]-2'-amine (1.5 eq), tris(dibenzylideneacetone)dipalladium(0) (0.05 eq), tri-tert-butylphosphine (0.1 eq), and sodium tert-butoxide (3 eq) were dissolved in toluene, and then stirred at 100° C. for 12 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 68-2. (Yield: 60%)

Synthesis of Intermediate 68-3

4-bromodibenzo[b,d]tellurophene (1 eq), aniline (2.1 eq), tris(dibenzylideneacetone)dipalladium(0) (0.1 eq), tri-tert-butylphosphine (0.2 eq), and sodium tert-butoxide (3 eq) were dissolved in toluene, and then stirred at 110° C. for 8 hours in a nitrogen atmosphere. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 68-3. (Yield: 60%)

Synthesis of Intermediate 68-4

Intermediate 68-3 (2.1 eq), 3,5-dibromophenol (1 eq), tris(dibenzylideneacetone)dipalladium(0) (0.1 eq), tri-tert-butylphosphine (0.2 eq), and sodium tert-butoxide (4 eq) were dissolved in toluene, and then stirred at 110° C. for 12 hours in a nitrogen atmosphere. Next, the reaction mixture was cooled and dried under reduced pressure to remove toluene therefrom. After cooling, an organic layer obtained therefrom by washing three times with ethyl acetate and water was dried using $MgSO_4$, and then dried under reduced pressure. Subsequently, a separation-purification process was performed thereon by column chromatography to obtain Intermediate 68-4. (Yield: 62%)

Synthesis of Intermediate 68-5

Intermediate 68-4 (1 eq), 1-bromo-3-fluorobenzene (2 eq), CuI (0.2 eq), $K_2CO_3$ (3 eq), and picolinic acid (0.4 eq) were dissolved in DMF, and then stirred at 160° C. for 20 hours. After cooling, DMF was removed therefrom by drying under reduced pressure. Next, an organic layer obtained therefrom by washing with ethyl acetate and water was dried using $MgSO_4$, and then dried under reduced pressure. Subsequently, a purification-recrystallization process was performed thereon by column chromatography (dichloromethane:n-hexane) to obtain Intermediate 68-5. (Yield: 55%)

Synthesis of Intermediate 68-6

Intermediate 68-2 (1 eq), Intermediate 68-5 (1 eq), tris(dibenzylideneacetone)dipalladium(0) (0.1 eq), tri-tert-butylphosphine (0.2 eq), and sodium tert-butoxide (3 eq) were dissolved in toluene, and then stirred at 110° C. for 20 hours in a nitrogen atmosphere. After cooling, toluene was removed therefrom by drying under reduced pressure. Next, an organic layer obtained therefrom by washing three times with ethyl acetate and water was dried using $MgSO_4$, and then dried under reduced pressure. A recrystallization process was performed thereon by column chromatography (dichloromethane:n-hexane) to obtain Intermediate 68-6. (Yield: 58%)

Synthesis of Compound 68

Intermediate 68-6 (1 eq) was dissolved in ortho dichlorobenzene, the flask was cooled to 0° C. in a nitrogen atmosphere, and then, $BBr_3$ (4 eq) was slowly added dropwise thereto. After completion of the dropwise addition, the temperature was raised to 19° C., and the resultant solution was stirred for 24 hours. After cooling to 0° C., triethylamine was slowly added dropwise into the flask until the exotherm stopped to terminate the reaction. Next, hexane was added thereto to cause precipitation, and a solid was obtained therefrom by filtration. The obtained solid was purified by silica filtration, and then purified by MC/Hex recrystallization to obtain Compound 68. Next, the final purification process was performed thereon by sublimation purification. (Yield after sublimation: 3%)

Confirmation of Synthesized Compounds

Molecular weights, $^1H$ NMR, and MS/FAB of the synthesized compounds are shown in Table 1. Proton nuclear magnetic resonance ($^1H$ NMR) and mass spectroscopy/fast atom bombardment (MS/FAB) of the compounds synthesized according to Synthesis Examples above are shown in Table 1.

TABLE 1

| Compound | $^1H$ NMR (δ) | MS/FAB Calc | MS/FAB Found |
|---|---|---|---|
| 4 | 7.77 (1H, d), 7.71 (2H, d), 7.55-7.43 (5H, m), 7.29 (2H, m), 7.28 (1H, m), 7.25 (1H, s), 7.24 (12H, m), 7.18 (2H, m), 7.08 (12H, m), 7.01 (2H, m), 7.00 (6H, m), 6.86 (1H, s), 6.55-6.49 (4H, m) | 1174.88 | 1174.88 |
| 13 | 7.77 (2H, d), 7.71 (2H, d), 7.52-7.37 (10H, m), 7.29 (2H, m), 7.25 (1H, s), 7.24 (10H, m), 7.18 (4H, m), 7.08 (10H, m), 7.01 (2H, m), 6.86 (1H, s), 6.55-6.49 (4H, m) | 1425.20 | 1425.21 |
| 29 | 7.77 (3H, d), 7.71 (2H, d), 7.52-7.37 (15H, m), 7.29 (2H, m), 7.25 (1H, s), 7.24 (8H, m), 7.18 (5H, m), 7.08 (8H, m), 7.01 (2H, m), 7.00 (4H, m), 6.86 (1H, s), 6.55-6.49 (4H, m) | 1480.96 | 1480.96 |
| 36 | 7.77 (3H, d), 7.71 (2H, d), 7.55-7.43 (15H, m), 7.29 (2H, m), 7.28 (3H, m), 7.25 (1H, s), 7.18 (2H, m), 7.08 (8H, m), 7.01 (2H, m), 7.00 (4H, m), 6.86 (1H, s), 6.55-6.52 (4H, m) | 1626.88 | 1626.88 |
| 58 | 7.77 (5H, d), 7.71 (2H, d), 7.55-7.43 (25H, m), 7.29 (2H, m), 7.28 (5H, m), 7.25 (1H, s), 7.24 (4H, m), 7.18 (2H, m), 7.08 (4H, m), 7.01 (2H, m), 7.00 (2H, m), 6.86 (1H, s), 6.55-6.49 (4H, m) | 1787.05 | 1787.06 |

TABLE 1-continued

| Compound | $^1$H NMR (δ) | MS/FAB Calc | MS/FAB Found |
|---|---|---|---|
| 68 | 8.20 (2H, d), 7.77 (2H, d), 7.71 (2H, d), 7.55-7.45 (8H, m), 7.43-7.41 (8H, m), 7.29 (2H, m), 7.28 (2H, m), 7.25 (1H, s), 7.24 (8H, m), 7.18 (2H, m), 7.08 (12H, m), 7.01 (2H, m), 7.00 (4H, m), 6.86 (1H, s), 6.55-6.49 (4H, m) | 1577.40 | 1577.40 |

Evaluation Example 1

Physical property data of the synthesized compounds is shown in Table 2.

TABLE 2

| No. | Compound | HOMO (eV) | LUMO (eV) | $S_1$ (eV) | $T_1$ (eV) | $\Delta E_{S-T}$ (eV) |
|---|---|---|---|---|---|---|
| Example 1 | Compound 4 | −4.97 | −1.55 | 2.92 | 2.61 | 0.31 |
| Example 2 | Compound 13 | −4.98 | −1.58 | 2.91 | 2.60 | 0.31 |
| Example 3 | Compound 29 | −5.03 | −1.63 | 2.91 | 2.60 | 0.31 |
| Example 4 | Compound 36 | −5.01 | −1.59 | 2.92 | 2.61 | 0.31 |
| Example 5 | Compound 56 | −4.99 | −1.57 | 2.91 | 2.60 | 0.31 |
| Example 6 | Compound 68 | −4.99 | −1.59 | 2.92 | 2.61 | 0.31 |
| Comparative Example 1 | DABNA1 | −5.00 | −1.37 | 3.01 | 2.62 | 0.48 |
| Comparative Example 2 | 1-A | −4.83 | −1.46 | 2.87 | 2.55 | 0.32 |
| Comparative Example 3 | 2-A | −5.12 | −1.48 | 3.09 | 2.62 | 0.47 |

Example 1

As an anode, a glass substrate (a product of Corning Inc. of Corning, New York) with a 15 Ω/cm$^2$ (1,200 Å) ITO electrode formed thereon was cut to a size of 50 mm×50 mm×0.7 mm, sonicated with isopropyl alcohol and pure water each for 5 minutes, and then cleaned by exposure to ultraviolet rays and ozone for 30 minutes. Next, the resultant structure was mounted on a vacuum deposition apparatus.

The compound NPB was deposited on the anode to form a hole injection layer having a thickness of 300 Å, the compound TCTA was deposited on the hole injection layer to form a hole transport layer having a thickness of 200 Å, and the compound CzSi was vacuum-deposited on the hole transport layer to form an emission auxiliary layer having a thickness of 100 Å. The compound H126 (host) and Compound 4 (dopant) were co-deposited at a weight ratio of 99:1 on the emission auxiliary layer to form an emission layer having a thickness of 200 Å.

Next, the compound Diphenyl[4-(triphenylsilyl)phenyl] phosphine oxide (TSPO1) was deposited on the emission layer to form an electron transport layer having a thickness of 200 Å, the compound 1,3,5-Tris(1-phenyl-1H-benzo[d] imidazol-2-yl)benzene (TPBI), which is an electron transport compound, was deposited on the electron transport layer to form a buffer layer having a thickness of 300 Å, LiF was deposited on the buffer layer to form an electron injection layer having a thickness of 10 Å, and the element Al was deposited on the electron injection layer to form a cathode having a thickness of 3,000 Å, thereby completing the manufacture of an organic light-emitting device having a structure of ITO (1,200 Å)/NPB (300 Å)/TCTA (200 Å)/CzSi (100 Å)/H126 (host)+Compound 4 (99:1) (200 Å)/TSPO1 (200 Å)/TPBI (300 Å)/LiF (10 Å)/Al (3,000 Å).

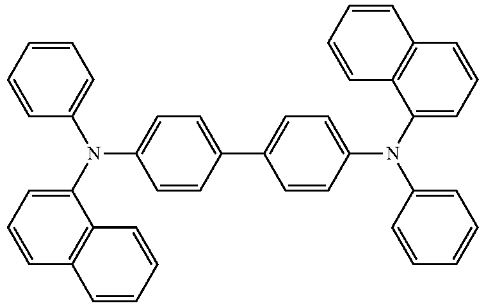

NPB

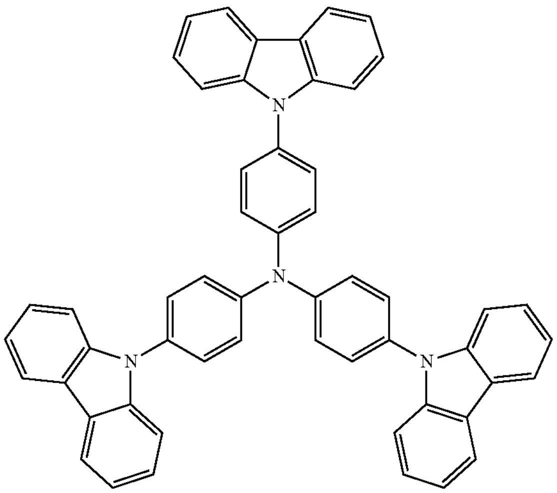

TCTA

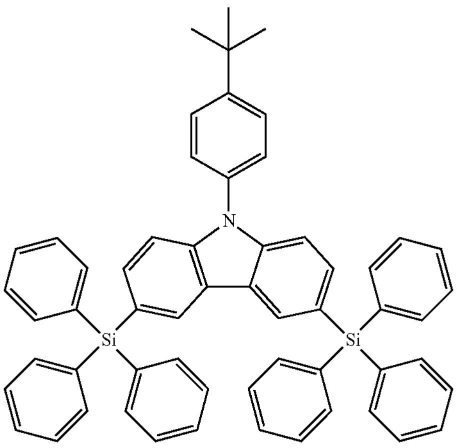

CzSi

-continued

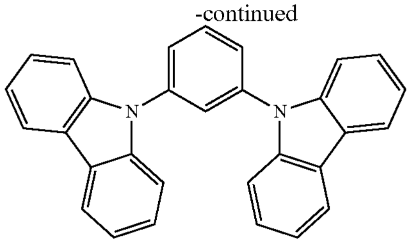

H126

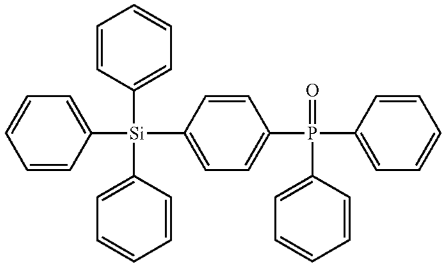

TSPO1

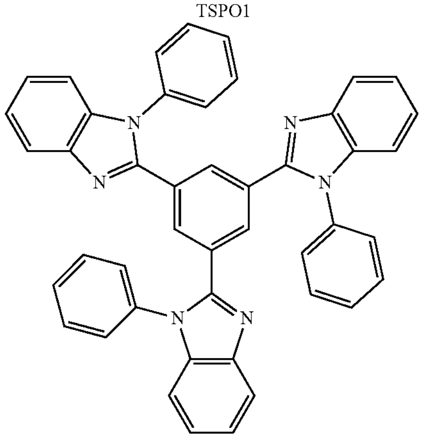

TPBI

Examples 2 to 6 and Comparative Examples 1 to 3

Organic light-emitting devices were manufactured in the same manner as in Example 1, except that corresponding compounds shown in Table 1 were used instead of Compound 4 for use as a dopant in an emission layer.

Evaluation Example 2

The driving voltage in volt (V) at 1,000 cd/$m^2$, luminescence efficiency in candela per meter squared (cd/A), maximum external quantum efficiency in percent (%), emission color, and lifespan of each of the organic light-emitting devices manufactured according to Examples 1 to 6 and Comparative Examples 1 to 3 were measured. The $T^{95}$ lifespan is the time it takes to achieve 95% of the initial luminance measured in hour at 100 milliamp per centimeter squared. A source meter (sold under the trade designation Keithley Instrument MU236 series, by Tektronix, Inc., of Beaverton, Oregon) and a luminance meter sold under the trade designation PR650, from Konica Minolta, Inc. of Tokyo, Japan were used and the results thereof are shown in Table 3.

In addition, the spin-orbit coupling (SOC) number in inverse centimeter ($cm^{-1}$), $k_{RISC}$ simulation in inverse second ($s^{-1}$), oscillator strength (f), and BDE simulation energy level in electron volt (eV) results of each dopant compound used in Examples 1 to 6 and Comparative Examples 1 to 3 were calculated by simulating the density functional theory (DFT) method based on using Gaussian 09 (B3LYP/6-311G**) program sold by Gaussian, Inc., Wallingford CT, and the basis set, 6-31G(d,p) may be used. The $T_1$ energy level, $S_1$ energy level, and $\Delta E_{S-T}$ which means difference between the singlet energy level and the triplet energy level, are measured, and Bond Dissociation Energy (BDE) values were calculated, and the results thereof are shown in Table 4. The SOC, $k_{RISC}$ values measured using the vibronic coupling constants, oscillator strength, Bond Dissociation Energy (BDE) values were calculated, and the results thereof are shown in Table 4.

TABLE 3

| No. | Hole transport layer material | Emission layer Dopant | Driving voltage (V) | Emission efficiency (cd/A) | Maximum external quantum efficiency (%) | Emission color | Lifespan ($T^{95}$) |
|---|---|---|---|---|---|---|---|
| Example 1 | TCTA | Compound 4 | 4.3 | 27.2 | 24.3 | Blue | 192 |
| Example 2 | TCTA | Compound 13 | 4.5 | 28.0 | 25.2 | Blue | 207 |
| Example 3 | TCTA | Compound 29 | 4.5 | 27.6 | 24.8 | Blue | 198 |
| Example 4 | TCTA | Compound 36 | 4.7 | 29.3 | 25.9 | Blue | 214 |
| Example 5 | TCTA | Compound 56 | 4.6 | 28.7 | 25.5 | Blue | 203 |
| Example 6 | TCTA | Compound 68 | 4.7 | 28.1 | 25.4 | Blue | 207 |
| Comparative Example 1 | TCTA | DABNA1 | 5.7 | 16.0 | 15.7 | Blue | 38 |
| Comparative Example 2 | TCTA | 1-A | 5.0 | 20.0 | 18.2 | Blue | 56 |
| Comparative Example 3 | TCTA | 2-A | 5.8 | 17.2 | 16.3 | Blue | 40 |

TABLE 4
| No. | Emission layer Dopant | SOC ($cm^{-1}$) | $k_{RISC}$ ($s^{-1}$) | Oscillator strength (f) | BDE (eV) |
|---|---|---|---|---|---|
| Example 1 | Compound 4 | 0.77 | 4.49E+06 | 0.68 | 2.32 |
| Example 2 | Compound 13 | 4.33 | 1.37E+08 | 0.63 | 2.53 |
| Example 3 | Compound 29 | 1.13 | 5.95E+06 | 0.63 | 2.42 |
| Example 4 | Compound 36 | 6.00 | 2.34E+10 | 0.71 | 2.63 |
| Example 5 | Compound 56 | 0.82 | 7.74E+06 | 0.73 | 2.44 |
| Example 6 | Compound 68 | 5.68 | 8.56E+08 | 0.67 | 2.57 |
| Comparative Example 1 | DABNA1 | 0.06 | 2.26E+04 | 0.20 | 1.14 |
| Comparative Example 2 | 1-A | 0.22 | 2.76E+05 | 0.64 | 2.16 |
| Comparative Example 3 | 2-A | 0.13 | 2.82E+05 | 0.18 | 1.26 |
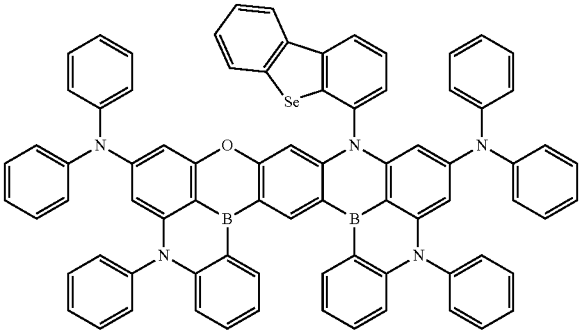
4
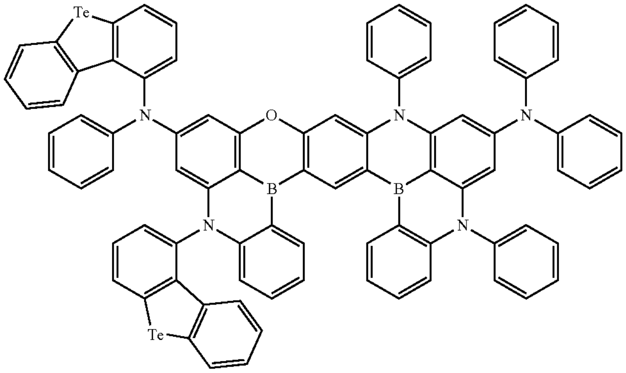
13
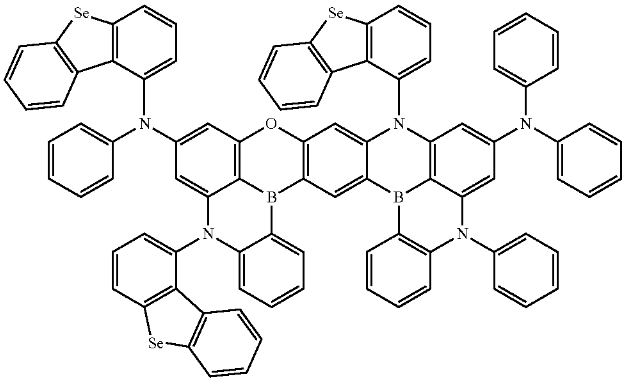
29

TABLE 4-continued
| No. | Emission layer Dopant | SOC ($cm^{-1}$) | $k_{RISC}$ ($s^{-1}$) | Oscillator strength (f) | BDE (eV) |
|---|---|---|---|---|---|
| 36 | 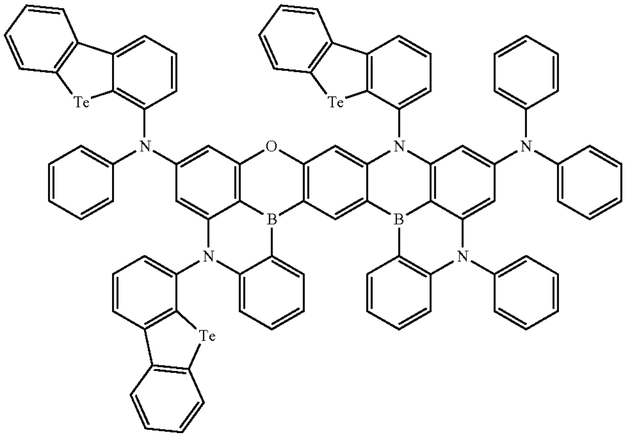 | | | | |
| 56 | 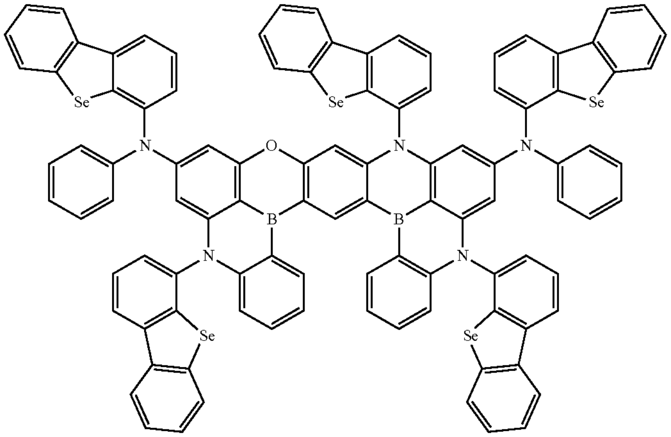 | | | | |
| 68 | 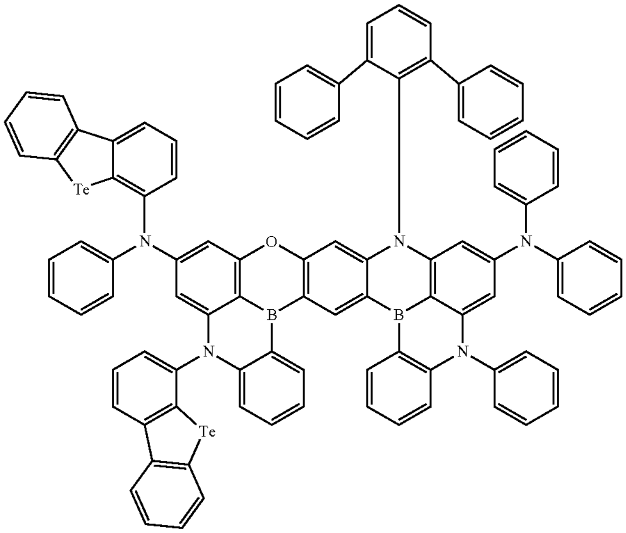 | | | | |

TABLE 4-continued

| No. | Emission layer Dopant | SOC ($cm^{-1}$) | $k_{RISC}$ ($s^{-1}$) | Oscillator strength (f) | BDE (eV) |
|---|---|---|---|---|---|

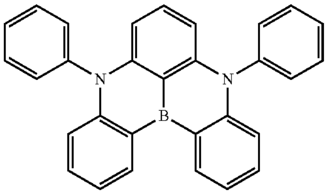

DABNA-1

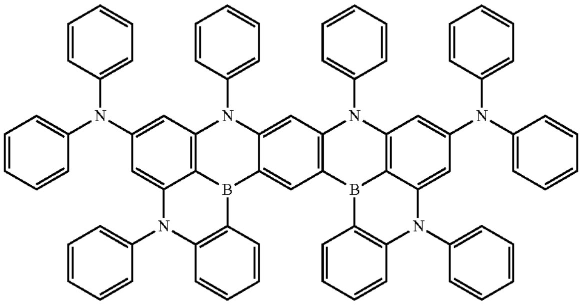

1-A

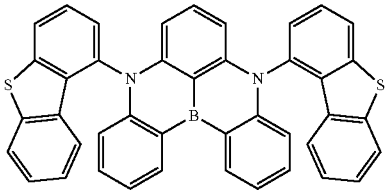

2-A

The results summarized in Table 3 show that the organic light-emitting devices of Examples 1 to 6 have significantly and unexpectedly improved driving voltage, improved luminescence efficiency, and improved lifespan, as compared with the organic light-emitting devices of Comparative Examples 1 to 3. The results summarized in Table 4 show that, as compared with the dopant compounds of Comparative Examples 1 to 3, the dopant compounds of Examples 1 to 6 have significantly and unexpectedly improved SOC and $k_{RISC}$ and show significant and unexpectedly increased multiple resonance, which leads to increased oscillator strength and improved BDE of an electron injection substituent.

Due to the inclusion of the heterocyclic compound represented by Formula 1, the light-emitting devices have significantly and unexpectedly excellent driving voltage, luminescence efficiency, and external quantum efficiency. Accordingly, high-quality electronic apparatuses may be manufactured using the light-emitting devices constructed according to the principles and embodiments of the invention.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:

a first electrode;

a second electrode facing the first electrode;

an interlayer located between the first electrode and the second electrode and comprising an emission layer; and a heterocyclic compound of Formula 1:

Formula I

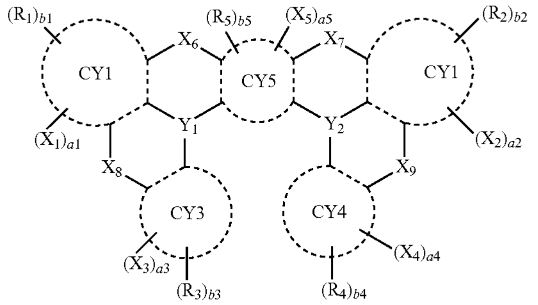

Formula II

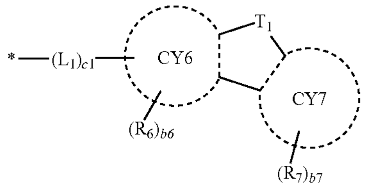

wherein, in Formulae 1 and 2, $Y_1$ is B, P(=O), or P(=S), $Y_2$ is B, P(=O), or P(=S), a1 to a5 are each, independently from one another, an integer from 0 to 4, $X_1$ is $N(Ar_{1a})(Ar_{1b})$, $N(Ar_{1a})(Z_{1a})$, or $N(Z_{1a})(Z_{1b})$, $X_2$ is $N(Ar_{2z})(Ar_{2b})$, $N(Ar_{2z})(Z_{2a})$, or $N(Z_{2a})(Z_{2b})$, $X_3$ is $N(Ar_{3a})(Ar_{3b})$, $N(Ar_{3a})(Z_{3a})$, or $N(Z_{3a})(Z_{3b})$, $X_4$ is $N(Ar_{4a})(Ar_{4b})$, $N(Ar_{4a})(Z_{4a})$, or $N(Z_{4a})(Z_{4b})$, $X_5$ is $N(Ar_{5a})(Ar_{5b})$, $N(Ar_{5a})(Z_{5a})$, or $N(Z_{5a})(Z_{5b})$, $X_6$ is O, S, $N(Ar_6)$, or $N(Z_6)$, $X_7$ is O, S, $N(Ar_7)$, or $N(Z_7)$, $X_8$ is O, S, $N(Ar_8)$, or $N(Z_8)$, $X_9$ is O, S, $N(Ar_9)$, or $N(Z_9)$, $Ar_{1a}$, $Ar_{1b}$, $Ar_{2a}$, $Ar_{2b}$, $Ar_{3a}$, $Ar_{3b}$, $Ar_{4a}$, $Ar_{4b}$, $Ar_{5a}$, $Ar_{5b}$, and $Ar_6$ to $Ar_9$ are each, independently from one another, a group of Formula 2, ring CY1 to ring CY7 are each, independently from one another, a $C_3$-$C_{60}$ carbocyclic group or a $C_1$-$C_{60}$ heterocyclic group, $T_1$ is Se or Te, b1 to b7 are each, independently from one another, an integer from 0 to 8, $Z_{1a}$, $Z_{1b}$, $Z_{2a}$, $Z_{2b}$, $Z_{3a}$, $Z_{3b}$, $Z_{4a}$, $Z_{4b}$, $Z_{5a}$, $Z_{5b}$, $Z_6$ to $Z_9$, and $R_1$ to $R_7$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ aryl alkyl group unsubstituted or substituted with at least one $R_{10a}$, a $C_2$-$C_{60}$ heteroaryl alkyl group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, c1 is an integer from 0 to 3, $L_1$ is a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, Formula 1 satisfies at least one of Conditions (1) to (9), Condition (1)

a1 is an integer of 1 or more, and at least one of $X_1$(s) in the number of a1 is $N(Ar_{1a})(Ar_{1b})$ or $N(Ar_{1a})(Z_{1a})$ Condition (2)

a2 is an integer of 1 or more, and at least one of $X_2$(s) in the number of a2 is $N(Ar_{2a})(Ar_{2b})$ or $N(Ar_{2a})(Z_{2a})$ Condition (3)

a3 is an integer of 1 or more, and at least one of $X_3$(s) in the number of a3 is $N(Ar_{3a})(Ar_{3b})$ or $N(Ar_{3a})(Z_{3a})$ Condition (4)

a4 is an integer of 1 or more, and at least one of $X_4$(s) in the number of a4 is $N(Ar_{4a})(Ar_{4b})$ or $N(Ar_{4a})(Z_{4a})$ Condition (5)

a5 is an integer of 1 or more, and at least one of $X_5$(s) in the number of a5 is $N(Ar_{5a})(Ar_{5b})$ or $N(Ar_{5a})(Z_{5a})$ Condition (6)

$X_6$ is $N(Ar_6)$

Condition (7)

$X_7$ is $N(Ar_7)$

Condition (8)

$X_8$ is $N(Ar_8)$

Condition (9)

$X_9$ is $N(Ar_9)$, provided that when $T_1$ is Se, Formula 1 satisfies at least two of Conditions (1) to (9),

* in Formula 2 is a binding site to Formula 1, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $—Si(q_{11})(q_{12})(q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-Coo aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each, independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

2. The light-emitting device of claim 1, wherein the emission layer comprises the heterocyclic compound of Formula 1.

3. The light-emitting device of claim 1, wherein the emission layer further comprises a host and a dopant, and the heterocyclic compound of Formula 1 is a dopant.

4. The light-emitting device of claim 3, wherein the emission layer further comprises a phosphorescent dopant.

5. An electronic apparatus comprising the light-emitting device of claim 1.

6. The electronic apparatus of claim 5, further comprising a thin-film transistor, wherein the thin-film transistor comprises a source electrode and a drain electrode, and the first electrode of the light-emitting device is electrically connected to at least one of the source electrode and the drain electrode of the thin-film transistor.

7. The electronic apparatus of claim 5, further comprising a color filter, a color conversion layer, a touch screen layer, a polarizing layer, or any combination thereof.

8. The light-emitting device of claim 1, wherein $Y_1$ and $Y_2$ in Formula 1 are each B.

9. The light-emitting device of claim 1, wherein, in Formula 1, a1 and a2 are each 1, a3 to a5 are each 0, and Formula 1 does not satisfy Conditions (3) to (5).

10. The light-emitting device of claim 1, wherein, in Formula 1, $X_1$ is $N(Ar_{1a})(Z_{1a})$ or $N(Z_{1a})(Z_{1b})$, $X_2$ is $N(Ar_{2a})(Z_{2a})$ or $N(Z_{2a})(Z_{2b})$, $X_3$ is $N(Ar_{3a})(Z_{3a})$ or $N(Z_{3a})(Z_{3b})$, $X_4$ is $N(Ar_{4a})(Z_{4a})$ or $N(Z_{4a})(Z_{4b})$, $X_5$ is $N(Ar_{5a})(Z_{5a})$ or $N(Z_{5a})(Z_{5b})$, and Formula 1 satisfies one of Conditions (1-1) to (5-1), one of Conditions (6) to (9), or any combination thereof:

Condition (1-1)

a1 is an integer of 1 or more, and at least one of $X_1$(s) in the number of a1 is $N(Ar_{1a})(Z_{1a})$ Condition (2-1)

a2 is an integer of 1 or more, and at least one of $X_2$(s) in the number of a2 is $N(Ar_{2a})(Z_{2a})$ Condition (3-1)

a3 is an integer of 1 or more, and at least one of $X_3$(s) in the number of a3 is $N(Ar_{3a})(Z_{3a})$ Condition (4-1)

a4 is an integer of 1 or more, and at least one of $X_4$(s) in the number of a4 is $N(Ar_{4a})(Z_{4a})$ Condition (5-1)

a5 is an integer of 1 or more, and at least one of $X_5$(s) in the number of a5 is $N(Ar_{5a})(Z_{5a})$, provided that when $T_1$ is Se, Formula 1 satisfies one of Conditions (1-1) to (5-1) and one of Conditions (6) to (9).

11. The light-emitting device of claim 1, wherein, in Formula 1, $X_6$ is O or S, $X_7$ is O, $N(Ar_7)$, or $N(Z_7)$, $X_8$ is O, $N(Ar_8)$, or $N(Z_8)$, $X_9$ is O, $N(Ar_9)$, or $N(Z_9)$, and Formula 1 does not satisfy Condition (6).

12. The light-emitting device of claim 1, wherein Formula 1 satisfies one of Conditions (1) and (2), one of Conditions (7) to (9), or any combination thereof, and Formula 1 does not satisfy Conditions (3) to (6), provided that when $T_1$ is Se, Formula 1 satisfies one of Conditions (1) and (2) and one of Conditions (7) to (9).

13. The light-emitting device of claim 1, wherein at least one of CY1 to CY5 in Formula 1 is a benzene group.

14. The light-emitting device of claim 1, wherein, in Formula 2, CY6 is a benzene group, and CY7 is a benzene group, a fluorene group, a carbazole group, a dibenzofuran group, a dibenzothiophene group, a dibenzosilole group, a dibenzoselenophene group, or a dibenzotellurophene group.

15. The light-emitting device of claim 1, wherein, in Formulae 1 and 2, $Z_{1a}$, $Z_{1b}$, $Z_{2a}$, $Z_{2b}$, $Z_{3a}$, $Z_{3b}$, $Z_{4a}$, $Z_{4b}$, $Z_{5a}$, $Z_{5b}$, $Z_6$ to $Z_9$, and $R_1$ to $R_7$ are each, independently from one another:

hydrogen, deuterium, —F, or a cyano group; or a phenyl group, a biphenyl group, or a terphenyl group, each unsubstituted or substituted with deuterium, —F, a cyano group, a $C_1$-$C_{20}$ alkyl group, a phenyl group, a biphenyl group, a terphenyl group, a $C_1$-$C_{20}$ alkylphenyl group, or any combination thereof.

16. The light-emitting device of claim 1, wherein, in Formula 2, $L_1$ is:

a single bond;

a phenylene group or a naphthylene group; or a phenylene group or a naphthylene group each, independently from one another, unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, or any combination thereof.

17. The light-emitting device of claim 1, wherein a group of

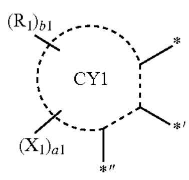

in Formula 1 is a group of one of Formulae CY1-1 to CY1-4:

CY1-1

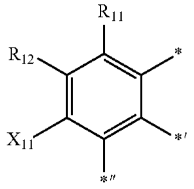

CY1-2

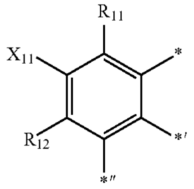

CY1-3

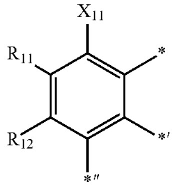

CY1-4

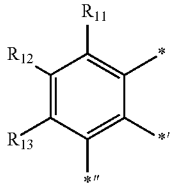

wherein, in Formulae CY1-1 to CY1-4, $X_{11}$ has the same meaning as $X_1$ in claim 1, $R_{11}$ and $R_{12}$ have, independently from one another, the same meaning as Rin claim 1,

* is a binding site to $X_6$ in Formula 1,

*' is a binding site to $Y_1$ in Formula 1, and

*" is a binding site to $X_8$ in Formula 1.

18. The light-emitting device of claim 1, wherein a group of

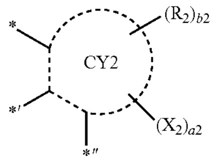

in Formula 1 is a group of one of Formulae CY2-1 to CY2-4:

CY2-1

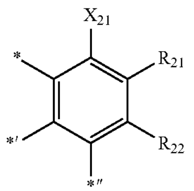

CY2-2

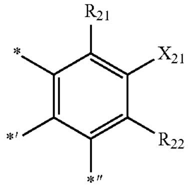

CY2-3

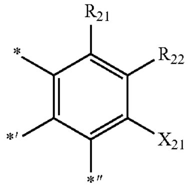

CY2-4

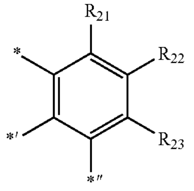

wherein, in Formulae CY2-1 to CY2-4, $X_{21}$ has the same meaning as $X_2$ in claim 1, $R_{21}$ to $R_{23}$ have, independently from one another, the same meaning as $R_2$ in claim 1,

* is a binding site to $X_7$ in Formula 1,

*' is a binding site to $Y_2$ in Formula 1, and

*" is a binding site to $X_9$ in Formula 1.

19. The light-emitting device of claim 1, wherein Formula 2 is a group of one of Formulae 2-1 to 2-4:

2-1

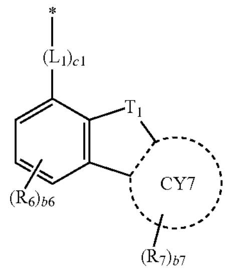

2-2

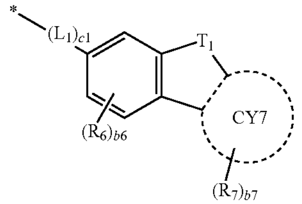

2-3

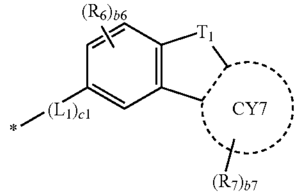

2-4

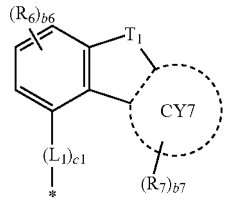

wherein, in Formulae 2-1 to 2-4, $L_1$, c1, $T_1$, b6, b7, $R_6$, $R_7$, and CY7 have, independently from one another, the same meaning as in claim 1, and

* is a binding site to Formula 1.

20. The light-emitting device of claim 1, wherein Formula 1 is one of Compounds 5 to 84, 89-92, and 97-100:

5

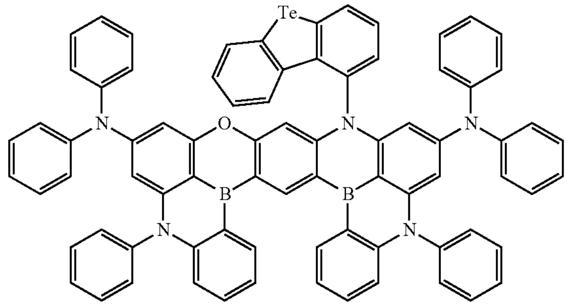

-continued
6
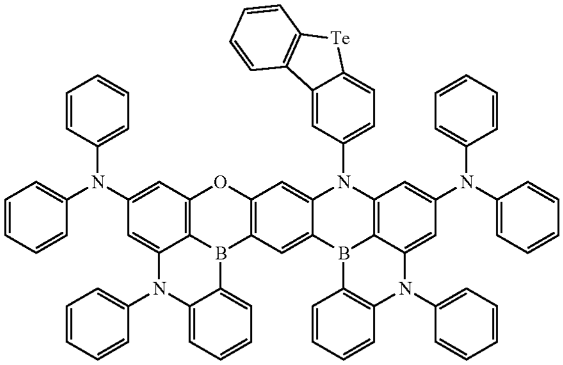
7
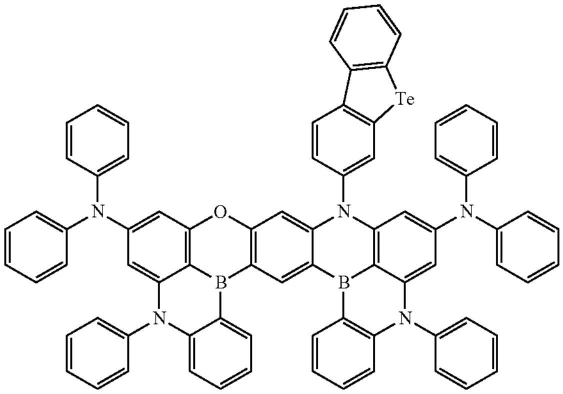
8
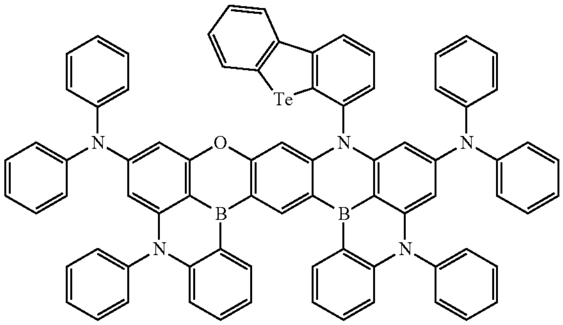
9
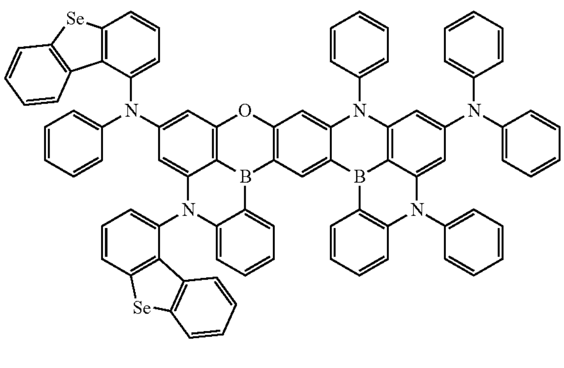
-continued
10
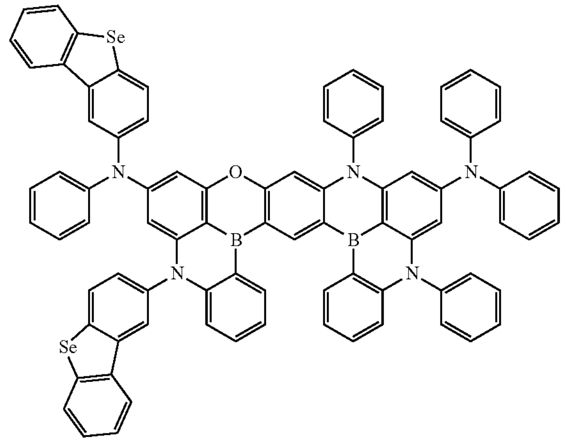
11
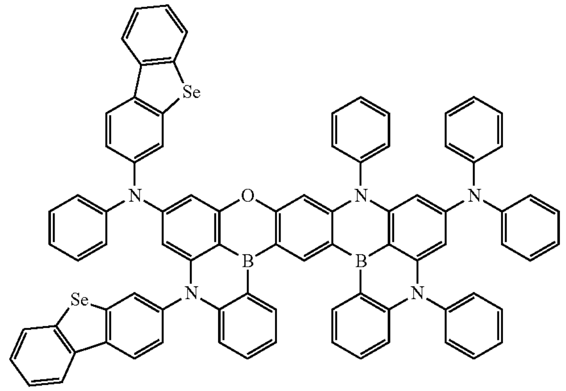
12
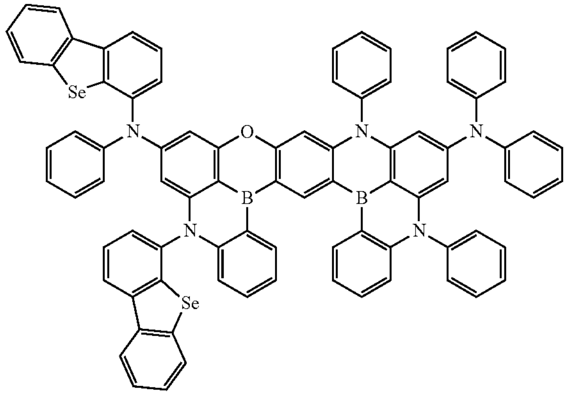
13
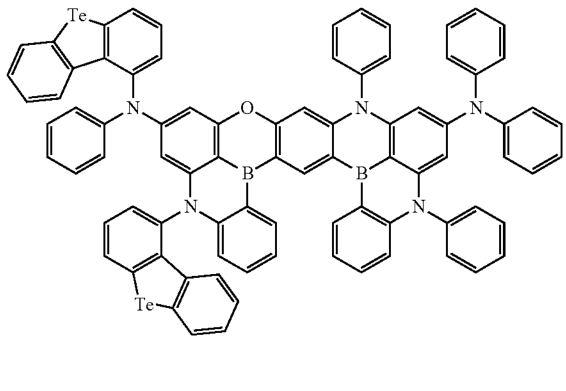

-continued
14
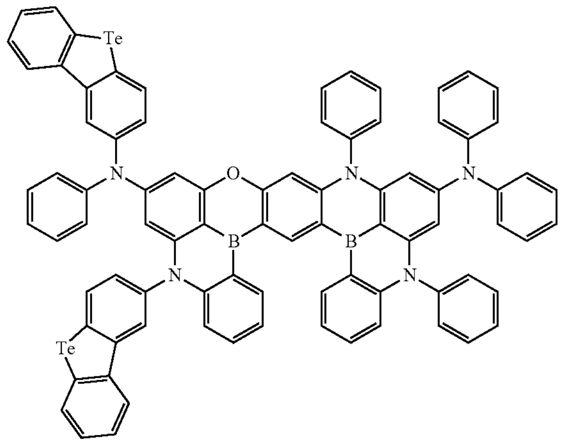
15
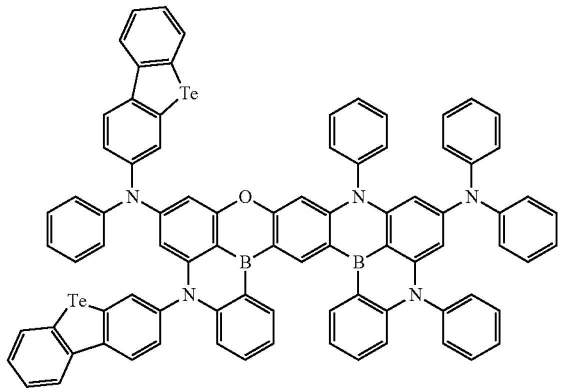
16
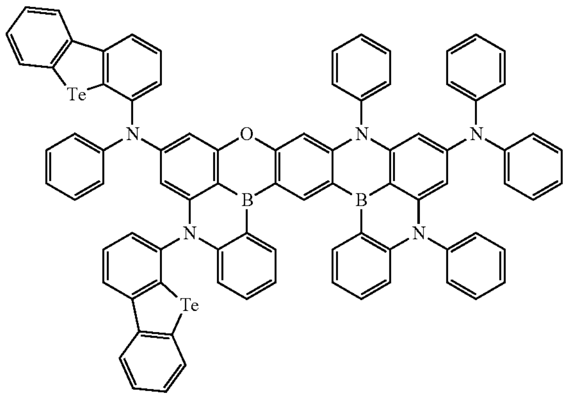
17
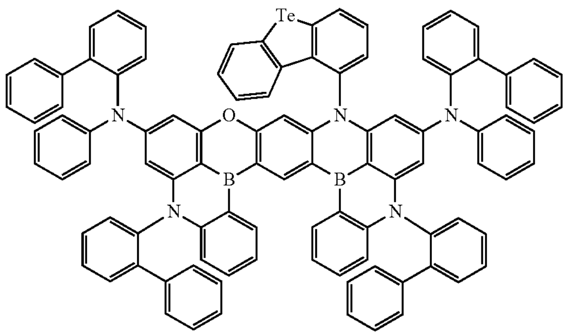
-continued
18
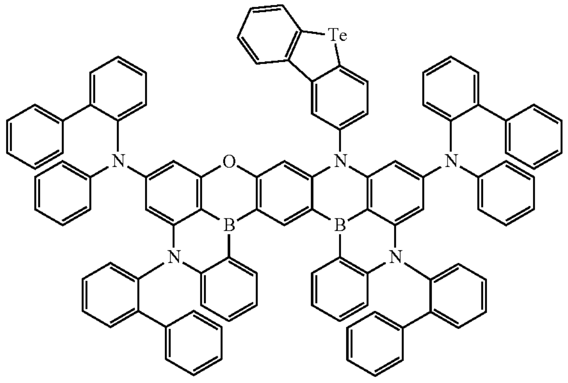
19
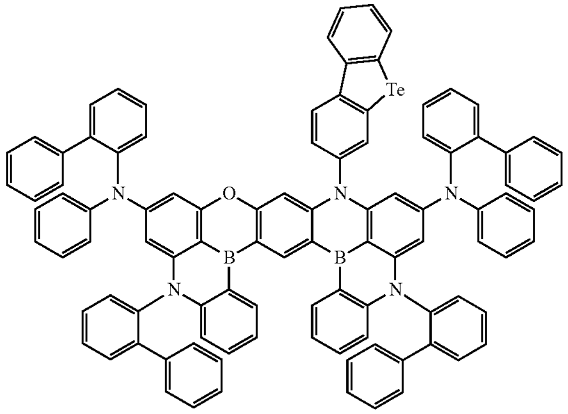
20
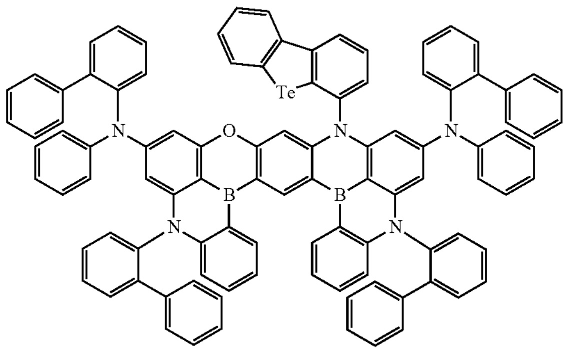
21
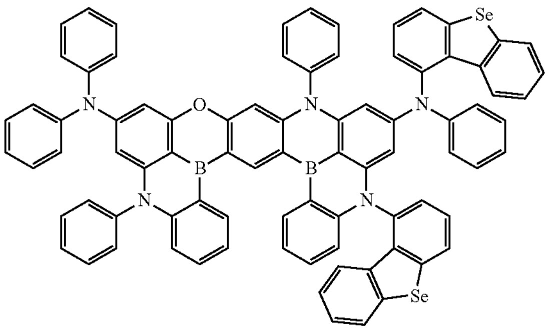

-continued
22
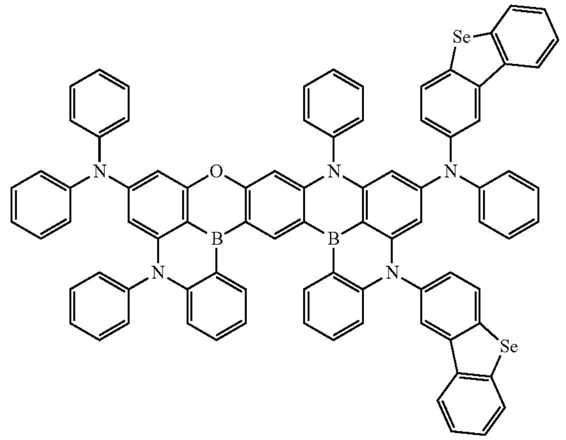
23
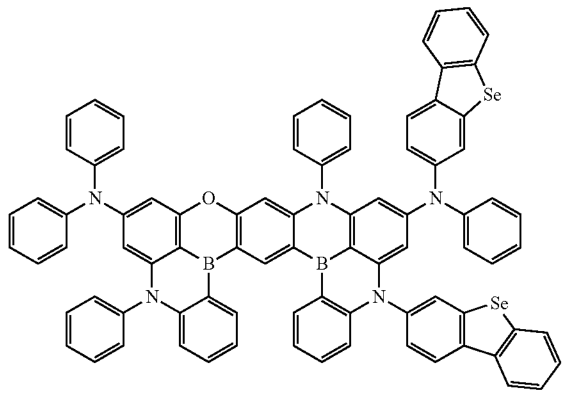
24
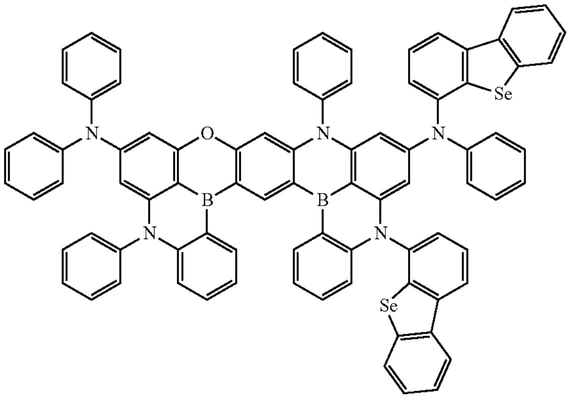
25
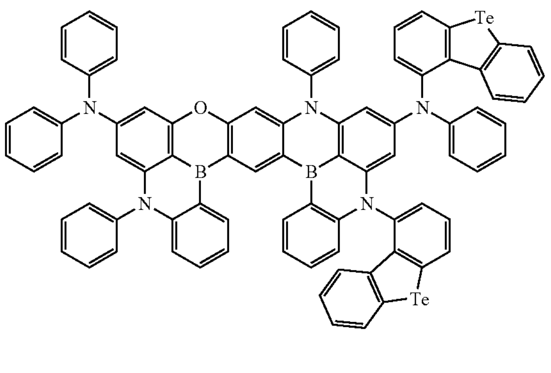
-continued
26
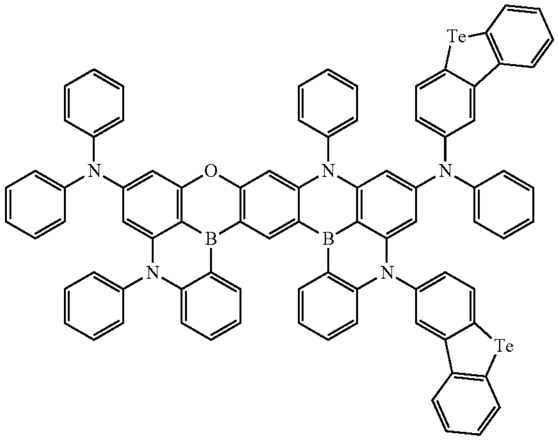
27
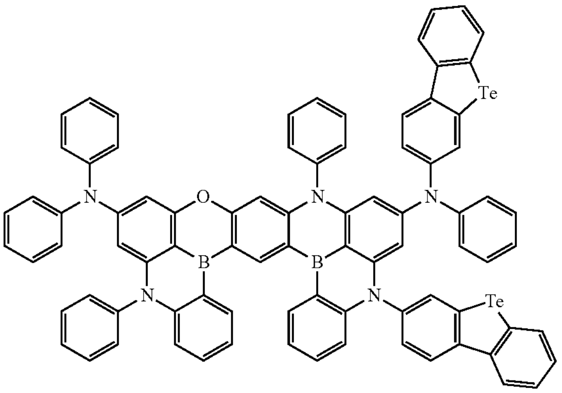
28
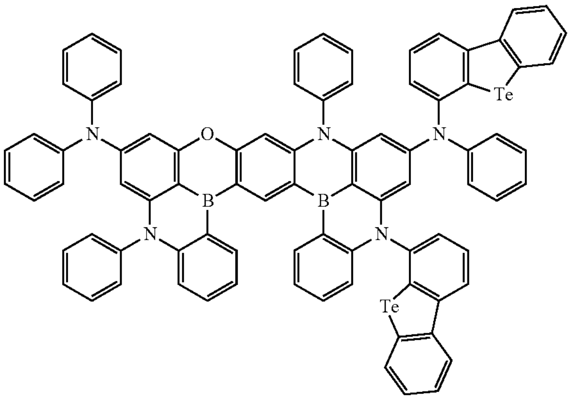

-continued
29
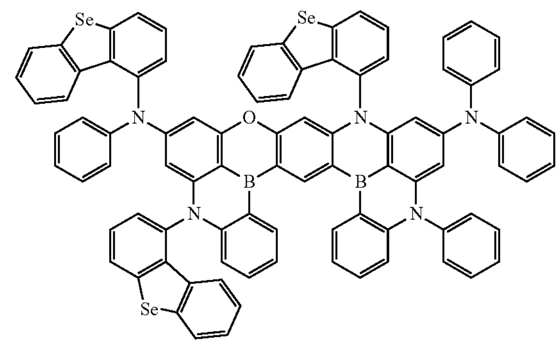
30
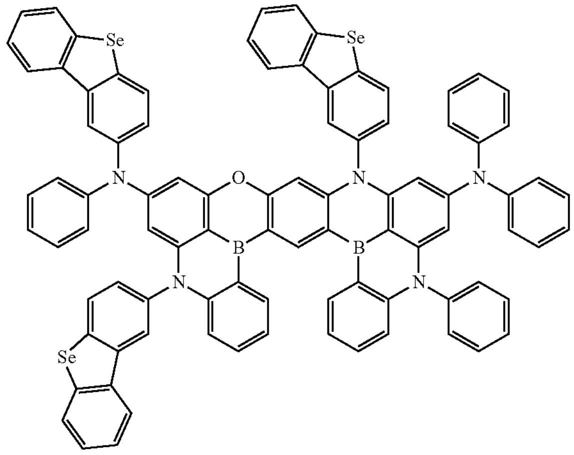
31
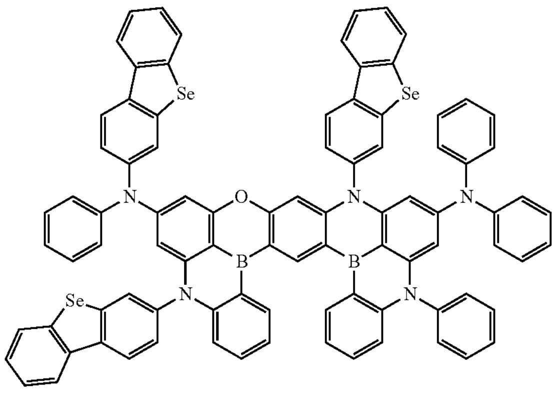
-continued
32
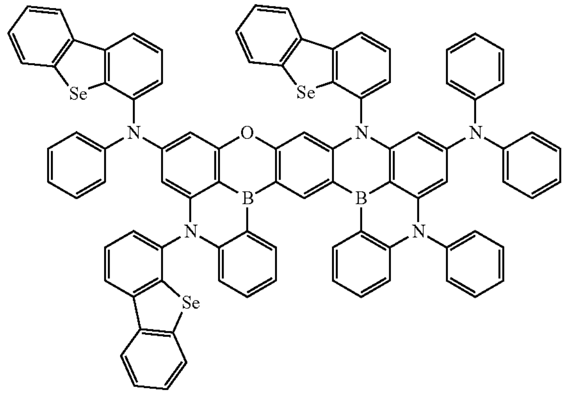
33
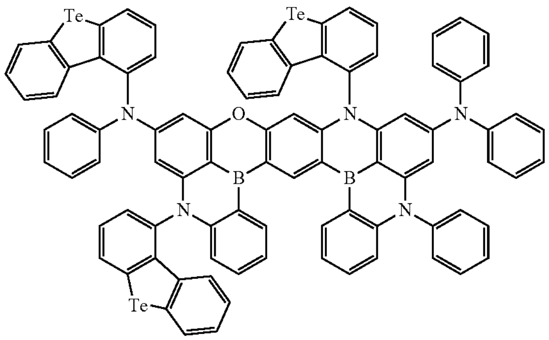
34
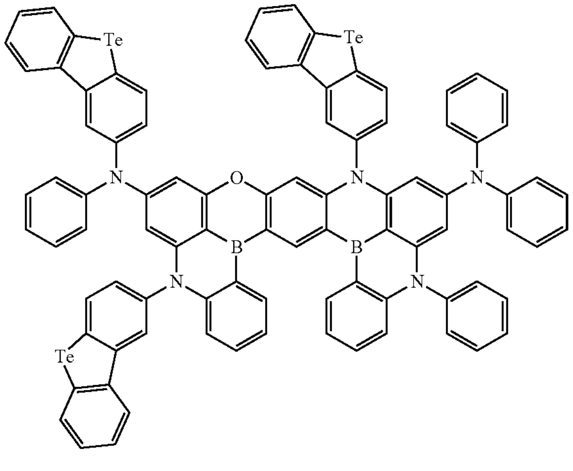

35
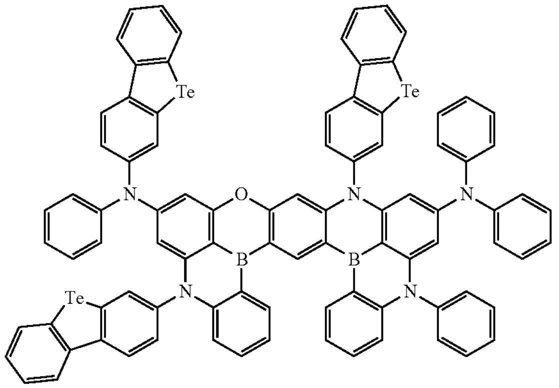
36
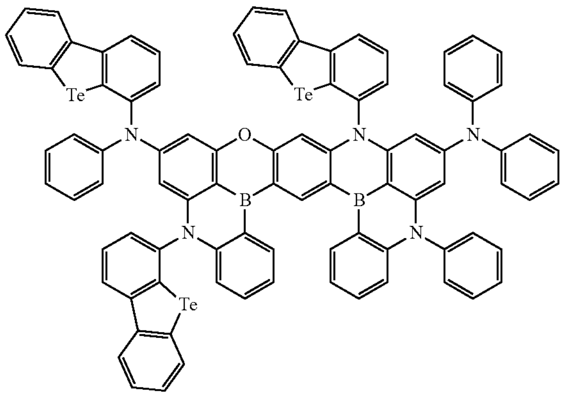
37
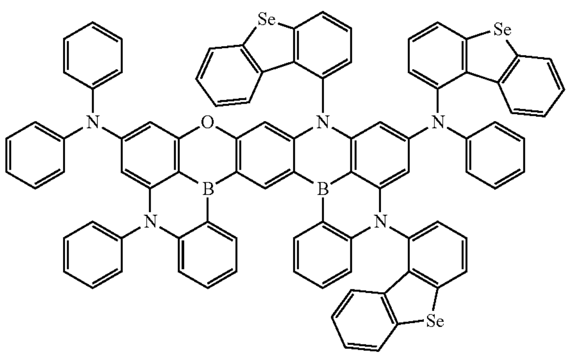
38
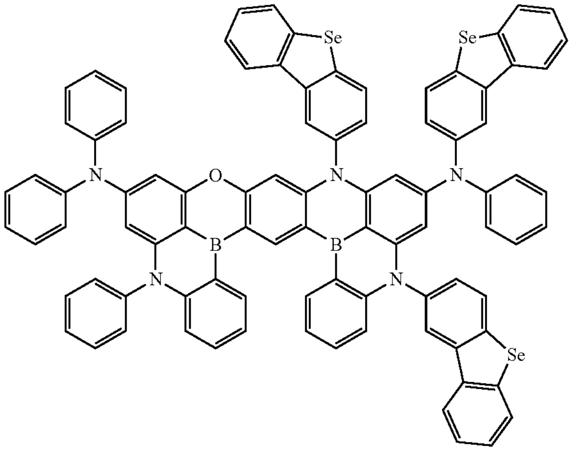
39
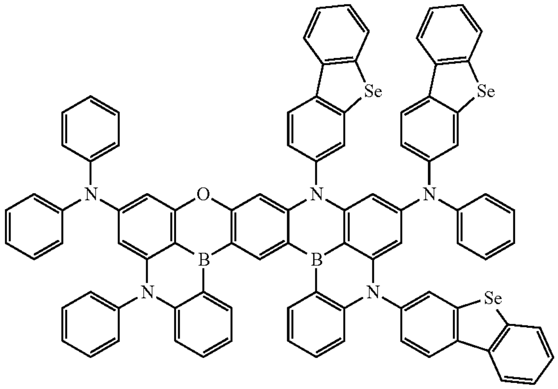
40
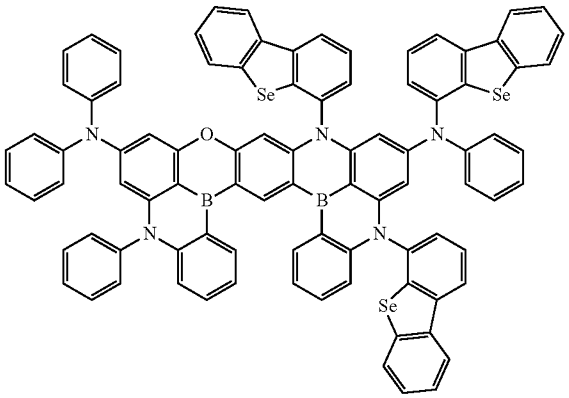

-continued
41
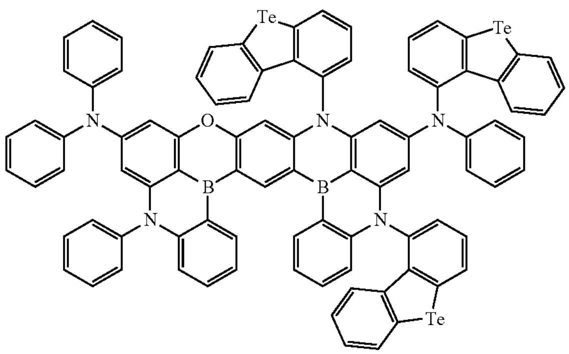
42
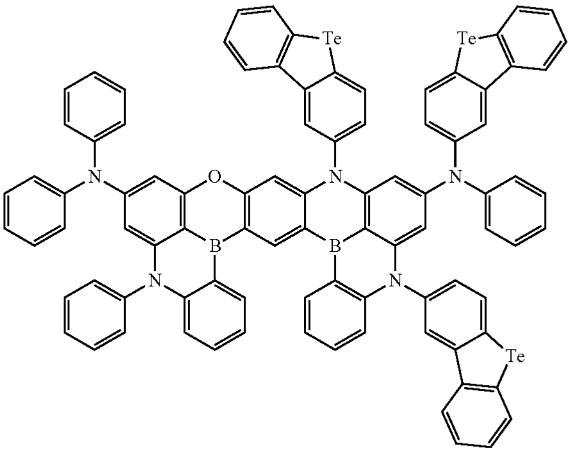
43
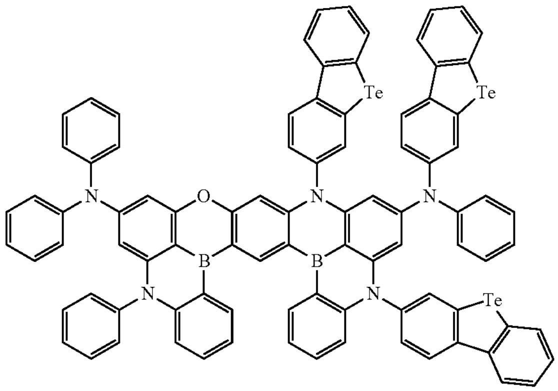
-continued
44
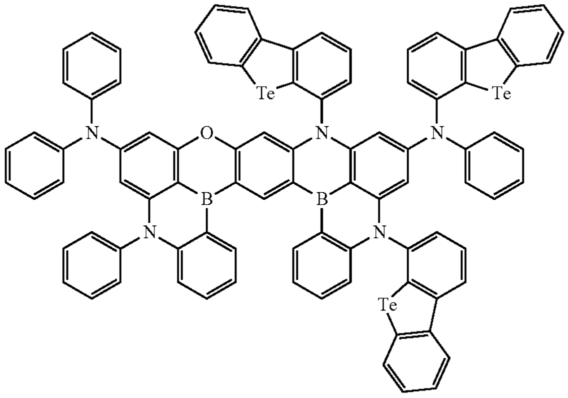
45
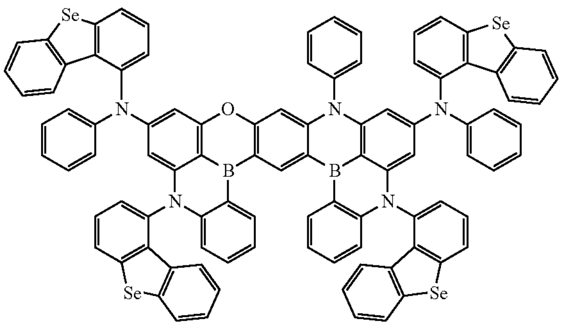
46
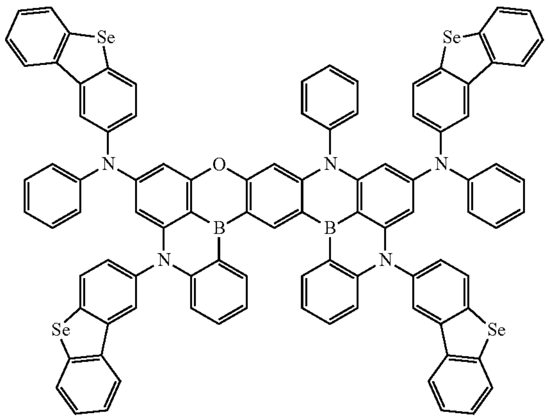
47
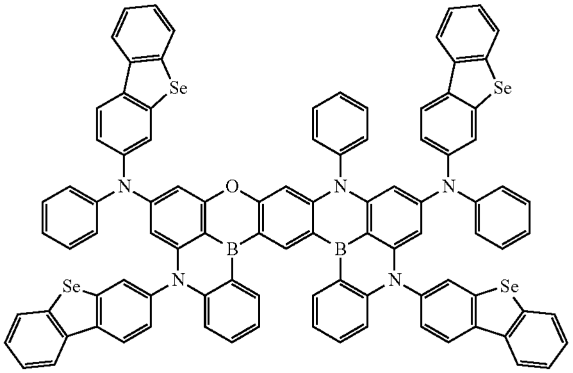

-continued
48
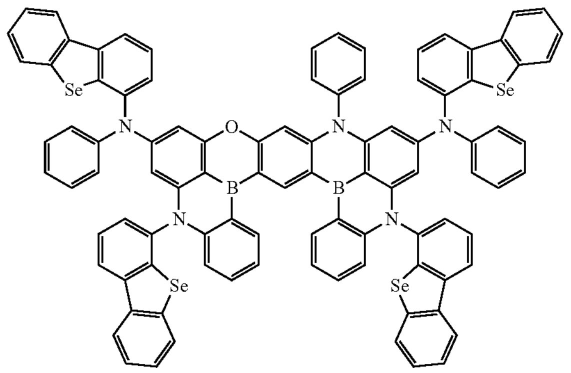
49
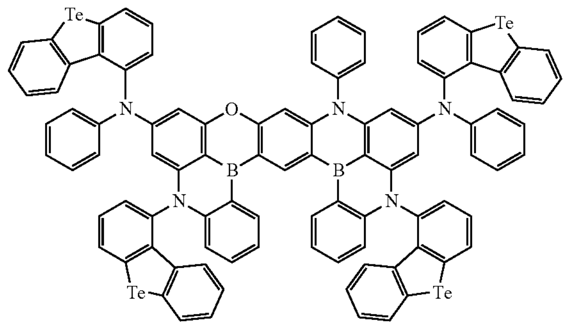
50
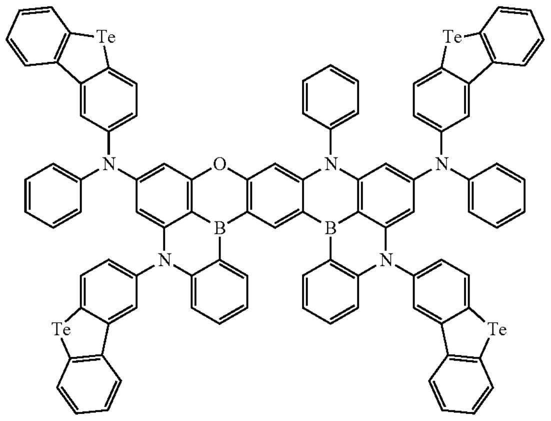
51
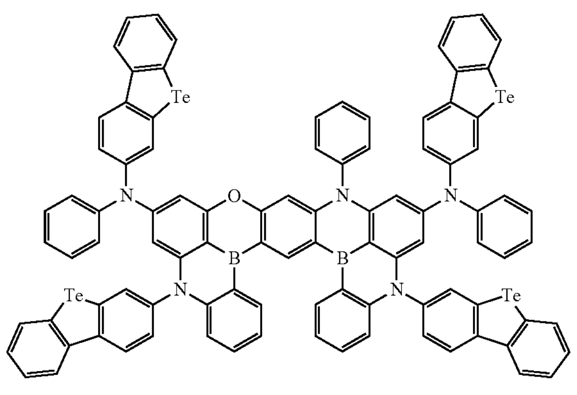
-continued
52
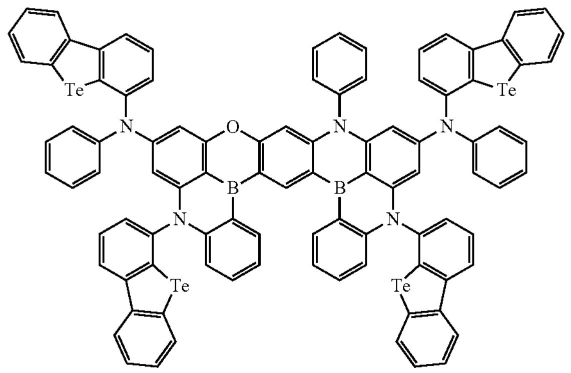
53
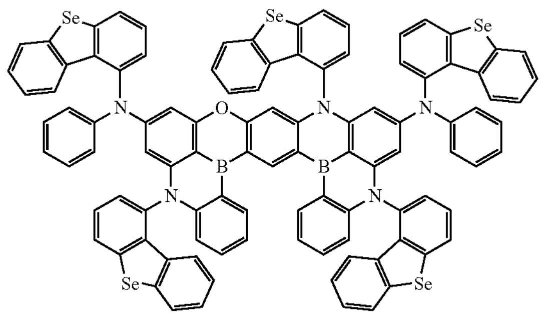
54
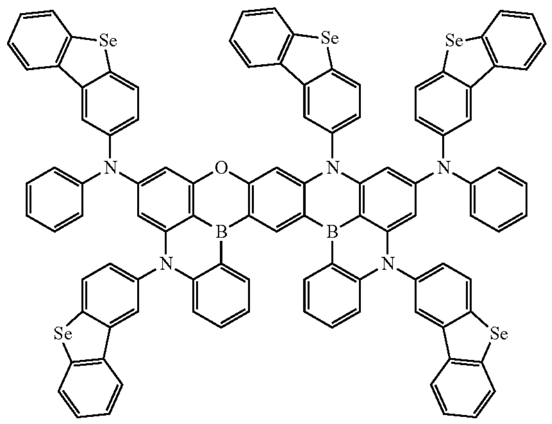
55
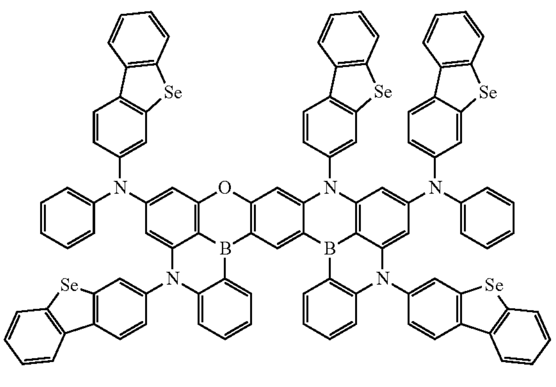

56
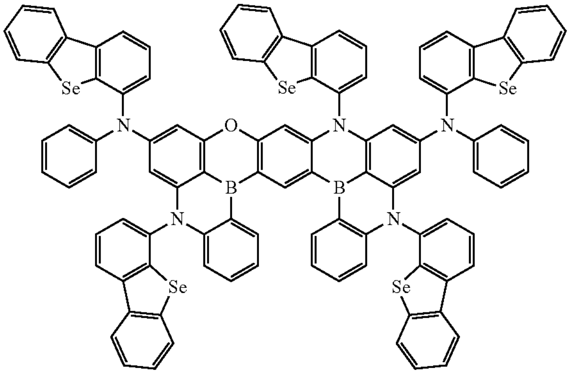
57
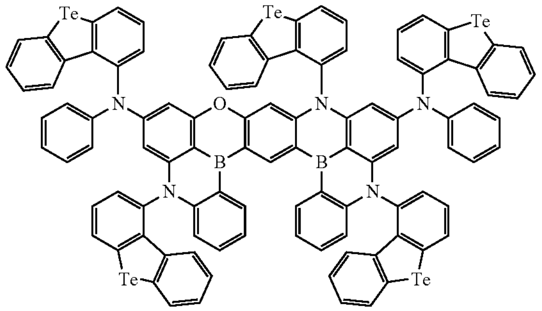
58
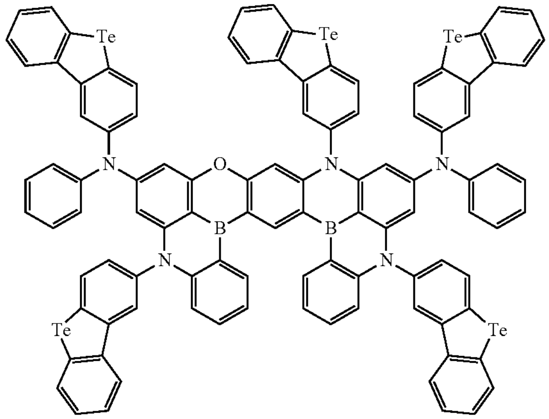
59
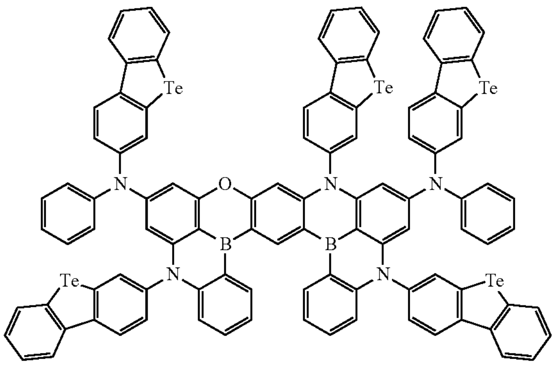
60
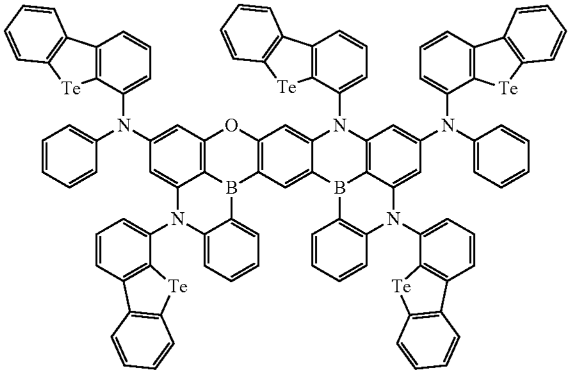
61
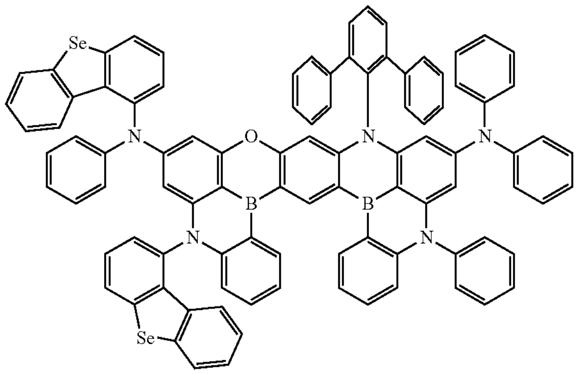
62
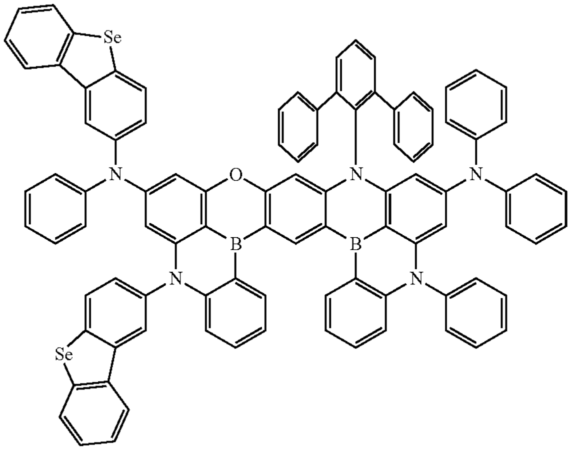

-continued
63
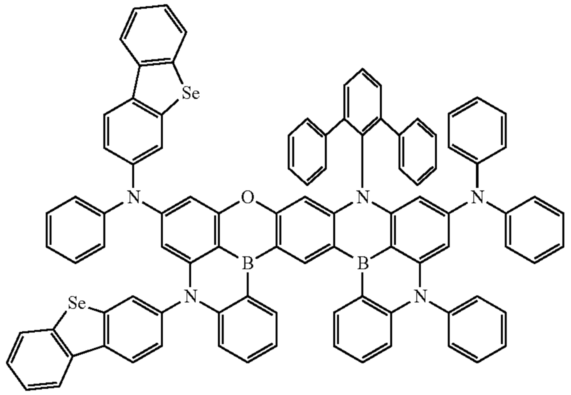
64
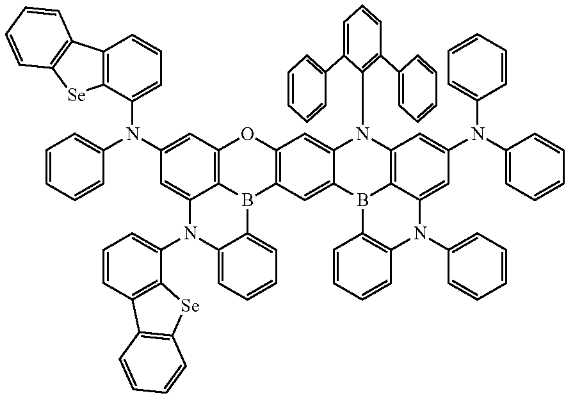
65
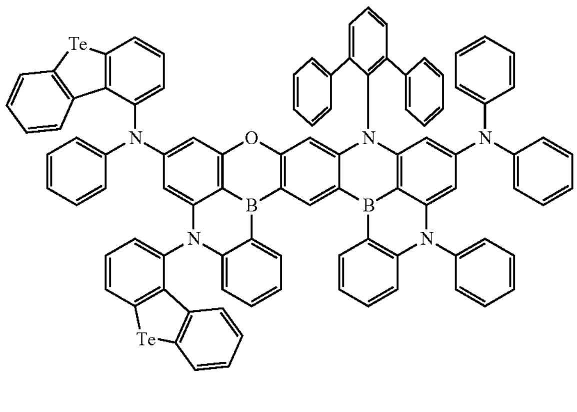
-continued
66
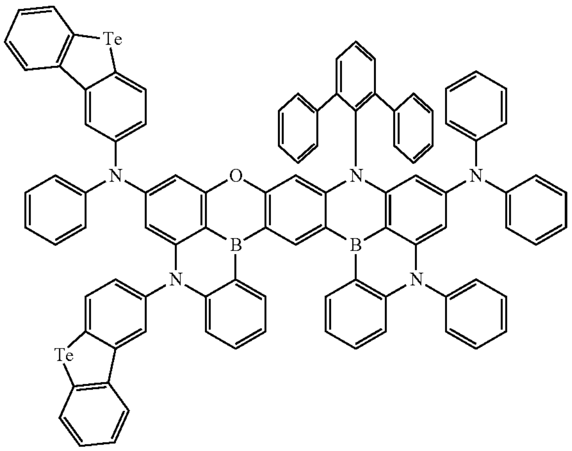
67
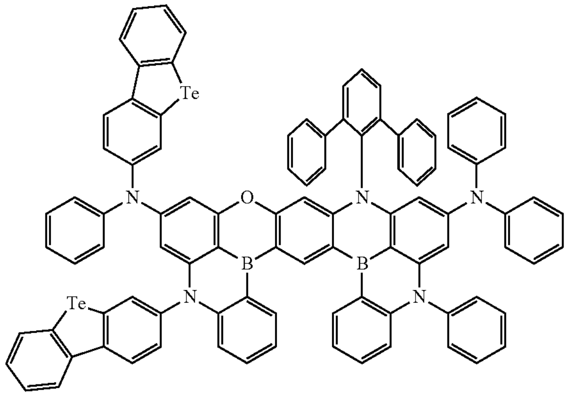
68
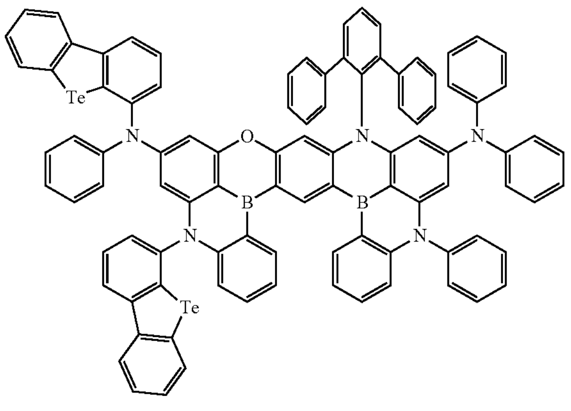

-continued
69
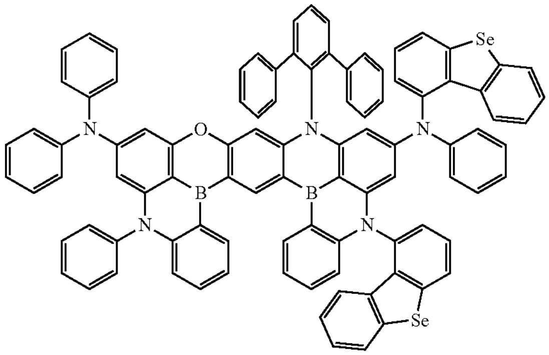
70
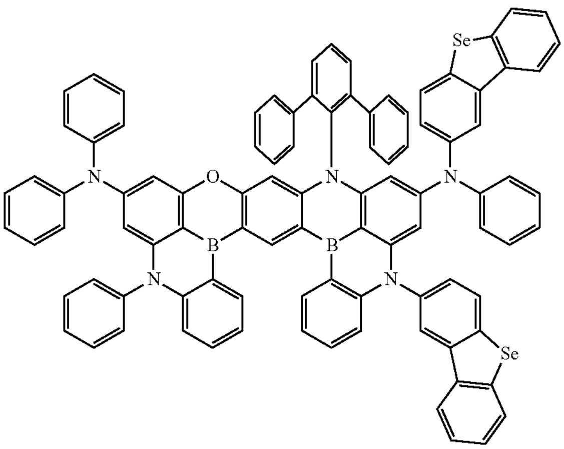
71
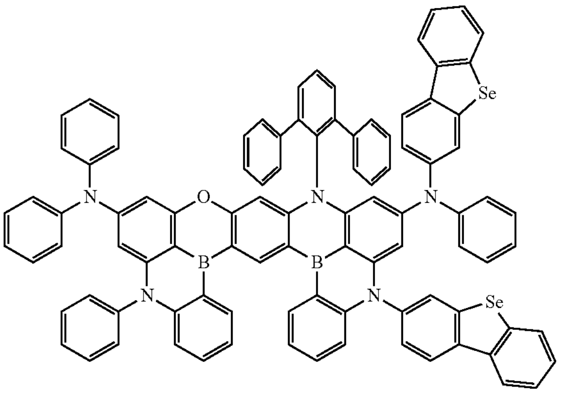
-continued
72
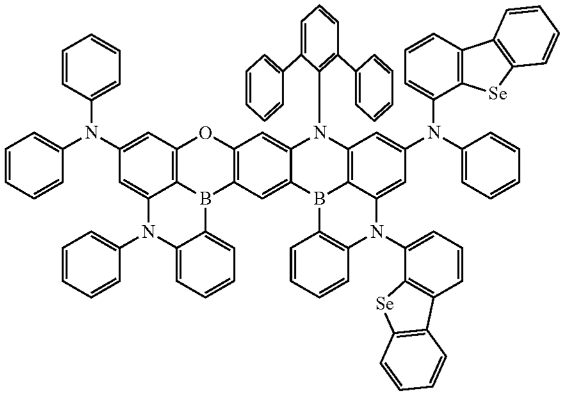
73
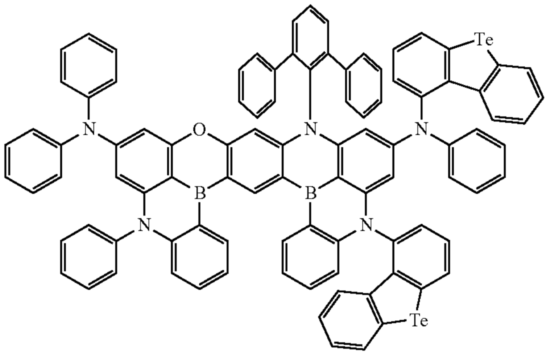
74
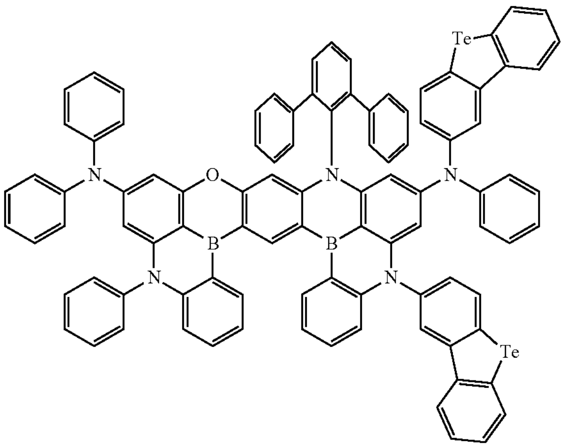

-continued
75
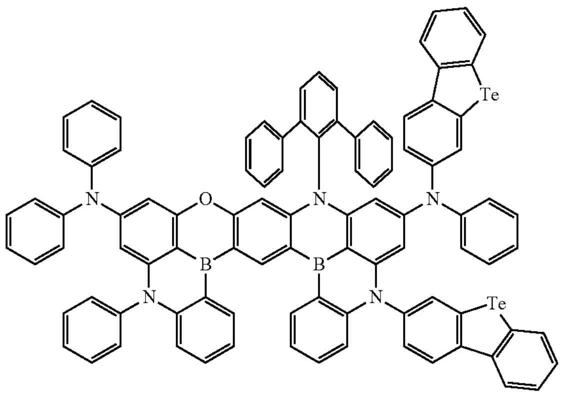
76
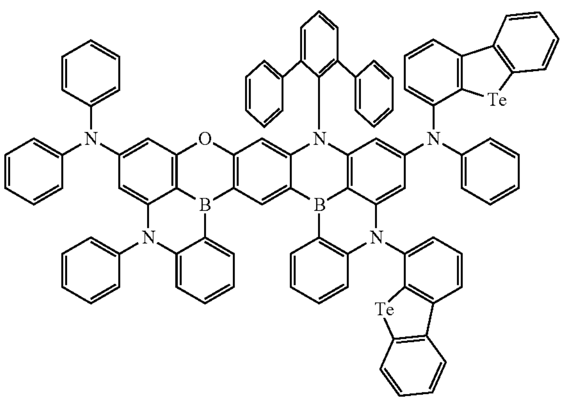
77
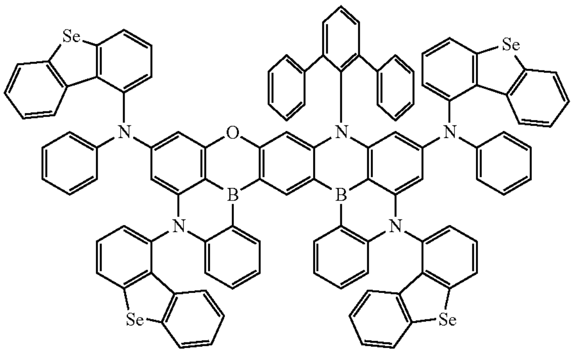
78
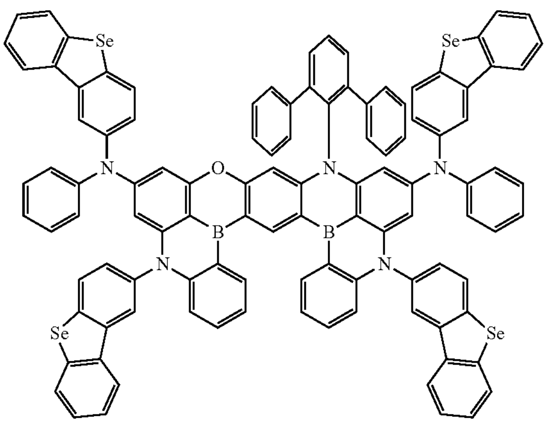
-continued
79
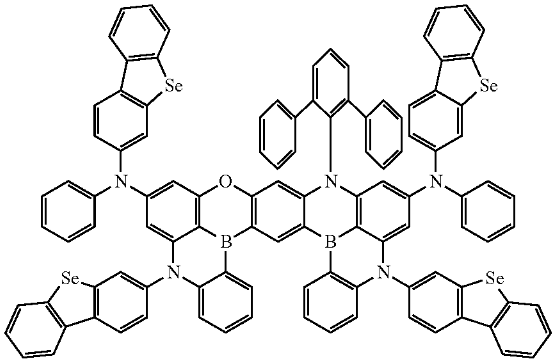
80
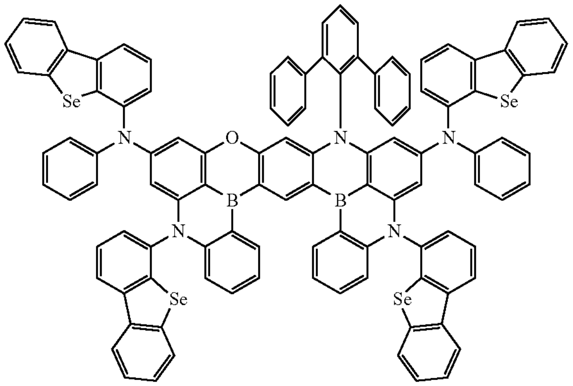
81
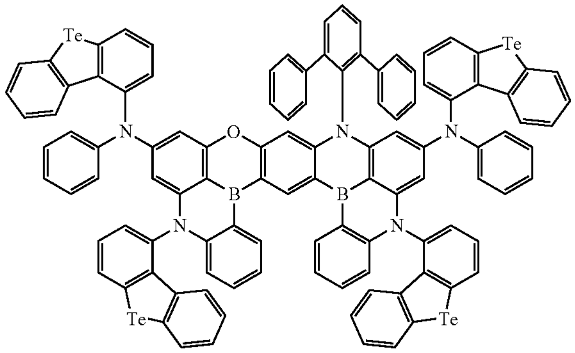
82
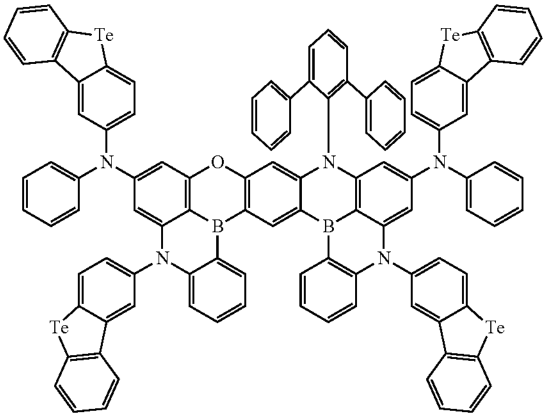

-continued
83
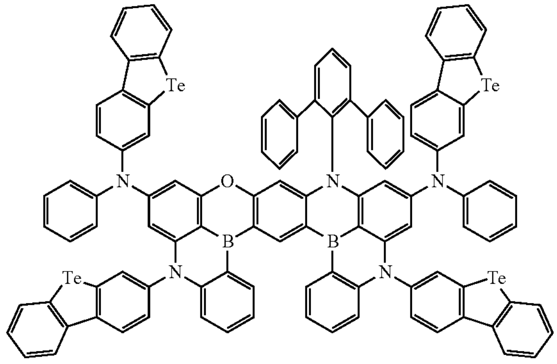
84
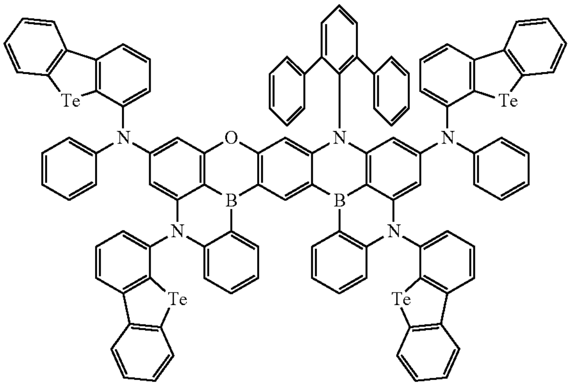
89
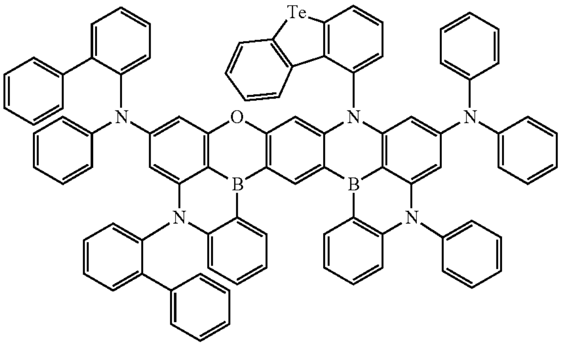
90
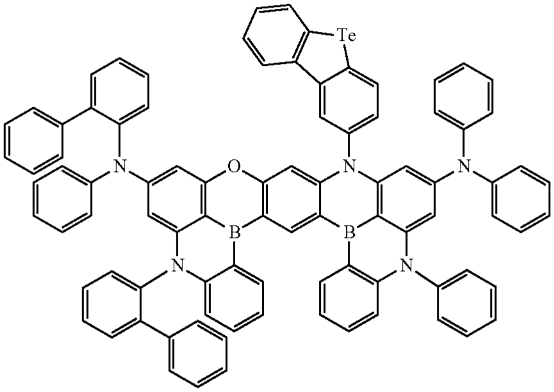
-continued
91
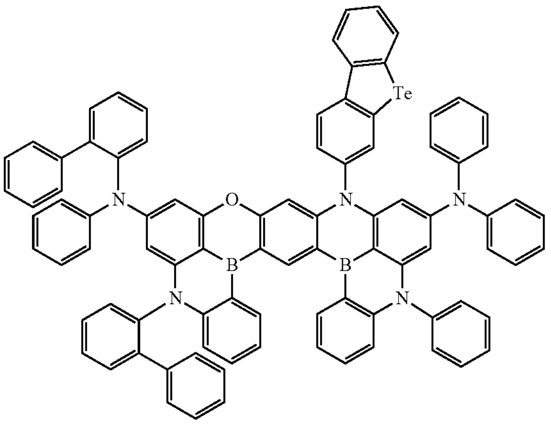
92
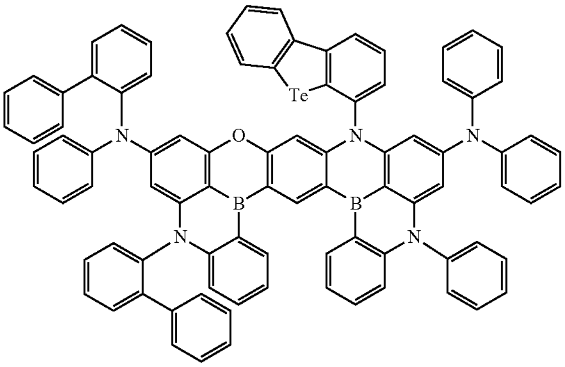
97
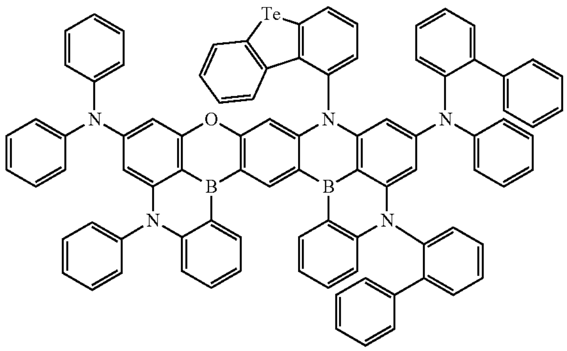
98
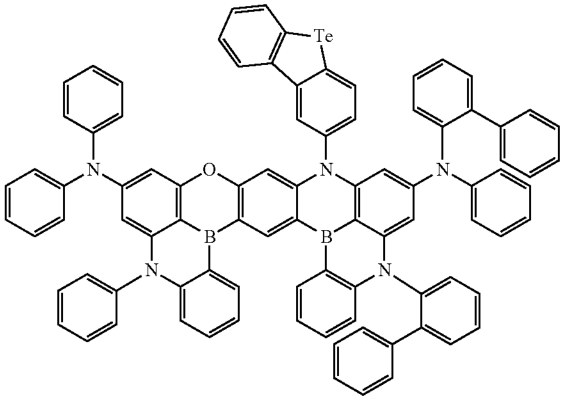

-continued
99
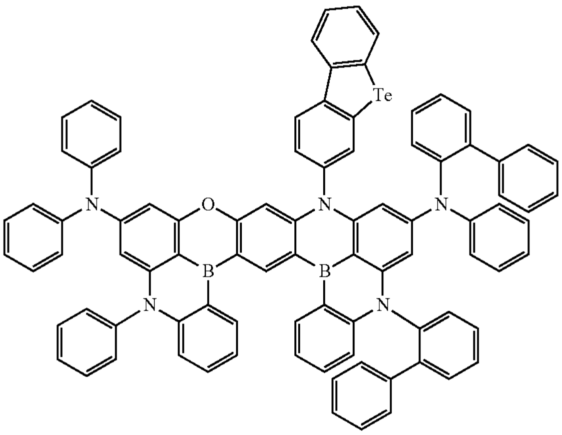
-continued
100
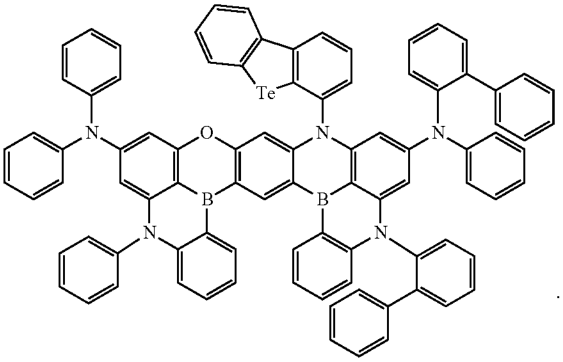
.
* * * * *